United States Patent
Azuma et al.

(10) Patent No.: US 8,885,387 B2
(45) Date of Patent: Nov. 11, 2014

(54) CROSS POINT VARIABLE RESISTANCE NONVOLATILE MEMORY DEVICE

(71) Applicant: Panasonic Corporation, Osaka (JP)

(72) Inventors: Ryotaro Azuma, Osaka (JP); Kazuhiko Shimakawa, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/990,187

(22) PCT Filed: Nov. 21, 2012

(86) PCT No.: PCT/JP2012/007490
§ 371 (c)(1),
(2), (4) Date: May 29, 2013

(87) PCT Pub. No.: WO2013/080496
PCT Pub. Date: Jun. 6, 2013

(65) Prior Publication Data
US 2014/0098594 A1    Apr. 10, 2014

(30) Foreign Application Priority Data
Dec. 2, 2011    (JP) .................. 2011-265301

(51) Int. Cl.
G11C 11/00    (2006.01)
G11C 13/00    (2006.01)
H01L 27/24    (2006.01)
H01L 45/00    (2006.01)

(52) U.S. Cl.
CPC ........ *G11C 13/0002* (2013.01); *G11C 13/0069* (2013.01); *G11C 13/004* (2013.01); *H01L 27/2418* (2013.01); *G11C 2213/71* (2013.01); *G11C 2213/77* (2013.01); *H01L 45/1233* (2013.01); *G11C 13/0007* (2013.01); *H01L 45/08* (2013.01); *G11C 13/0026* (2013.01); *H01L 27/2481* (2013.01); *H01L 45/146* (2013.01); *G11C 13/0023* (2013.01)
USPC ...................... 365/148; 365/163; 365/189.07

(58) Field of Classification Search
USPC ............ 365/46, 94, 100, 113, 129, 148, 163,
365/185.13–185.33, 189.07–189.12, 206,
365/222, 226, 230.03–230.06; 257/2–5, 9,
257/296, 310, E21.35, E31.047, E27.006;
438/29, 95, 96, 166, 135, 240, 259,
438/365, 482, 486, 597, 785; 977/754
See application file for complete search history.

(56) References Cited

U.S. PATENT DOCUMENTS 5,544,121 A    8/1996 Dosaka et al.
(Continued)

FOREIGN PATENT DOCUMENTS

JP    5-81852    4/1993
JP    7-134701    5/1995
(Continued)

OTHER PUBLICATIONS

International Search Report issued Dec. 25, 2012 in corresponding International Application No. PCT/JP2012/007490.

*Primary Examiner* — Harry W Byrne
(74) *Attorney, Agent, or Firm* — Wenderoth, Lind & Ponack, L.L.P.

(57) ABSTRACT

Each memory cell is formed at a different one of cross points of bit lines extending in an X direction and formed in a plurality of layers and word lines extending in a Y direction. In a multilayer cross point structure in which a plurality of vertical array planes sharing the word lines are aligned in the Y direction each for a group of bit lines aligned in a Z direction, even and odd layer bit line selection switch elements switch connection and disconnection between a global bit line and the commonly-connected even layer bit line and the commonly-connected odd layer bit line, respectively. Each of the even and odd layer bit line selection switch elements has both a bit line selection function and a current limiting function in low resistance writing.

18 Claims, 54 Drawing Sheets

(56) References Cited

U.S. PATENT DOCUMENTS

| | | |
|---|---|---|
| 5,559,750 A | 9/1996 | Dosaka et al. |
| 5,583,813 A | 12/1996 | Dosaka et al. |
| 5,623,454 A | 4/1997 | Dosaka et al. |
| 5,629,895 A | 5/1997 | Dosaka et al. |
| 5,650,968 A | 7/1997 | Dosaka et al. |
| 5,652,723 A | 7/1997 | Dosaka et al. |
| 5,848,004 A | 12/1998 | Dosaka et al. |
| 5,930,523 A | 7/1999 | Kawasaki et al. |
| 6,026,029 A | 2/2000 | Dosaka et al. |
| 6,212,620 B1 | 4/2001 | Kawasaki et al. |
| 6,223,265 B1 | 4/2001 | Kawasaki et al. |
| 6,279,063 B1 | 8/2001 | Kawasaki et al. |
| 6,356,484 B2 | 3/2002 | Dosaka et al. |
| 6,591,294 B2 | 7/2003 | Kawasaki et al. |
| 6,735,683 B2 | 5/2004 | Kawasaki et al. |
| 6,748,507 B2 | 6/2004 | Kawasaki et al. |
| 7,394,680 B2 | 7/2008 | Toda et al. |
| 7,400,522 B2 | 7/2008 | Toda et al. |
| 7,606,059 B2 | 10/2009 | Toda |
| 7,692,951 B2 | 4/2010 | Toda et al. |
| 7,778,062 B2 | 8/2010 | Toda et al. |
| 7,826,249 B2 | 11/2010 | Toda |
| 7,920,408 B2 | 4/2011 | Azuma et al. |
| 8,094,485 B2 | 1/2012 | Shimakawa et al. |
| 8,102,697 B2 | 1/2012 | Toda |
| 8,233,311 B2 | 7/2012 | Shimakawa et al. |
| 2001/0040827 A1 | 11/2001 | Dosaka et al. |
| 2002/0007430 A1 | 1/2002 | Kawasaki et al. |
| 2003/0046514 A1 | 3/2003 | Kawasaki et al. |
| 2003/0233527 A1 | 12/2003 | Kawasaki et al. |
| 2004/0199716 A1 | 10/2004 | Kawasaki et al. |
| 2006/0268594 A1 | 11/2006 | Toda |
| 2007/0285966 A1 | 12/2007 | Toda et al. |
| 2007/0285967 A1 | 12/2007 | Toda et al. |
| 2007/0285968 A1 | 12/2007 | Toda et al. |
| 2008/0123393 A1 | 5/2008 | Kinoshita |
| 2008/0263228 A1 | 10/2008 | Kawasaki et al. |
| 2008/0310211 A1 | 12/2008 | Toda et al. |
| 2009/0052225 A1 | 2/2009 | Morimoto |
| 2010/0046273 A1 | 2/2010 | Azuma et al. |
| 2010/0148143 A1* | 6/2010 | Fujii et al. ......................... 257/5 |
| 2010/0165702 A1 | 7/2010 | Toda |
| 2010/0177555 A1 | 7/2010 | Shimakawa et al. |
| 2010/0295012 A1* | 11/2010 | Mikawa et al. ................... 257/4 |
| 2011/0019462 A1 | 1/2011 | Toda |
| 2011/0044088 A1 | 2/2011 | Muraoka et al. |
| 2011/0122680 A1* | 5/2011 | Ikeda et al. .................... 365/148 |
| 2012/0023281 A1 | 1/2012 | Kawasaki et al. |
| 2012/0074375 A1 | 3/2012 | Shimakawa et al. |
| 2012/0099365 A1 | 4/2012 | Toda |
| 2012/0099367 A1 | 4/2012 | Azuma et al. |
| 2012/0281453 A1 | 11/2012 | Shimakawa et al. |

FOREIGN PATENT DOCUMENTS

| | | |
|---|---|---|
| JP | 2006-203098 | 8/2006 |
| JP | 4377817 | 12/2009 |
| WO | 2006/137111 | 12/2006 |
| WO | 2009/001534 | 12/2008 |
| WO | 2009/141857 | 11/2009 |
| WO | 2010/021134 | 2/2010 |
| WO | 2010/119671 | 10/2010 |
| WO | 2011/152061 | 12/2011 |

* cited by examiner

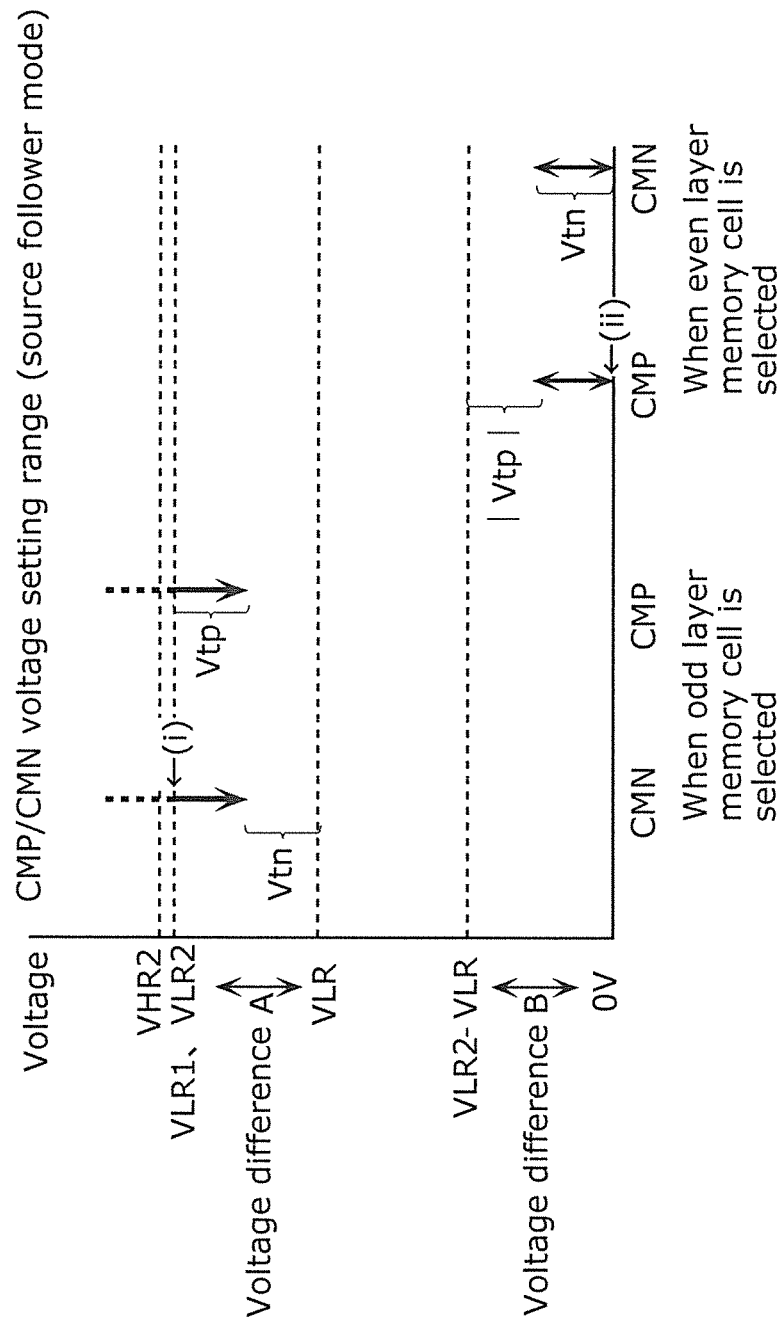

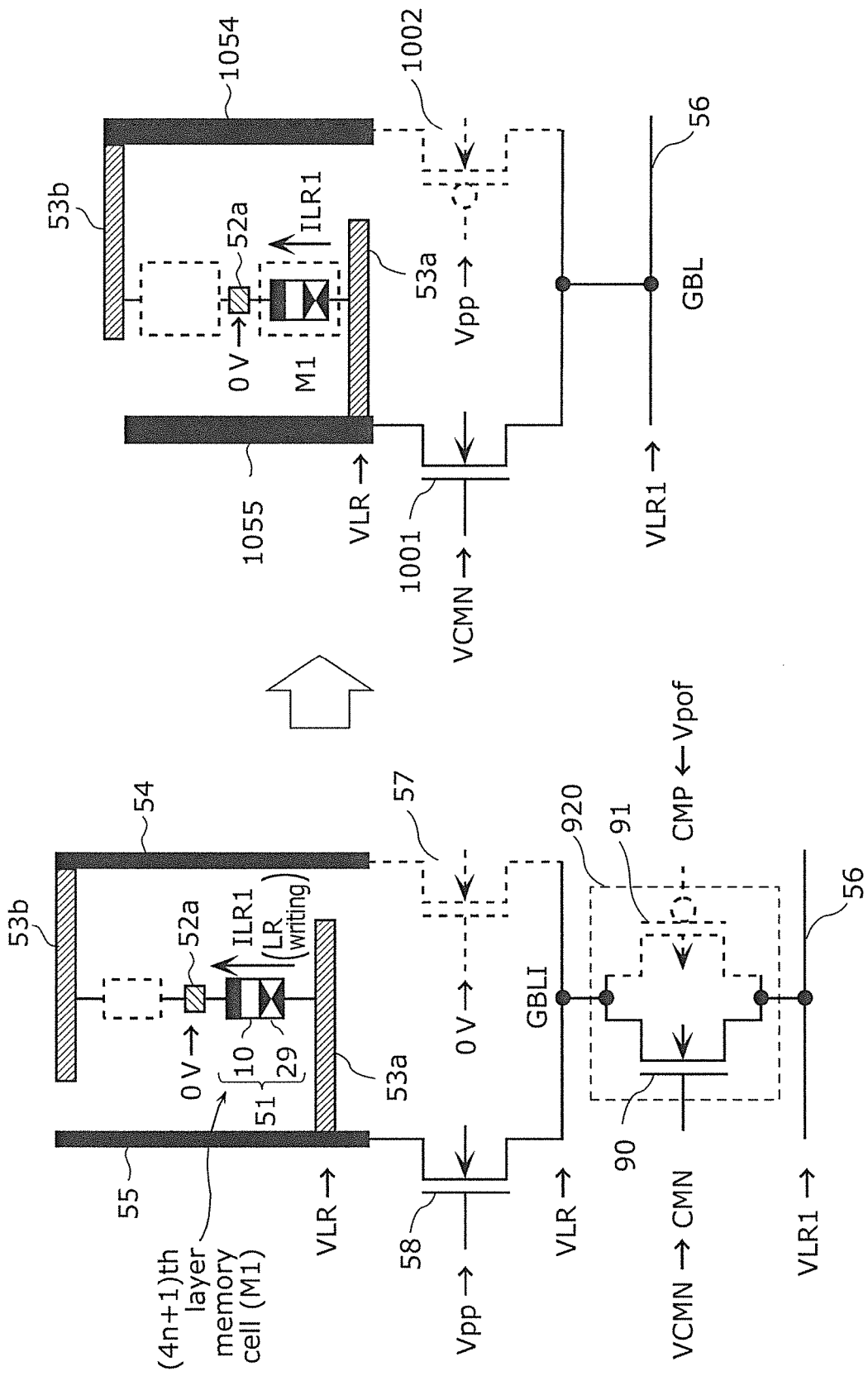

CROSS POINT VARIABLE RESISTANCE NONVOLATILE MEMORY DEVICE

TECHNICAL FIELD

The present invention relates to a nonvolatile memory device having cross point memory cells that include variable resistance elements.

BACKGROUND ART

In recent years, research and development are conducted on a nonvolatile memory device having memory cells that include variable resistance elements. A variable resistance element is an element that has a property of changing in resistance value (changing between a high resistance state and a low resistance state) according to an electrical signal and enables information to be written by this change in resistance value.

One structure of memory cells using variable resistance elements is a cross point structure. In the cross point structure, each memory cell is formed at a different one of cross points of orthogonally arranged bit lines and word lines so as to be positioned between a bit line and a word line. Various types of such cross point variable resistance nonvolatile memory devices are developed in recent years (for example, see Patent Literatures (PTLs) 1 to 4).

PTL 1 discloses a nonvolatile memory device having memory cells that use bidirectional variable resistors in the cross point structure. In this nonvolatile memory device, for example a varistor is used as a bidirectional nonlinear element included in each memory cell, in order to reduce a leakage current which flows into an unselected memory cell.

PTL 2 discloses a writing method in a nonvolatile semiconductor memory device having resistance memory elements each of which has a high resistance state and a low resistance state and changes between the high resistance state and the low resistance state by voltage application. In the writing method, when changing a resistance memory element from the low resistance state to the high resistance state, a predetermined constant voltage that enables a resistance change is applied to the resistance memory element, thereby changing the resistance memory element to the high resistance state. When changing the resistance memory element from the high resistance state to the low resistance state, a predetermined constant current that enables a resistance change is caused to flow through the resistance memory element, thereby changing the resistance memory element to a resistance state of a low resistance value corresponding to the value of the current.

PTL 3 describes a memory device that achieves higher integration. The memory device includes: a semiconductor substrate; a cross point memory cell array formed above the semiconductor substrate and having memory cells in a three-dimensional multilayer arrangement, each of the memory cells having a stack structure of a programmable resistance element and an access element, the programmable resistance element being written to a high resistance state or a low resistance state in a nonvolatile manner according to a polarity of an applied voltage, and the access element having a resistance value in an OFF state in a certain voltage range that is at least ten times as high as that in a selected state; and a read/write circuit formed on the semiconductor substrate so as to be situated below the memory cell array, for reading and writing data from and to the memory cell array.

However, PTL 3 does not disclose such a writing method as described in PTL 2 in which, when changing a programmable resistance element from the high resistance state to the low resistance state, a predetermined constant current that enables a resistance change is caused to flow through the programmable resistance element to thereby change the programmable resistance element to a resistance state of a low resistance value corresponding to the value of the current.

PTL 4 discloses, in a three-dimensional multilayer cross point variable resistance memory cell array, a hierarchical bit line structure realized in a small area and a layout method for such a structure. In the hierarchical bit line structure, short-segmented local bit lines are connected to global bit lines via switches for selectively switching the connection, in order to reduce a leakage current to an unselected memory cell and ensure a stable operation.

CITATION LIST

Patent Literature

[PTL 1]
Japanese Unexamined Patent Application Publication No. 2006-203098 (FIGS. 2 and 5)
[PTL 2]
International Patent Application Publication No. 2006/137111 (FIG. 3)
[PTL 3]
Japanese Patent Publication No. 4377817 (FIG. 18)
[PTL 4]
International Patent Application Publication No. 2009/1534

SUMMARY OF INVENTION

Technical Problem

However, the above-mentioned conventional techniques have the following problem. In the case of producing a multilayer cross point variable resistance nonvolatile memory device that includes, in each layer, memory cells in each of which a first electrode, a variable resistance layer, and a second electrode constituting a resistance memory element (variable resistance element) are arranged in the same order in a direction perpendicular to a semiconductor substrate so as to attain stable characteristics in all layers, it is difficult to perform a stable resistance change operation of each memory cell by a uniform current limiting method common to all layers.

In view of the problem stated above, the present invention has an object of providing a multilayer cross point variable resistance nonvolatile memory device that includes, in each layer, memory cells in each of which a first electrode, a variable resistance layer, and a second electrode constituting a resistance memory element (variable resistance element) are arranged in the same order in a direction perpendicular to a semiconductor substrate so as to attain stable characteristics in all layers, and that is capable of stably setting a resistance value of a low resistance state for each memory cell by a uniform current limiting method common to all layers.

Solution to Problem

According to an aspect of the present invention, a nonvolatile memory device using variable resistance elements employs a multilayer cross point structure in which each memory cell includes a variable resistance element and a current steering element connected in series with the variable resistance element and also a hierarchical bit line structure having local bit lines and global bit lines, and further has a structure of preventing an increase in layout area caused by bit line selection switch elements for realizing the hierarchical bit line structure. In addition, the nonvolatile memory device has a bidirectional current limiting function by using a PMOS transistor for one bit line selection switch element and an NMOS transistor for the other bit line selection switch element in correspondence with memory cells of odd layers and even layers, for stably setting a resistance value in low resistance writing.

In detail, an aspect of a cross point variable resistance nonvolatile memory device according to the present invention is a cross point variable resistance nonvolatile memory device including: a substrate; a memory cell array formed on the substrate and having a plurality of memory cells each of which includes a variable resistance element and a bidirectional current steering element, the variable resistance element reversibly changing between at least two states including a low resistance state and a high resistance state by application of voltages of different polarities, and the current steering element being connected in series with the variable resistance element and having nonlinear current-voltage characteristics, wherein each of the plurality of memory cells is formed at a different one of cross points of a plurality of bit lines and a plurality of word lines to be positioned between a corresponding bit line and a corresponding word line, the plurality of bit lines extending in an X direction and being formed in a first layer closer to a main surface of the substrate and a second layer farther from the main surface of the substrate, and the plurality of word lines extending in a Y direction and being formed between a bit line in the first layer and a bit line in the second layer, a memory cell of the plurality of memory cells that is formed at a cross point of the bit line in the first layer and each of the plurality of word lines is a first memory cell, a memory cell of the plurality of memory cells that is formed at a cross point of the bit line in the second layer and each of the plurality of word lines is a second memory cell, one or more XZ planes that each correspond to a different one of a plurality of bit line groups and are aligned in the Y direction are one or more vertical array planes respectively, each of the plurality of bit line groups being composed of the plurality of bit lines aligned in a Z direction which is a layer stacking direction, the one or more vertical array planes share the plurality of word lines that perpendicularly pass through the one or more vertical array planes, in each of the one or more vertical array planes, the bit line in the first layer is connected to a first via extending in the Z direction, and the bit line in the second layer is connected to a second via extending in the Z direction, the variable resistance element in each of the plurality of memory cells: includes a first electrode, a variable resistance layer, and a second electrode that are arranged in the stated order in the Z direction; and has characteristics of changing to the high resistance state when a voltage greater than or equal to a predetermined voltage is applied to the second electrode with respect to the first electrode and changing to the low resistance state when a voltage greater than or equal to a predetermined voltage is applied to the first electrode with respect to the second electrode, and the first electrode, the variable resistance layer, and the second electrode are arranged in the same order in the Z direction in the variable resistance element in the first memory cell and the variable resistance element in the second memory cell; a global bit line provided for each of the one or more vertical array planes; a first bit line selection switch element provided for each of the one or more vertical array planes, including one of a PMOS transistor and an NMOS transistor, and having one of a source terminal and a drain terminal connected to the first via and the other one of the source terminal and the drain terminal connected to the global bit line; and a second bit line selection switch element provided for each of the one or more vertical array planes, including the other one of the PMOS transistor and the NMOS transistor, and having one of a source terminal and a drain terminal connected to the second via and the other one of the source terminal and the drain terminal connected to the global bit line.

Advantageous Effects of Invention

The cross point variable resistance nonvolatile memory device of the multilayer memory structure according to the present invention has a feature (bidirectional current limiting function) that is based on a structure of simply stacking memory cells of the same structure, and so can be manufactured easily. In addition, an operation of writing a memory cell can be performed in such a manner that the memory cell is written to the low resistance state with a current limited to a predetermined amount of current and written to the high resistance state with a current greater than or equal to the predetermined amount of current, regardless of which layer the accessed memory cell belongs to. Hence, a stable writing operation can be achieved in all layers.

Thus, the present invention realizes a cross point variable resistance nonvolatile memory device capable of fast operation and suitable for mass memory. The present invention therefore has an extremely high practical value today with the proliferation of various information devices which need memory.

BRIEF DESCRIPTION OF DRAWINGS

FIG. 21 is a diagram showing a set voltage range of a gate of a current limiting element in the source follower mode in the reference example.

FIG. 38A is a diagram for describing a low resistance writing operation of a (4n+1)th layer memory cell in the source follower mode in the embodiment of the present invention.

DESCRIPTION OF EMBODIMENTS

Underlying Knowledge Forming the Basis of the Present Invention

Underlying knowledge forming the basis of the present invention is described first, before describing the present invention in detail.

Figure 1:
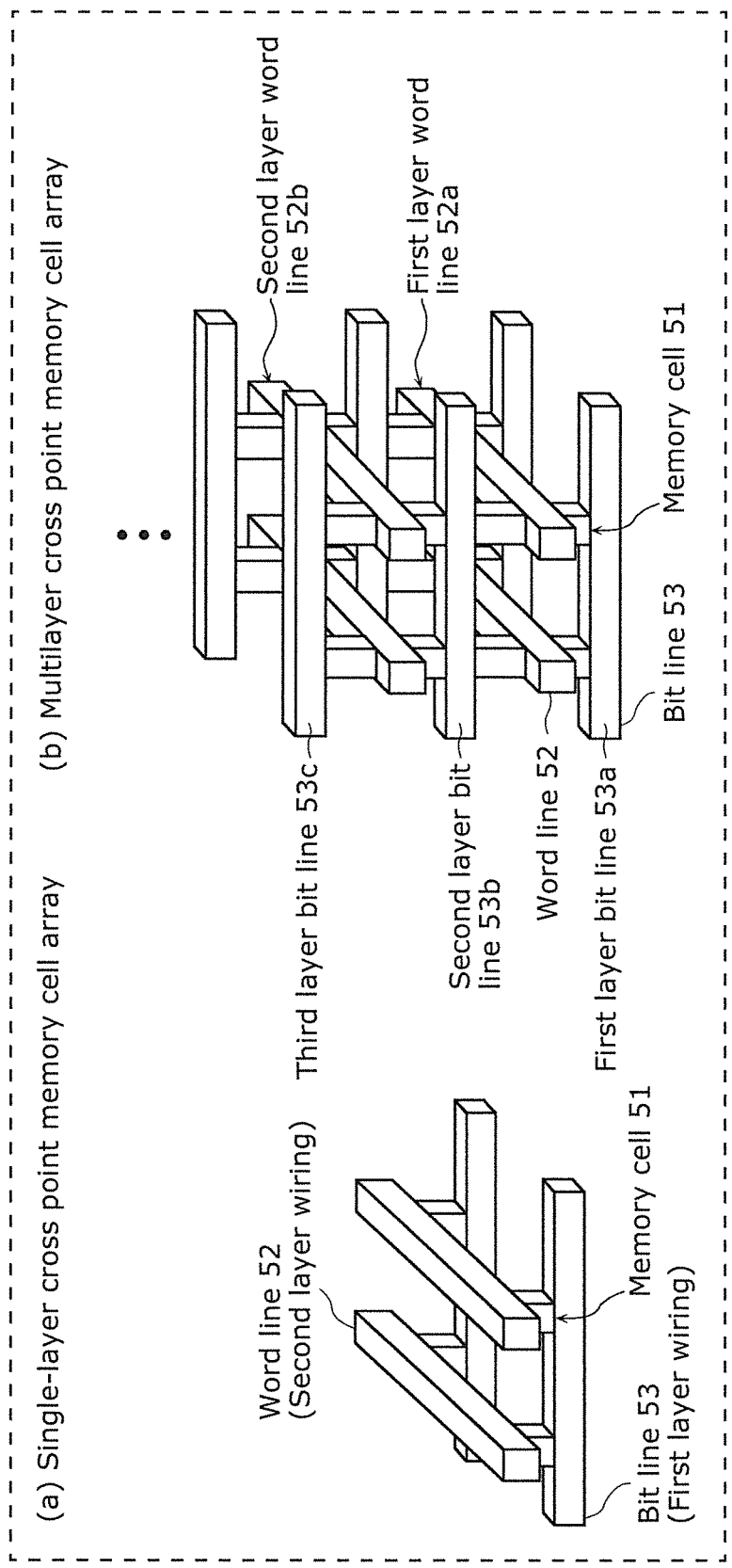
FIGS. 1(a) and 1(b) is a diagram showing three-dimensional structures of single-layer cross point memory cells and multilayer cross point memory cells, respectively.

FIG. 1(a) is a diagram showing a three-dimensional structure of a single-layer cross point memory cell array. FIG. 1(a) shows memory cells 51, multiple word lines (for example, second layer wiring) 52 arranged in parallel with each other in one arbitrary direction, and multiple bit lines (for example, first layer wiring) 53 arranged in parallel with each other in one direction so as to be orthogonal to the word lines 52. Each memory cell 51 is formed at a different one of cross points of the word lines 52 and the bit lines 53 so as to be positioned between the corresponding word line 52 and bit line 53. FIG. 1(b) is a diagram showing a three-dimensional structure of a multilayer cross point memory cell array. FIG. 1(b) shows a stack structure in multiple layers in which: bit lines 53 (first layer bit lines 53a) are placed in a first wiring layer; word lines 52 (first layer word lines 52a) are placed in a second wiring layer above the first wiring layer so as to be orthogonal to the bit lines 53; bit lines 53 (second layer bit lines 53b) are placed in a third wiring layer above the second wiring layer so as to be orthogonal to the word lines 52; word lines 52 (second layer word lines 52b) are placed in a fourth wiring layer above the third wiring layer so as to be orthogonal to the bit lines 53; and bit lines 53 (third layer bit lines 53c) are placed in a fifth wiring layer above the fourth wiring layer so as to be orthogonal to the word lines 52. Each memory cell 51 is formed at a different one of cross points of the word lines 52 and the bit lines 53 so as to be positioned between the corresponding word line 52 and bit line 53.

Thus, a cross point memory achieves a reduction in memory cell area per unit area without relying on a miniaturization process, by vertically stacking simple structures in each of which memory cells are formed at cross points of wires. Hence, a cross point memory is known as a structure suitable for high integration.

The following describes problems newly found when actually configuring a multilayer cross point memory, using a multilayer cross point memory invented earlier by the present inventors as an example.

[Specific Structure of Cross Point Memory Cell Array]

A specific three-dimensional structure of a multilayer cross point memory is described below.

Figure 2:
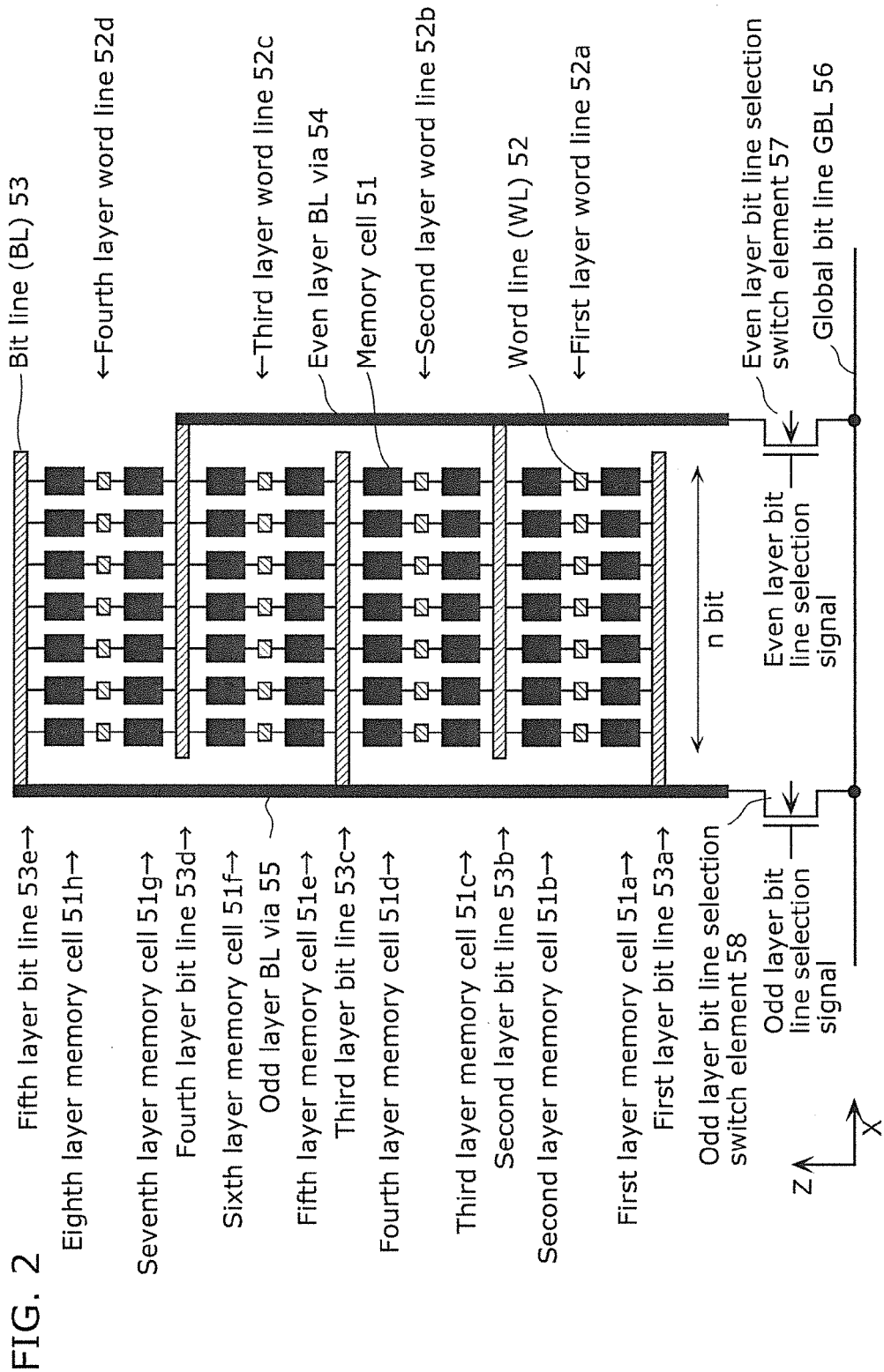
FIG. 2 is a cross section diagram of a conventional multilayer cross point memory.

FIG. 2 is a diagram showing an example (PTL 4) of a multilayer cross point memory invented by the present inventors, in a cross section as viewed from a word line direction. According to this structure, an increase in chip area can be prevented even when a memory cell array is multiple-divided in relatively small units in order to reduce a leakage current to an unselected memory cell.

FIG. 2 shows memory cells 51, word lines 52 arranged in parallel with a substrate and perpendicular to the plane of paper, and bit lines 53 (local bit lines in a hierarchical bit line structure) arranged in parallel with the substrate so as to be orthogonal to the word lines 52. The word lines 52 and the bit lines 53 are alternately stacked as in FIG. 1(b). In this structure, the bit lines 53 are formed in five layers (first to fifth layer bit lines 53a to 53e), and the word lines 52 are formed in four layers (first to fourth layer word lines 52a to 52d). Each memory cell 51 is formed at a different one of cross points of the word lines 52 and the bit lines 53 in each layer. FIG. 2 also shows an even layer bit line via 54 commonly connecting even layer wires (the second layer bit line 53b and the fourth layer bit line 53d) of the bit lines 53, an odd layer bit line via 55 commonly connecting odd layer wires (the first layer bit line 53a, the third layer bit line 53c, and the fifth layer bit line 53e) of the bit lines 53, a global bit line 56 arranged so as to longitudinally cut through a region below the multilayer cross point memory cell array, an even layer bit line selection switch element 57 that is connected to the global bit line 56 and the even layer bit line via 54 and controls the connection between the global bit line 56 and the even layer bit line via 54 according to an even layer bit line selection signal, and an odd layer bit line selection switch element 58 that is connected to the global bit line 56 and the odd layer bit line via 55 and controls the connection between the global bit line 56 and the odd layer bit line via 55 according to an odd layer bit line selection signal.

The following describes an operation of writing a predetermined memory cell in the multilayer cross point memory of the structure shown in FIG. 2.

In this structure, the operation is different depending on whether the selected memory cell is included in memory cells (first layer memory cells 51a, fourth layer memory cells 51d, fifth layer memory cells 51e, and eighth layer memory cells 51h) belonging to first, fourth, fifth, and eighth layers connected to the odd layer bit line via 55 or included in memory cells (second layer memory cells 51b, third layer memory cells 51c, sixth layer memory cells 51f, and seventh layer memory cells 51g) belonging to second, third, sixth, and seventh layers connected to the even layer bit line via 54.

In FIG. 2, in the case of writing an arbitrarily selected 1-bit memory cell (one of the first layer memory cells 51a, the fourth layer memory cells 51d, the fifth layer memory cells 51e, and the eighth layer memory cells 51h) respectively belonging to memory cell arrays in the first, fourth, fifth, and eighth layers, a predetermined first write voltage (e.g. 0 V) is applied to one word line 52 related to the selected memory cell, and at the same time the odd layer bit line selection signal is applied to the odd layer bit line selection switch element 58, to turn ON the odd layer bit line selection switch element 58 (and turn OFF the even layer bit line selection switch element 57). Moreover, a predetermined second write voltage (e.g. Vp) is applied to the global bit line 56, as a result of which the write voltage Vp is transmitted, through the odd layer bit line selection switch element 58, to the bit lines 53 connected to the odd layer bit line via 55. Thus, the voltage Vp is applied to the selected memory cell, thereby executing the writing. During this time, a predetermined unselection voltage (e.g. Vp/2) is applied to word lines 52 related to other unselected memory cells.

On the other hand, in the case of writing an arbitrarily selected 1-bit memory cell (one of the second layer memory cells 51b, the third layer memory cells 51c, the sixth layer memory cells 51f, and the seventh layer memory cells 51g) respectively belonging to the second, third, sixth, and seventh layers, the predetermined first write voltage (e.g. 0 V) is applied to one word line 52 related to the selected memory cell, and at the same time the even layer bit line selection signal is applied to the even layer bit line selection switch element 57, to turn ON the even layer bit line selection switch element 57 (and turn OFF the odd layer bit line selection switch element 58). Moreover, the predetermined second write voltage (e.g. Vp) is applied to the global bit line 56, as a result of which the write voltage Vp is transmitted, through the even layer bit line selection switch element 57, to the bit lines 53 connected to the even layer bit line via 54. Thus, the voltage Vp is applied to the selected memory cell, thereby executing the writing. During this time, the predetermined unselection voltage (e.g. Vp/2) is applied to word lines 52 related to other unselected memory cells.

Writing a high resistance state and writing a low resistance state (also referred to as high resistance (HR) writing and low resistance (LR) writing, respectively) to a memory cell 51 are bidirectional writing performed by reversing a polarity of a predetermined voltage applied across both ends of the memory cell 51. Accordingly, in the case of performing opposite data writing in the above-mentioned example, the predetermined first write voltage (e.g. 0 V) is applied to the global bit line 56, and the predetermined second write voltage (e.g. Vp) is applied to the word line 52.

Note that "writing a high resistance state (or a low resistance state) to a memory cell" or "writing a memory cell to a high resistance state (or a low resistance state)" means to change the memory cell (more precisely, the variable resistance element included in the memory cell) to the high resistance state (or the low resistance state).

[Memory Cell Structure]

Figure 3:
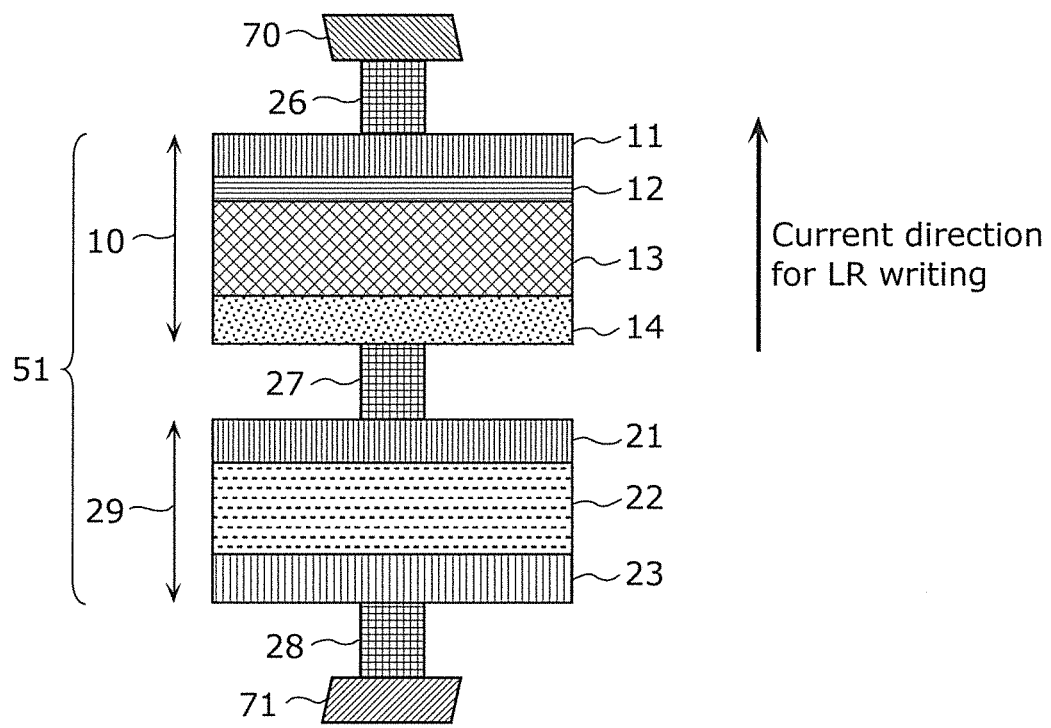
FIG. 3 is a cross section diagram of a memory cell.

FIG. 3 is a diagram showing a cross section of a memory cell 51 used in the cross point memory.

The memory cell 51 is a 1-bit memory cell including a variable resistance element 10 and a current steering element 29 that are connected in series with each other.

The variable resistance element 10 has the following structure. Oxygen-deficient tantalum oxide ($TaO_x$, $0<x<2.5$) is formed on a lower electrode 14 comprising tantalum nitride (TaN), as a first variable resistance layer 13 (a first region included in a variable resistance layer). An upper interface of the first variable resistance layer 13 is irradiated with oxygen plasma at 300° C. and 200 W for 20 seconds, thereby forming a thin second variable resistance layer 12 (a second region included in the variable resistance layer) comprising $TaO_y$ ($x<y$) lower in oxygen deficiency than $TaO_x$ in the first variable resistance layer 13. An upper electrode 11 comprising platinum (Pt) is formed on the second variable resistance layer 12. The term "oxygen-deficient" means a composition state of a metal oxide that is lower in oxygen content than a metal oxide having a stoichiometric composition typically exhibiting an insulating property, and exhibits a semiconducting electric property. Moreover, while platinum (Pt) is used in the upper electrode 11 which is an electrode in contact with the second variable resistance layer 12, a feature lies in that a material having a higher standard electrode potential than tantalum (Ta) in the first variable resistance layer 13 and tantalum nitride (TaN) in the lower electrode 14 is used in the upper electrode 11.

In this structure, a resistance change occurs at the second variable resistance layer 12 that comprises $TaO_y$ lower in oxygen deficiency and that is in contact with the upper electrode 11 comprising platinum (Pt). When performing voltage application so that the upper electrode 11 is higher in voltage than the lower electrode 14 by a predetermined voltage or more, the variable resistance element 10 changes to the high resistance state. Conversely, when performing voltage application so that the lower electrode 14 is higher in voltage than the upper electrode 11 by a predetermined voltage or more, the variable resistance element 10 changes to the low resistance state.

In more detail, the structure of the variable resistance element 10 is as follows.

The variable resistance layer (the layer including the first variable resistance layer 13 and the second variable resistance layer 12) is a layer that is interposed between the lower electrode 14 and the upper electrode 11 and reversibly changes in resistance value according to an electrical signal applied across the lower electrode 14 and the upper electrode 11. For example, the variable resistance layer is a layer that reversibly changes between the high resistance state and the low resistance state according to a polarity of a voltage applied across the lower electrode 14 and the upper electrode 11. The variable resistance layer is formed by stacking at least two layers including the first variable resistance layer 13 connected to the lower electrode 14 and the second variable resistance layer 12 connected to the upper electrode 11.

The first variable resistance layer 13 comprises a first metal oxide that is oxygen-deficient, and the second variable resistance layer 12 comprises a second metal oxide that is lower in oxygen deficiency than the first metal oxide. A small local region that reversibly changes in oxygen deficiency according to an applied electrical pulse is formed in the second variable resistance layer 12 in the variable resistance element 10. The local region is considered to include a filament composed of an oxygen vacancy site.

The term "oxygen deficiency" means a proportion of a shortage of oxygen in a metal oxide relative to an oxygen content of an oxide having a stoichiometric composition (a stoichiometric composition with a highest resistance value in the case where a plurality of stoichiometric compositions are present). A metal oxide having a stoichiometric composition has a more stable and higher resistance value than a metal oxide having any other composition.

Take tantalum (Ta) as an example of metal. $Ta_2O_5$ is an oxide having a stoichiometric composition according to the definition given above, which can be expressed as $TaO_{2.5}$. The oxygen deficiency of $TaO_{2.5}$ is 0%. The oxygen deficiency of $TaO_{1.5}$ is $(2.5-1.5)/2.5 = 40\%$. The oxygen deficiency of an oxygen-excessive metal oxide is a negative value. In this description, the term "oxygen deficiency" includes positive values, zero, and negative values unless otherwise stated.

An oxide lower in oxygen deficiency has a higher resistance value because it is closer to an oxide having a stoichiometric composition, and an oxide higher in oxygen deficiency has a lower resistance value because it is closer to a metal included in an oxide.

The term "oxygen content percentage" means a ratio of oxygen atoms to a total number of atoms. For example, the oxygen content percentage of $Ta_2O_5$ is a ratio (O/(Ta+O)) of oxygen atoms to a total number of atoms, which is 71.4 atm %. Accordingly, oxygen-deficient tantalum oxide has an oxygen content percentage higher than 0 and lower than 71.4 atm %. As an example, in the case where the metal in the first metal oxide layer and the metal in the second metal oxide layer are of the same type, the oxygen content percentage is in a correspondence relationship with the oxygen deficiency. That is, when the oxygen content percentage of the second metal oxide is higher than the oxygen content percentage of the first metal oxide, the oxygen deficiency of the second metal oxide is lower than the oxygen deficiency of the first metal oxide.

The metal used in the variable resistance layer may be a metal other than tantalum. A transition metal or aluminum (Al) may be used as the metal in the variable resistance layer. Examples of the transition metal include tantalum (Ta), titanium (Ti), hafnium (Hf), zirconium (Zr), niobium (Nb), tungsten (W), and nickel (Ni). Since the transition metal can assume a plurality of oxidation states, different resistance states can be realized by oxidation reduction reactions.

As an example, in the case of using hafnium oxide, the resistance value of the variable resistance layer can be changed stably at high speed when $0.9 \leq x \leq 1.6$ and $x<y$ where $HfO_x$ is the composition of the first metal oxide and $HfO_y$ is the composition of the second metal oxide. Here, the second metal oxide may be 3 nm to 4 nm in film thickness.

As another example, in the case of using zirconium oxide, the resistance value of the variable resistance layer can be changed stably at high speed when $0.9 \leq x \leq 1.4$ and $x<y$ where $ZrO_x$ is the composition of the first metal oxide and $ZrO_y$ is the composition of the second metal oxide. Here, the second metal oxide may be 1 nm to 5 nm in film thickness.

Different metals may be used as a first metal in the first metal oxide and a second metal in the second metal oxide. In this case, the second metal oxide may be lower in oxygen deficiency than the first metal oxide, i.e. higher in resistance than the first metal oxide. According to this structure, a voltage applied across the lower electrode 14 and the upper electrode 11 for a resistance change is distributed more to the second metal oxide, which can increase a likelihood that an oxidation reduction reaction occurs in the second metal oxide.

In the case of using different materials as the first metal in the first metal oxide forming the first variable resistance layer 13 and the second metal in the second metal oxide forming the second variable resistance layer 12, the second metal may have a lower standard electrode potential than the first metal. A higher standard electrode potential causes less oxidation. A likelihood of an oxidation reduction reaction occurring in the second metal oxide with the relatively low standard electrode potential can thus be increased. Note that a resistance change phenomenon is believed to take place in a manner that an oxidation reduction reaction which occurs in the small local region formed in the second metal oxide higher in resistance causes the filament (conductive path) to change and results in a change in resistance value (oxygen deficiency).

For example, the use of oxygen-deficient tantalum oxide ($TaO_x$) in the first metal oxide and titanium oxide ($TiO_2$) in the second metal oxide enables a stable resistance change operation. Titanium (standard electrode potential=−1.63 eV) is a material that is lower in standard electrode potential than tantalum (standard electrode potential=−0.6 eV). By using, in the second metal oxide, an oxide of a metal having a lower standard electrode potential than the first metal oxide in this way, a likelihood of an oxidation reduction reaction occurring in the second metal oxide can be increased. As another combination, aluminum oxide ($Al_2O_3$) may be used in the second metal oxide forming the high resistance layer. One example is the use of oxygen-deficient tantalum oxide ($TaO_x$) in the first metal oxide and aluminum oxide ($Al_2O_3$) in the second metal oxide.

A resistance change phenomenon in the variable resistance layer having the stack structure is believed to take place in a manner that an oxidation reduction reaction which occurs in the small local region formed in the second metal oxide higher in resistance in each case causes the filament (conductive path) in the local region to change and results in a change in resistance value.

In detail, when a positive voltage is applied to the upper electrode 11 connected to the second metal oxide with respect to the lower electrode 14, oxygen ions in the variable resistance layer are drawn toward the second metal oxide. As a result, an oxidation reaction occurs in the small local region formed in the second metal oxide, leading to a decrease in oxygen deficiency. This hinders the connection of the filament in the local region, so that the resistance value increases.

On the other hand, when a negative voltage is applied to the upper electrode 11 connected to the second metal oxide with respect to the lower electrode 14, oxygen ions in the second metal oxide are pushed toward the first metal oxide. As a result, a reduction reaction occurs in the small local region formed in the second metal oxide, leading to an increase in oxygen deficiency. This facilitates the connection of the filament in the local region, so that the resistance value decreases.

The upper electrode 11 connected to the second metal oxide lower in oxygen deficiency comprises a material, such as platinum (Pt), iridium (Ir), palladium (Pd), or the like, that is higher in standard electrode potential than the metal in the second metal oxide and the material in the lower electrode 14. The lower electrode 14 connected to the first metal oxide higher in oxygen deficiency may comprise a material, such as tungsten (W), nickel (Ni), tantalum (Ta), titanium (Ti), aluminum (Al), tantalum nitride (TaN), titanium nitride (TiN), or the like, that is lower in standard electrode potential than the metal in the first metal oxide. A higher standard electrode potential causes less oxidation.

That is, the relations Vr2<V2 and V1<V2 may be satisfied where V2 is the standard electrode potential of the second electrode, Vr2 is the standard electrode potential of the metal in the second metal oxide, Vr1 is the standard electrode potential of the metal in the first metal oxide, and V1 is the standard electrode potential of the first electrode. Moreover, the relations V2>Vr2 and Vr1≥V1 may be satisfied.

According to the structure described above, an oxidation reduction reaction selectively occurs in the second metal oxide near the interface between the upper electrode 11 and the second metal oxide, as a result of which a stable resistance change phenomenon can be produced.

The current steering element 29 is a diode element having nonlinear current-voltage characteristics in both positive and negative directions of an applied voltage, and is formed by sandwiching a current steering layer 22 comprising nitrogen-deficient silicon nitride between a lower electrode 23 and an upper electrode 21 comprising tantalum nitride (TaN) or the like. The bidirectional nonlinear current-voltage characteristics are such characteristics of the current steering element 29 that is in a high resistance (OFF) state in a predetermined voltage range and in a low resistance (ON) state in voltage ranges higher and lower than the predetermined voltage range. That is, the current steering element 29 is in the high resistance (OFF) state when the applied voltage has an absolute value less than or equal to a predetermined value, and in the low resistance (ON) state when the applied voltage has an absolute value greater than the predetermined value.

The memory cell 51 is a memory cell formed by connecting the variable resistance element 10 and the current steering element 29 in series by a via 27. The upper electrode 11 of the variable resistance element 10 is connected to an upper wire 70 (corresponding to a bit line 53 or a word line 52) by a via 26, while the lower electrode 23 of the current steering element 29 is connected to a lower wire 71 (corresponding to a bit line 53 or a word line 52) by a via 28.

Note that, in FIG. 3, the current steering element 29 and the variable resistance element 10 may be vertically reversed with each other.

Figure 10:
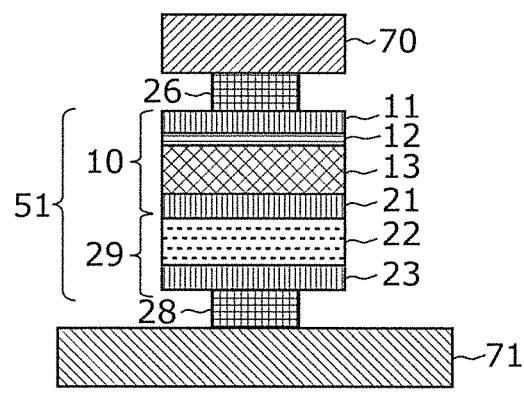
FIG. 10 is a cross section diagram of a memory cell.

Moreover, the memory cell 51 may have a structure that does not include the via 27, as shown in FIG. 10 (described in detail later).

Figure 4:
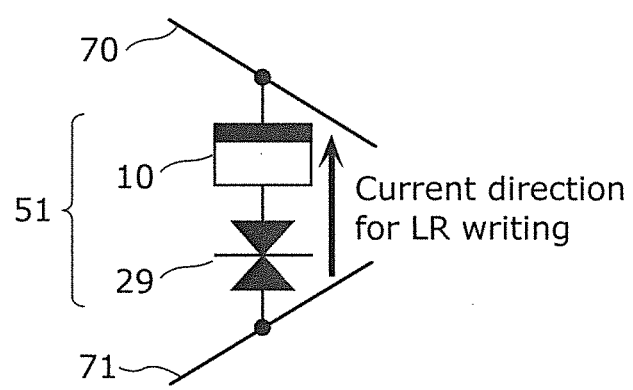
FIG. 4 is an equivalent circuit diagram of a memory cell.

FIG. 4 is a circuit diagram showing a connection relationship corresponding to the structure of the variable resistance element 10, i.e. an equivalent circuit diagram corresponding to the memory cell 51. In an equivalent circuit diagram of the variable resistance element 10, the orientation of the second variable resistance layer 12 positioned on the upper electrode 11 side is shown in black color for the sake of clarity.

[Memory Cell Characteristics]

Figure 5:
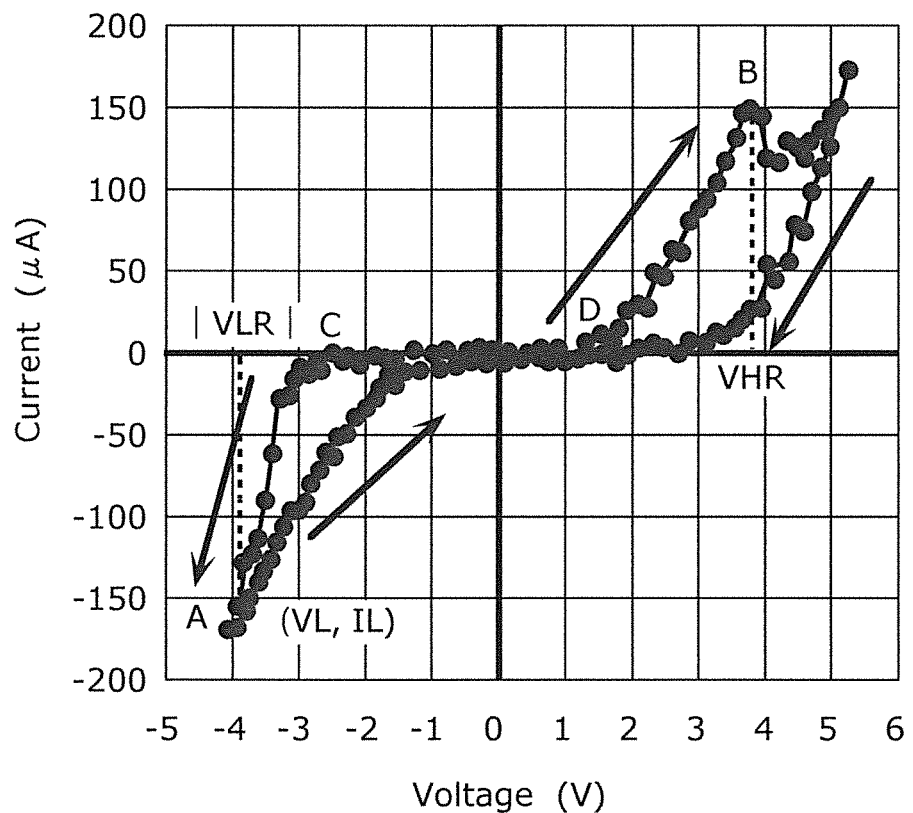
FIG. 5 is a V-I characteristic graph of a memory cell.

The following describes an operation of the memory cell 51, with reference to FIG. 5. FIG. 5 is a characteristic diagram obtained by actually measuring a current-voltage relationship in the case of applying a voltage that is positive in polarity when the upper wire 70 has a higher voltage than the lower wire 71, to the memory cell 51 having the structure in FIG. 3.

Suppose the memory cell 51 is initially in the high resistance state. When, to the memory cell 51, a voltage of a negative polarity where the lower wire 71 is higher in potential than the upper wire 70 is gradually applied from an applied voltage of 0 V, a current begins to flow at about −2.5 V (point C), and the variable resistance element starts to change from the high resistance state to the low resistance state around a time when the voltage exceeds −3.0 V. When the voltage is further applied up to −4.0 V (point A), the change to the low resistance state rapidly progresses according to the applied voltage. Subsequently, the voltage is gradually applied until it reaches 0 V, while the variable resistance element is in the low resistance state.

After this, when a voltage of a positive polarity where the upper wire 70 is higher in potential than the lower wire 71 is applied to the memory cell 51, a current begins to flow at about 1.5 V (point D), and the variable resistance element starts to change from the low resistance state to the high resistance state at about 3.9 V (point B) that is substantially point-symmetrical to the voltage (point A) at which the low resistance state is reached. When the voltage is further applied up to 5.1 V, a current increase takes place. Subsequently, when the applied voltage is decreased, the current is lower than when the applied voltage is increased, indicating that the variable resistance element has changed to the high resistance state.

That is, the actual measurement data shown in FIG. 5 indicates, for the memory cell 51 having the structure shown in FIG. 3, bidirectional resistance change characteristics of changing to the low resistance state when the voltage of the lower wire 71 is greater than or equal to a predetermined voltage VLth with respect to the voltage of the upper wire 70 and changing to the high resistance state when the voltage of the upper wire 70 is greater than or equal to a predetermined voltage VHth with respect to the voltage of the lower wire 71, where the applied voltage in the low resistance state (point A) and the voltage at which the change to the high resistance state starts (point B) are in a substantially symmetrical current-voltage relationship.

Besides, when changing the variable resistance element 10 in this memory cell 51 from the high resistance state to the low resistance state, the variable resistance element 10 changes to a resistance state of a low resistance value corresponding to a value of a current that is caused to flow through the variable resistance element 10 by applying a predetermined voltage that enables a resistance change, in the same way as disclosed in PTL 2. Furthermore, the applied voltage in the low resistance state (point A) and the voltage at which the change to the high resistance state starts (point B) are substantially symmetrical. This means that high resistance writing requires a current greater than or equal to a current for low resistance writing.

In other words, for a stable resistance change operation, low resistance writing needs to be performed by limiting a current to a predetermined current value to thereby attain a predetermined low resistance state, whereas high resistance writing needs to be performed by applying a voltage in an opposite direction to that in low resistance writing and causing a larger current to flow than in low resistance writing.

Note that a voltage section from 0 V to point C in low resistance writing (high resistance state) and a voltage section from 0 V to point D in high resistance writing (low resistance state) are a voltage range in which there is no noticeable current flow even when a voltage is applied to the memory cell 51.

Point C and point D each correspond to a total voltage of a threshold voltage (hereafter denoted by VF) of the current steering element 29 and a resistance change voltage of the variable resistance element 10. An operation of reading or writing the cross point array is desirably performed by applying a voltage greater than or equal to this total voltage to a selected cell while controlling an operating point to be between point C and point D for an unselected memory cell, to reduce a leakage current to the unselected memory cell

[Optimal Cross Point Structure Based on Disclosed Conventional Techniques and its Problem]

Figure 7:
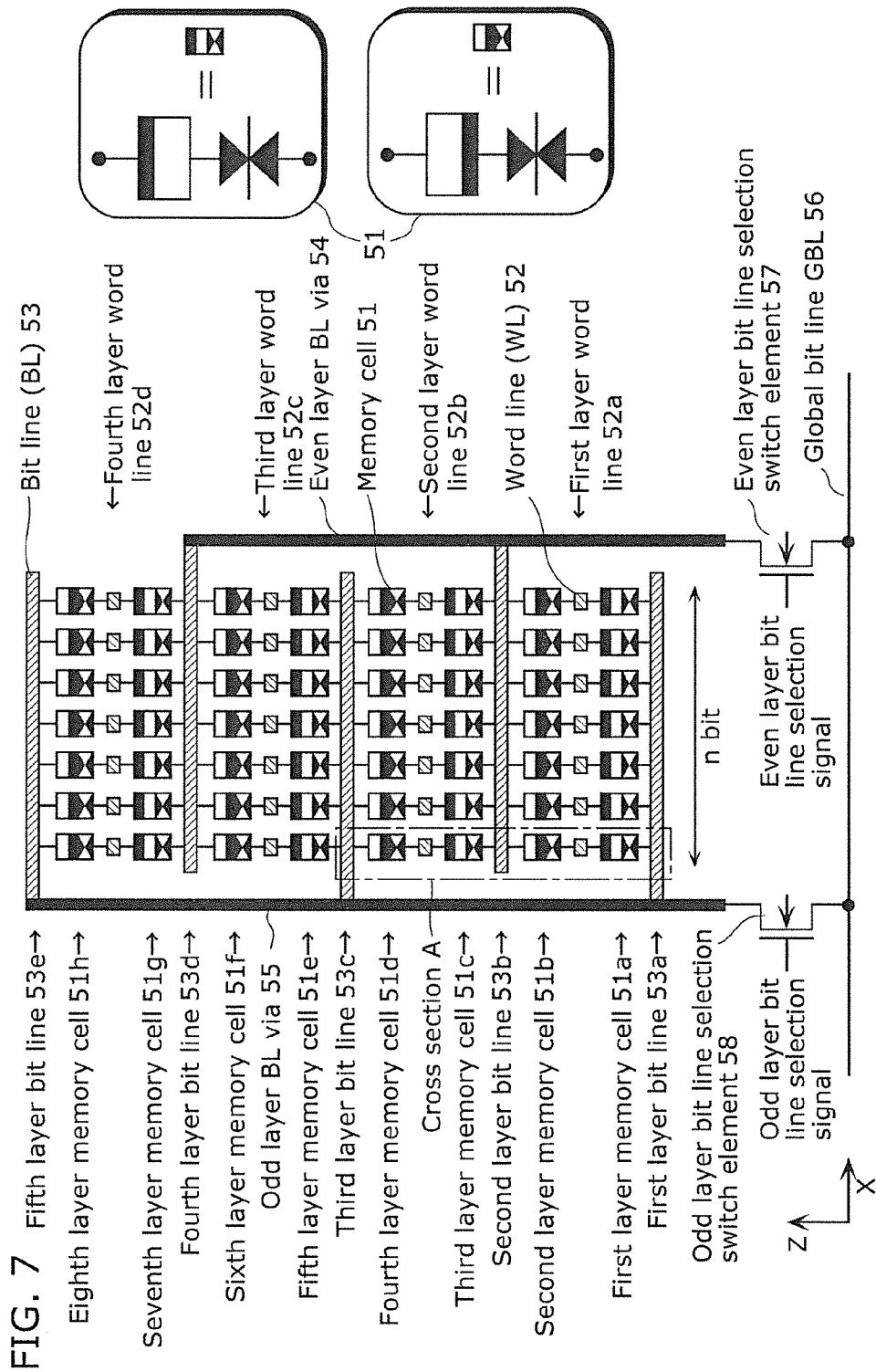
FIG. 7 is a cross section diagram of a multilayer cross point memory cell array.

FIG. 7 is a diagram showing an example of a more desirable structure for a stable resistance change based on the conventionally known variable resistance element structure and characteristics and multilayer cross point memory structure.

Figure 8:
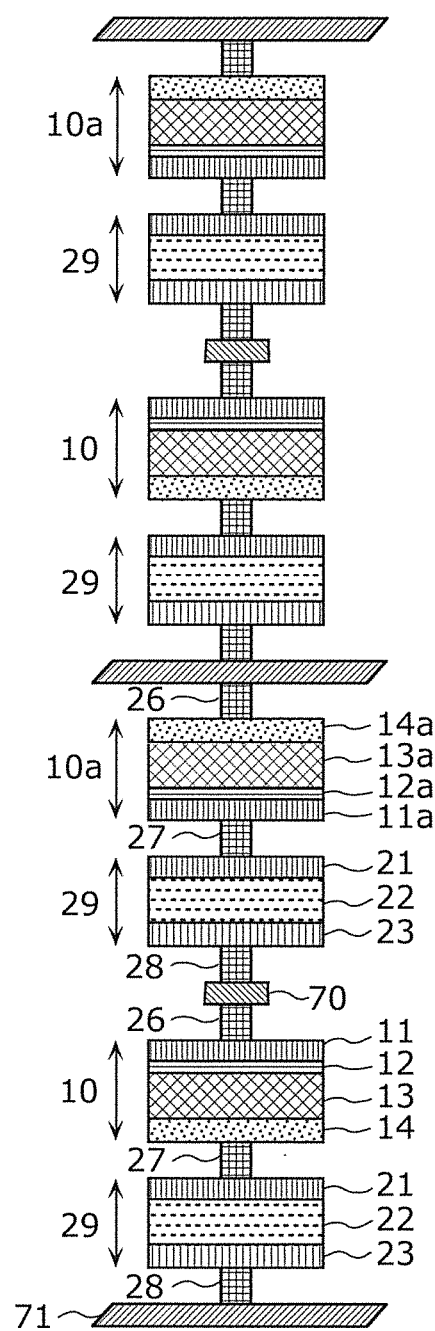
FIG. 8 is a cross section diagram where cross point memory cells positioned in different orientations are stacked.

FIG. 7 is the same as FIG. 2, except that the vertical orientation of each memory cell 51 is shown. FIG. 8 is a cross section diagram of a part designated as cross section A in FIG. 7.

The variable resistance element 10 in each memory cell (the second layer memory cells 51b, the fourth layer memory cells 51d, the sixth layer memory cells 51f, and the eighth layer memory cells 51h) belonging to the even layers, i.e. the second, fourth, sixth, and eighth layers, has a structure that is opposite in a Z direction to the variable resistance element 10 in each memory cell (the first layer memory cells 51a, the third layer memory cells 51c, the fifth layer memory cells 51e, and the seventh layer memory cells 51g) belonging to the odd layers, i.e. the first, third, fifth, and seventh layers. The orientation of the variable resistance element 10 alternates on a layer-by-layer basis in such a manner that the second variable resistance layer 12 lower in oxygen deficiency is located on the upper side in each odd layer memory cell array and located on the lower side in each even layer memory cell array. This structure is optimal for the following reason.

As mentioned above, in the case of changing the variable resistance element 10 from the high resistance state to the low resistance state, the electrode 11 in contact with the second variable resistance layer 12 needs to be negative in voltage with respect to the other electrode 14 by a predetermined voltage or more. Here, the variable resistance element 10 can be set to a resistance value of a predetermined low resistance state by limiting a flow of a current to not greater than a predetermined current value. In the case of changing the variable resistance element 10 from the low resistance state to the high resistance state, on the other hand, the variable resistance element 10 needs to be driven with a current greater than or equal to the current limit value in low resistance writing, in a direction opposite to that in low resistance writing.

For example, consider an operation of setting a memory cell included in the second layer memory cells 51b and a memory cell included in the third layer memory cells 51c to the low resistance state. The two memory cells share the second layer bit line 53b, and are connected to the global bit line 56 through the even layer bit line via 54 and the even layer bit line selection switch element 57. The predetermined second write pulse voltage Vp is applied to the global bit line 56. Moreover, the predetermined first write pulse voltage (e.g. 0 V) is applied to, in the case of setting the memory cell 51b included in the second layer memory cells 51b to the low resistance state, a predetermined first layer word line 52a connected to the selected memory cell, and in the case of setting the memory cell 51c included in the third layer memory cells 51c to the low resistance state, a predetermined second layer word line 52b connected to the selected memory cell.

The variable resistance element 10 in the second layer and the variable resistance element 10 in the third layer are opposite in structure to each other in the Z direction (up and down symmetry). Accordingly, the writing to the memory cell included in the second layer memory cells 51b and the writing to the memory cell included in the third layer memory cells 51c can both be performed by the same control (polarity) of the global bit line, with there being only a need to change the position of the selected word line.

Figure 6:
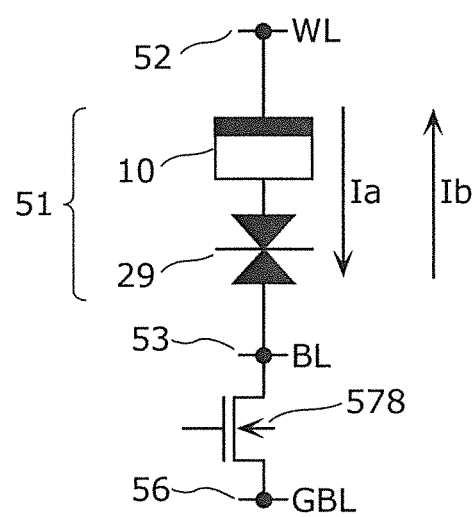
FIG. 6 is an equivalent circuit diagram for describing a current limiting method in low resistance writing.

FIG. 6 is an equivalent circuit diagram of one selected memory cell and the odd or even layer bit line selection switch element in FIG. 7, for the sake of simplicity. An NMOS transistor 578 representing the odd layer bit line selection switch element 58 or the even layer bit line selection switch element 57 is shown in FIG. 6.

Low resistance writing is performed in a direction in which a current flows from the global bit line (GBL) 56 side to the word line (WL) 52 side as designated by arrow Ib. Here, the NMOS transistor 578 has a source on the bit line 53 side. The global bit line 56 is set to such a voltage that makes the source voltage greater than or equal to a voltage for low resistance writing of the memory cell 51. This being so, when causing a current to flow in this direction, a substrate bias effect occurs in the NMOS transistor 578, which leads to a reduction in current drive capability of the NMOS transistor 578 as compared with when causing a current to flow in the opposite direction. By setting a gate voltage of the NMOS transistor 578 to a predetermined voltage greater than or equal to a sum of the voltage for low resistance writing and a threshold voltage of the NMOS transistor 578, the NMOS transistor 578 operates (source follower operation) as a constant current source determined by the gate voltage even when a high voltage is applied to the global bit line 56.

On the other hand, high resistance writing is performed in a direction in which a current flows from the word line 52 side to the global bit line 56 side as designated by arrow Ia. The substrate bias effect of the NMOS transistor 578 is small in this direction of high resistance writing. Hence, merely by applying a voltage same as and opposite in direction to that in low resistance writing, a larger current than in low resistance writing can be caused to flow, enabling a stable resistance change operation. The above structure allows a low resistance writing operation and a high resistance writing operation to be performed stably.

Figure 9:
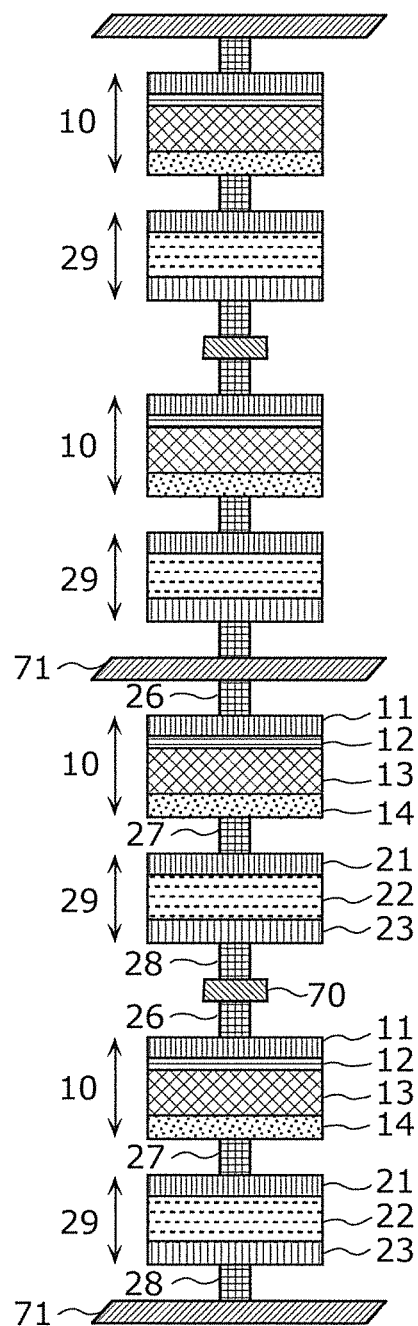
FIG. 9 is a cross section diagram where cross point memory cells positioned in the same orientation are stacked.

In terms of cross point memory cell array manufacturing, however, a structure shown in FIG. 9 is more desirable as its manufacturing process is easier. In the structure shown in FIG. 9, the first variable resistance layer 13 and the second variable resistance layer 12 are stacked in the same order in the Z direction, in each variable resistance element 10 of all memory cell array layers.

There is a manufacturing method of the variable resistance element 10 in which the oxygen-deficient first variable resistance layer 13 is formed in an upper layer of the lower electrode 14, and the upper interface of the first variable resistance layer 13 is oxidized to form the second variable resistance layer 12 lower in oxygen deficiency than the first variable resistance layer 13. In the case of applying this formation method to the multilayer cross point memory, odd layer memory cells (the first layer memory cells 51a, the third layer memory cells 51c, the fifth layer memory cells 51e, and the seventh layer memory cells 51g, which are hereafter referred to as odd layer memory cells) in FIG. 7 can be formed by this method. In even layer memory cells (the second layer memory cells 51b, the fourth layer memory cells 51d, the sixth layer memory cells 51f, and the eighth layer memory cells 51h, which are hereafter referred to as even layer memory cells) in FIG. 7, however, the second variable resistance layer 12 cannot be formed first.

As a means of independently forming the second variable resistance layer 12, there is a method of depositing the second variable resistance layer 12 by sputtering. By applying this method to the structure shown in FIG. 8, the odd layer memory cells and the even layer memory cells can be formed with the same structure. In this case, however, there is a possibility that the state of the boundary (interface) between the first variable resistance layer 13 and the second variable resistance layer 12 or the state of the boundary (interface) between the second variable resistance layer 12 and the electrode 11 or between a second variable resistance layer 12a and an electrode 11a slightly differs between the odd layer memory cells and the even layer memory cells, causing a difference in resistance change characteristics.

For example, in the odd layer memory cells, the second variable resistance layer 12 which is a high resistance layer is sputtered after depositing the first variable resistance layer 13. This raises a possibility that a natural oxide film, even slightly, adheres to the surface of the first variable resistance layer 13.

Meanwhile, in the even layer memory cells, a first variable resistance layer 13a is formed after depositing the second variable resistance layer 12a which is a high resistance layer, with there being no adhesion of a natural oxide film and the like.

This incurs a possibility that the odd layer memory cells and the even layer memory cells differ in writing and reading performance, yields, reliability, and so on. Therefore, the structure in which each memory cell 51 has the same orientation in all layers and so can be manufactured in the same manufacturing process condition in all layers as shown in FIG. 9 is desirable.

However, the following problem arises in the case where this structure is employed.

As operations in the case where this desirable structure is employed, for example, consider the case of writing a memory cell (i.e. an even layer memory cell) included in the second layer memory cells 51b to the low resistance state and the case of writing a memory cell (i.e. an odd layer memory cell) included in the third layer memory cells 51c to the low resistance state in the structure shown in FIG. 9.

In the case of writing the memory cell included in the second layer memory cells 51b to the low resistance state, the predetermined first write voltage (e.g. 0 V) needs to be applied to a second layer bit line 71 (53b) shared with the memory cell included in the third layer memory cells 51c. In the case of writing the memory cell included in the third layer memory cells 51c to the low resistance state, the predetermined second write voltage (e.g. Vp>0) needs to be applied to the second layer bit line 71 (53b) shared with the memory cell included in the second layer memory cells 51b. In the equivalent circuit shown in FIG. 6, this means that the writing of the memory cell included in the second layer memory cells 51b to the low resistance state is performed in the direction of arrow Ia whereas the writing of the memory cell included in the third layer memory cells 51c to the low resistance state is performed in the direction of arrow Ib, with a need to limit a current to the same current value in both cases.

In the case where the even layer bit line selection switch element 57 and the odd layer bit line selection switch element 58 are each composed of the NMOS transistor 578, a limited current flows in the direction of arrow Ib due to the source follower operation of the NMOS transistor 578, but a current not smaller than the limited current flows in the direction of arrow Ia because the NMOS transistor 578 does not operate as a source follower, as mentioned earlier.

In other words, there is a problem that a stable resistance change operation is possible in the odd layer memory cells but is not possible in the even layer memory cells according to this structure.

In view of the problem stated above, the present invention has an object of providing a multilayer cross point variable resistance nonvolatile memory device that includes, in each layer, memory cells in each of which a first electrode, a variable resistance layer, and a second electrode constituting a resistance memory element (variable resistance element) are arranged in the same order in a direction perpendicular to a semiconductor substrate so as to attain stable characteristics in all layers, and that is capable of stably setting a resistance value of a low resistance state for each memory cell by a uniform current limiting method common to all layers.

Before describing an embodiment of the present invention, Embodiments 1 and 2 of an invention relating to a structure that uses a bidirectional current limiting circuit filed earlier by the present applicant (PTL 5 (International Patent Application Publication No. 2011/152061)) are described first respectively as "Reference Example 1" and "Reference Example 2" for describing the present invention, with reference to FIGS. 10 to 31. Reference Example 1 and Reference Example 2 are each an example for achieving the same object as the present invention but differ, in that they use a bidirectional current limiting circuit, from the present invention (the embodiment described later) capable of realizing current limitation by simple circuitry without using a bidirectional current limiting circuit.

The following description is based on a premise that a relation between an application direction of a pulse voltage applied to a variable resistance element and a resistance change polarity, i.e. a relation between an application direction of a pulse voltage applied to a variable resistance element and whether the variable resistance element changes to a high resistance state or a low resistance state, is clear. This can be realized by an electrode material of a variable resistance element or a structure of a variable resistance layer.

International Patent Application Publication No. 2009/141857 (PTL 6) discloses that, in a 1T1R variable resistance memory in which a variable resistance element formed by sandwiching a transition metal oxide between electrodes comprising materials of different standard electrode potentials is connected to a transistor, a predetermined low resistance state can be set by applying a predetermined voltage to the electrode of the lower standard electrode potential with respect to the electrode of the higher standard electrode potential while limiting a current, whereas a high resistance state can be set by applying a predetermined voltage to the electrode of the higher standard electrode potential with respect to the electrode of the lower standard electrode potential.

An earlier patent application (International Patent Application Publication No. 2010/021134 (PTL 7)) by the present applicant discloses that, in a 1T1R variable resistance memory in which a variable resistance element formed by stacking a transition metal oxide and another transition metal oxide lower in oxygen deficiency than the former transition metal oxide and sandwiching this stack structure between electrodes is connected to a transistor, a predetermined low resistance state can be set by applying a predetermined voltage to the electrode in contact with the transition metal oxide of the higher oxygen deficiency with respect to the electrode in contact with the transition metal oxide of the lower oxygen deficiency while limiting a current, whereas a high resistance state can be set by applying a predetermined voltage to the electrode in contact with the transition metal oxide of the lower oxygen deficiency with respect to the electrode in contact with the transition metal oxide of the higher oxygen deficiency.

Thus, the resistance change polarity can be controlled by a difference in standard electrode potential of electrodes, a difference in oxygen deficiency of variable resistance layers, or a combination thereof. These basic data are described in detail in PTL 6 and PTL 7, and so their detailed description is omitted here.

Reference Example 1

Description of Circuit Structure

FIG. 10 is a diagram showing a cross section structure of a memory cell 51 included in a cross point variable resistance nonvolatile memory device having a multilayer memory cell array in Reference Example 1.

The memory cell 51 has a structure in which a first electrode 23 comprising tantalum nitride (TaN), a current steering layer 22 comprising nitrogen-deficient silicon nitride, a second electrode 21 comprising TaN, a first variable resistance layer 13 comprising oxygen-deficient tantalum oxide ($TaO_x$), a second variable resistance layer 12 formed by oxidation of the first variable resistance layer 13 in an oxygen plasma atmosphere and comprising $TaO_y$ ($x<y$) lower in oxygen deficiency than $TaO_x$, and a third electrode 11 comprising platinum (Pt) are stacked in this order. A lower wire 71 comprising aluminum (Al) is disposed below the memory cell 51, and connected to the first electrode 23 of the memory cell 51 by a first via 28. An upper wire 70 comprising aluminum (Al) is disposed above the memory cell 51, and connected to the third electrode 11 of the memory cell 51 by a third via 26. The lower wire 71 and the upper wire 70 are arranged so as to be orthogonal to each other.

In this structure, the first electrode 23, the current steering layer 22, and the second electrode 21 constitute a current steering element 29, and the second electrode 21, the first variable resistance layer 13, the second variable resistance layer 12, and the third electrode 11 constitute a variable resistance element 10. That is, the memory cell 51 includes the variable resistance element 10 that reversibly changes between at least two states including a low resistance state and a high resistance state by application of voltages of different polarities, and the current steering element 29 that is connected in series with the variable resistance element 10.

The second electrode 21 serves both as an electrode of the current steering element 29 and an electrode of the variable resistance element 10. As described with regard to the conventional techniques, in this memory cell structure, a resistance change occurs at the second variable resistance layer 12 that is in contact with the third electrode 11 comprising a material (platinum (Pt) in this example) having a higher standard electrode potential than tantalum which is the material of the first variable resistance layer 13 or TaN which is the material of the second electrode 21 serving as a lower electrode of the variable resistance element 10, and that comprises $TaO_y$ lower in oxygen deficiency than the first variable resistance layer 13. When applying a voltage greater than or equal to a predetermined voltage to the upper wire 70 with respect to the lower wire 71, the variable resistance element 10 changes to the high resistance state. When applying a voltage greater than or equal to a predetermined voltage to the lower wire 71 with respect to the upper wire 70, the variable resistance element 10 changes to the low resistance state. That is, the variable resistance element 10: includes the second electrode, the first variable resistance layer 13, the second variable resistance layer 12, and the third electrode that are stacked in the Z direction (stacking direction described later) so that the first variable resistance layer 13 and the second variable resistance layer 12 are sandwiched between the second electrode and the third electrode; is asymmetrical in that the variable resistance element 10 differs in structure between when viewed in a direction from the second electrode to the third electrode and when viewed in a direction from the third electrode to the second electrode; and has characteristics of changing to the high resistance state when a voltage greater than or equal to a predetermined voltage is applied to the third electrode with respect to the second electrode and changing to the low resistance state when a voltage greater than or equal to a predetermined voltage is applied to the second electrode with respect to the third electrode.

Note that, in this reference example, the lower wire 71 corresponds to one of a bit line and a word line, and the upper wire 70 orthogonal to the lower wire 71 corresponds to the other one of the bit line and the word line.

A memory cell array formed by stacking a plurality of memory cells 51 shown in FIG. 10 has a structure in which the memory cells 51 are positioned in the same orientation in all layers, as shown in FIG. 9.

In FIG. 9, each variable resistance element 10 in all memory cell array layers has the first variable resistance layer 13 and the second variable resistance layer 12 stacked in this order in the Z direction.

Figure 11:
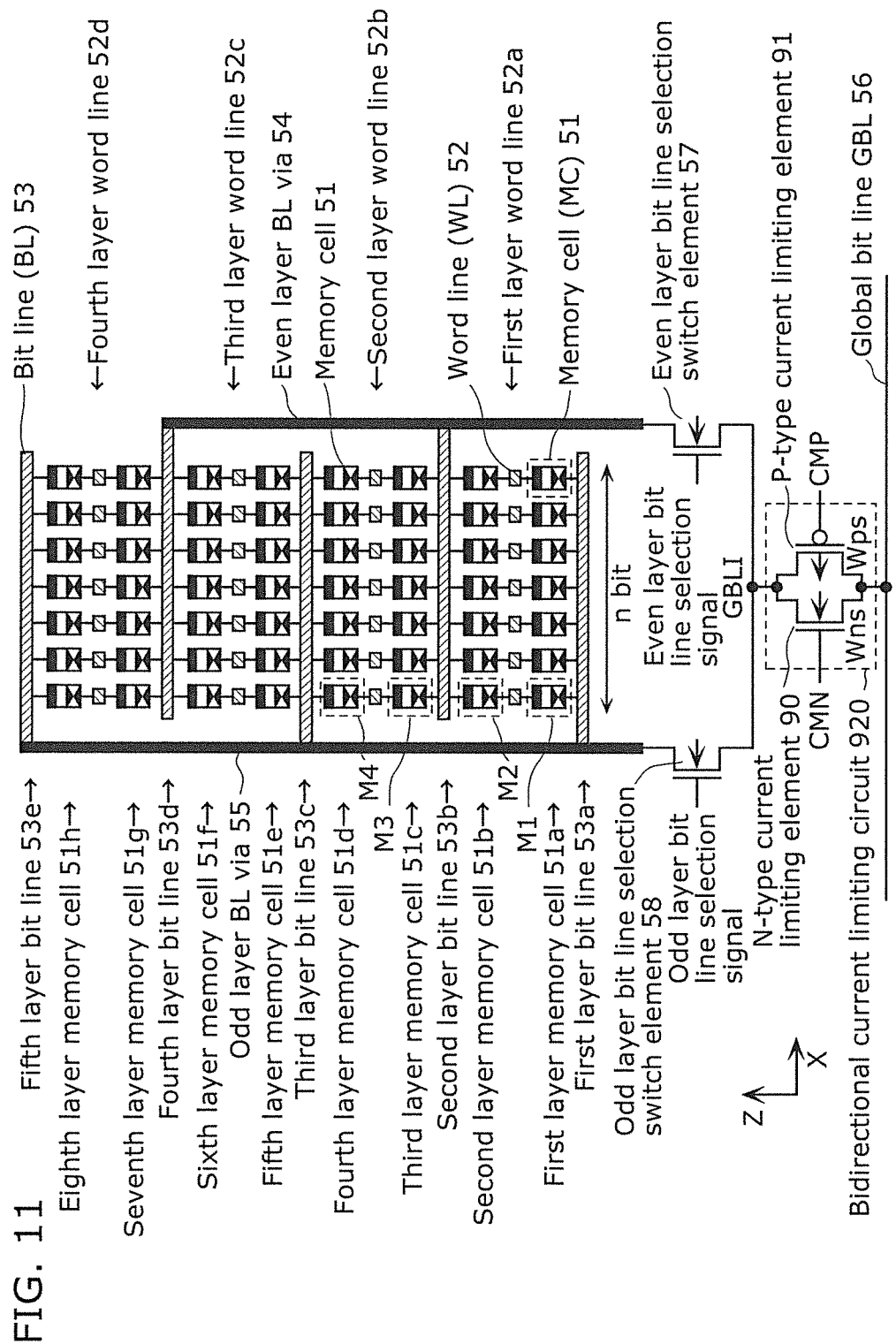
FIG. 11 is a cross section diagram of a multilayer cross point memory in a reference example.

FIG. 11 is a diagram showing a part (one vertical array plane) of the cross point variable resistance nonvolatile memory device in this reference example. A cross section structure of a multilayer cross point memory cell array in which memory cells are stacked in the same pattern as in FIG. 9 as viewed from a word line direction and a circuit structure provided below the multilayer cross point memory cell array are shown in FIG. 11.

Each memory cell 51 is formed at a cross point of a first layer bit line 53*a* comprising a wiring material such as aluminum and extending in a direction (the X direction) horizontal to the plane of paper and a first layer word line 52*a* comprising a wiring material such as aluminum and extending in a direction (the Y direction not shown) perpendicular to the plane of paper. Memory cells 51 corresponding to n bits are arranged above the first layer bit line 53*a* along the X direction, constituting first layer memory cells 51*a*.

In a layer above (the Z direction) the first layer memory cells 51*a*, each memory cell 51 is formed at a cross point of the first layer word line 52*a* and a second layer bit line 53*b* comprising a wiring material such as aluminum and extending in the X direction horizontal to the plane of paper, where the first layer word line 52*a* is situated below the memory cell 51 this time. Memory cells 51 corresponding to n bits are arranged below the second layer bit line 53*b* along the X direction, constituting second layer memory cells 51*b*. Note that the Z direction is a layer stacking direction.

Likewise, in a manner that shares a word line or a bit line, each third layer memory cell 51*c* is formed at a cross point of the second layer bit line 53*b* and a second layer word line 52*b*, each fourth layer memory cell 51*d* is formed at a cross point of the second layer word line 52*b* and a third layer bit line 53*c*, each fifth layer memory cell 51*e* is formed at a cross point of the third layer bit line 53*c* and a third layer word line 52*c*, each sixth layer memory cell 51*f* is formed at a cross point of the third layer word line 52*c* and a fourth layer bit line 53*d*, each seventh layer memory cell 51*g* is formed at a cross point of the fourth layer bit line 53*d* and a fourth layer word line 52*d*, and each eighth layer memory cell 51*h* is formed at a cross point of the fourth layer word line 52*d* and a fifth layer bit line 53*e*. A three-dimensional memory cell array in which memory cells 51 are stacked in eight layers is formed in this way.

Thus, each memory cell 51 is formed at a different one of the cross points of the plurality of bit lines 53*a* to 53*e* extending in the X direction and formed in a plurality of layers and the plurality of word lines 52*a* to 52*d* extending in the Y direction and formed in layers between the bit lines, so as to be positioned between the corresponding bit line and word line. Here, a memory cell formed at a cross point of a bit line and a word line above the bit line is referred to as an odd layer (first, third, fifth, and seventh layers) memory cell, and a memory cell formed at a cross point of a bit line and a word line below the bit line is referred to as an even layer (second, fourth, sixth, and eighth layers) memory cell.

The first layer bit line 53*a*, the third layer bit line 53*c*, and the fifth layer bit line 53*e* are commonly connected by an odd layer bit line via 55 which is an example of a first via, while the second layer bit line 53*b* and the fourth layer bit line 53*d* are commonly connected by an even layer bit line via 54 which is an example of a second via. Since memory cell groups of adjacent layers in the Z direction share a bit line or a word line in this way, a multilayer cross point memory can be produced with a minimum number of wiring layers, which contributes to a lower cost.

This reference example has a feature that, in all layers from the first layer memory cells 51*a* to the eighth layer memory cells 51*h*, the variable resistance element 10 in each memory cell 51 can be formed in the same manufacturing condition and structure in the Z direction (e.g. in all layers the variable resistance element 10 can be formed by stacking the second electrode 21, the first variable resistance layer 13, the second variable resistance layer 12, and the third electrode 11 in this order from bottom to top). Hence, each memory cell of the same structure can be manufactured regardless of whether the memory cell belongs to an odd layer or an even layer. In other words, the variable resistance element 10 in each even layer memory cell and the variable resistance element 10 in each odd layer memory cell are positioned in the same orientation in the Z direction.

The even layer bit line via 54 is connected to one of a drain and a source of an even layer bit line selection switch element 57 including an NMOS transistor, which is an example of a first bit line selection switch element. The odd layer bit line via 55 is connected to one of a drain and a source of an odd layer bit line selection switch element 58 including an NMOS transistor, which is an example of a second bit line selection switch element. The other one of the drain and the source of the even layer bit line selection switch element 57 and the other one of the drain and the source of the odd layer bit line selection switch element 58 are commonly connected to a common contact (GBLI). A gate of the even layer bit line selection switch element 57 is connected to an even layer bit line selection signal line, while a gate of the odd layer bit line selection switch element 58 is connected to an odd layer bit line selection signal line.

The common contact GBLI is connected to one of a drain and a source of an N-type current limiting element 90 including an NMOS transistor, and also connected to one of a drain and a source of a P-type current limiting element 91 including a PMOS transistor. The other one of the drain and the source of the N-type current limiting element 90 is connected to a global bit line (GBL), and the other one of the drain and the source of the P-type current limiting element 91 is equally connected to the global bit line (GBL). That is, the N-type current limiting element 90 and the P-type current limiting element 91 are connected in parallel with each other, and constitute a bidirectional current limiting circuit 920 that limits each bidirectional current flowing between the global bit line (GBL) and each of the even layer bit line selection switch element 57 and the odd layer bit line selection switch element 58.

A gate of the N-type current limiting element 90 is connected to a signal line that is connected to a node CMN, and a gate of the P-type current limiting element 91 is connected to a signal line that is connected to a node CMP. The P-type current limiting element 91 is designed to have a transistor channel width Wps, and the N-type current limiting element 90 is designed to have a transistor channel width Wns. The N-type current limiting element 90 and the P-type current limiting element 91 constitute a bidirectional current limiting element. Voltage values of signals applied from the nodes CMP and CMN to the respective gates and their control method and how the channel widths Wps and Wns are designed will be described in detail later.

Note that a group having a structure obtained by slicing in the direction in which the bit lines 53 are aligned, as shown in FIG. 11, is referred to as a vertical array plane. In detail, a plurality of XZ planes that each correspond to a different one of a plurality of bit line groups each of which has bit lines aligned in the Z direction which is a layer stacking direction, that share word lines perpendicularly passing through the plurality of XZ planes, and that are aligned in the Y direction are each referred to as a vertical array plane.

Figure 12:
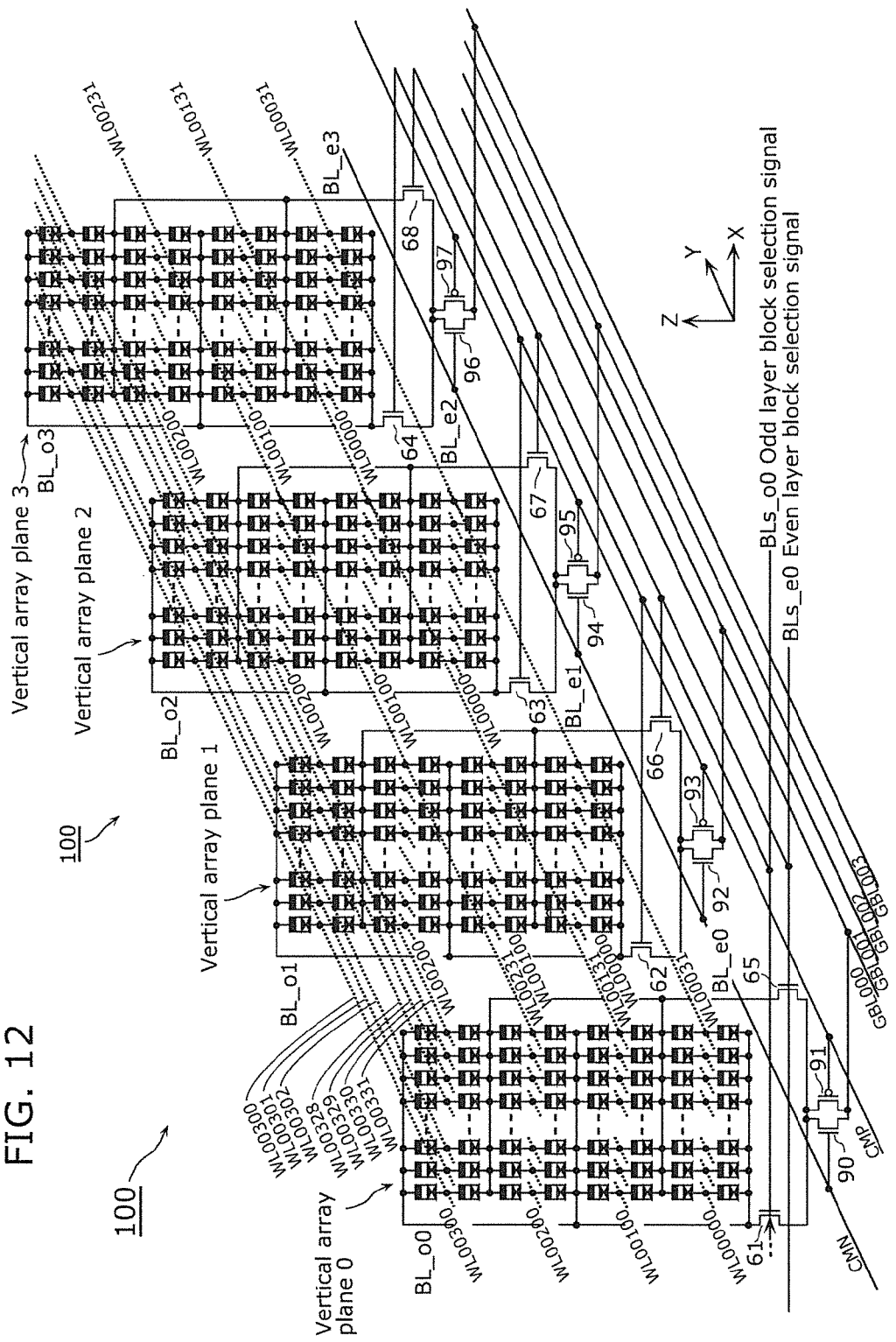
FIG. 12 is a circuit diagram showing a structure of a memory cell array in the reference example.

FIG. 12 is a diagram showing a structure in which four vertical array planes are arranged face to face.

In FIG. 12, the X direction is a direction in which bit lines extend, the Y direction is a direction in which word lines extend, and the Z direction is a direction in which the bit lines or the word lines are stacked in layers.

In FIG. 12, bit lines (BL) 53 extend in the X direction and are formed in a plurality of layers (five layers in FIG. 12), and word lines (WL) 52 extend in the Y direction and are formed in layers (four layers in FIG. 12) between the bit lines. In a memory cell array 100, each memory cell (MC) 51 is formed at a different one of cross points of the bit lines 53 and the word lines 52 so as to be positioned between the corresponding bit line 53 and word line 52. Note that a part of the memory cells 51 and a part of the word lines 52 are not shown for the sake of simplicity.

Each of vertical array planes 0 to 3 that corresponds to a different one of bit line groups each composed of bit lines BL arranged in layers in the Z direction includes memory cells 51 formed between the bit lines BL and the word lines WL. The vertical array planes 0 to 3 share the word lines WL. In the example shown in FIG. 12, the number of memory cells 51 in the X direction is 32 (n=32 in FIG. 11) and the number of memory cells 51 in the Z direction is 8, in each of the vertical array planes 0 to 3. The memory cell array 100 includes the four vertical array planes 0 to 3 aligned in the Y direction.

Note that the number of memory cells in each vertical array plane and the number of vertical array planes in the Y direction are not limited to such.

In each of the vertical array planes 0 to 3, the even layer bit lines BL are commonly connected by the even layer bit line via 54 in FIG. 11 (BL_e0 to BL_e3), and the odd layer bit lines BL are commonly connected by the odd layer bit line via 55 in FIG. 11 (BL_o0 to BL_o3).

Moreover, global bit lines GBL000 to GBL003 respectively corresponding to the vertical array planes 0 to 3 extend in the Y direction. Further, odd layer bit line selection switch elements 61 to 64 and even layer bit line selection switch elements 65 to 68 are respectively provided for the vertical array planes 0 to 3. In FIG. 12, the odd layer bit line selection switch elements 61 to 64 and the even layer bit line selection switch elements 65 to 68 each include an NMOS transistor. In addition, the odd layer bit line selection switch elements 61 to 64 and the even layer bit line selection switch elements 65 to 68 related to N-type current limiting elements 90, 92, 94, and 96 each including an NMOS transistor and P-type current limiting elements 91, 93, 95, and 97 each including a PMOS transistor are respectively connected to the global bit lines GBL000 to GBL003 related to the N-type current limiting elements 90, 92, 94, and 96 and the P-type current limiting elements 91, 93, 95, and 97, each at a diffusion layer terminal of the other one of the drain and the source of the corresponding pair of the odd layer bit line selection switch elements 61 to 64 and the even layer bit line selection switch elements 65 to 68. Gate terminals of the N-type current limiting elements 90, 92, 94, and 96 are commonly connected to the node CMN for a control voltage, and gate terminals of the P-type current limiting elements 91, 93, 95, and 97 are commonly connected to the node CMP for a control voltage. The voltage of the node CMN and the voltage of the node CMP can be arbitrarily set according to the amount of current to which a current flow is to be limited.

The odd layer bit line selection switch elements 61 to 64 respectively switch, according to an odd layer bit line selection signal BLs_o0, electrical connection and disconnection between the global bit lines GBL000 to GBL003 for the vertical array planes 0 to 3 and the odd layer bit lines BL_o0 to BL_o3 commonly connected in each of the vertical array planes 0 to 3, through the N-type current limiting elements 90, 92, 94, and 96 and the P-type current limiting elements 91, 93, 95, and 97. Meanwhile, the even layer bit line selection switch elements 65 to 68 respectively switch, according to an even layer bit line selection signal BLs_e0, electrical connection and disconnection between the global bit lines GBL000 to GBL003 for the vertical array planes 0 to 3 and the even layer bit lines BL_e0 to BL_e3 commonly connected in each of the vertical array planes 0 to 3, through the N-type current limiting elements 90, 92, 94, and 96 and the P-type current limiting elements 91, 93, 95, and 97.

According to this structure, each of the vertical array planes 0 to 3 can be formed by placing the memory cells 51 so that their variable resistance elements 10 have the same structure in the Z direction in all memory cell layers. Moreover, in FIG. 11, the even layer bit lines 53b and 53d are commonly connected and the odd layer bit lines 53a, 53c, and 53e are commonly connected by separate vias (the even layer BL via 54 and the odd layer BL via 55), and these vias are connected to the global bit line GBL through the respective even layer switch 57 and odd layer switch 58 and the bidirectional current limiting circuit 920. A multilayer cross point structure according to a hierarchical bit line system is realized in this way.

Figure 13:
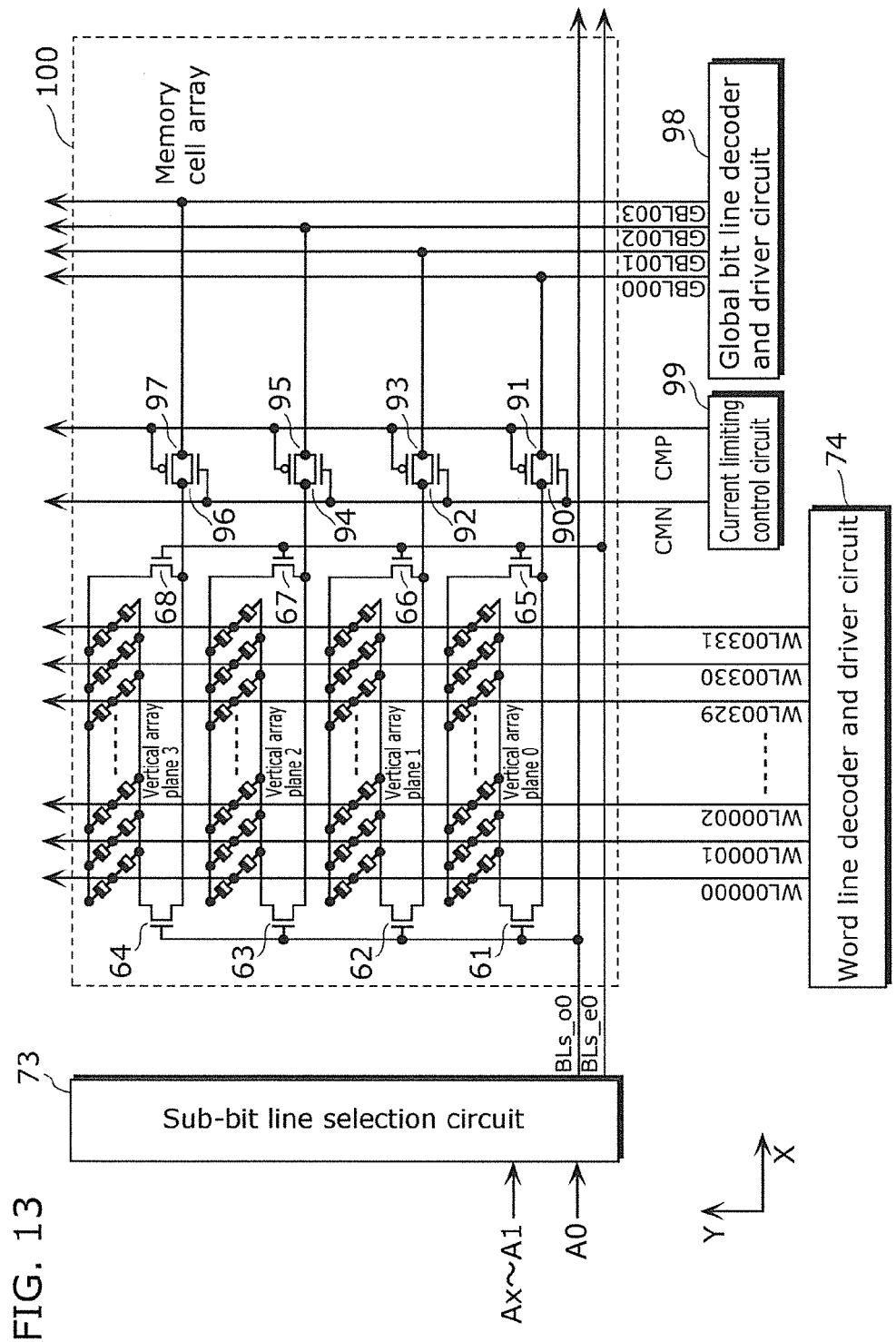
FIG. 13 is a circuit diagram showing the memory cell array shown in FIG. 12 and its peripheral circuitry.

FIG. 13 is a circuit diagram showing the memory cell array 100 in FIG. 12 and its peripheral circuitry.

In FIG. 13, a global bit line decoder and driver circuit 98 is a circuit that supplies a signal for selecting a memory cell 51 to each of the global bit lines GBL000 to GBL003, and selectively drives and controls the global bit lines GBL000 to GBL003.

A current limiting control circuit 99 is a circuit that controls the bidirectional current limiting circuit 920 and, when setting a selected memory cell to the low resistance state, activates a current limiting element that is more capable of limiting the amount of current flowing through the selected memory cell from among the N-type current limiting elements 90, 92, 94, and 96 and the P-type current limiting elements 91, 93, 95, and 97. That is, the current limiting control circuit 99 is a control circuit that turns ON one of a current limiting element pair of the N-type current limiting elements 90, 92, 94, and 96 and the P-type current limiting elements 91, 93, 95, and 97 which are respectively paired with each other, and turns OFF the other one of the current limiting element pair. The current limiting control circuit 99 controls output voltages VCMN and VCMP to the nodes CMN and CMP, according to an operation mode (e.g. a high resistance writing mode, a low resistance writing mode, or a reading mode) and a selected memory cell layer (an even layer or an odd layer). In detail, in the case of changing the selected memory cell from the high resistance state to the low resistance state, the current limiting control circuit 99 generates the voltage VCMN or VCMP for limiting the amount of current for a write pulse. In the case of changing the selected memory cell from the low resistance state to the high resistance state, the current limiting control circuit 99 generates a sufficiently high voltage VCMN or VCMP so as not to limit the amount of current for a write pulse. In the case of the reading mode, too, the current limiting control circuit 99 generates a sufficiently high voltage VCMN or VCMP so as not to limit the amount of current for a read pulse. Various voltage settings for the selected memory cell will be described in detail later.

A sub-bit line selection circuit 73 is a circuit that controls the odd layer bit line selection switch elements 61 to 64 and the even layer bit line selection switch elements 65 to 68, and outputs the even layer bit line selection signal BLs_e0 and the odd layer bit line selection signal BLs_o0 according to address signals A0 to Ax.

A word line decoder and driver circuit 74 is a circuit that supplies a signal for selecting a memory cell 51 to each of word lines WL00000 to WL00331, and selectively drives and controls the word lines WL00000 to WL00331.

Figure 14:
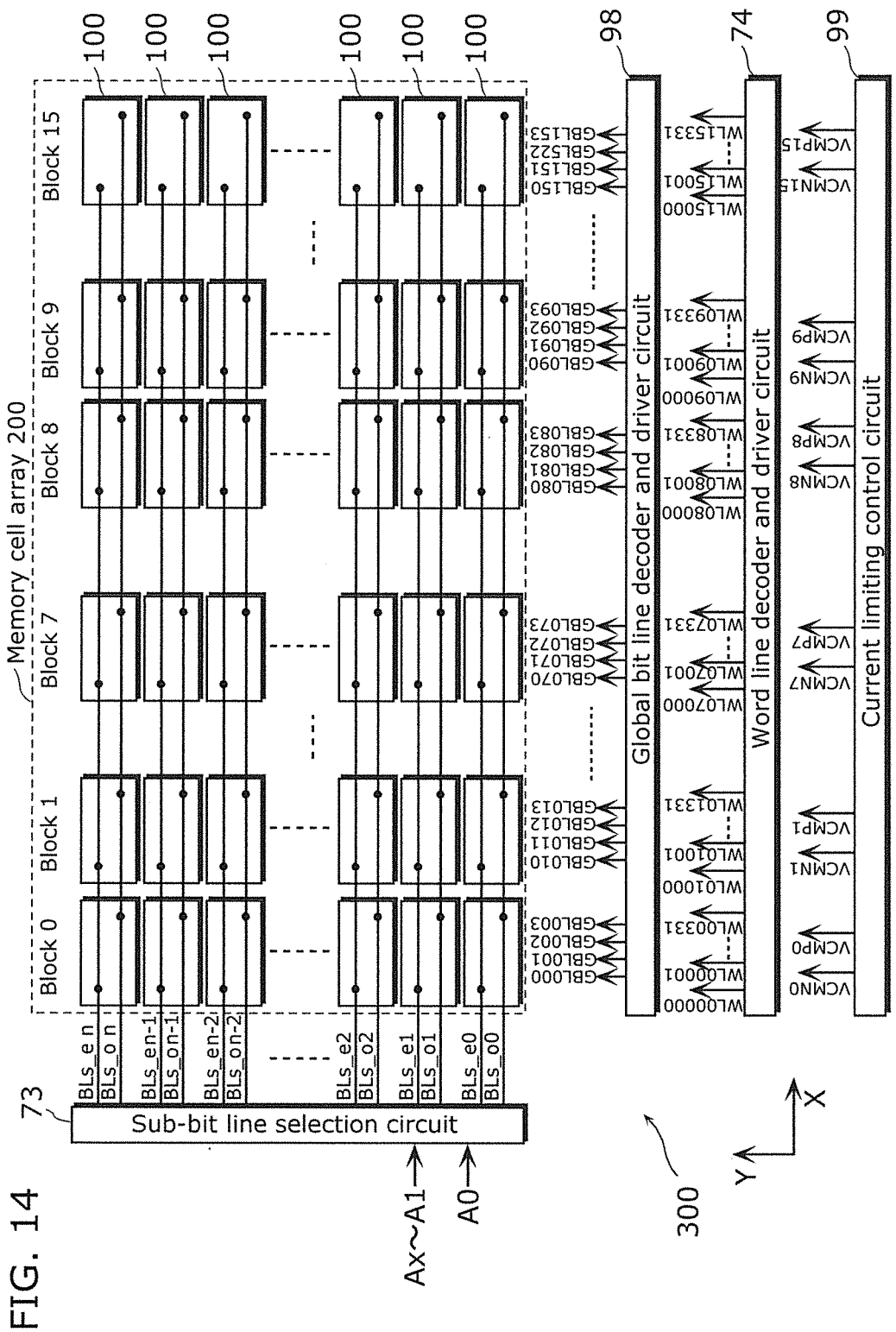
FIG. 14 is a circuit diagram showing a main part of a cross point variable resistance nonvolatile memory device that uses a plurality of memory cell arrays shown in FIG. 12.

FIG. 14 is a circuit diagram showing a main part of the cross point variable resistance nonvolatile memory device in this reference example.

As shown in FIG. 14, in an actual cross point variable resistance nonvolatile memory device, a memory cell array 200 is formed by providing a plurality of memory cell arrays 100 (each corresponding to the vertical array planes) shown in FIG. 12. (n+1)×16 memory cell arrays 100 are arranged in the example shown in FIG. 14.

The word line decoder and driver circuit 74 selectively drives and controls word lines WL00000 to WL15331.

The global bit line decoder and driver circuit 98 selectively drives and controls global bit lines GBL000 to GBL153.

The current limiting control circuit 99 individually generates voltages VCMNn and VCMPn (n is a number from 0 to 15) for controlling the bidirectional current limiting circuit 920 according to an operation mode.

The sub-bit line selection circuit 73 controls, according to the address signals A0 to Ax, even layer bit line selection signals BLs_e0 to BLs_en and odd layer bit line selection signals BLs_o0 to BLs_on for the memory cell arrays 100 so that, in the memory cell array 200, an odd layer bit line selection switch element (one of the odd layer bit line selection switch elements 61 to 64 in the example shown in FIG. 12) or an even layer bit line selection switch element (one of the even layer bit line selection switch elements 65 to 68 in the example shown in FIG. 12) belonging to a selected vertical array plane becomes conductive.

Figure 15:
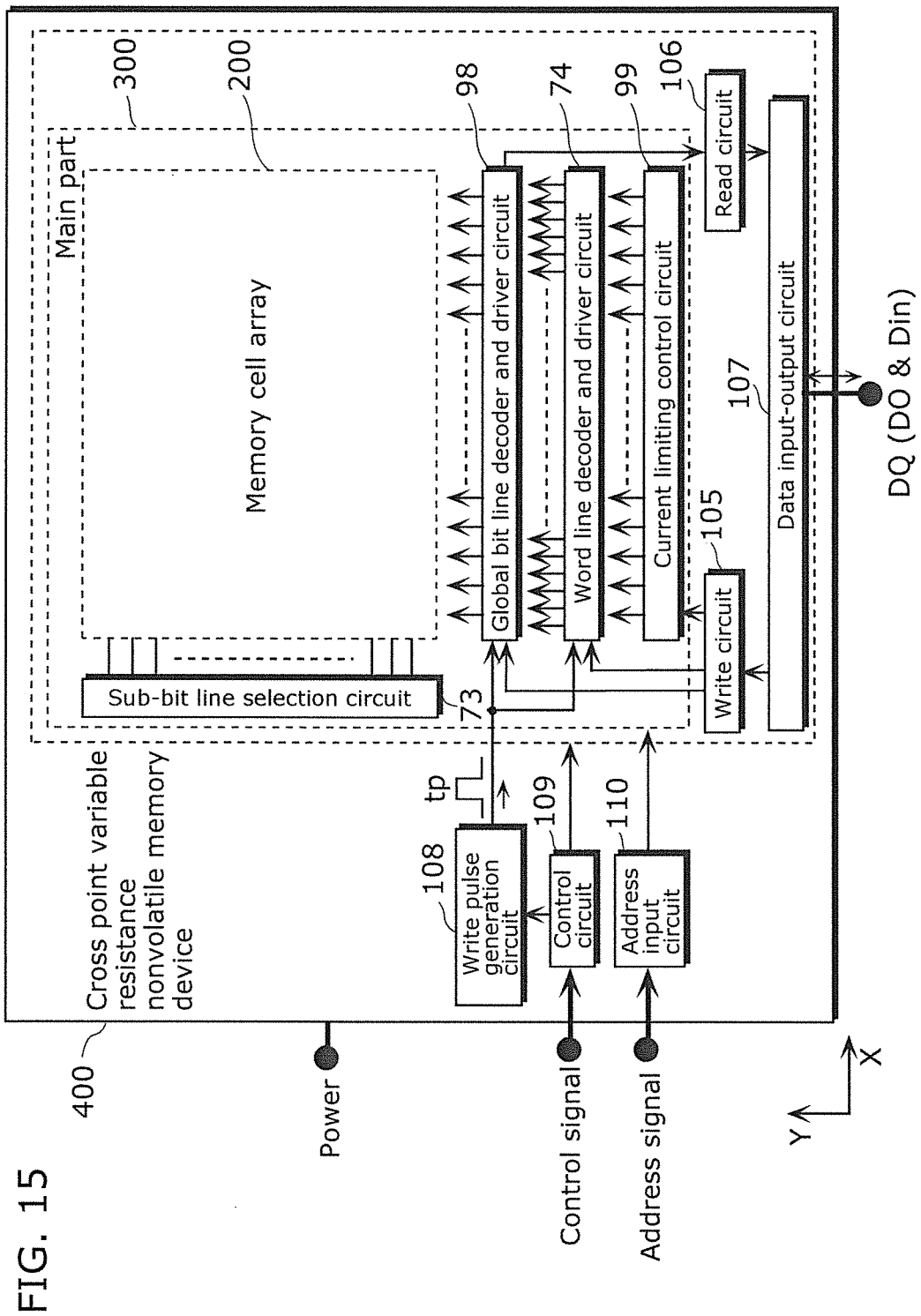
FIG. 15 is a circuit diagram showing a structure of a cross point variable resistance nonvolatile memory device in the reference example.
Figure 16:
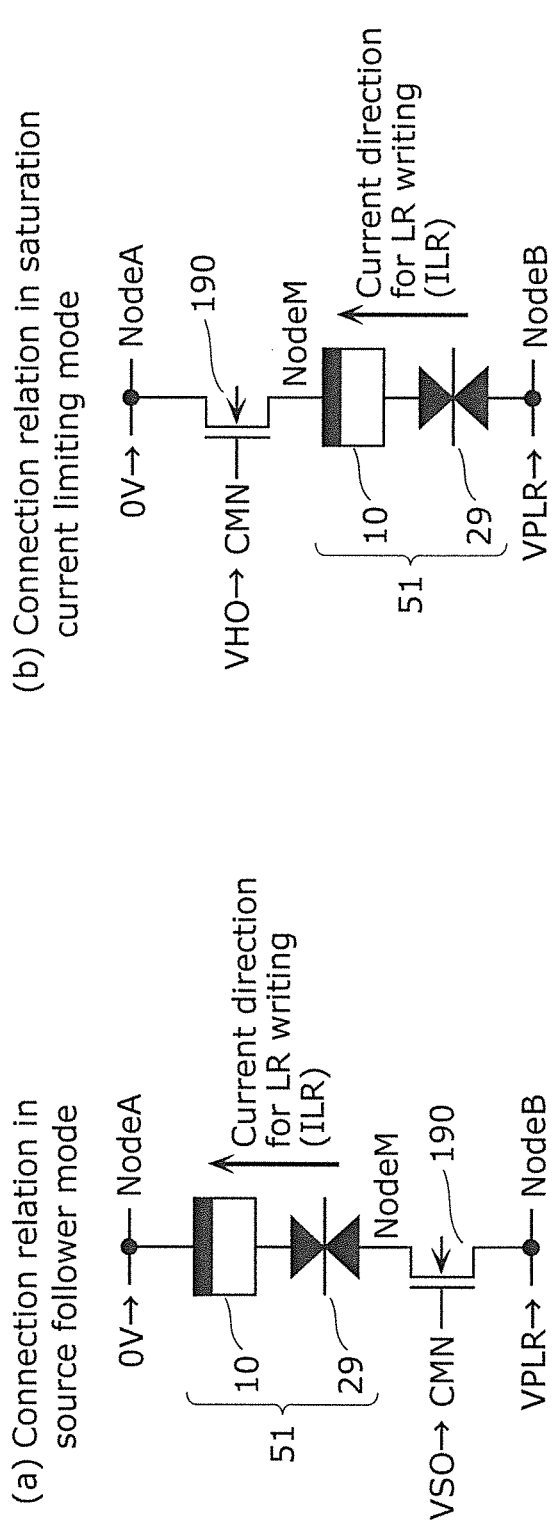
FIGS. 16(a) and 16(b) is a diagram showing connection relations in a source follower mode and a saturation current limiting mode respectively in the reference example.
Figure 17:
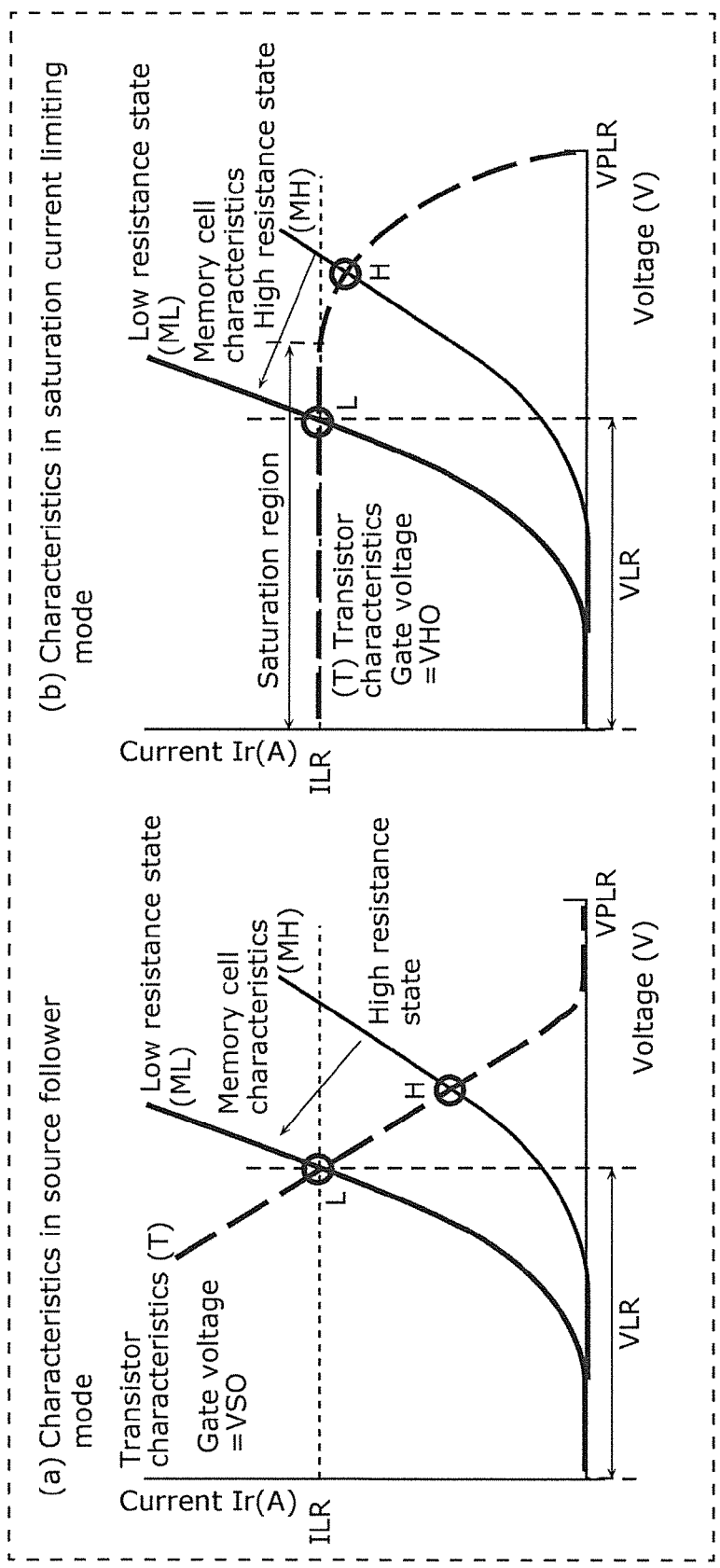
FIGS. 17(a) and 17(b) is a diagram showing characteristics in the source follower mode and the saturation current limiting mode respectively in the reference example.

FIG. 15 is a circuit diagram showing an overall structure of a cross point variable resistance nonvolatile memory device 400 in this reference example. A main part 300 shown in FIG. 15 corresponds to the structure shown in FIG. 14.

In FIG. 15, an address input circuit 110 temporarily latches address signals from outside during a high resistance writing cycle, a low resistance writing cycle, or a reading cycle, and outputs the latched address signals to the sub-bit line selection circuit 73, the global bit line decoder and driver circuit 98, the word line decoder and driver circuit 74, and the current limiting control circuit 99.

A control circuit 109 receives a plurality of input signals (control signals), and outputs signals indicating states in the high resistance writing cycle, the low resistance writing cycle, the reading cycle, and standby, to the sub-bit line selection circuit 73, the global bit line decoder and driver circuit 98, the word line decoder and driver circuit 74, the current limiting control circuit 99, a write circuit 105, a read circuit 106, and a data input-output circuit 107. The control circuit 109 also outputs trigger signals for generating a high resistance write pulse, a low resistance write pulse, and a read pulse respectively in the high resistance writing cycle, the low resistance writing cycle, and the reading cycle, to a write pulse generation circuit 108.

The write pulse generation circuit 108 generates a pulse for a given period tp (tp_E, tp_P, tp_R) in a high resistance writing time in the high resistance writing cycle, a low resistance writing time in the low resistance writing cycle, or a reading time in the reading cycle, and outputs the generated pulse to the global bit line decoder and driver circuit 98 and the word line decoder and driver circuit 74.

The data input-output circuit 107 is a block that sends or receives data to or from outside. In a writing operation, the data input-output circuit 107 latches data Din at an external terminal DQ, and outputs the write data to the write circuit 105 until reception of the next data. In a reading operation, the data input-output circuit 107 latches read data from the read circuit 106, and outputs the read data to the external terminal DQ as output data DO until reception of the next output data.

The write circuit 105 is a circuit that writes data to a memory cell selected by the global bit line decoder and driver circuit 98 and the word line decoder and driver circuit 74. Upon receiving a data signal from the data input-output circuit 107, the write circuit 105 outputs a write command signal to the global bit line decoder and driver circuit 98, the word line decoder and driver circuit 74, and the current limiting control circuit 99.

The read circuit 106 is a circuit that reads data from a memory cell selected by the global bit line decoder and driver circuit 98 and the word line decoder and driver circuit 74. The read circuit 106 detects a stored data state of a memory cell selected by the sub-bit line selection circuit 73 and the global bit line decoder and driver circuit 98, and outputs a detection result to the data input-output circuit 107 as a data signal.

Regarding a threshold of a transistor included in each circuit, the peripheral circuits of the memory cell array 200, namely, the sub-bit line selection circuit 73, the global bit line decoder and driver circuit 98, the word line decoder and driver circuit 74, the current limiting control circuit 99, the write circuit 105, the read circuit 106, the data input-output circuit 107, the write pulse generation circuit 108, the control circuit 109, and the address input circuit 110 each include at least one of an NMOS transistor having a positive first threshold voltage and a PMOS transistor having a negative second threshold voltage. In the bidirectional current limiting circuits 920, on the other hand, the N-type current limiting elements 90, 92, 94, and 96 each include an NMOS transistor having a third threshold voltage (e.g. 100 mV) lower than the first threshold voltage, and the P-type current limiting elements 91, 93, 95, and 97 each include a PMOS transistor having a fourth threshold voltage (e.g. −100 mV) lower in absolute value than the second threshold voltage.

The odd layer bit line selection switch elements and the even layer bit line selection switch elements also each include an NMOS transistor having the third threshold voltage.

[Description of Operating Voltage Setting]

The following describes an operation of the cross point variable resistance nonvolatile memory device 400 having the above-mentioned structure.

One feature of this reference example is that, in the cross point memory shown in FIG. 11, the variable resistance layers and the electrode layers of the variable resistance element 10 in the memory cell 51 shown in FIG. 10 can be stacked in the same order regardless of which memory cell layer the memory cell 51 belongs to.

Meanwhile, the bit line and the word line alternate between the lower connection and the upper connection to the memory cell 51, depending on the placement layer of the memory cell 51. The memory cell 51 has bidirectional writing characteristics of changing to the high resistance state when the electrode 11 in contact with the second variable resistance layer 12 is set to a voltage higher than a predetermined voltage with respect to the electrode 21, and changing to the low resistance state when the electrode 11 is set to a voltage lower than a predetermined voltage with respect to the electrode 21. Therefore, the bit line and the word line are reversed in operation in the case of selecting an odd layer memory cell and in the case of selecting an even layer memory cell. Another feature is that a stable resistance change can be achieved in such a manner that one of the odd layer bit line selection switch element 58 and the even layer bit line selection switch element 57 is selectively brought into conduction depending on the layer of the selected bit line and, regardless of which layer the selected memory cell belongs to, low resistance writing is performed by limiting a current to a predetermined value whereas high resistance writing is performed by causing a flow of a current larger than and opposite in direction to that in low resistance writing without current limitation.

To realize this, it is necessary to assume the following eight types of operations corresponding to all combinations of the writing to the low resistance state or the high resistance state and the current direction of the global bit line and the word line depending on the selected memory cell layer.

(A) Operation of writing a memory cell M1 in a (4n+1)th layer (n is a natural number) to the low resistance state.

(B) Operation of writing the memory cell M1 in the (4n+1)th layer (n is a natural number) to the high resistance state.

(C) Operation of writing a memory cell M2 in a (4n+2)th layer (n is a natural number) to the low resistance state.

(D) Operation of writing the memory cell M2 in the (4n+2)th layer (n is a natural number) to the high resistance state.

(E) Operation of writing a memory cell M3 in a (4n+3)th layer (n is a natural number) to the low resistance state.

(F) Operation of writing the memory cell M3 in the (4n+3)th layer (n is a natural number) to the high resistance state.

(G) Operation of writing a memory cell M4 in a (4n+4)th layer (n is a natural number) to the low resistance state.

(H) Operation of writing the memory cell M4 in the (4n+4)th layer (n is a natural number) to the high resistance state.

Here, the memory cells M1 to M4 correspond to the memory cells of the different layers shown in FIG. 11. Operations of memory cells in higher layers than the memory cell M4 are the same as those of the memory cells M1 to M4, except a difference in the selected word line.

The bidirectional current limiting circuit 920 performs a current limiting operation according to the selected memory cell layer. This current limiting operation can be performed in two modes using the same circuit structure, namely, (1) a method that uses source follower characteristics of a transistor (hereafter referred to as a source follower mode) and (2) a method that uses saturation region characteristics of a transistor (hereafter referred to as a saturation current limiting mode).

The following describes each of these modes, with reference to a structure example shown in FIGS. 16(a) and 16(b) and a characteristic diagram shown in FIGS. 17(a) and 17(b).

FIGS. 16(a) and 16(b) shows examples of series connection between the memory cell 51 and an NMOS transistor 190 for current limitation. FIG. 16(a) shows an example of connection and applied voltages in the source follower mode, whereas FIG. 16(b) shows an example of connection and applied voltages in the saturation current limiting mode. Both examples correspond to a method of controlling the amount of current flowing through the memory cell 51 to a predetermined value in order to set a resistance value of the low resistance state.

In FIG. 16(a), the source follower mode is used, and accordingly a drain terminal of the NMOS transistor 190 is connected to Node B of a voltage VPLR, and a terminal of the memory cell 51 not connected to a source of the NMOS transistor 190 is connected to Node A of a low voltage (e.g. 0 V). Meanwhile, a voltage VSO is applied to the node CMN connected to a gate terminal of the NMOS transistor 190.

FIG. 17(a) is a characteristic operating point diagram in the case of the connection in FIG. 16(a). In FIG. 17(a), a solid line (MH) represents current-voltage characteristics of the memory cell 51 in the high resistance state, a solid line (ML) represents current-voltage characteristics of the memory cell 51 in the low resistance state, and a dashed line (T) represents load characteristics of the NMOS transistor 190 when the voltage VSO is applied to the gate terminal of the NMOS transistor 190. Since the NMOS transistor 190 operates as a source follower, the characteristic line (T) shifts left and right on a voltage axis according to the gate voltage.

In the case where the memory cell 51 changes from the high resistance state to the low resistance state, its operating point with the NMOS transistor 190 is initially at intersection point H (i.e. Node M in FIG. 16(a) has a voltage at point H), based on the current-voltage characteristics (MH) in the high resistance state. Subsequently, when the memory cell 51 changes to the low resistance state, its current-voltage characteristics are changed to (ML), and its operating point with the NMOS transistor 190 shifts to intersection point L (i.e. Node M has a voltage VLR at point L). The resistance value of the low resistance state of the memory cell 51 is determined by a current ILR when the voltage applied across the memory cell 51 is VLR. For example, in the case of increasing the gate voltage VSO of the NMOS transistor 190, the transistor characteristics (T) shift to the higher voltage side, and as a result operating point L shifts to the higher current side, thus setting a lower resistance value. In the case of decreasing the gate voltage VSO, the transistor characteristics (T) shift to the lower voltage side, and as a result operating point L shifts to the lower current side, thus setting a higher resistance value.

In FIG. 16(b), the saturation current limiting mode is used, and accordingly a source terminal of the NMOS transistor 190 is connected to Node A of a low voltage (e.g. 0 V), and a terminal of the memory cell 51 not connected to a drain of the NMOS transistor 190 is connected to Node B of a high voltage VPLR. Meanwhile, a voltage VHO is applied to the node CMN connected to a gate terminal of the NMOS transistor 190.

FIG. 17(b) is a characteristic operating point diagram in the case of the connection in FIG. 16(b). In FIG. 17(b), a solid line (MH) represents characteristics of the memory cell 51 in the high resistance state, a solid line (ML) represents characteristics of the memory cell 51 in the low resistance state, and a dashed line (T) represents characteristics of the NMOS transistor 190 when the voltage VHO is applied to the gate terminal. Since the NMOS transistor 190 operates with saturation characteristics, the saturation region characteristic line of the characteristic line (T) shifts up and down on a current axis according to the gate voltage.

In the case where the memory cell 51 changes from the high resistance state to the low resistance state, its operating point with the NMOS transistor 190 is initially at intersection point H (i.e. Node M has a voltage obtained by subtracting a voltage at point H from VPLR), based on the current-voltage characteristics (MH) in the high resistance state. Subsequently, when the memory cell 51 changes to the low resistance state, its current-voltage characteristics are changed to (ML), and its operating point with the NMOS transistor 190 shifts to intersection point L in the saturation region (i.e. Node M has a voltage (VPLR−VLR)). The resistance value of the low resistance state of the memory cell 51 is determined by a current ILR when the voltage applied across the memory cell 51 is VLR. For example, in the case of increasing the gate voltage VHO of the NMOS transistor 190, the saturation region characteristic line of the transistor characteristics (T) shifts to the higher current side, and as a result operating point L shifts to the higher current side, thus setting a lower resistance value. In the case of decreasing the gate voltage VHO, the saturation region characteristic line of the transistor characteristics (T) shifts to the lower current side, and as a result operating point L shifts to the lower current side, thus setting a higher resistance value.

As described above, the resistance value of the low resistance state of the memory cell 51 can be controlled in the two current limiting modes.

The following describes a detailed operation in the case of applying each of the above-mentioned two current limiting modes to the structure of the multilayer cross point memory shown in FIG. 11.

As an operation of writing the multilayer cross point variable resistance nonvolatile memory device according to this reference example, the following describes an operation whereby, when performing low resistance writing to a selected memory cell depending on a memory cell layer to which the selected memory cell belongs to, low resistance writing is performed by activating only one of the N-type current limiting element 90 and the P-type current limiting element 91 that has a greater substrate bias effect, with the source follower mode being used for current limitation in low resistance writing. The saturation current limiting mode will be described in detail later as Reference Example 2.

Table 1 shows set voltages of main signals in the diagram of the basic structure shown in FIG. 11 in association with each of the operations of the memory cells M1 to M4 of the different layers, in the source follower mode. In the table, "(ON: SF)" means that the current limiting element is ON and the source follower current limitation is performed, and "(ON)" and "(OFF)" respectively mean that the corresponding bit line selection switch element or current limiting element is ON and OFF.

TABLE 1

| | Writing to M1 | | Writing to M2 | | Writing to M3 | | Writing to M4 | |
| --- | --- | --- | --- | --- | --- | --- | --- | --- |
| | LR (A) | HR (B) | LR (C) | HR (D) | LR (E) | HR (F) | LR (G) | HR (H) |
| Gate voltage of odd layer bit line selection switch element 58 | Vpp (ON) | Vpp (ON) | 0 V (OFF) | 0 V (OFF) | 0 V (OFF) | 0 V (OFF) | Vpp (ON) | Vpp (ON) |
| Gate voltage of even layer bit line selection switch element 57 | 0 V (OFF) | 0 V (OFF) | Vpp (ON) | Vpp (ON) | Vpp (ON) | Vpp (ON) | 0 V (OFF) | 0 V (OFF) |
| Voltage of CMN | VCMN (ON:SF) | VCMN (ON) | 0 V (OFF) | 0 V (OFF) | VCMN (ON:SF) | VCMN (ON) | 0 V (OFF) | 0 V (OFF) |
| Voltage of CMP | Vpof (OFF) | Vpof (OFF) | VCMP (ON:SF) | VCMP (ON) | Vpof (OFF) | Vpof (OFF) | VCMP (ON:SF) | VCMP (ON) |
| Global bit line | VLR1 | 0 V | 0 V | VHR2 | VLR1 | 0 V | 0 V | VHR2 |
| Selected word line | 0 V | VHR1 | VLR2 | 0 V | 0 V | VHR1 | VLR2 | 0 V |

The following describes examples of writing the memory cells 51 included in the first to fourth layer memory cells 51a to 51d as designated by M1 to M4 in FIG. 11, with reference to FIGS. 18A to 18H.

Figure 18A:
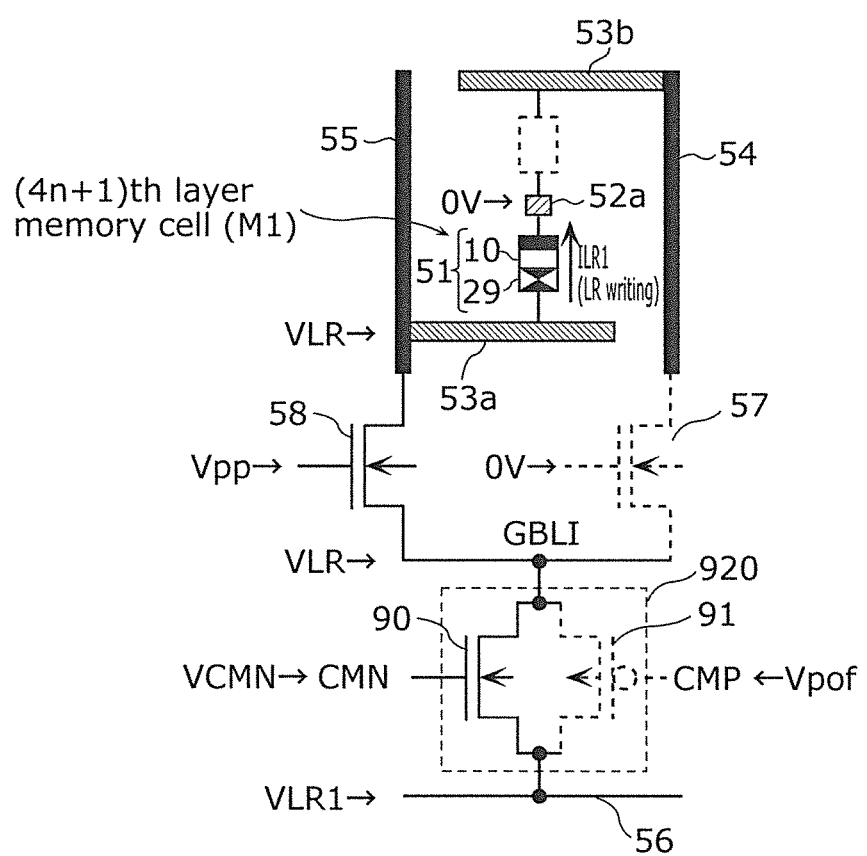
FIG. 18A is a diagram for describing a low resistance writing operation of a (4n+1)th layer memory cell in the source follower mode in the reference example.

(A) Operation of Writing the Memory Cell M1 in the (4n+1)th Layer (n is a Natural Number) to the Low Resistance State FIG. 18A is an equivalent circuit diagram showing an element connection structure from the global bit line 56 to the word line 52a in the cross section diagram in FIG. 11, for describing an operation of writing the (4n+1)th layer memory cell M1 to the low resistance state.

In FIG. 18A, reference numeral 51 is the selected memory cell M1 in the (4n+1)th layer (M2 is shown by a dashed line box), 58 is the odd layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a voltage VLR1 greater than or equal to the voltage VLR required for low resistance writing is applied to the global bit line 56 with respect to the word line 52$a$ so that a current flows in a direction of the global bit line 56→the bidirectional current limiting circuit 920→the odd layer bit line selection switch element 58→the bit line 53$a$→the selected memory cell 51→the word line 52$a$.

When writing the memory cell M1 to the low resistance state, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines). Here, Vpp is a voltage that is sufficiently higher than the threshold voltage of the odd layer bit line selection switch element 58, and is stepped-up to be greater than or equal to a power voltage Vcc.

In this case, the current limiting control circuit 99 applies a voltage Vpof greater than or equal to Vcc to the node CMP connected to the gate terminal of the P-type current limiting element 91 to turn OFF the P-type current limiting element 91 (the P-type current limiting element 91 is shown by dashed lines), and applies VCMN to the node CMN connected to the gate terminal of the N-type current limiting element 90 to turn ON the N-type current limiting element 90.

The word line decoder and driver circuit 74 applies a reference voltage (0 V in this example) to the word line 52$a$ connected to the selected memory cell 51, and the global bit line decoder and driver circuit 98 applies the voltage VLR1 to the global bit line 56 so that the voltage across both ends of the selected memory cell 51 is greater than or equal to the voltage VLR required for low resistance writing, thereby causing a flow of a current in a direction in which the selected memory cell 51 changes to the low resistance state.

Here, the current limiting control circuit 99 applies such a voltage VCMN that limits the current flowing through the N-type current limiting element 90 to a predetermined current value ILR1, to the node CMN connected to the gate terminal of the N-type current limiting element 90. This exploits characteristics that, since the source of the N-type current limiting element 90 including an NMOS transistor is on the side of the contact with the odd layer bit line selection switch element 58, the voltage applied across both ends of the selected memory cell 51 is limited to the voltage VLR as a result of a drop of the threshold voltage Vt including the substrate bias effect from the gate voltage VCMN of the N-type current limiting element 90, thus enabling the N-type current limiting element 90 to function as a constant current source in the source follower mode.

That is, by setting the gate voltage VCMN of the N-type current limiting element 90 to an appropriate value, the current limited to a predetermined current value can be caused to flow through the selected memory cell 51 in the direction from the bit line 53$a$ to the word line 52$a$, allowing the memory cell 51 to be set to a predetermined low resistance value. According to the above-mentioned control, when changing the (4n+1)th layer memory cell M1 to the low resistance state, the memory cell M1 can be changed to the low resistance state of a desired resistance value by current limitation in the source follower mode.

Figure 18B:
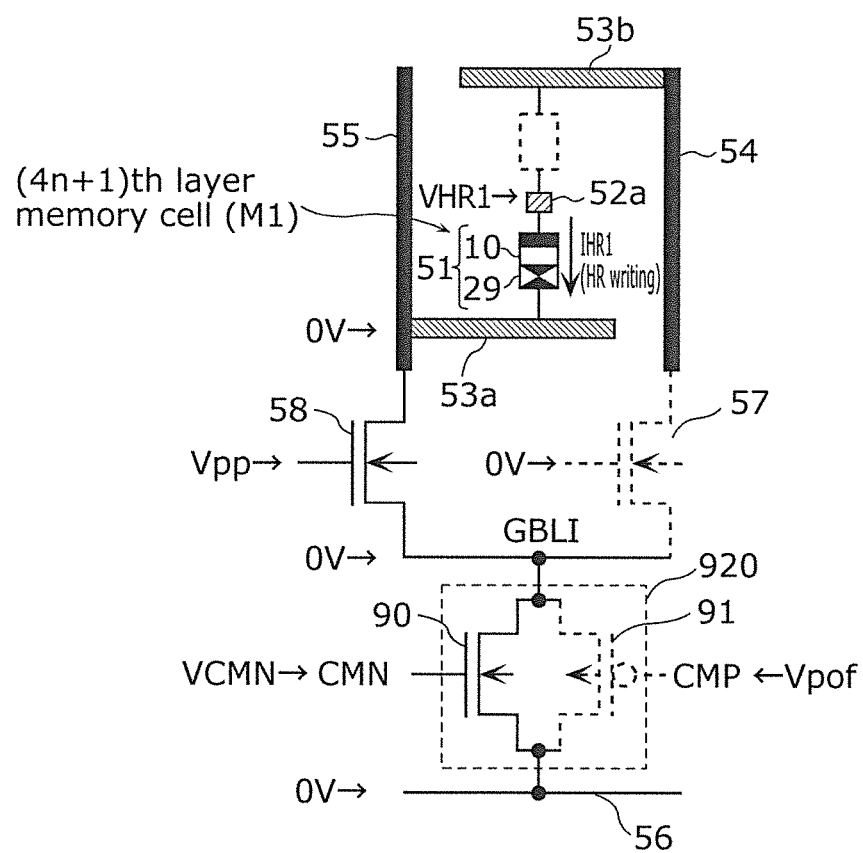
FIG. 18B is a diagram for describing a high resistance writing operation of the (4n+1)th layer memory cell in the source follower mode in the reference example.

(B) Operation of Writing the Memory Cell M1 in the (4n+1)th Layer (n is a Natural Number) to the High Resistance State FIG. 18B is an equivalent circuit diagram showing an element connection structure from the global bit line 56 to the word line 52$a$ in the cross section diagram in FIG. 11, for describing an operation of writing the (4n+1)th layer memory cell M1 to the high resistance state. Though the same structure as in FIG. 18A is used here, a voltage is applied so that the word line 52$a$ is higher in voltage than the global bit line 56, to cause a flow of a current in a direction from the word line 52$a$ to the bit line 53$a$.

When writing the memory cell M1 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

In this case, too, the current limiting control circuit 99 applies the voltage Vpof greater than or equal to Vcc to the node CMP connected to the gate terminal of the P-type current limiting element 91 to turn OFF the P-type current limiting element 91 (the P-type current limiting element 91 is shown by dashed lines), and applies VCMN to the node CMN connected to the gate terminal of the N-type current limiting element 90 to turn ON the N-type current limiting element 90.

The global bit line decoder and driver circuit 98 applies a reference voltage (0 V in this example) to the global bit line 56, and the word line decoder and driver circuit 74 applies a voltage VHR1 to the word line 52$a$ so that the voltage across both ends of the selected memory cell 51 is greater than or equal to a voltage VHR required for high resistance writing of the selected memory cell 51, thereby causing a flow of a current in a direction in which the selected memory cell 51 changes to the high resistance state.

Here, the current limiting control circuit 99 applies the same voltage VCMN as in low resistance writing to the node CMN connected to the gate terminal of the N-type current limiting element 90, to turn ON the N-type current limiting element 90.

In this state, the source of the N-type current limiting element 90 including an NMOS transistor is on the side of the contact with the global bit line 56 set to 0 V. Such an N-type current limiting element 90 has a low substrate bias effect, and also the gate voltage VCMN of the N-type current limiting element 90 is sufficiently higher than the threshold voltage Vt of the NMOS transistor. Accordingly, the N-type current limiting element 90 can function as a bit line selection switch element having a current drive capability of a current IHR1 for high resistance writing, which is higher than the limited current value ILR1 in low resistance writing (no current limitation is performed).

That is, by merely setting a voltage required for high resistance writing of the selected memory cell 51 to the selected word line 52$a$ while setting the gate voltage VCMN of the N-type current limiting element 90 to the same value as in low resistance writing, a larger current than in low resistance writing can be caused to flow through the selected memory cell 51, ensuring that the selected memory cell 51 is written to the high resistance state. According to the above-mentioned control, when changing the (4n+1)th layer memory cell M1 to the high resistance state, the memory cell M1 can be reliably changed to the high resistance state by causing a larger current than in low resistance writing to flow through the memory cell M1.

Figure 18C:
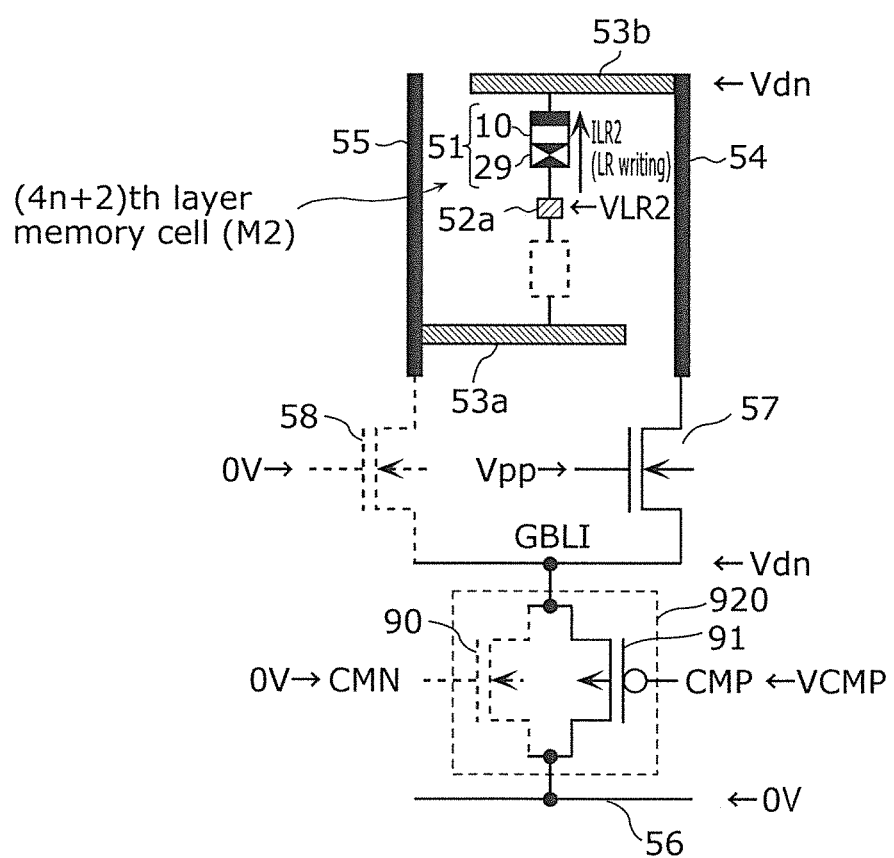
FIG. 18C is a diagram for describing a low resistance writing operation of a (4n+2)th layer memory cell in the source follower mode in the reference example.

(C) Operation of Writing the Memory Cell M2 in the (4n+2)th Layer (n is a Natural Number) to the Low Resistance State FIG. 18C is an equivalent circuit diagram showing an element connection structure from the global bit line 56 to the word line 52a in the cross section diagram in FIG. 11, for describing an operation of writing the (4n+2)th layer memory cell M2 to the low resistance state.

In FIG. 18C, reference numeral 51 is the selected memory cell M2 in the (4n+2)th layer (M1 is shown by a dashed line box), 57 is the even layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a higher voltage is applied to the word line 52a with respect to the global bit line 56 so that a current flows in a direction of the word line 52a→the selected memory cell 51→the bit line 53b→the even layer bit line selection switch element 57→the bidirectional current limiting circuit 920→the global bit line 56.

When writing the memory cell M2 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines).

In this case, the current limiting control circuit 99 applies 0 V to the node CMN connected to the gate terminal of the N-type current limiting element 90 to turn OFF the N-type current limiting element 90 (the N-type current limiting element 90 is shown by dashed lines), and applies the voltage VCMP to the node CMP connected to the gate terminal of the P-type current limiting element 91 to turn ON the P-type current limiting element 91.

The word line decoder and driver circuit 74 applies a voltage VLR2 to the word line 52a connected to the selected memory cell 51 so that the voltage across both ends of the selected memory cell 51 is greater than or equal to the voltage VLR required for low resistance writing of the selected memory cell 51, and the global bit line decoder and driver circuit 98 applies a reference voltage (0 V in this example) to the global bit line 56, thereby causing a flow of a current in a direction in which the selected memory cell 51 changes to the low resistance state.

Here, the current limiting control circuit 99 applies such a voltage VCMP that limits the current flowing through the P-type current limiting element 91 to a predetermined current value ILR2, to the node CMP connected to the gate terminal of the P-type current limiting element 91. This exploits characteristics that, since the source of the P-type current limiting element 91 including a PMOS transistor is on the side of the contact with the even layer bit line selection switch element 57, the voltage applied across both ends of the selected memory cell 51 is limited to a voltage Vdn (VLR2−Vdn=VLR) as a result of a drop of a threshold voltage Vtp including the substrate bias effect from the gate voltage VCMP of the P-type current limiting element 91, thus enabling the PMOS transistor to function as a constant current source in the source follower mode.

That is, by setting the gate voltage VCMP of the P-type current limiting element 91 to an appropriate value, the current limited to a predetermined current value can be caused to flow through the selected memory cell 51 in the direction from the word line 52a to the bit line 53b, allowing the memory cell 51 to be set to a predetermined low resistance state. According to the above-mentioned control, when changing the (4n+2)th layer memory cell M2 to the low resistance state, the memory cell M2 can be changed to the low resistance state of a desired resistance value by current limitation in the source follower mode.

The predetermined current limit value ILR2 is set to be equal to the predetermined current limit value ILR1 when writing the (4n+1)th memory cell to the low resistance state as described in (A), by adjusting the gate voltages VCMN and VCMP and the transistor sizes of the N-type current limiting element 90 and the P-type current limiting element 91.

Figure 18D:
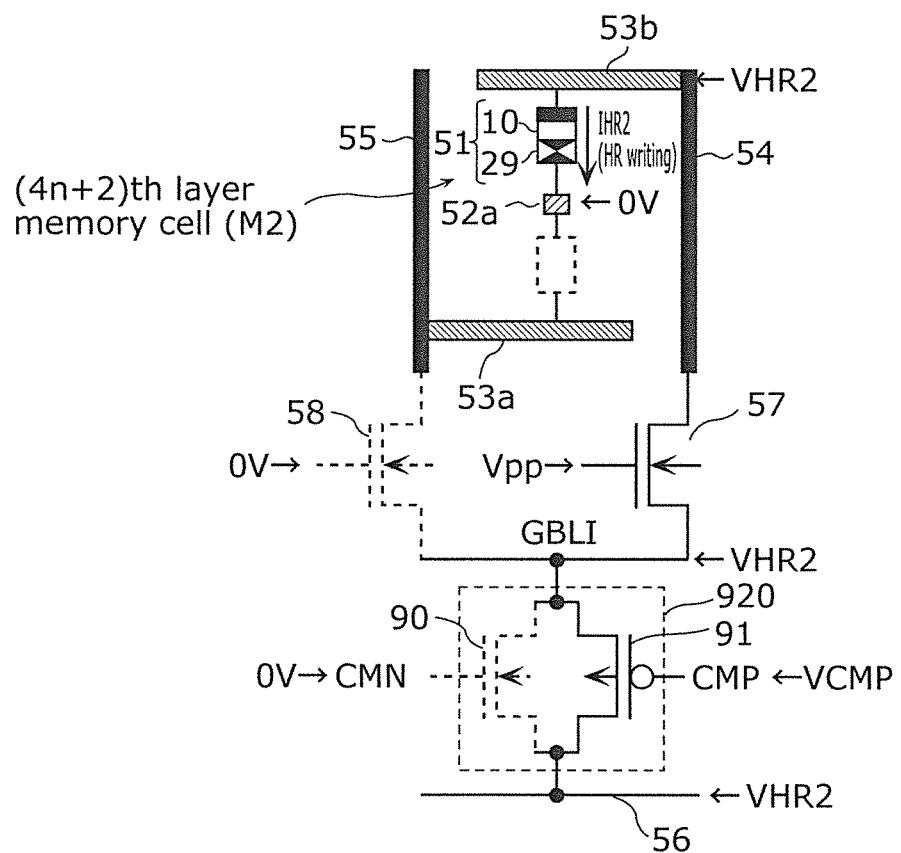
FIG. 18D is a diagram for describing a high resistance writing operation of the (4n+2)th layer memory cell in the source follower mode in the reference example.

(D) Operation of Writing the Memory Cell M2 in the (4n+2)th Layer (n is a Natural Number) to the High Resistance State FIG. 18D is an equivalent circuit diagram showing an element connection structure from the global bit line 56 to the word line 52a in the cross section diagram in FIG. 11, for describing an operation of writing the (4n+2)th layer memory cell M2 to the high resistance state. Though the same structure as in FIG. 18C is used here, a voltage is applied so that the global bit line 56 is higher in voltage than the word line 52a, to cause a flow of a current in a direction from the bit line 53b to the word line 52a.

When writing the memory cell M2 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines).

In this case, too, the current limiting control circuit 99 applies 0 V to the node CMN connected to the gate terminal of the N-type current limiting element 90 to turn OFF the N-type current limiting element 90 (the N-type current limiting element 90 is shown by dashed lines), and applies the voltage VCMP to the node CMP connected to the gate terminal of the P-type current limiting element 91 to turn ON the P-type current limiting element 91.

The word line decoder and driver circuit 74 applies a reference voltage (0 V in this example) to the word line 52a, and the global bit line decoder and driver circuit 98 applies a voltage VHR2 to the global bit line 56 so that the voltage across both ends of the selected memory cell 51 is greater than or equal to the voltage VHR required for high resistance writing of the selected memory cell 51, thereby causing a flow of a current in a direction in which the selected memory cell 51 changes to the high resistance state.

Here, the current limiting control circuit 99 applies the same voltage VCMP as in low resistance writing to the node CMP connected to the gate terminal of the P-type current limiting element 91, to turn ON the P-type current limiting element 91.

In this state, the source of the P-type current limiting element 91 including a PMOS transistor is on the side of the contact with the global bit line 56 set to VHR2. Such a P-type current limiting element 91 has a low substrate bias effect, and also the gate voltage VCMP of the P-type current limiting element 91 is sufficiently lower than the threshold voltage Vt of the PMOS transistor. Accordingly, the P-type current limiting element 91 can function as a bit line selection switch element having a current drive capability of a current IHR2 for high resistance writing, which is higher than the limited current value ILR2 in low resistance writing.

That is, by merely setting a voltage required for high resistance writing of the selected memory cell 51 to the global bit line 56 while setting the gate voltage VCMP of the P-type current limiting element 91 to the same value as in low resistance writing, a larger current than in low resistance writing can be caused to flow through the selected memory cell 51, ensuring that the selected memory cell is written to the high resistance state. According to the above-mentioned control, when changing the (4n+2)th layer memory cell M2 to the high resistance state, the memory cell M2 can be reliably changed to the high resistance state by causing a larger current than in low resistance writing to flow through the memory cell M2.

Figure 18E:
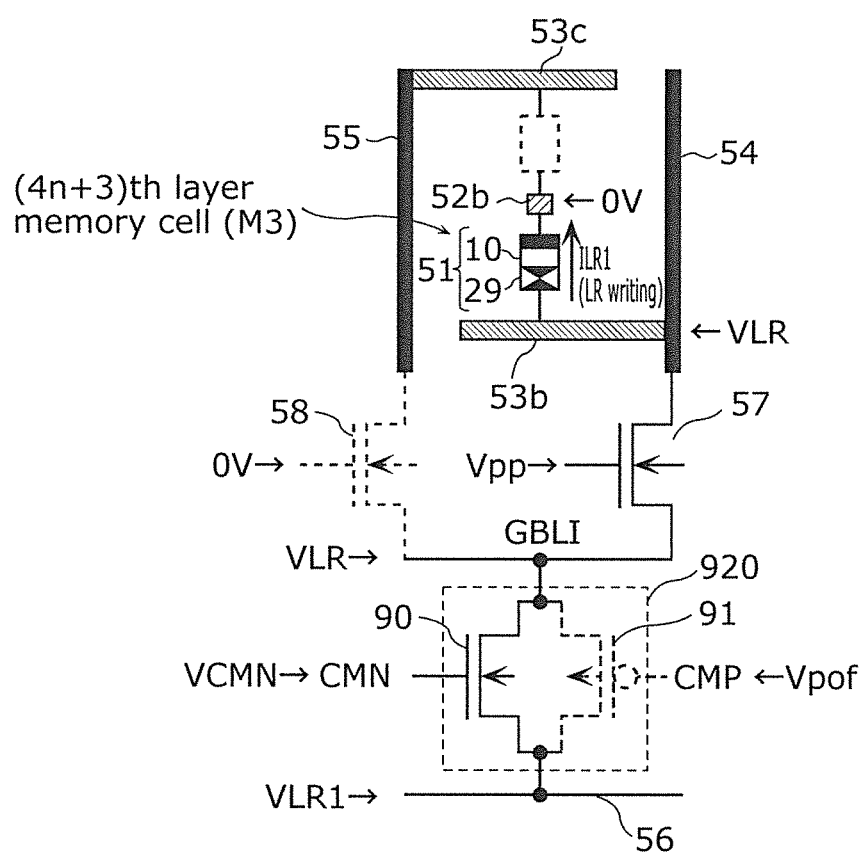
FIG. 18E is a diagram for describing a low resistance writing operation of a (4n+3)th layer memory cell in the source follower mode in the reference example.

(E) Operation of Writing the Memory Cell M3 in the (4n+3)th Layer (n is a Natural Number) to the Low Resistance State FIG. 18E is an equivalent circuit diagram showing an element connection structure from the global bit line 56 to the word line 52b in the cross section diagram in FIG. 11, for describing an operation of writing the (4n+3)th layer memory cell M3 to the low resistance state.

The equivalent circuit diagram in FIG. 18E differs from the equivalent circuit diagram in FIG. 18A in the placement layer of the memory cell 51, the word line and the bit line related to the memory cell 51, and the bit line selection switch element for selecting the odd layer or even layer bit line, but the other parts are the same as in FIG. 18A. Accordingly, only the difference from FIG. 18A is described below.

In FIG. 18E, reference numeral 51 is the selected memory cell M3 in the (4n+3)th layer, 57 is the even layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a higher voltage is applied to the global bit line 56 with respect to the word line 52b so that a current flows in a direction of the global bit line 56→the bidirectional current limiting circuit 920→the even layer bit line selection switch element 57→the bit line 53b→the selected memory cell 51→the word line 52b.

When writing the memory cell M3 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines). Here, Vpp is a voltage that is sufficiently higher than the threshold voltage of the even layer bit line selection switch element 57, and is stepped-up to be greater than or equal to the power voltage Vcc.

The operating conditions of the bidirectional current limiting circuit 920, the global bit line 56, and the word line 52b are the same as in (A) (the word line 52b is operated in the same way as the word line 52a), and so their description is omitted here.

According to the above-mentioned control, when changing the (4n+3)th layer memory cell M3 to the low resistance state, the memory cell M3 can be changed to the low resistance state of a desired resistance value by current limitation in the source follower mode.

Figure 18F:
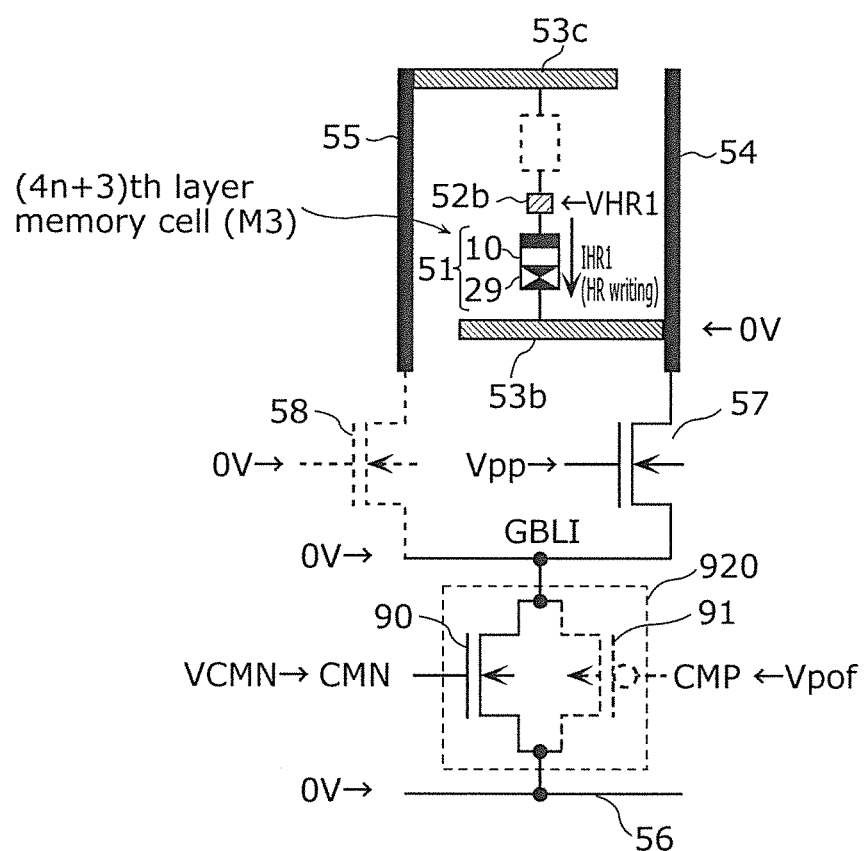
FIG. 18F is a diagram for describing a high resistance writing operation of the (4n+3)th layer memory cell in the source follower mode in the reference example.

(F) Operation of Writing the Memory Cell M3 in the (4n+3)th Layer (n is a Natural Number) to the High Resistance State FIG. 18F is an equivalent circuit diagram showing an element connection structure from the global bit line 56 to the word line 52b in the cross section diagram in FIG. 11, for describing an operation of writing the (4n+3)th layer memory cell M3 to the high resistance state.

The equivalent circuit diagram in FIG. 18F differs from the equivalent circuit diagram in FIG. 18B in the placement layer of the memory cell 51, the word line and the bit line related to the memory cell 51, and the bit line selection switch element for selecting the odd layer or even layer bit line, but the other parts are the same as in FIG. 18B. Accordingly, only the difference from FIG. 18B is described below.

Though the same structure as in FIG. 18E is used in FIG. 18F, a higher voltage is applied to the word line 52b with respect to the global bit line 56, to cause a flow of a current in a direction from the word line 52b to the bit line 53b.

When writing the memory cell M3 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines).

The operating conditions of the bidirectional current limiting circuit 920, the global bit line 56, and the word line 52b are the same as in (B) (the word line 52b is operated in the same way as the word line 52a), and so their description is omitted here.

According to the above-mentioned control, when changing the (4n+3)th layer memory cell M3 to the high resistance state, the memory cell M3 can be reliably changed to the high resistance state by causing a larger current than in low resistance writing to flow through the memory cell M3.

Figure 18G:
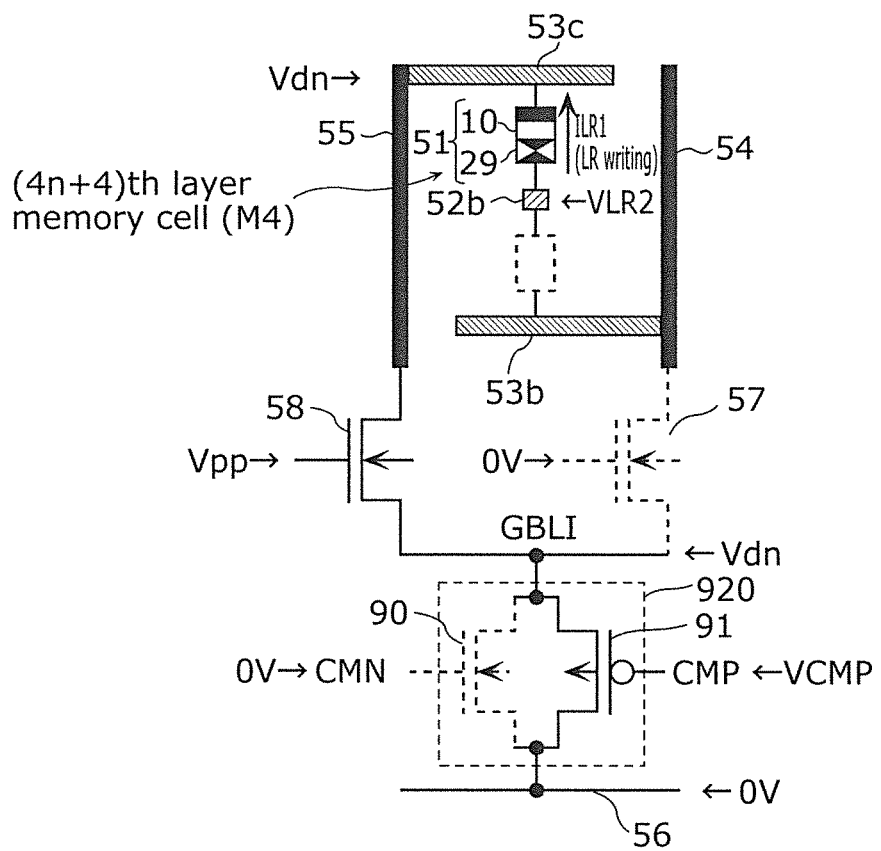
FIG. 18G is a diagram for describing a low resistance writing operation of a (4n+4)th layer memory cell in the source follower mode in the reference example.

(G) Operation of Writing the Memory Cell M4 in the (4n+4)th Layer (n is a Natural Number) to the Low Resistance State FIG. 18G is an equivalent circuit diagram showing an element connection structure from the global bit line 56 to the word line 52b in the cross section diagram in FIG. 11, for describing an operation of writing the (4n+4)th layer memory cell M4 to the low resistance state.

The equivalent circuit diagram in FIG. 18G differs from the equivalent circuit diagram in FIG. 18C in the placement layer of the memory cell 51, the word line and the bit line related to the memory cell 51, and the bit line selection switch element for selecting the odd layer or even layer bit line, but the other parts are the same as in FIG. 18C. Accordingly, only the difference from FIG. 18C is described below.

In FIG. 18G, reference numeral 51 is the selected memory cell M4 in the (4n+4)th layer, 58 is the odd layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a higher voltage is applied to the word line 52*b* with respect to the global bit line 56 so that a current flows in a direction of the word line 52*b*→the selected memory cell 51→the bit line 53*c*→the odd layer bit line selection switch element 58→the bidirectional current limiting circuit 920→the global bit line 56.

When writing the memory cell M4 to the low resistance state, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

The operating conditions of the bidirectional current limiting circuit 920, the global bit line 56, and the word line 52*b* are the same as in (C) (the word line 52*b* is operated in the same way as the word line 52*a*), and so their description is omitted here.

According to the above-mentioned control, when changing the (4n+4)th layer memory cell M4 to the low resistance state, the memory cell M4 can be changed to the low resistance state of a desired resistance value by current limitation in the source follower mode.

Figure 18H:
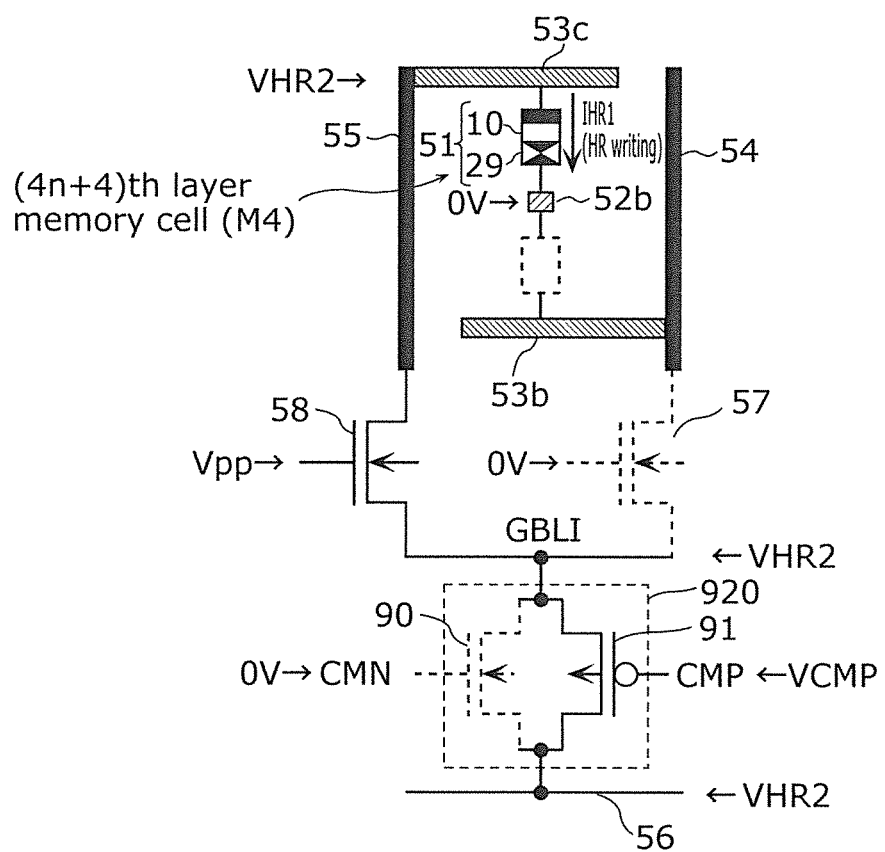
FIG. 18H is a diagram for describing a high resistance writing operation of the (4n+4)th layer memory cell in the source follower mode in the reference example.
Figure 19:
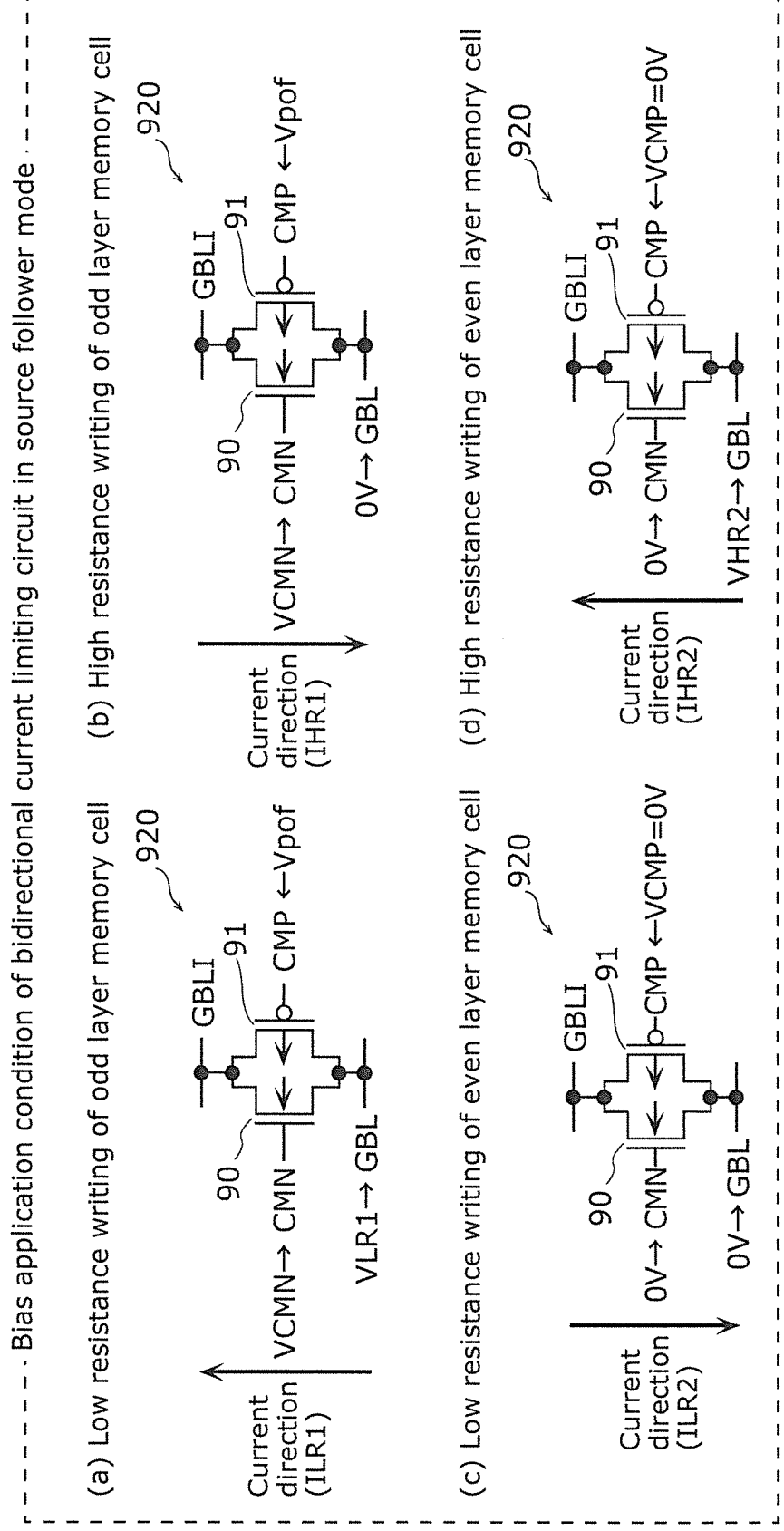
FIGS. 19(a) to 19(d) is a circuit diagram of a bidirectional current limiting circuit for describing a bias in low resistance writing of an odd layer memory cell, high resistance writing of an odd layer memory cell, low resistance writing of an even layer memory cell, and high resistance writing of an even layer memory cell in the source follower mode respectively in the reference example.
Figure 20:
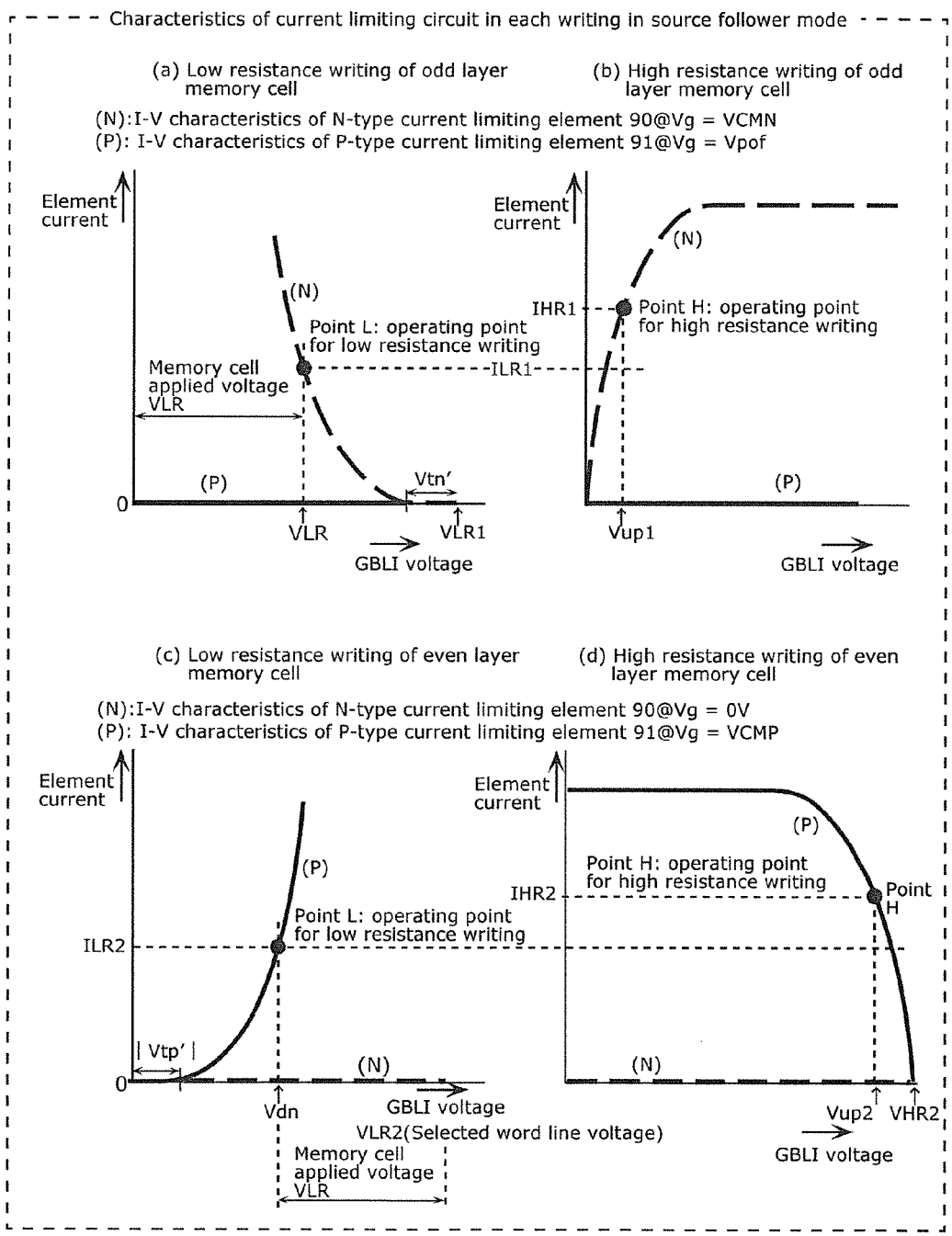
FIGS. 20(a) to 20(d) is a characteristic diagram of the bidirectional current limiting circuit for describing a bias in low resistance writing of an odd layer memory cell, high resistance writing of an odd layer memory cell, low resistance writing of an even layer memory cell, and high resistance writing of an even layer memory cell in the source follower mode respectively in the reference example.

(H) Operation of Writing the Memory Cell M4 in the (4n+4)th Layer (n is a Natural Number) to the High Resistance State FIG. 18H is an equivalent circuit diagram showing an element connection structure from the global bit line 56 to the word line 52*b* in the cross section diagram in FIG. 11, for describing an operation of writing the (4n+4)th layer memory cell M4 to the high resistance state.

The equivalent circuit diagram in FIG. 18H differs from the equivalent circuit diagram in FIG. 18D in the placement layer of the memory cell 51, the word line and the bit line related to the memory cell 51, and the bit line selection switch element for selecting the odd layer or even layer bit line, but the other parts are the same as in FIG. 18D. Accordingly, only the difference from FIG. 18D is described below.

Though the same structure as in FIG. 18G is used in FIG. 18H, a higher voltage is applied to the global bit line 56 with respect to the word line 52*b*, to cause a flow of a current in a direction from the bit line 53*c* to the word line 52*b*.

When writing the memory cell M4 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

The operating conditions of the bidirectional current limiting circuit 920, the global bit line 56, and the word line 52*b* are the same as in (D) (the word line 52*b* is operated in the same way as the word line 52*a*), and so their description is omitted here.

According to the above-mentioned control, when changing the (4n+4)th layer memory cell M4 to the high resistance state, the memory cell M4 can be reliably changed to the high resistance state by causing a larger current than in low resistance writing to flow through the memory cell M4.

Note that these operations are performed through selection of the memory cell layer, the word line, and the global bit line according to the address designated from outside.

Moreover, the writing to the low resistance state or the high resistance state is carried out by applying the above-mentioned voltages to the selected word line and the selected global bit line for a predetermined time (e.g. pulse drive of about 50 ns).

Besides, each unselected bit line other than the selected bit line and each unselected word line other than the selected word line may be set in a high impedance state, or a voltage may be applied to turn OFF a diode in each unselected memory cell.

As described above, in the source follower mode, when an odd layer memory cell is selected, the current limiting control circuit 99 controls the gate voltages of the N-type current limiting element 90 and the P-type current limiting element 91 so that one of the N-type current limiting element 90 and the P-type current limiting element 91 is ON and the other one of the N-type current limiting element 90 and the P-type current limiting element 91 is OFF (the N-type current limiting element 90 is ON in the above example). When an even layer memory cell is selected, on the other hand, the current limiting control circuit 99 controls the gate voltages of the N-type current limiting element 90 and the P-type current limiting element 91 so that the other one of the N-type current limiting element 90 and the P-type current limiting element 91 is ON and the one of the N-type current limiting element 90 and the P-type current limiting element 91 is OFF (the P-type current limiting element 91 is ON in the above example). Depending on whether the writing target memory cell is the odd layer memory cell or the even layer memory cell, the current limiting control circuit 99 turns ON only one of the N-type current limiting element 90 and the P-type current limiting element 91 that has a greater substrate bias effect in the case where the current for low resistance writing (flowing in a direction from the first variable resistance layer to the second variable resistance layer) flows between the selected global bit line and the selected word line through the NMOS transistor in the N-type current limiting element 90 and in the case where the current flows between the selected global bit line and the selected word line through the PMOS transistor in the P-type current limiting element 91. In this way, the memory cell is written to the low resistance state.

In the case of writing the memory cell to the low resistance state by voltage application that sets the voltage of the selected global bit line higher than the voltage of the selected word line (the case where the odd layer memory cell is selected and the second variable resistance layer is formed on the upper surface of the first variable resistance layer in the variable resistance element in the memory cell, in the above example), the current limiting control circuit 99 turns ON only the NMOS transistor in the N-type current limiting element 90. In the case of writing the memory cell to the low resistance state by voltage application that sets the voltage of the selected global bit line lower than the voltage of the selected word line (the case where the even layer memory cell is selected and the second variable resistance layer is formed on the upper surface of the first variable resistance layer in the variable resistance element in the memory cell, in the above example), the current limiting control circuit 99 turns ON only the PMOS transistor in the P-type current limiting element 91. In these operations of writing to the low resistance state, the current flowing through one of the N-type current limiting element 90 and the P-type current limiting element 91 in the case where the odd layer memory cell is selected and the current flowing through the other one of the N-type current limiting element 90 and the P-type current limiting element 91 in the case where the even layer memory cell is selected are opposite in current direction, and equal in absolute value within a predetermined range of fluctuations. The predetermined range of fluctuations is 10%, as an example.

The following method is used to adjust the limited current value. The current limiting control circuit 99 adjusts the gate voltage of the NMOS transistor in the N-type current limiting element 90 and the gate voltage of the PMOS transistor in the P-type current limiting element 91, so that the limited current value flowing through one of the N-type current limiting element 90 and the P-type current limiting element 91 which is a current limiting element capable of limiting the current flow in the direction of changing the memory cell to the low resistance state in the case where the odd layer memory cell is selected and the limited current value flowing through the other one of the N-type current limiting element 90 and the P-type current limiting element 91 which is a current limiting element capable of limiting the current flow in the direction of changing the memory cell to the low resistance state in the case where the even layer memory cell is selected are equal to each other. This makes it possible to reduce fluctuations in resistance value between the even layer memory cell and the odd layer memory cell.

Moreover, depending on the writing target layer, the current limiting control circuit 99 applies the same voltage to the gate terminal of the N-type current limiting element 90 or the P-type current limiting element 91, both in the case of writing the writing target memory cell to the high resistance state and in the case of writing the writing target memory cell to the low resistance state. In detail, in the above reference example, when the even layer memory cell is selected, the current limiting control circuit 99 uniformly applies a first voltage (VCMP in the above reference example) to the gate terminal of the P-type current limiting element 91 in both cases (while applying 0 V to the gate terminal of the N-type current limiting element 90 to turn OFF the N-type current limiting element 90). When the odd layer memory cell is selected, the current limiting control circuit 99 uniformly applies a second voltage (VCMN in the above reference example) to the gate terminal of the N-type current limiting element 90 in both cases (while applying Vpof to the gate terminal of the P-type current limiting element 91 to turn OFF the P-type current limiting element 91).

In more detail, let VLR be the voltage applied across both ends of the memory cell when writing the memory cell to the low resistance state, and Vtn be the threshold voltage of the NMOS transistor in the N-type current limiting element 90. The current limiting control circuit 99 applies a voltage greater than or equal to (Vtn+VLR) to the gate terminal of the N-type current limiting element 90, to turn ON the N-type current limiting element 90. On the other hand, the current limiting control circuit 99 applies 0 V to the gate terminal of the P-type current limiting element 91 (the limited current value when writing to the low resistance state is adjusted by the selected word line voltage VLR2), to turn ON the P-type current limiting element 91.

As described above, the source follower characteristics of the transistor in the bidirectional current limiting circuit 920 are used as the means of current limitation in low resistance writing, in such a manner that selectively switches between the NMOS transistor and the PMOS transistor constituting the bidirectional current limiting circuit 920 depending on whether the selected memory cell belongs to an odd layer or an even layer. Necessary conditions for writing the selected memory cell are summarized below.

[Necessary Conditions for Writing]

In the method according to Reference Example 1, writing to a predetermined memory cell layer is performed by respectively applying, to the PMOS transistor and the NMOS transistor constituting the bidirectional current limiting circuit 920, such gate voltages that turn ON one current limiting element out of the PMOS transistor and the NMOS transistor that is capable of a current limiting function in low resistance writing, as mentioned above.

Necessary conditions for this are described in detail below, with reference to FIGS. 19(a) to 19(d) and 20(a) to 20(d). FIGS. 19(a) to 19(d) is a diagram additionally showing current-voltage states of the bidirectional current limiting circuit 920 in the diagram in FIG. 11. FIGS. 20(a) to 20(d) is an Ids-Vds characteristic diagram of the N-type current limiting element 90 and the P-type current limiting element 91. In FIGS. 20(a) to 20(d), the characteristics of the N-type current limiting element 90 are shown by dashed lines, and the characteristics of the P-type current limiting element 91 are shown by solid lines. FIGS. 19(a) and 20(a) show the state of low resistance writing of the odd layer memory cell, FIGS. 19(b) and 20(b) show the state of high resistance writing of the odd layer memory cell, FIGS. 19(c) and 20(c) show the state of low resistance writing of the even layer memory cell, and FIGS. 19(d) and 20(d) show the state of high resistance writing of the even layer memory cell. The following description is based on a premise that the variable resistance element has a structure in which the second variable resistance layer 12 is formed on the first variable resistance layer 13 as shown in FIG. 9.

Necessary conditions for writing to the odd layer memory cell are listed first. It is assumed that the gate voltages applied to the P-type current limiting element 91 and the N-type current limiting element 90 are the same in low resistance writing and in high resistance writing.

(Condition 1) In low resistance writing, the global bit line GBL is set to a higher voltage than the word line, and a current flows from the bit line 53a into the memory cell 51 (a current direction from the first variable resistance layer 13 to the second variable resistance layer 12 in the variable resistance element, see FIG. 18A) (FIG. 19(a)).

Here, the same VCMN is applied to the gate of the transistor in the bidirectional current limiting circuit 920, to turn ON the N-type current limiting element 90 that, as a result of an increase in source voltage, has a greater substrate bias effect and so has a higher transistor threshold voltage Vt. Hence, the N-type current limiting element 90 operates in the source follower mode, thereby creating a current limiting state (the current for low resistance writing is limited to ILR1 at point L in FIG. 20(a)).

(Condition 2) In both low resistance writing and high resistance writing (where the word line is set to a higher voltage than the global bit line GBL, and a current flows out of the memory cell 51 to the bit line 53a (a current direction from the second variable resistance layer 12 to the first variable resistance layer 13 in the variable resistance element, see FIG. 18B), the gate voltage VCMN is applied to the P-type current limiting element 91 to turn OFF the P-type current limiting element 91 (see FIGS. 19(a) and 19(b)). Low resistance writing and high resistance writing are both performed through only the N-type current limiting element 90. In high resistance writing, the current flows in the direction in which the substrate bias effect of the N-type current limiting element 90 is lower than in low resistance writing, so that a larger current can be caused to flow (point H (IHR1 (current for high resistance writing)>ILR1) in FIG. 20(b)).

Necessary conditions for writing to the even layer memory cell are listed next. Since the current directions in high resistance writing and low resistance writing are reversed from Conditions 1 to 2, the P-type current limiting element 91 and the N-type current limiting element 90 are interchanged in function.

(Condition 3) In low resistance writing, the word line is set to a higher voltage than the global bit line GBL, and a current flows out of the memory cell 51 to the bit line 53b (a current direction from the first variable resistance layer 13 to the second variable resistance layer 12 in the variable resistance element, see FIG. 18C).

Here, the same VCMP is applied to the gate of the transistor in the bidirectional current limiting circuit 920, to turn ON the P-type current limiting element 91 that, as a result of a decrease in source voltage, has a greater substrate bias effect and so has a higher transistor threshold voltage Vt (FIG. 19(c)). Hence, the P-type current limiting element 91 operates in the source follower mode, thereby creating a current limiting state (the current for low resistance writing is limited to ILR2 at point L in FIG. 20(c)).

(Condition 4) In both low resistance writing and high resistance writing (where the global bit line GBL is set to a higher voltage than the word line, and a current flows from the bit line 53b into the memory cell 51 (a current direction from the second variable resistance layer 12 to the first variable resistance layer 13 in the variable resistance element, see FIG. 18D)), the gate voltage VCMP (=0 V) is applied to the gate of the transistor in the bidirectional current limiting circuit 920 so that the N-type current limiting element 90 is turned OFF (see FIGS. 19(c) and 19(d)). Low resistance writing and high resistance writing are both performed through only the P-type current limiting element 91. In high resistance writing, the current flows in the direction in which the substrate bias effect of the P-type current limiting element 91 is lower than in low resistance writing, so that a larger current can be caused to flow (point H (IHR2 (current for high resistance writing) >ILR2) in FIG. 20(d)).

Further, the following condition is applied in order to reduce fluctuations in resistance value between the odd layer memory cell and the even layer memory cell.

(Condition 5) The gate voltages, the write voltages, and the transistor sizes are adjusted so that the source follower current ILR1 of the N-type current limiting element 90 in Condition 1 and the source follower current ILR2 of the P-type current limiting element 91 in Condition 3 are equal.

The following describes a detailed design method for each condition.

(Regarding Condition 1)

FIG. 19(a) shows the voltage state of the bidirectional current limiting circuit 920 when performing low resistance writing on the odd layer memory cell. 0 V is applied to the selected word line 52a (see FIG. 18A), the current limiting voltage VCMN is applied to the node CMN connected to the gate terminal of the N-type current limiting element 90, and Vpof is applied to the node CMP connected to the gate terminal of the P-type current limiting element 91.

In this state, when the voltage VLR1 is applied to the global bit line GBL, the current ILR1 for low resistance writing flows through the memory cell, causing the voltage across both ends of the memory cell (i.e. the voltage between the selected word line and the intermediate node GBLI) to be equal to the voltage VLR for low resistance writing. Hence, the voltage of the intermediate node GBLI is substantially VLR. That is, the source of the N-type current limiting element 90 on the intermediate node GBLI side is VLR in voltage, and the drain of the N-type current limiting element 90 on the global bit line GBL side is VLR1 in voltage.

This being the case, since the NMOS transistor is in a state of being increased in source voltage, the threshold voltage of the NMOS transistor is Vtn' (>Vtn) which is higher than the threshold voltage Vtn in a normal state where the source voltage is 0 V.

Let Vgs be a gate voltage of a typical transistor, and Vt be a threshold voltage of the transistor. A condition for turning ON the transistor is $$Vgs > Vt.$$

Therefore, a condition for turning ON the N-type current limiting element 90 is $$VCMN - VLR > Vtn' \tag{1}.$$

Moreover, a maximum current Imax that can be caused to flow through the typical transistor is $$Imax = \beta n/2 \times (Vgs - Vt)^2$$

when it reaches a saturation region (i.e. a source follower operation). Accordingly, the maximum current ILR1 that can be caused to flow through the NMOS transistor in the source follower operation is expressed as $$ILR1 = \beta n/2 \times (VCMN - VLR - Vtn')^2 \tag{2}.$$

Here, $\beta n = W/L \times \mu n \times Cox$, where W denotes a channel width of the N-type current limiting element 90, L denotes a channel length of the N-type current limiting element 90, μn denotes an electron mobility, and Cox denotes an oxide film capacitance per unit area.

(Regarding Condition 2)

In the operating condition of Condition 1 (FIG. 19(a)), the source terminal of the P-type current limiting element 91 is on the global bit line GBL side that is higher in voltage. A condition for turning OFF the P-type current limiting element 91 is $$VCMN \geq VLR1 - |Vtp| \tag{3}.$$

When performing high resistance writing on the odd layer memory cell, the applied voltage is reversed in direction from the state in Condition 1, so that the source and the drain of the N-type current limiting element 90 are replaced with each other. The N-type current limiting element 90 operates in a direction in which the substrate bias effect is lower, and has the normal threshold voltage Vtn (<Vtn').

In this case, the N-type current limiting element 90 is turned ON when VCMN>Vtn. Though the current flowing through the N-type current limiting element 90 depends on the voltage VHR1 for high resistance writing applied to the word line 52a (while the global bit line GBL is 0 V as shown in FIG. 19(b)), the current in the saturation region of the N-type current limiting element 90 can be caused to flow at the maximum (see FIG. 20(b)).

That is, $$IHR1 \leq \beta n/2 \times (VCMN - Vtn)^2 \tag{4}.$$

Appropriately adjusting the voltage VHR1 for high resistance writing makes it possible to satisfy IHR1>ILR1.

(Regarding Condition 3)

Though the same method as in Condition 1 is employed, the P-type current limiting element 91 operates in the source follower mode instead of the N-type current limiting element 90 because the voltage direction is reversed.

FIG. 19(c) shows the voltage state of the bidirectional current limiting circuit 920 when performing low resistance writing on the even layer memory cell. VLR2 is applied to the selected word line 52a (see FIG. 18C), 0 V as an example of the current limiting voltage VCMP is applied to the node CMP connected to the gate terminal of the P-type current limiting element 91, and 0 V (=VCMP) as an example is applied to the node CMN connected to the gate terminal of the N-type current limiting element 90.

In this state, when 0 V is applied to the global bit line GBL, the current ILR2 for low resistance writing flows through the memory cell, causing the voltage across both ends of the memory cell (i.e. the voltage between the selected word line and the intermediate node GBLI) to be equal to the voltage VLR for low resistance writing. Hence, the voltage of the intermediate node GBLI is substantially (VLR2−VLR). That is, the source of the P-type current limiting element 91 on the intermediate node GBLI side is (VLR2−VLR) in voltage, and the drain of the P-type current limiting element 91 on the global bit line GBL side is 0 V in voltage.

This being the case, since the PMOS transistor is in a state of being decreased in source voltage, the threshold voltage of the PMOS transistor is |Vtp'| which is higher than the threshold voltage |Vtp| in a normal state (where the source voltage is VLR2, as an example).

A condition for turning ON the P-type current limiting element 91 is, from |Vgs|>|Vt|, $$VLR2-VLR>|Vtp| \quad (5)$$

Moreover, the maximum current ILR2 that can be caused to flow through the PMOS transistor when it reaches the saturation region (i.e. in the source follower operation) is, from $I=\beta p/2 \times (|Vgs|-|Vtp|)^2$, expressed as $$ILR2=\beta p/2 \times (VLR2-VLR-|Vtp'|)^2 \quad (6).$$

Here, $\beta p=W/L \times \mu p \times Cox$, where W denotes a channel width of the P-type current limiting element 91, L denotes a channel length of the P-type current limiting element 91, μp denotes a hole mobility, and Cox denotes an oxide film capacitance per unit area.

(Regarding Condition 4)

In the operating condition of Condition 4, the source terminal of the N-type current limiting element 90 is on the global bit line GBL side that is lower in voltage. A condition for turning OFF the N-type current limiting element 90 is $$VCMP \leq |Vtn| \quad (7).$$

When performing high resistance writing, the applied voltage is reversed in direction from the state in Condition 3, so that the source and the drain of the P-type current limiting element 91 are replaced with each other. The P-type current limiting element 91 operates in a direction in which the substrate bias effect is lower, and has the normal threshold voltage Vtp (|Vtp|<|Vtp'|).

Let VHR2 be the voltage for high resistance writing applied to the global bit line GBL. The P-type current limiting element 91 is turned ON when $$VCMP<VHR2-|Vtp|.$$

Though the current flowing through the P-type current limiting element 91 depends on the voltage VHR2 for high resistance writing, the current in the saturation region of the P-type current limiting element 91 can be caused to flow at the maximum.

That is, $$IHR2 \geq \beta p/2 \times (VHR2-VCMP-|Vtp|)^2.$$

When VCMP=0 V, $$IHR2 \leq \beta p/2 \times (VHR2-|Vtp|)^2 \quad (8).$$

Appropriately adjusting the voltage VHR2 for high resistance writing makes it possible to satisfy IHR2>ILR2.

(Regarding Condition 5)

ILR1=ILR2 in Condition 5 can be written as $$\beta n/2 \times (VCMN-VLR-Vtn')^2 \beta p/2 \times (VLR2-VLR-|Vtp'|)^2 \quad (9)$$

from Expressions (2) and (6).

This relation is satisfied by adjusting βn, βp, VCMN, and VLR2. Here, βn and βp are each a term proportional to a current drive capability of a transistor per unit length, where PMOS is typically about ½ in current drive capability of NMOS. Accordingly, by designing the transistor of the P-type current limiting element 91 to have the gate width (W) about twice the gate width of the transistor of the N-type current limiting element 90, in general only the magnitude relation between the squared terms in Expression (9) needs to be taken into consideration.

Besides, since the threshold voltages of NMOS and PMOS may be substantially equal in absolute value, the threshold voltages are set to be equal (Vtn'=|Vtp'|). As a result, the squared terms each relate to the relation of the gate voltage with respect to the source voltage. Therefore, by setting substantially the same relation for PMOS and NMOS, Expression (9) can be satisfied. That is, the following relational expression holds.

From VCMN−VLR=VLR2−VLR, $$VCMN=VLR2 \quad (10).$$

Though the above describes the case where βn and βp or the thresholds of the PMOS transistor and the NMOS transistor are the same for the sake of simplicity, they may instead be set to different values.

The following describes an example.

FIG. 21 is a graph showing the set voltage ranges of the node CMP and the node CMN connected to the gate terminals, in Conditions 1 to 5 described above.

The following examines a situation where a condition that maximizes the current limit is set in each of the case where the odd layer memory cell is selected and the case where the even layer memory cell is selected in FIG. 21, as an example.

From (1), the voltage condition of the voltage VCMN applied to the node CMN is $$VCMN>VLR+Vtn'.$$

Meanwhile, the current flowing through the memory cell in low resistance writing is $$ILR1=\beta n/2 \times (VCMN-VLR-Vtn')^2$$

in Expression (2), and $$ILR2=\beta p/2 \times (VLR2-VLR-|Vtp'|)^2$$

in Expression (6). When the gate voltage VCMN=VLR1 is applied, Expression (2) is $$ILR1=\beta n/2 \times (VLR1-VLR-Vtn')^2 \quad (11).$$

In the case where design is made such that βp=βn and Vtn=|Vtp| as mentioned earlier, by performing voltage control such that VLR1=VLR2, the drive currents of (i) and (ii) in FIG. 21 become equal to each other. Thus, the same resistance value can be set in the even layer and the odd layer.

When comparing Expressions (2) and (4), the threshold is Vtn'>Vtn, and the entry of Vgs is different. Hence, it is clear that $$VCMN>VCMN-VLR.$$

Accordingly, $$IHR1>ILR1.$$

When comparing Expressions (6) and (8), the threshold is |Vtp'|>|Vtp|, and the entry of Vgs is different. Hence, by setting VLR2 and VHR2 so that the relation $$VHR2 > VLR2 - VLR$$

holds, $$IHR2 > ILR2$$

can be satisfied. Typically, VLR2=VHR2, so that IHR2>ILR2 can be achieved.

Thus, the current in high resistance writing is higher than the current in low resistance writing for both the odd layer and the even layer, indicating that Condition 5 is satisfied.

In FIG. 21, a voltage difference A (=VLR1−VLR) corresponds to a voltage drop due to an impedance between the source and the drain of the N-type current limiting element 90 when the voltage VLR1 for low resistance writing is applied to the global bit line GBL to cause the current ILR1 for low resistance writing to flow. A voltage difference B (=VLR2−VLR) corresponds to a voltage drop due to an impedance between the source and the drain of the P-type current limiting element 91 when the voltage VLR2 for low resistance writing is applied to the selected word line to cause the current ILR2 for low resistance writing to flow. This being so, the relation (VLR2− VLR<VLR<VLR1) can be satisfied by designing the transistor width W of each of the P-type current limiting element 91 and the N-type current limiting element 90 to an appropriate width or more so that the impedance of the transistor in low resistance writing is lower than the low resistance state of the memory cell (the impedance of the transistor is less than or equal to VLR/ILR1 or VLR/ILR2).

Table 2 shows set voltages of main signals in association with each of the operations of the memory cells M1 to M4 of the different layers.

TABLE 2

|  | Writing to odd layer | | Writing to even layer | |
| --- | --- | --- | --- | --- |
|  | LR (A, E) | HR (B, F) | LR (C, G) | HR (D, H) |
| Gate voltage of odd layer bit line selection switch element 58 | Vpp (A) 0 V (E) | Vpp (B) 0 V (F) | 0 V (C) Vpp (G) | 0 V (D) Vpp (H) |
| Gate voltage of even layer bit line selection switch element 57 | 0 V (A) Vpp (E) | 0 V (B) Vpp (F) | Vpp (C) 0 V (G) | Vpp (D) 0 V (H) |
| Voltage of CMN | VCMN | | 0 V | |
| Voltage of CMP | Vpof | | VCMP = 0 V | |
| Global bit line | VLR1 | 0 V | 0 V | VHR2 |
| Selected word line | 0 V | VHR1 | VLR2 | 0 V |
| Drive current of N-type current limiting element 90 | $\beta n/2 \times (VCMN - VLR - Vtn')^2$ | $\leq \beta n/2 \times (VCMN - Vtn)^2$ | 0 | |
| Drive current of P-type current limiting element 91 | | 0 | $\beta p/2 \times (VLR2 - VLR - |Vtp'|)^2$ | $\leq \beta p/2 \times (VHR2 - |Vtp|)^2$ |

The odd layer bit line selection switch element 58 and the even layer bit line selection switch element 57 each include an NMOS transistor in this reference example. It is desirable to apply, as the gate voltage Vpp in the ON state, at least a voltage higher than (VHR2+Vtn) to the even layer bit line selection signal or the odd layer bit line selection signal, for a sufficient reduction in impedance when the N-type current limiting element 90 or the P-type current limiting element 91 functions as a current limiter.

Though the design methods of Conditions 1 to 5 are described above based on the operation principle, there are various fluctuations in actual circuit operations. Accordingly, even when design is made such that βp=βn, for example, there is a possibility that the resistance value set in the even layer and the resistance value set in the odd layer do not exactly match. The conditions such as the equality relations described here have an acceptable error range of about 10% as with a typical fluctuation tolerance, though depending on factors such as specifications of products envisioned.

Moreover, the voltages VCMP, VCMN, VLR1, VHR1, VLR2, and VHR2 designed based on these conditions may be subject to fine adjustment in a manufacturing stage by a trimming means typically known as a fuse programming circuit, to achieve more optimal states.

It is not desirable that a difference in characteristics between the odd layer bit line selection switch element 58 and the even layer bit line selection switch element 57 causes a difference in current limiting effect between when the first layer memory cell is selected and when the second layer memory cell is selected. Hence, the gate voltage of each bit line selection switch element may be set to be higher than at least the gate voltage VCMN of the N-type current limiting element 90, with a voltage stepped-up from the power voltage of the whole circuit or VCMN by about the threshold voltage being applied to each of the even layer bit line selection signal and the odd layer bit line selection signal.

As can be understood from the above description, the voltage applied to the global bit line or the word line needs to be at least greater than or equal to a total sum of the write voltage of the variable resistance element, the threshold voltage VF of the diode element (a total sum of the write voltage and VF substantially corresponds to the voltage VLR or VHR for the resistance change of the memory cell 51), the threshold voltage of the even layer bit line selection switch element or the odd layer bit line selection switch element, and the threshold voltage Vtn or Vtp of the N-type current limiting element 90 or the P-type current limiting element 91. In the above reference example, a voltage of about 5 V is necessary as a voltage for driving the cross point memory.

As a result of the voltage settings described above, current limiting writing for setting the resistance value of the low resistance state can be stably performed for all layers.

Besides, the voltages of the node CMN and the node CMP are the same in low resistance writing and high resistance writing of the memory cell of the same layer (see Tables 1 to 2), and so low resistance writing and high resistance writing can be performed in the same manner merely by changing the voltages of the global bit line 56 and the selected word line 52 related to the selected memory cell.

Therefore, even in the case where low resistance writing and high resistance writing for the memory cell of the same layer are performed in a plurality of blocks in the memory cell array 200 at the same time, the same voltage values can be used for VCMN0 to VCMN15 and VCMP0 to VCMP15 supplied on a block-by-block basis as shown in FIG. 14. Since only one current limiting control circuit is required, simpler circuitry can be achieved. In addition, it is also possible to easily and quickly execute inverse writing methods such as a method whereby, in low resistance writing, high resistance writing is first performed to create the high resistance state and then low resistance writing is performed and a method whereby, in high resistance writing, low resistance writing is first performed to create the low resistance state and then high resistance writing is performed.

As described above, according to this reference example, a multilayer cross point memory capable of stably performing current limiting writing for setting the resistance value of the low resistance state for all layers can be realized in a nonvolatile memory device of a multilayer cross point memory structure in which cross point memory array layers of the same structure are stacked.

Reference Example 2

In Reference Example 1, in the operation of writing to the multilayer cross point nonvolatile memory device, only one transistor out of the N-type current limiting element 90 and the P-type current limiting element 91 that has a greater substrate bias effect in a direction in which a current for low resistance writing flows through the memory cell is activated depending on the writing target memory array layer to which the memory cell belongs, to thereby perform the low resistance writing operation. In such low resistance writing, the current flow is limited in the source follower operation mode (i.e. the source follower mode).

Reference Example 2 is based on the same structure in which the N-type current limiting element 90 and the P-type current limiting element 91 are included, but differs in control method. Depending on the writing target memory array layer, a desired gate voltage is applied to the gate terminal of each of the N-type current limiting element 90 and the P-type current limiting element 91 so that one current limiting element is used for low resistance writing and the other current limiting element is used for high resistance writing. In this case, when causing the current in the low resistance writing direction to flow through the memory cell of the writing target layer, a transistor out of the N-type current limiting element 90 and the P-type current limiting element 91 that has a lower substrate bias effect is activated to perform the low resistance writing operation. An operation mode (saturation current limiting mode) in which an appropriate gate voltage is set to limit the current flow so that this transistor operates in a saturation region is described here. When causing the current in the high resistance writing direction to flow, a transistor out of the N-type current limiting element 90 and the P-type current limiting element 91 that is different from the one in low resistance writing is used in a sufficient ON state.

In this mode, a voltage generation circuit for applying a desired gate voltage to the current limiting circuit is further included.

[Description of Operating Voltage Setting]

In the saturation current limiting mode, the nonvolatile memory device has the same structure as above, so that eight types of operation states (A') to (H') are assumed as in the above example.

Table 3 shows set voltages of main signals in the diagram of the basic structure shown in FIG. 11, in association with each of the operations of the memory cells M1 to M4 of the different layers. In the table, "(ON: SAT)" means that the current limiting element is current-limited in the saturation region.

TABLE 3

|  | Writing to M1 | | Writing to M2 | | Writing to M3 | | Writing to M4 | |
| --- | --- | --- | --- | --- | --- | --- | --- | --- |
|  | LR (A') | HR (B') | LR (C') | HR (D') | LR (E') | HR (F') | LR (G') | HR (H') |
| Gate voltage of odd layer bit line selection switch element 58 | Vpp (ON) | Vpp (ON) | 0 V (OFF) | 0 V (OFF) | 0 V (OFF) | 0 V (OFF) | Vpp (ON) | Vpp (ON) |
| Gate voltage of even layer bit line selection switch element 57 | 0 V (OFF) | 0 V (OFF) | Vpp (ON) | Vpp (ON) | Vpp (ON) | Vpp (ON) | 0 V (OFF) | 0 V (OFF) |
| Voltage of CMN | Vnsn (OFF) | Vnsn (ON) | VCMN (ON: SAT) | VCMN (OFF) | Vnsn (OFF) | Vnsn (ON) | VCMN (ON: SAT) | VCMN (OFF) |
| Voltage of CMP | VCMP (ON: SAT) | VCMP (OFF) | Vnsp (OFF) | Vnsp (ON) | VCMP (ON: SAT) | VCMP (OFF) | Vnsp (OFF) | Vnsp (ON) |
| Global bit line | VLR3 | 0 V | 0 V | VHR4 | VLR3 | 0 V | 0 V | VHR4 |
| Selected word line | 0 V | VHR3 | VLR4 | 0 V | 0 V | VHR3 | VLR4 | 0 V |

The following describes examples of writing the memory cells 51 included in the first to fourth layer memory cells 51_a_ to 51_d_ as designated by M1 to M4 in FIG. 11, with reference to FIGS. 22A to 22H.

In this method, only one of the N-type current limiting element 90 and the P-type current limiting element 91 is turned ON, depending on whether to perform low resistance writing or high resistance writing on the memory cell of the same layer. That is, in the case of the current direction for writing to the low resistance state, one of the N-type current limiting element 90 and the P-type current limiting element 91 is set to an ON state of being current-limited by predetermined saturation region characteristics. In the case of the current direction for writing to the high resistance state, the other one of the N-type current limiting element 90 and the P-type current limiting element 91 is set to a sufficient ON state.

Figure 22A:
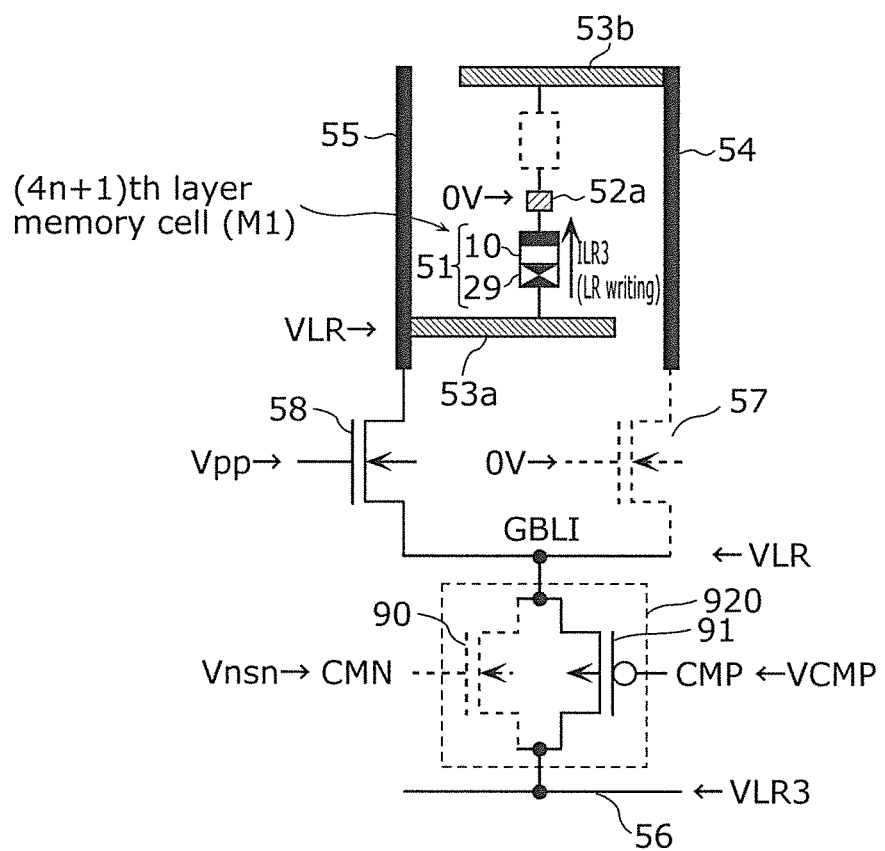
FIG. 22A is a diagram for describing a low resistance writing operation of the (4n+1)th layer memory cell in the saturation current limiting mode in the reference example.

(A') Operation of Writing the Memory Cell M1 in the (4n+1)th Layer (n is a Natural Number) to the Low Resistance State FIG. 22A is an equivalent circuit diagram showing an element connection structure from the global bit line 56 to the word line 52_a_ in the cross section diagram in FIG. 11, for describing an operation of writing the (4n+1)th layer memory cell M1 to the low resistance state.

In FIG. 22A, reference numeral 51 is the selected memory cell M1 in the (4n+1)th layer, 57 is the even layer bit line selection switch element including an NMOS transistor, 58 is the odd layer bit line selection switch element including an NMOS transistor, 90 is the N-type current limiting element including an NMOS transistor, and 91 is the P-type current limiting element including a PMOS transistor. The N-type current limiting element 90 and the P-type current limiting element 91 are connected in parallel with each other at their source and drain terminals, thereby constituting the bidirectional current limiting circuit 920. In the low resistance writing operation, a voltage VLR3 greater than or equal to the voltage VLR required for low resistance writing is applied to the global bit line 56 with respect to the word line 52a so that a current flows in a direction of the global bit line 56→the bidirectional current limiting circuit 920→the odd layer bit line selection switch element 58→the bit line 53a→the selected memory cell 51→the word line 52a.

When writing the memory cell M1 to the low resistance state, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines). Here, Vpp is a voltage that is sufficiently higher than the threshold voltage of the odd layer bit line selection switch element 58, and is stepped-up to be greater than or equal to the power voltage Vcc.

In this case, the current limiting control circuit 99 applies a predetermined voltage Vnsn to the node CMN connected to the gate terminal of the N-type current limiting element 90, to turn OFF the N-type current limiting element 90. The current limiting control circuit 99 also applies the voltage VCMP that limits the current flowing through the selected memory cell 51 to a predetermined current ILR3 to the node CMP connected to the gate terminal of the P-type current limiting element 91, to set the P-type current limiting element 91 to an ON state of being current-limited to a predetermined current value. The word line decoder and driver circuit 74 applies 0 V (reference voltage) to the word line 52a connected to the selected memory cell 51, and the global bit line decoder and driver circuit 98 applies the voltage VLR3 to the global bit line 56 so that the voltage applied to the selected memory cell 51 is greater than or equal to the voltage VLR required for low resistance writing, thereby causing the current ILR3 to flow in a direction in which the selected memory cell 51 changes to the low resistance state.

Here, the P-type current limiting element 91 including a PMOS transistor operates in the saturation current region. In the case where the gate voltage VCMP of the P-type current limiting element 91 is a predetermined constant potential lower than the voltage VLR3 of the global bit line 56 by the threshold |Vtp| of the P-type current limiting element 91, the P-type current limiting element 91 can function as a constant current source.

That is, by setting the gate voltage VCMP of the P-type current limiting element 91 to an appropriate value with respect to the voltage VLR3 of the global bit line 56, a current limited to the predetermined current ILR3 for low resistance writing can be caused to flow through the selected memory cell 51 in a direction from the bit line 53a to the word line 52a to perform low resistance writing, enabling the memory cell 51 to be set to the low resistance state of a predetermined resistance value. According to the above-mentioned control, when changing the (4n+1)th layer memory cell M1 to the low resistance state, the memory cell M1 can be changed to the desired low resistance state by limiting the current for low resistance writing in the saturation current limiting mode.

Figure 22B:
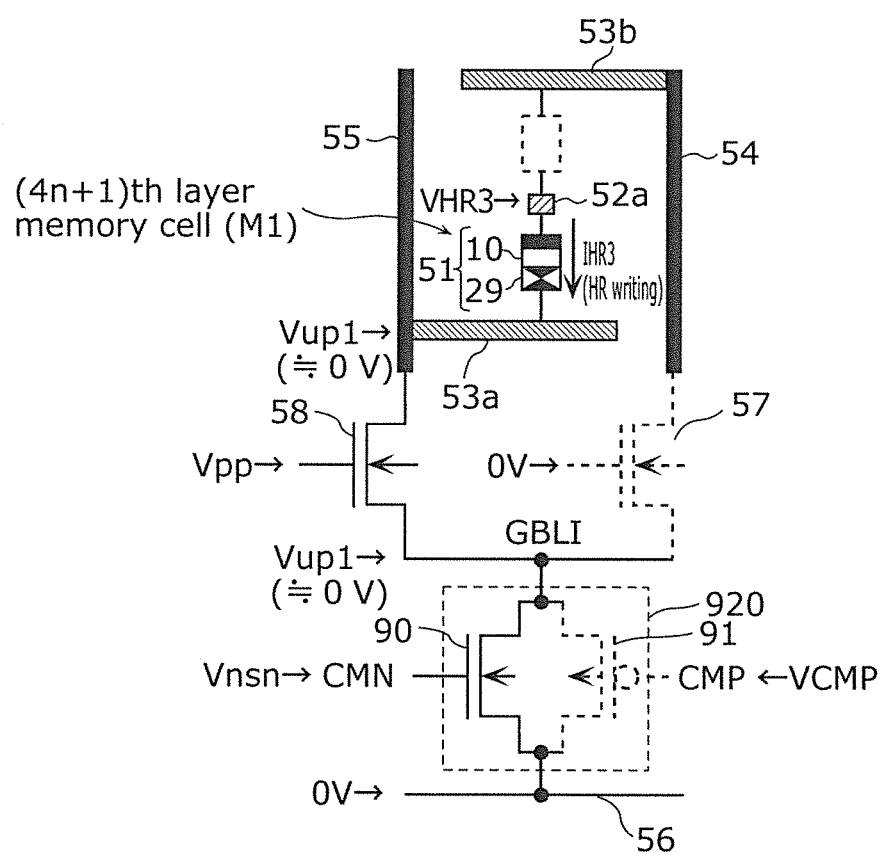
FIG. 22B is a diagram for describing a high resistance writing operation of the (4n+1)th layer memory cell in the saturation current limiting mode in the reference example.

(B') Operation of Writing the Memory Cell M1 in the (4n+1)th Layer (n is a Natural Number) to the High Resistance State FIG. 22B is an equivalent circuit diagram showing an element connection structure from the global bit line 56 to the word line 52a in the cross section diagram in FIG. 11, for describing an operation of writing the (4n+1)th layer memory cell M1 to the high resistance state. Though the same structure as in FIG. 22A is used here, a higher voltage VHR3 is applied to the word line 52a with respect to the global bit line 56, to cause a flow of a current in a direction from the word line 52a to the bit line 53a.

When writing the selected memory cell M1 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57.

In this case, the current limiting control circuit 99 applies the predetermined voltage VCMP (the same VCMP as applied in (A')) to the node CMP connected to the gate terminal of the P-type current limiting element 91, to turn OFF the P-type current limiting element 91. The current limiting control circuit 99 also applies the gate voltage Vnsn (the same Vnsn as applied in (A')) for sufficiently turning ON the N-type current limiting element 90 to the node CMN connected to the gate terminal of the N-type current limiting element 90, to turn ON the N-type current limiting element 90.

The global bit line decoder and driver circuit 98 applies 0 V (reference voltage) to the global bit line 56, and the word line decoder and driver circuit 74 applies the voltage VHR3 to the word line 52a so that the voltage across both ends of the selected memory cell 51 is greater than or equal to the voltage VHR required for high resistance writing, thereby causing a flow of a current in a direction in which the selected memory cell 51 changes to the high resistance state.

Here, the current limiting control circuit 99 applies the same voltage Vnsn as in low resistance writing to the node CMN connected to the gate terminal of the N-type current limiting element 90, to turn ON the N-type current limiting element 90.

In this state, the source of the N-type current limiting element 90 including an NMOS transistor is on the side of the contact with the global bit line 56 set to 0 V. Such an N-type current limiting element 90 has a low substrate bias effect, and also the gate voltage Vnsn of the N-type current limiting element 90 is sufficiently higher than the threshold voltage Vtn of the NMOS transistor. Accordingly, the N-type current limiting element 90 can function as a bit line selection switch element having a current drive capability of causing the current IHR3 for high resistance writing, which is higher than the limited current value ILR3 in low resistance writing, to flow. This causes a potential of the first layer bit line 53a and the common contact GBLI to be a voltage obtained by adding a voltage drop (substantially 0 V) in the N-type current limiting element 90 to the voltage (0 V) of the global bit line 56, i.e. a voltage Vup1 which is substantially 0 V.

That is, by merely setting the voltage required for high resistance writing of the selected memory cell 51 to the selected word line 52a while setting the gate voltage Vnsn of the N-type current limiting element 90 to the same value as in low resistance writing, a larger current than in low resistance writing can be caused to flow through the selected memory cell 51, ensuring that the selected memory cell 51 is written to the high resistance state. According to the above-mentioned control, when changing the (4n+1)th layer memory cell M1 to the high resistance state, the memory cell M1 can be reliably changed to the high resistance state by causing a larger current than in low resistance writing to flow through the memory cell M1.

As is clear from (A') and (B'), in both low resistance writing and high resistance writing, the gate voltage of the N-type current limiting element 90 is Vnsn and the gate voltage of the P-type current limiting element 91 is VCMP in the bidirectional current limiting circuit 920. Thus, each gate voltage is unchanged even though the resistance change writing direction is different. The resistance change writing direction is controlled simply by setting the applied voltages of the global bit line GBL 56 and the word line 52a. In detail, in low resistance writing, 0 V is applied to the word line 52a and VLR3 is applied to the global bit line GBL 56, and the N-type current limiting element 90 is turned OFF and the P-type current limiting element 91 is set to a current-limited ON state. In high resistance writing, VHR3 is applied to the word line 52a and 0 V is applied to the global bit line GBL 56, and the N-type current limiting element 90 is turned ON and the P-type current limiting element 91 is turned OFF. This is a two-transistor switching mode in which the P-type current limiting element 91 is used in low resistance writing and the N-type current limiting element 90 is used in high resistance writing.

Thus, by using the same gate voltage of the current limiting element in high resistance writing and low resistance writing, a time required for changing the gate voltage can be saved, with it being possible to achieve a faster operation.

Figure 22C:
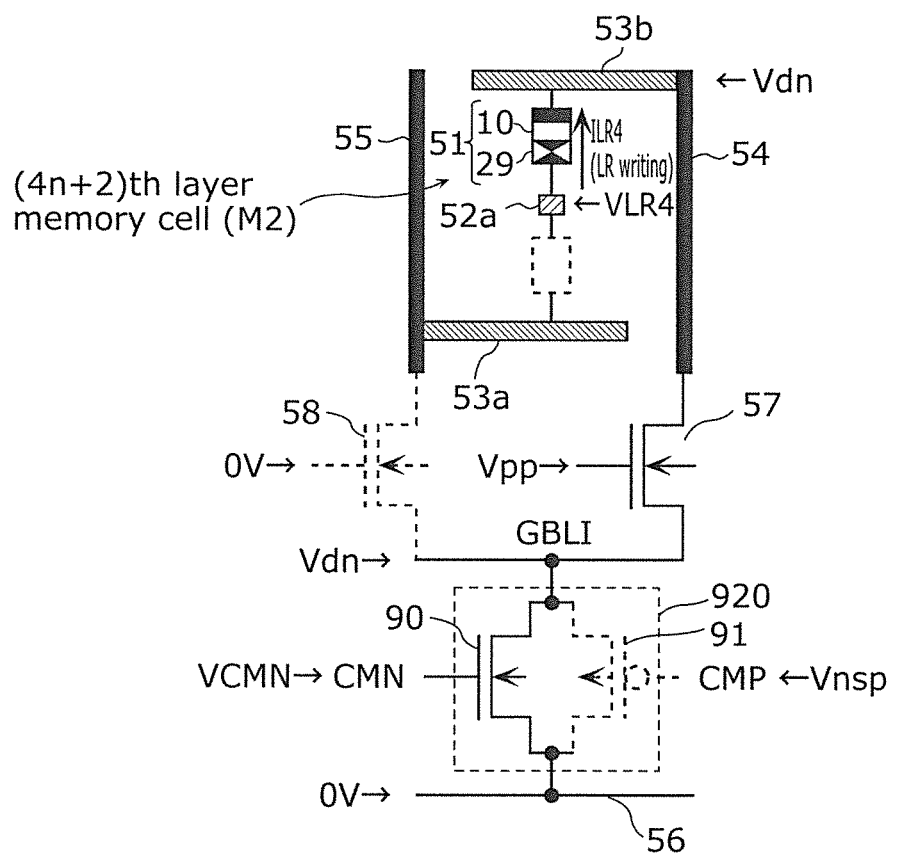
FIG. 22C is a diagram for describing a low resistance writing operation of the (4n+2)th layer memory cell in the saturation current limiting mode in the reference example.

(C') Operation of Writing the Memory Cell M2 in the (4n+2)th Layer (n is a Natural Number) to the Low Resistance State FIG. 22C is an equivalent circuit diagram showing an element connection structure from the global bit line 56 to the word line 52a in the cross section diagram in FIG. 11, for describing an operation of writing the (4n+2)th layer memory cell M2 to the low resistance state.

In FIG. 22C, reference numeral 51 is the selected memory cell M2 in the (4n+2)th layer, 57 is the even layer bit line selection switch element including an NMOS transistor, 58 is the odd layer bit line selection switch element including an NMOS transistor, 90 is the N-type current limiting element including an NMOS transistor, and 91 is the P-type current limiting element including a PMOS transistor. The N-type current limiting element 90 and the P-type current limiting element 91 are connected in parallel with each other at their source and drain terminals, thereby constituting the bidirectional current limiting circuit 920. In this operation, a high voltage VLR4 is applied to the word line 52a with respect to the global bit line 56 so that a current flows in a direction of the word line 52a→the selected memory cell 51→the bit line 53b→the even layer bit line selection switch element 57→the bidirectional current limiting circuit 920→the global bit line 56.

When writing the memory cell M2 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58.

Here, Vpp is a voltage that is sufficiently higher than the threshold voltage of the even layer bit line selection switch element 57, and is stepped-up to be greater than or equal to the power voltage Vcc.

In this case, the current limiting control circuit 99 applies a predetermined voltage Vnsp to the node CMP connected to the gate terminal of the P-type current limiting element 91, to turn OFF the P-type current limiting element 91. The current limiting control circuit 99 also applies the voltage VCMN that limits the current flowing through the selected memory cell 51 to a predetermined current ILR4 to the node CMN connected to the gate terminal of the N-type current limiting element 90, to set the N-type current limiting element 90 to a predetermined ON state of being current-limited. The word line decoder and driver circuit 74 applies a voltage VLR4 to the word line 52a connected to the selected memory cell 51 so that the voltage across the selected memory cell 51 is greater than or equal to the voltage VLR required for low resistance writing, and the global bit line decoder and driver circuit 98 applies 0 V (reference voltage) to the global bit line 56, thereby causing a flow of a current in a direction in which the selected memory cell 51 changes to the low resistance state.

Here, the N-type current limiting element 90 including an NMOS transistor operates in the saturation current region. In the case where the gate voltage VCMN of the N-type current limiting element 90 is a predetermined constant potential higher than the voltage (0 V) of the global bit line 56 by the threshold Vtn of the N-type current limiting element 90, the N-type current limiting element 90 can function as a constant current source.

That is, by setting the gate voltage VCMN of the N-type current limiting element 90 to an appropriate value with respect to the voltage (0 V) of the global bit line 56, a current limited to the predetermined current ILR4 can be caused to flow through the selected memory cell 51 in a direction from the word line 52a to the bit line 53b to perform low resistance writing, enabling the memory cell 51 to be set to the predetermined low resistance state. According to the above-mentioned control, when changing the (4n+2)th layer memory cell M2 to the low resistance state, the memory cell M2 can be changed to the desired low resistance state by limiting the current flow in the saturation current limiting mode.

The predetermined current ILR4 is set to be equal to the predetermined current ILR3 when writing the (4n+1)th memory cell to the low resistance state as described in (A'), by adjusting the gate voltages VCMN and VCMP and the transistor sizes of the N-type current limiting element 90 and the P-type current limiting element 91.

Figure 22D:
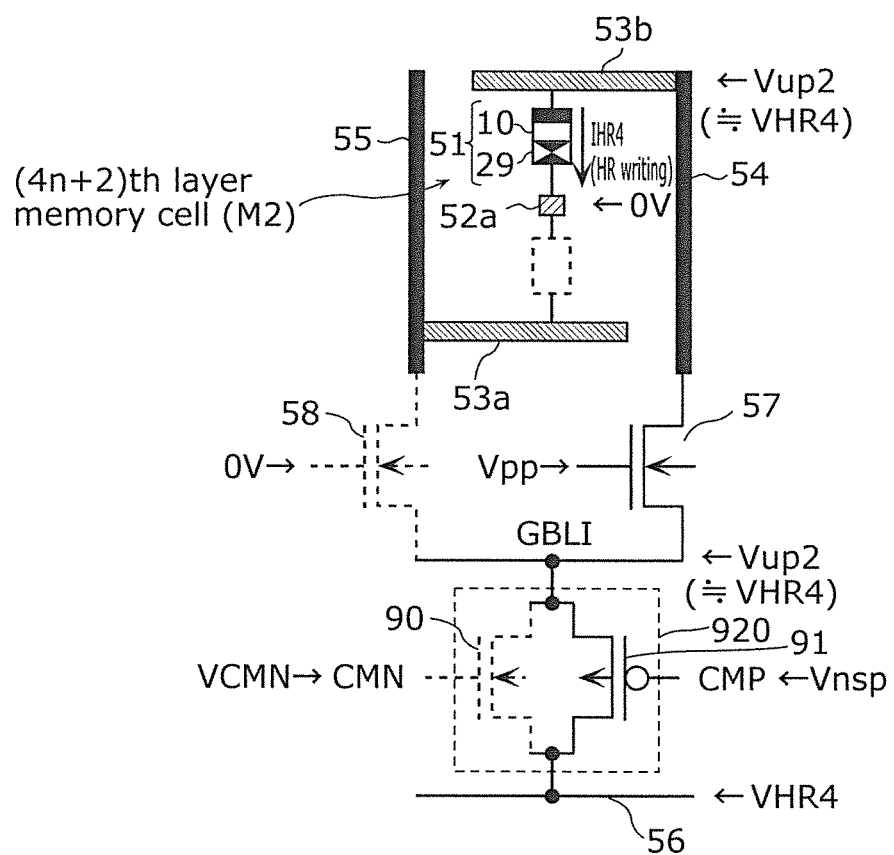
FIG. 22D is a diagram for describing a high resistance writing operation of the (4n+2)th layer memory cell in the saturation current limiting mode in the reference example.

(D') Operation of Writing the Memory Cell M2 in the (4n+2)th Layer (n is a Natural Number) to the High Resistance State FIG. 22D is an equivalent circuit diagram showing an element connection structure from the global bit line 56 to the word line 52a in the cross section diagram in FIG. 11, for describing an operation of writing the (4n+2)th layer memory cell M2 to the high resistance state. Though the same structure as in FIG. 22C is used here, a higher voltage VHR4 is applied to the global bit line 56 with respect to the word line 52a, to cause a flow of a current in a direction from the bit line 53b to the word line 52a.

When writing the selected memory cell M2 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58.

In this case, the current limiting control circuit 99 applies the predetermined voltage VCMN to the node CMN connected to the gate terminal of the N-type current limiting element 90, to turn OFF the N-type current limiting element 90. The current limiting control circuit 99 also applies the gate voltage Vnsp to the node CMP connected to the gate terminal of the P-type current limiting element 91, to turn ON the P-type current limiting element 91.

The word line decoder and driver circuit 74 applies 0 V (reference voltage) to the word line 52a, and the global bit line decoder and driver circuit 98 applies the voltage VHR4 to the global bit line 56 so that the voltage across both ends of the selected memory cell 51 is greater than or equal to the voltage VHR required for high resistance writing, thereby causing a flow of a current IHR4 in a direction in which the selected memory cell 51 changes to the high resistance state.

Here, the current limiting control circuit 99 applies the same voltage Vnsp as in low resistance writing to the node CMP connected to the gate terminal of the P-type current limiting element 91, to turn ON the P-type current limiting element 91.

In this state, the source of the P-type current limiting element 91 including a PMOS transistor is on the side of the contact with the global bit line 56 set to VHR4. Such a P-type current limiting element 91 has a low substrate bias effect, and also the source-to-gate voltage (VHR4−Vnsp) of the P-type current limiting element 91 is sufficiently higher than the threshold voltage Vt of the PMOS transistor. Accordingly, the P-type current limiting element 91 can function as a bit line selection switch element having a current drive capability of causing the current IHR4 for high resistance writing, which is higher than the limited current value ILR4 in low resistance writing, to flow. This causes a potential of the second layer bit line 53b and the common contact GBLI to be a voltage obtained by subtracting a voltage drop (substantially 0 V) in the P-type current limiting element 91 from the voltage VHR4 of the global bit line 56, i.e. a voltage Vup2 which is substantially the same potential as the voltage VHR4.

That is, by merely setting the voltage required for high resistance writing of the selected memory cell 51 to the global bit line 56 while setting the gate voltage Vnsp of the P-type current limiting element 91 to the same value as in low resistance writing, a larger current than in low resistance writing can be caused to flow through the selected memory cell 51, ensuring that the selected memory cell is written to the high resistance state. According to the above-mentioned control, when changing the (4n+2)th layer memory cell M2 to the high resistance state, the memory cell M2 can be reliably changed to the high resistance state by causing a larger current than in low resistance writing to flow through the memory cell M2.

As is clear from (C') and (D'), in both low resistance writing and high resistance writing, the gate voltage of the N-type current limiting element 90 is VCMN and the gate voltage of the P-type current limiting element 91 is Vnsp in the bidirectional current limiting circuit 920. Thus, each gate voltage is unchanged even though the resistance change writing direction is different. The resistance change writing direction is controlled simply by setting the applied voltages of the global bit line GBL 56 and the word line 52a. In detail, in low resistance writing, VLR4 is applied to the word line 52a and 0 V is applied to the global bit line GBL 56, and the N-type current limiting element 90 is set to a current-limited ON state and the P-type current limiting element 91 is turned OFF. In high resistance writing, 0 V is applied to the word line 52a and VHR4 is applied to the global bit line GBL 56, and the N-type current limiting element 90 is turned OFF and the P-type current limiting element 91 is turned ON. This is a two-transistor switching mode in which the N-type current limiting element 90 is used in low resistance writing and the P-type current limiting element 91 is used in high resistance writing.

Thus, by using the same gate voltage of the current limiting element in high resistance writing and low resistance writing, a time required for changing the gate voltage can be saved, with it being possible to achieve a faster operation.

Figure 22E:
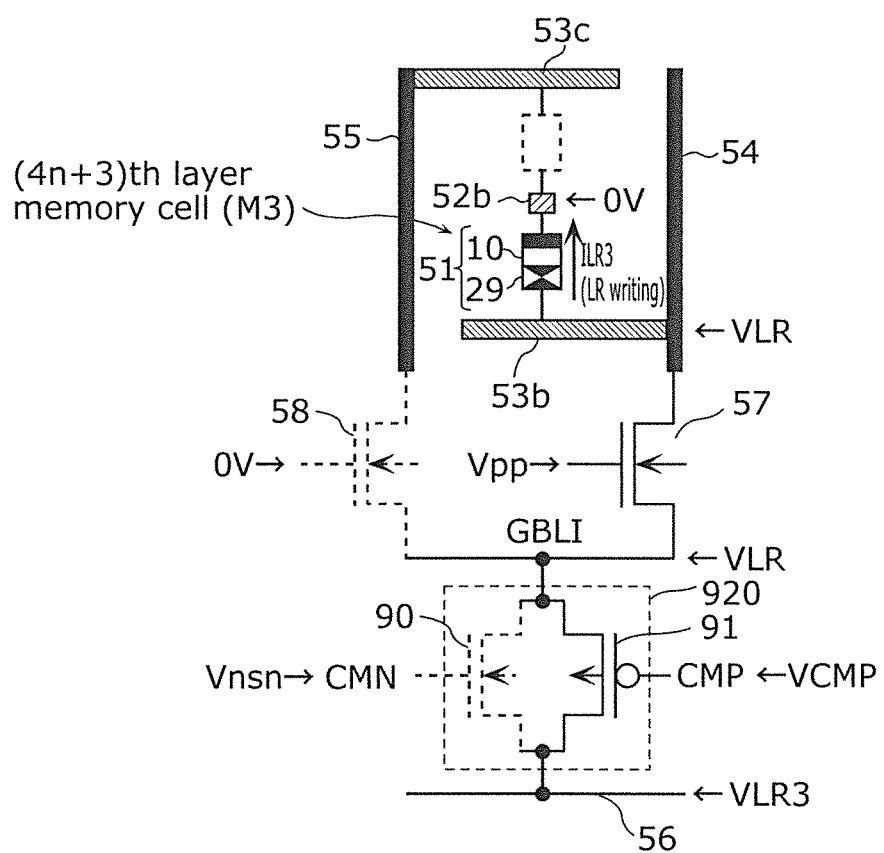
FIG. 22E is a diagram for describing a low resistance writing operation of the (4n+3)th layer memory cell in the saturation current limiting mode in the reference example.

(E') Operation of Writing the Memory Cell M3 in the (4n+3)th Layer (n is a Natural Number) to the Low Resistance State FIG. 22E is an equivalent circuit diagram showing an element connection structure from the global bit line 56 to the word line 52b in the cross section diagram in FIG. 11, for describing an operation of writing the (4n+3)th layer memory cell M3 to the low resistance state.

The equivalent circuit diagram in FIG. 22E differs from the equivalent circuit diagram in FIG. 22A in the placement layer of the memory cell 51, the word line and the bit line related to the memory cell 51, and the bit line selection switch element for selecting the odd layer or even layer bit line, but the other parts are the same as in FIG. 22A. Accordingly, only the difference from FIG. 22A is described below.

In FIG. 22E, reference numeral 51 is the selected memory cell M3 in the (4n+3)th layer, 57 is the even layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, the higher voltage VLR3 is applied to the global bit line 56 with respect to the word line 52b so that a current flows in a direction of the global bit line 56→the bidirectional current limiting circuit 920→the even layer bit line selection switch element 57→the bit line 53b→the selected memory cell 51→the word line 52b.

When writing the memory cell M3 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58. Here, Vpp is a voltage that is sufficiently higher than the threshold voltage of the even layer bit line selection switch element 57, and is stepped-up to be greater than or equal to the power voltage Vcc.

The operating conditions of the bidirectional current limiting circuit 920, the global bit line 56, and the word line 52b are the same as in (A') (the word line 52b is operated in the same way as the word line 52a), and so their description is omitted here.

According to the above-mentioned control, when changing the (4n+3)th layer memory cell M3 to the low resistance state, the memory cell M3 can be changed to the desired low resistance state by limiting the current flow in the saturation current limiting mode.

Figure 22F:
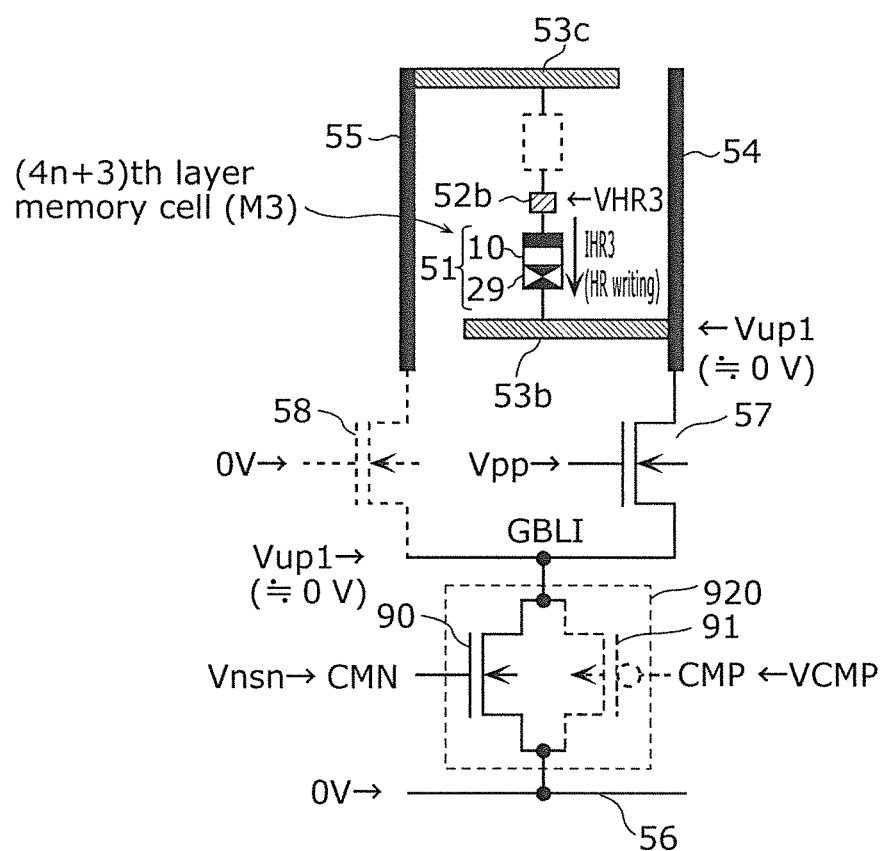
FIG. 22F is a diagram for describing a high resistance writing operation of the (4n+3)th layer memory cell in the saturation current limiting mode in the reference example.

(F') Operation of Writing the Memory Cell M3 in the (4n+3)th Layer (n is a Natural Number) to the High Resistance State FIG. 22F is an equivalent circuit diagram showing an element connection structure from the global bit line 56 to the word line 52b in the cross section diagram in FIG. 11, for describing an operation of writing the (4n+3)th layer memory cell M3 to the high resistance state.

The equivalent circuit diagram in FIG. 22F differs from the equivalent circuit diagram in FIG. 22B in the placement layer of the memory cell 51, the word line and the bit line related to the memory cell 51, and the bit line selection switch element for selecting the odd layer or even layer bit line, but the other parts are the same as in FIG. 22B. Accordingly, only the difference from FIG. 22B is described below.

Though the same structure as in FIG. 22E is used in FIG. 22F, the higher voltage VHR3 is applied to the word line 52b with respect to the global bit line 56, to cause a flow of the current IHR3 in a direction from the word line 52b to the bit line 53b.

When writing the memory cell M3 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58.

The operating conditions of the bidirectional current limiting circuit 920, the global bit line 56, and the word line 52b are the same as in (B') (the word line 52b is operated in the same way as the word line 52a), and so their description is omitted here.

According to the above-mentioned control, when changing the (4n+3)th layer memory cell M3 to the high resistance state, the memory cell M3 can be reliably changed to the high resistance state by causing the larger current IHR3 (>ILR3) than in low resistance writing to flow through the memory cell M3.

Figure 22G:
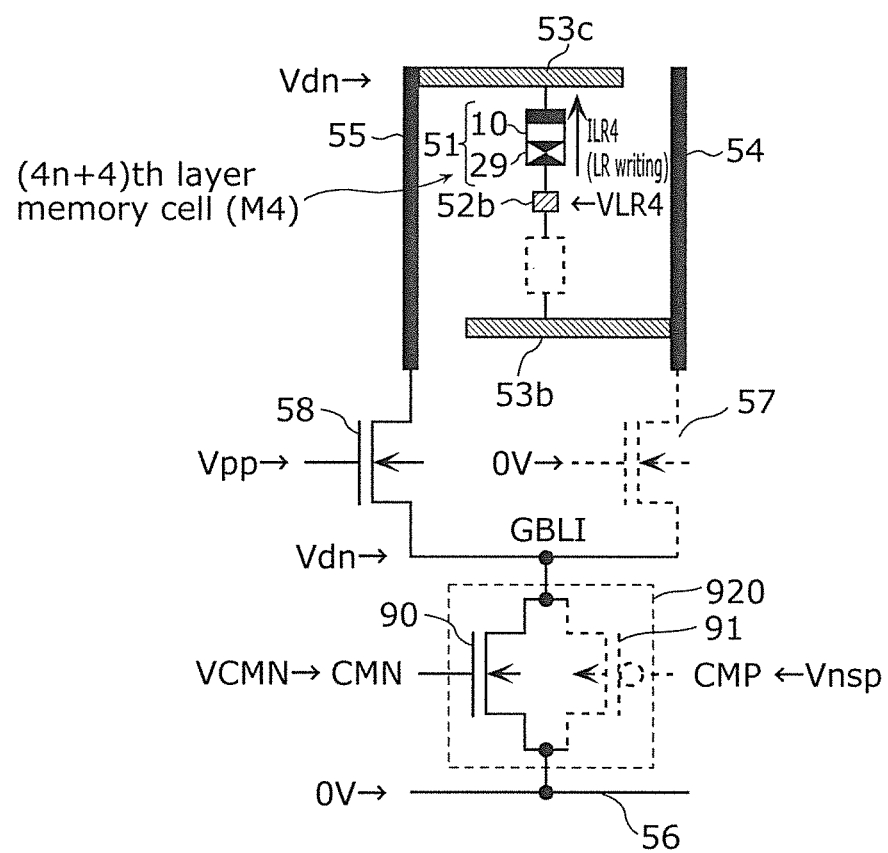
FIG. 22G is a diagram for describing a low resistance writing operation of the (4n+4)th layer memory cell in the saturation current limiting mode in the reference example.

(G') Operation of Writing the Memory Cell M4 in the (4n+4)th Layer (n is a Natural Number) to the Low Resistance State FIG. 22G is an equivalent circuit diagram showing an element connection structure from the global bit line 56 to the word line 52b in the cross section diagram in FIG. 11, for describing an operation of writing the (4n+4)th layer memory cell M4 to the low resistance state.

The equivalent circuit diagram in FIG. 22G differs from the equivalent circuit diagram in FIG. 22C in the placement layer of the memory cell 51, the word line and the bit line related to the memory cell 51, and the bit line selection switch element for selecting the odd layer or even layer bit line, but the other parts are the same as in FIG. 22C. Accordingly, only the difference from FIG. 22C is described below.

In FIG. 22G, reference numeral 51 is the selected memory cell M4 in the (4n+4)th layer, 58 is the odd layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, the higher voltage VLR4 is applied to the word line 52b with respect to the global bit line 56 so that a current flows in a direction of the word line 52b→the selected memory cell 51→the bit line 53c→the odd layer bit line selection switch element 58→the bidirectional current limiting circuit 920→the global bit line 56.

When writing the memory cell M4 to the low resistance state, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

The operating conditions of the bidirectional current limiting circuit 920, the global bit line 56, and the word line 52b are the same as in (C') (the word line 52b is operated in the same way as the word line 52a), and so their description is omitted here.

According to the above-mentioned control, when changing the (4n+4)th layer memory cell M4 to the low resistance state, the memory cell M4 can be changed to the desired low resistance state by limiting the current flow in the saturation current limiting mode.

Figure 22H:
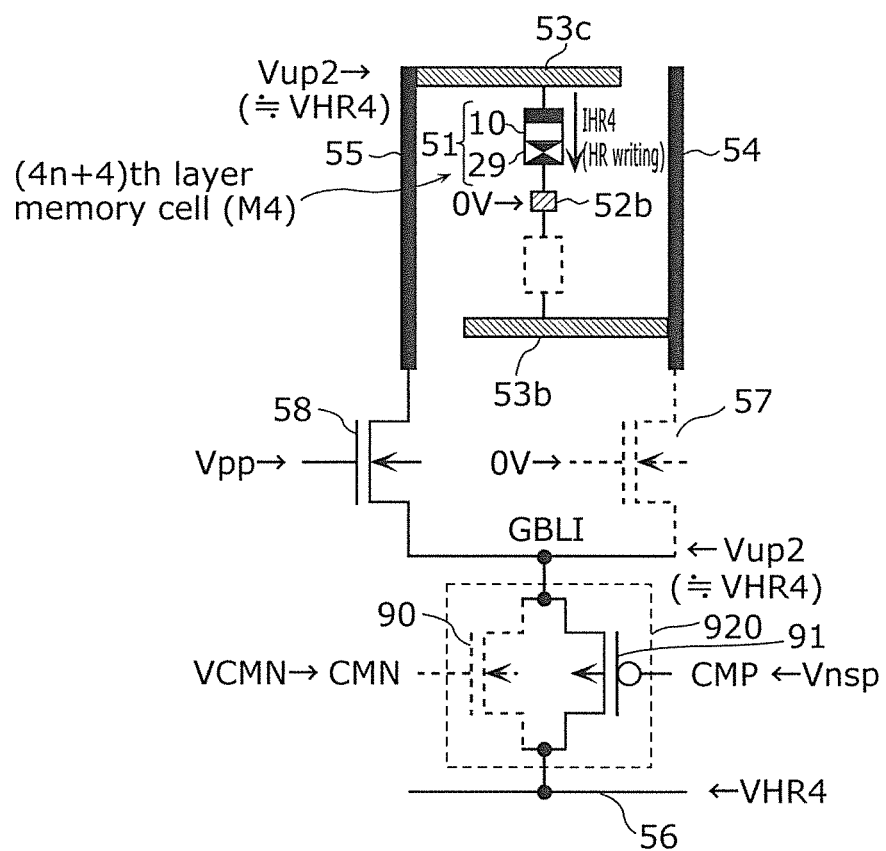
FIG. 22H is a diagram for describing a high resistance writing operation of the (4n+4)th layer memory cell in the saturation current limiting mode in the reference example.
Figure 23:
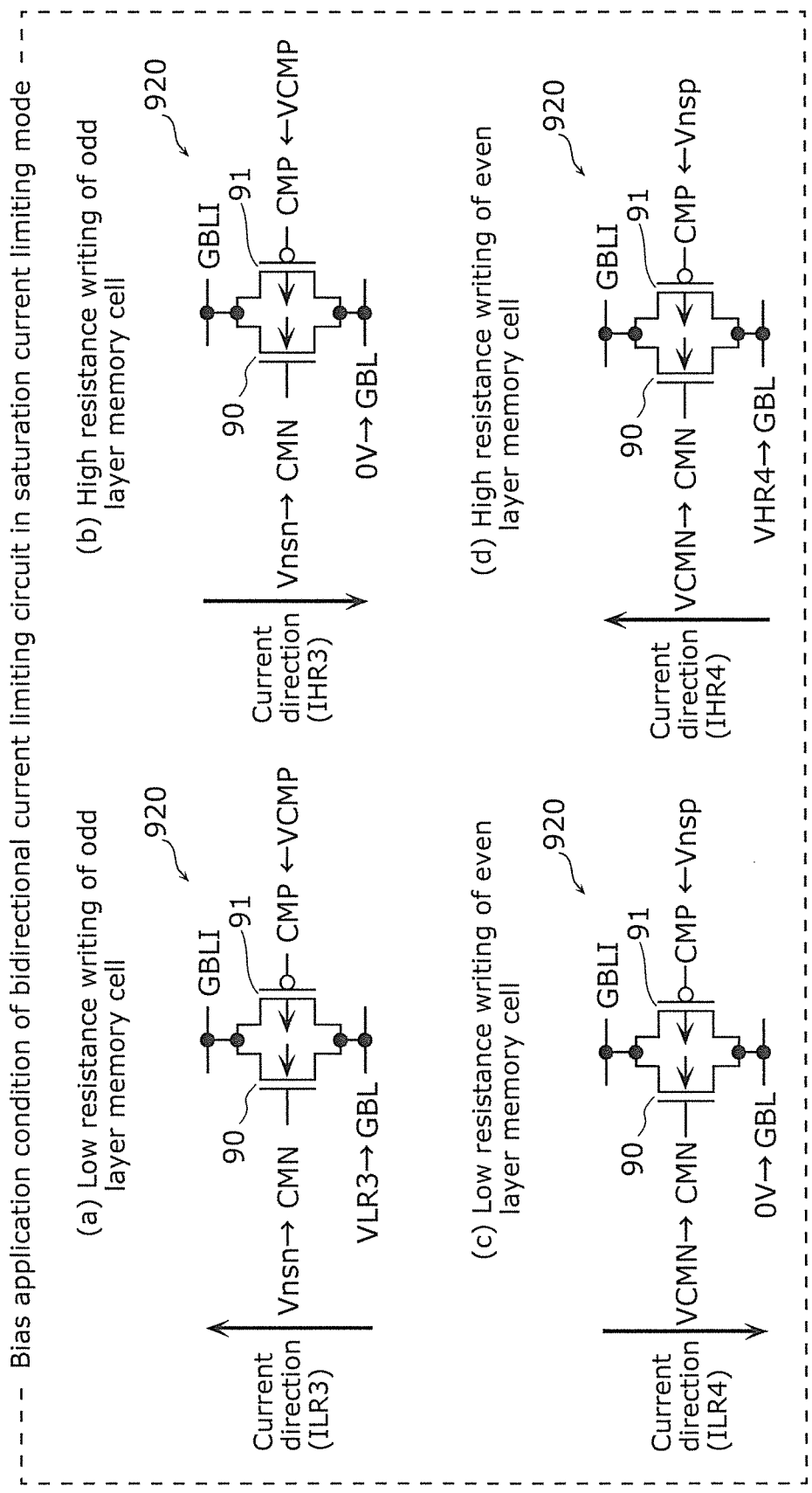
FIGS. 23(a) to 23(d) is a circuit diagram of the bidirectional current limiting circuit for describing a bias in low resistance writing of an odd layer memory cell, high resistance writing of an odd layer memory cell, low resistance writing of an even layer memory cell, and high resistance writing of an even layer memory cell in the saturation current limiting mode respectively in the reference example.

(H') Operation of Writing the Memory Cell M4 in the (4n+4)th Layer (n is a Natural Number) to the High Resistance State FIG. 22H is an equivalent circuit diagram showing an element connection structure from the global bit line 56 to the word line 52b in the cross section diagram in FIG. 11, for describing an operation of writing the (4n+4)th layer memory cell M4 to the high resistance state.

The equivalent circuit diagram in FIG. 22H differs from the equivalent circuit diagram in FIG. 22D in the placement layer of the memory cell 51, the word line and the bit line related to the memory cell 51, and the bit line selection switch element for selecting the odd layer or even layer bit line, but the other parts are the same as in FIG. 22D. Accordingly, only the difference from FIG. 22D is described below.

Though the same structure as in FIG. 22G is used in FIG. 22H, a higher voltage is applied to the global bit line 56 with respect to the word line 52b, to cause a flow of a current in a direction from the bit line 53c to the word line 52b.

When writing the memory cell M4 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57.

The operating conditions of the bidirectional current limiting circuit 920, the global bit line 56, and the word line 52b are the same as in (D') (the word line 52b is operated in the same way as the word line 52a), and so their description is omitted here.

According to the above-mentioned control, when changing the (4n+4)th layer memory cell M4 to the high resistance state, the memory cell M4 can be reliably changed to the high resistance state by causing the larger current IHR4 (>ILR4) than in low resistance writing to flow through the memory cell M4.

Note that these operations are performed through selection of the memory cell layer, the word line, and the global bit line according to the address designated from outside.

Moreover, the writing to the low resistance state or the high resistance state is carried out by applying the above-mentioned voltages to the selected word line and the selected global bit line for a predetermined time (e.g. pulse drive of about 50 ns).

Besides, each unselected bit line other than the selected bit line and each unselected word line other than the selected word line may be set in a high impedance state, or a voltage may be applied to turn OFF a diode in each unselected memory cell.

As described above, in the saturation current limiting mode, the current limiting control circuit 99: applies, in the case where the even layer memory cell is selected, a first voltage to the gate terminal of the N-type current limiting element 90 and a second voltage to the gate terminal of the P-type current limiting element 91, and applies, in the case where the odd layer memory cell is selected, a third voltage to the gate terminal of the N-type current limiting element 90 and a fourth voltage to the gate terminal of the P-type current limiting element 91.

Moreover, (1) in the case of writing the even layer memory cell to the low resistance state, the current limiting control circuit 99 applies the first voltage and the second voltage respectively to the gate terminal of the N-type current limiting element 90 and the gate terminal of the P-type current limiting element 91 so that one of the N-type current limiting element 90 and the P-type current limiting element 91 that has a lower substrate bias effect in the case where a current for writing flows between the selected global bit line and the selected word line through the NMOS transistor in the N-type current limiting element 90 and in the case where the current flows between the selected global bit line and the selected word line through the PMOS transistor in the P-type current limiting element 91 is ON and the other one of the N-type current limiting element 90 and the P-type current limiting element 91 is OFF. (2) In the case of writing the even layer memory cell to the high resistance state, the current limiting control circuit 99 applies the first voltage and the second voltage respectively to the gate terminal of the N-type current limiting element 90 and the gate terminal of the P-type current limiting element 91 so that a current for writing flows between the selected global bit line and the selected word line in an opposite direction to the current for low resistance writing and the other one of the N-type current limiting element 90 and the P-type current limiting element 91, which is OFF in low resistance writing, is ON. (3) In the case of writing the odd layer memory cell to the low resistance state, the current limiting control circuit 99 applies the third voltage and the fourth voltage respectively to the gate terminal of the N-type current limiting element 90 and the gate terminal of the P-type current limiting element 91 so that one of the N-type current limiting element 90 and the P-type current limiting element 91 that has a lower substrate bias effect in the case where a current for writing flows between the selected global bit line and the selected word line through the NMOS transistor in the N-type current limiting element 90 and in the case where the current flows between the selected global bit line and the selected word line through the PMOS transistor in the P-type current limiting element 91 is ON and the other one of the N-type current limiting element 90 and the P-type current limiting element 91 is OFF. (4) In the case of writing the odd layer memory cell to the high resistance state, the current limiting control circuit 99 applies the third voltage and the fourth voltage respectively to the gate terminal of the N-type current limiting element 90 and the gate terminal of the P-type current limiting element 91 so that a current for writing flows between the selected global bit line and the selected word line in an opposite direction to the current for low resistance writing and the other one of the N-type current limiting element 90 and the P-type current limiting element 91, which is OFF in low resistance writing, is ON.

In more detail, the odd layer memory cell is written to the low resistance state as follows. A voltage applied across both ends of the memory cell when writing the memory cell to the low resistance state is denoted as VLR. In the case of writing the memory cell to the low resistance state by applying a higher voltage to the selected global bit line than the selected word line where a voltage difference between the selected global bit line and the selected word line is VLR3, the current limiting control circuit 99: turns ON the P-type current limiting element 91 in a current limiting state, by applying a voltage VCMP that satisfies $$VLR-|Vtp| \leq VCMP < VLR3-|Vtp|$$

to the gate terminal of the PMOS transistor in the P-type current limiting element 91 where Vtp is a threshold voltage of the PMOS transistor; and turns OFF the N-type current limiting element 90, by applying a voltage Vnsn that satisfies $$Vtn \leq Vnsn \leq VLR+Vtn$$

to the gate terminal of the NMOS transistor in the N-type current limiting element 90 where Vtn is a threshold voltage of the NMOS transistor. On the other hand, the even layer memory cell is written to the low resistance state as follows. A voltage applied across both ends of the memory cell when writing the memory cell to the low resistance state is denoted as VLR. In the case of writing the memory cell to the low resistance state by applying a lower voltage to the selected global bit line than the selected word line where a voltage difference between the selected global bit line and the selected word line is VLR4, the current limiting control circuit 99: turns ON the N-type current limiting element 90 in a current limiting state, by applying a voltage VCMN that satisfies $$Vtn < VCMN \leq VLR4-VLR+Vtn$$

to the gate terminal of the NMOS transistor in the N-type current limiting element 90 where Vtn is a threshold voltage of the NMOS transistor; and turns OFF the P-type current limiting element 91, by applying a voltage Vnsp that satisfies $$VLR4-VLR-|Vtp| \leq Vnsp \leq VHR4-|Vtp|$$

to the gate terminal of the PMOS transistor in the P-type current limiting element 91 where Vtp is a threshold voltage of the PMOS transistor.

Here, in the low resistance writing, the current limiting control circuit 99 applies the voltage VCMN to the gate terminal of the NMOS transistor when writing the even layer memory cell to the low resistance state and the voltage VCMP to the gate terminal of the PMOS transistor when writing the odd layer memory cell to the low resistance state, so that a current flowing between the global bit line and the word line when the P-type current limiting element 91 is ON in the case of writing the odd layer memory cell to the low resistance state and a current flowing between the global bit line and the word line when the N-type current limiting element 90 is ON in the case of writing the even layer memory cell to the low resistance state are opposite in current direction (the direction of the current flowing in the memory cell is the same), and equal in absolute value within a predetermined range of fluctuations. The predetermined range of fluctuations is 10%, as an example. Moreover, for the writing target layer, the current limiting control circuit 99 applies the same voltages to the gate terminals of the N-type current limiting element 90 and the P-type current limiting element 91, in the case of writing the writing target memory cell to the high resistance state and in the case of writing the writing target memory cell to the low resistance state.

[Necessary Conditions for Writing]

In the method according to Reference Example 2, writing to a predetermined memory cell layer is performed by applying such gate voltages that enable both the P-type current limiting element 91 and the N-type current limiting element 90 to be turned ON (i.e. such gate potentials that do not cause both current limiting elements to be simultaneously turned ON, but enable each current limiting element to be turned ON depending on the source potential of the current limiting element), as mentioned above.

Necessary conditions for this are described in detail below, with reference to FIGS. 23(a) to 23(d) and 24(a) to 24(d). FIGS. 23(a) to 23(d) is a diagram additionally showing current-voltage states of the bidirectional current limiting circuit 920 in the diagram in FIG. 11. FIGS. 24(a) to 24(d) is a current-voltage characteristic diagram of the N-type current limiting element 90 and the P-type current limiting element 91 between GBLI and GBL. FIGS. 23(a) and 24(a) show the state of low resistance writing of the odd layer memory cell, FIGS. 23(b) and 24(b) show the state of high resistance writing of the odd layer memory cell, FIGS. 23(c) and 24(c) show the state of low resistance writing of the even layer memory cell, and FIGS. 23(d) and 24(d) show the state of high resistance writing of the even layer memory cell.

Figure 24:
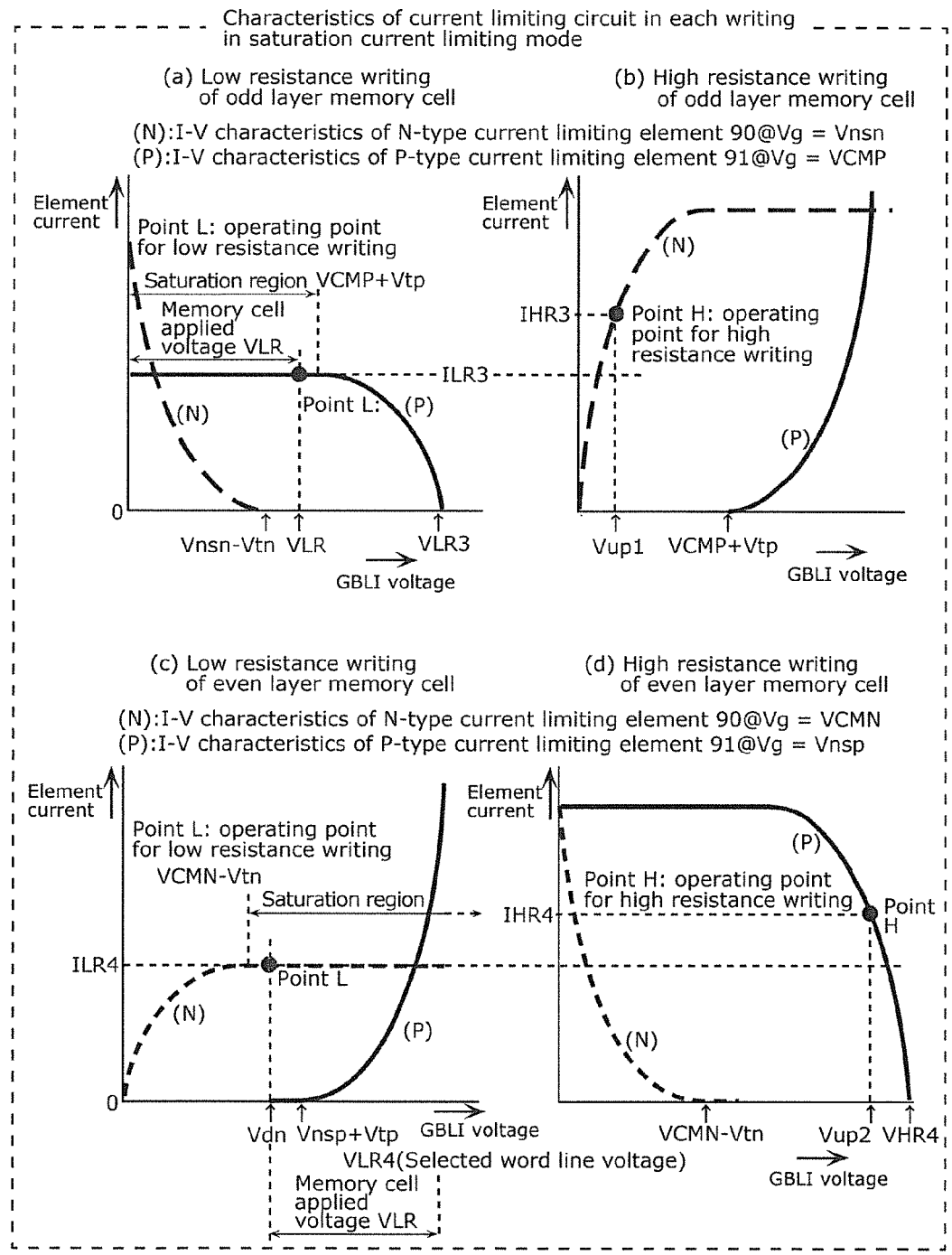
FIGS. 24(a) to 24(d) is a characteristic diagram of the bidirectional current limiting circuit for describing a bias in low resistance writing of an odd layer memory cell, high resistance writing of an odd layer memory cell, low resistance writing of an even layer memory cell, and high resistance writing of an even layer memory cell in the saturation current limiting mode respectively in the reference example.

In FIG. 24, "(N)" represents characteristics of the N-type current limiting element 90, and "(P)" represents characteristics of the P-type current limiting element 91.

Necessary conditions for writing to the odd layer memory cell are listed first. Note that the gate voltages applied to the P-type current limiting element 91 and the N-type current limiting element 90 are the same in low resistance writing and high resistance writing.

(Condition 1) In low resistance writing, the global bit line GBL is set to a higher voltage than the word line (the voltage between the global bit line GBL and the word line is VLR3), and the current ILR3 flows from the bit line related to the memory cell 51 into the memory cell 51 (FIGS. 22A, 22E, and 23(a)).

In this case, the P-type current limiting element 91 having a lower substrate bias effect is turned ON, and put in a state of operating in the saturation region (point L (current ILR3) in FIG. 24(a)). Here, the gate voltage of the P-type current limiting element 91 is VCMP.

(Condition 2) In Condition 1, the N-type current limiting element 90 is turned OFF by a substrate bias effect (FIG. 24(a)). Here, the gate voltage of the N-type current limiting element 90 is Vnsn.

(Condition 3) In high resistance writing, the word line is set to a higher voltage than the global bit line GBL (the voltage between the word line and the global bit line GBL is VHR3), and the current IHR3 flows out of the memory cell 51 to the bit line related to the memory cell 51 (point H (current IHR3) in FIG. 24(b)).

In this case, the N-type current limiting element 90 changes to ON (the gate voltage is kept at Vnsn). The drive current at this time is larger than the drive current of the P-type current limiting element 91 in Condition 1 (IHR3>ILR3). Here, the gate voltage of the P-type current limiting element 91 is VCMP, and the P-type current limiting element 91 may be either ON or OFF (OFF in the example of FIG. 24(b)).

Necessary conditions for writing to the even layer memory cell are listed next. Since the current directions in high resistance writing and low resistance writing are reversed from Conditions 1 to 3, the P-type current limiting element 91 and the N-type current limiting element 90 are interchanged in function.

(Condition 4) In low resistance writing, the word line is set to a higher voltage than the global bit line GBL (the voltage between the word line and the global bit line GBL is VLR4), and the current ILR4 flows out of the memory cell 51 to the bit line related to the memory cell 51 (FIG. 23(c)).

In this case, the N-type current limiting element 90 having a lower substrate bias effect is turned ON, and put in a state of operating in the saturation region (point L (current ILR4) in FIG. 24(c)). Here, the gate voltage of the N-type current limiting element 90 is VCMN.

(Condition 5) In Condition 4, the P-type current limiting element 91 is turned OFF by a substrate bias effect (FIG. 24(c)). Here, the gate voltage of the P-type current limiting element 91 is Vnsp.

(Condition 6) In high resistance writing, the global bit line GBL is set to a higher voltage than the word line (the voltage between the global bit line GBL and the word line is VHR4), and the current IHR4 flows from the bit line related to the memory cell 51 into the memory cell 51 (point H (current IHR4) in FIG. 24(d)).

In this case, the P-type current limiting element 91 changes to ON (the gate voltage is kept at Vnsp). The drive current at this time is larger than the drive current of the N-type current limiting element 90 in Condition 4 (IHR4>ILR4). Here, the N-type current limiting element 90 may be either ON or OFF (OFF in the example of FIG. 24(d)).

Further, the following condition is applied in order to reduce fluctuations in resistance value between the odd layer memory cell and the even layer memory cell.

(Condition 7) The saturation current of the P-type current limiting circuit 91 in Condition 1 and the saturation current of the N-type current limiting circuit 90 in Condition 4 are equal (ILR3=ILR4).

The gate voltages, the write voltages, the transistor sizes, and the like are adjusted to satisfy Conditions 1 to 7. The following describes a detailed design method for each condition.

(Regarding Condition 1)

FIG. 23(a) shows the voltage state of the bidirectional current limiting circuit 920 when performing low resistance writing on the odd layer memory cell. 0 V is applied to the selected word line 52a or 52b (not shown), the current limiting voltage VCMP is applied to the node CMP connected to the gate terminal of the P-type current limiting element 91, and the predetermined voltage Vnsn is applied to the node CMN connected to the gate terminal of the N-type current limiting element 90. Meanwhile, Vpp is applied to the gate of one of the even layer bit line selection switch element 57 and the odd layer bit line selection switch element 58 that corresponds to the selected memory cell to turn ON the bit line selection switch element, and 0 V is applied to the gate of the other bit line selection switch element to turn OFF the bit line selection switch element (not shown).

In this state, the voltage VLR3 is applied to the global bit line GBL so that the voltage across both ends of the memory cell (i.e. the voltage between the selected word line and the intermediate node GBLI) corresponds to the voltage VLR for low resistance writing (the voltage of the intermediate node GBLI is substantially VLR), thereby causing the current ILR3 for low resistance writing to flow through the selected memory cell 51. That is, the voltage of one of the source and the drain of the P-type current limiting element 91 is VLR on the intermediate node GBLI side, and the voltage of the other one of the source and the drain of the P-type current limiting element 91 is VLR3 on the global bit line GBL side.

A condition for a transistor to operate in a saturation region is $$Vds \geq Vgs - Vt$$

where Vds denotes a drain-to-source voltage of the transistor, Vgs denotes a gate-to-source voltage of the transistor, and Vt denotes a threshold voltage of the transistor.

This condition for the transistor to operate in the saturation region is applied to Condition 1, as follows. For the P-type current limiting element 91, $$Vds = VLR3 - VLR$$

$$Vgs = VLR3 - VCMP.$$

Accordingly, a condition for the P-type current limiting element 91 to operate in the saturation region is $$VLR3 - VLR \geq VLR3 - VCMP - |Vtp|$$

which can be transformed into $$VCMP \geq VLR - |Vtp| \quad (12).$$

A condition for turning ON the P-type current limiting element 91 is, from Vgs>Vt, $$VLR3 - VCMP > |Vtp|.$$

The P-type current limiting element 91 is ON and operates in the saturation region when VCMP is in a voltage range of $$VLR - |Vtp| \leq VCMP < VLR3 - |Vtp|.$$

$I = \beta p/2 \times (Vgs - Vt)^2$, and so the saturation current flowing through the PMOS transistor is expressed as $$ILR3 = \beta p/2 \times (VLR3 - VCMP - |Vtp|)^2 \quad (13).$$

Here, $\beta p = W/L \times \mu p \times Cox$, where W denotes a channel width of the P-type current limiting element 91, L denotes a channel length of the P-type current limiting element 91, μp denotes a hole mobility, and Cox denotes an oxide film capacitance per unit area.

(Regarding Condition 2)

A condition for turning OFF the transistor is Vgs≤Vt.

In the operating condition of Condition 1, the source of the N-type current limiting element 90 is on the global bit line GBL side that is lower in voltage. When the gate voltage Vnsn is given, a condition for turning OFF the N-type current limiting element 90 is $$Vnsn - VLR \leq Vtn$$

which can be transformed into $$Vnsn \leq VLR + Vtn \quad (14).$$

(Regarding Condition 3)

In high resistance writing, the applied voltage between the global bit line and the selected word line is reversed in direction from the state in Conditions 1 and 2, so that the source and the drain of the N-type current limiting element 90 are replaced with each other. The drain of the N-type current limiting element 90 is on the intermediate node GBLI side with a voltage of (VHR3−VHR), and the source of the N-type current limiting element 90 is on the global bit line GBL side with a voltage of 0 V.

This being so, when the gate voltage of the N-type current limiting element 90 satisfies the condition Vnsn>Vtn, the N-type current limiting element 90 changes to ON, despite that the N-type current limiting element 90 is OFF in Condition 2.

Though the current flowing through the N-type current limiting element 90 depends on the voltage VHR3 for high resistance writing, the current of the N-type current limiting element 90 in the saturation region can be caused to flow at the maximum.

That is, $$IHR3 \leq \beta n/2 \times (Vnsn - Vtn)^2 \quad (15).$$

As is clear from Expressions (13) and (15), IHR3>ILR3 can be satisfied by adjusting βp, βn, VCMP, and Vnsn.

(Regarding Condition 4)

Though the same method as in Condition 1 is employed in the case of performing low resistance writing on the even layer memory cell, the N-type current limiting element 90 operates in the saturation region instead of the P-type current limiting element 91 because the applied voltage between the global bit line and the selected word line is reversed in direction.

A condition for the N-type current limiting element 90 to operate in the saturation region is $$VLR4 - VLR \geq VCMN - Vtn$$

which can be transformed into $$VCMN \leq VLR4 - VLR + Vtn \quad (16).$$

When a condition for turning ON the N-type current limiting element 90 is also taken into account, the voltage range of VCMN is $$Vtn < VCMN \leq VLR4 - VLR + Vtn.$$

The saturation current flowing through the N-type current limiting element 90 in this case is expressed as $$ILR4 = \beta n/2 (VCMN - Vtn)^2 \quad (17).$$

(Regarding Condition 5)

Though the same method as in Condition 2 is employed, the P-type current limiting element 91 is turned OFF instead of the N-type current limiting element 90 because the applied voltage between the global bit line and the selected word line is reversed in direction.

The source of the P-type current limiting element 91 is on the global bit line GBL side that is higher in voltage. When the gate voltage Vnsp is given, a condition for turning OFF the P-type current limiting element 91 is $$(VLR4 - VLR) - Vnsp \leq |Vtp|$$

which can be transformed into $$Vnsp \geq (VLR4 - VLR) - |Vtp| \quad (18).$$

(Regarding Condition 6)

Though the same method as in Condition 3 is employed, the P-type current limiting element 91 is turned ON because the applied voltage between the global bit line and the selected word line is reversed in direction.

The applied voltage between the global bit line and the selected word line is reversed in direction from the state in Condition 5, so that the source and the drain of the P-type current limiting element 91 are replaced with each other. The drain of the P-type current limiting element 91 is on the intermediate node GBLI side with a voltage of VHR, and the source of the P-type current limiting element 91 is on the global bit line GBL side with a voltage of VHR4.

This being so, when the gate voltage of the P-type current limiting element 91 satisfies the condition Vnsp<VHR4−Vtp, the P-type current limiting element 91 changes to ON with the same gate voltage Vnsp, despite that the P-type current limiting element 91 is OFF in Condition 5.

Though the current flowing through the P-type current limiting element 91 depends on the voltage VHR4 for high resistance writing, the current of the P-type current limiting element 91 in the saturation region can be caused to flow at the maximum. That is, $$IHR4 \leq \beta p/2 \times (VHR4-Vnsp-|Vtp|)^2 \tag{19}$$

As is clear from Expressions (17) and (19), IHR4>ILR4 can be satisfied by adjusting βp, βn, VCMP, and Vnsn.

(Regarding Condition 7)

The saturation current of the P-type current limiting circuit 91 in Condition 1 and the saturation current of the N-type current limiting circuit 90 in Condition 4 are equal (ILR3=ILR4).

From Expressions (13) and (17), $$\beta p(VLR3-VCMP-|Vtp|)^2 = \beta n(VCMN-Vtn)^2 \tag{20}$$

This relation is satisfied by adjusting βn, βp, VCMP, VCMN, and VLR3. Here, βn and βp are each a term proportional to a current drive capability of a transistor per unit length, where PMOS is typically about ½ in current drive capability of NMOS. Accordingly, by designing the PMOS transistor of the P-type current limiting element 91 to have the transistor width (W) twice the transistor width of the NMOS transistor of the N-type current limiting element 90, in general only the magnitude relation between the squared terms in Expression (20) needs to be taken into consideration.

Besides, since the threshold voltages of the NMOS transistor and the PMOS transistor may be substantially equal in absolute value, the threshold voltages are set to be equal. As a result, the squared terms each relate to only the gate-to-source voltage (VCMN and VCMP).

Figure 25:
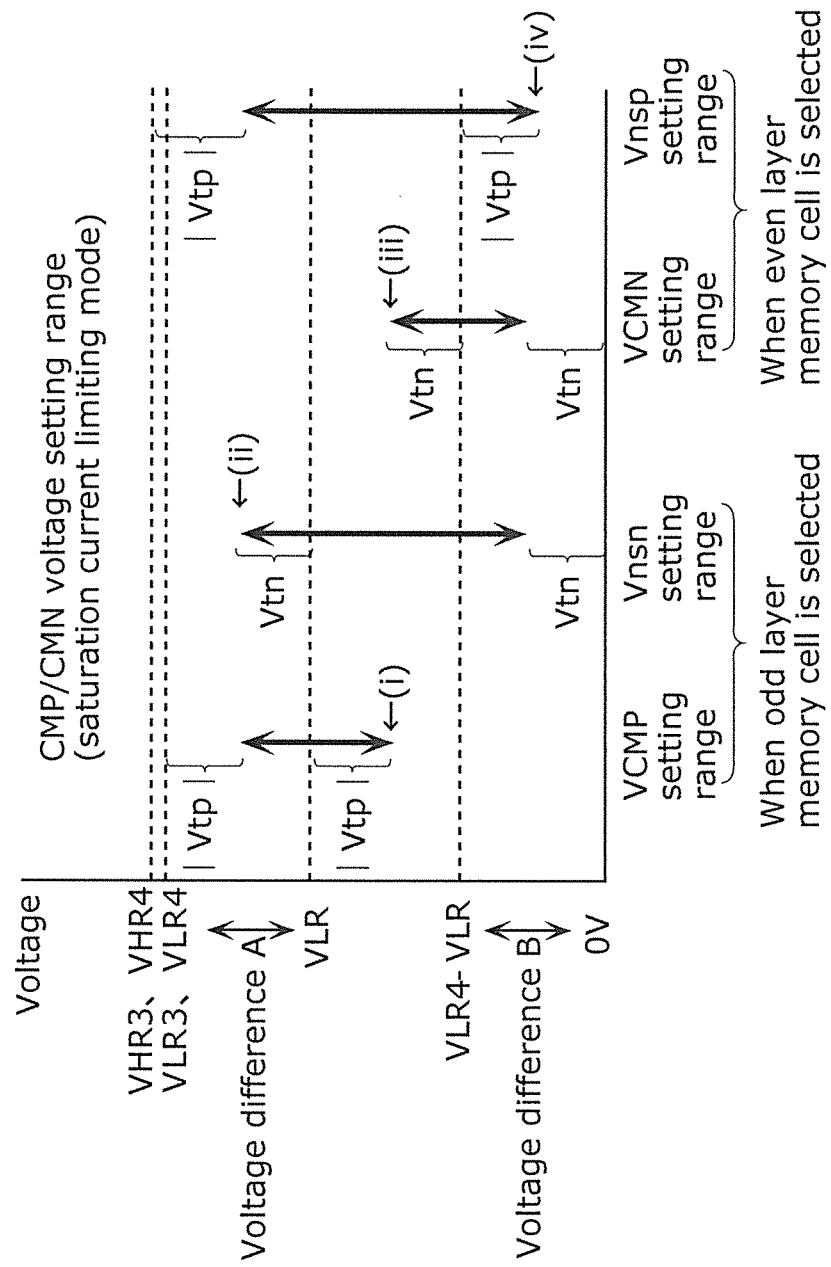
FIG. 25 is a diagram showing a set voltage range of a gate of a current limiting element in the saturation current limiting mode in the reference example.

FIG. 25 is a graph showing an example of the set voltage ranges of the node CMP and the node CMN connected to the gate terminals, in Conditions 1 to 7 described above.

The following examines a situation where a condition (indicated by arrows (i) to (iv)) that maximizes the current in high resistance writing is set for each of the voltages VCMP, Vnsn, VCMN, and Vnsp, as an example.

VCMP, Vnsn, VCMN, and Vnsp are respectively $$VCMP = VLR - |Vtp|$$

$$Vnsn = VLR + Vtn$$

$$VCMN = VLR3 - VLR + Vtn = VLR4 - VLR + Vtn$$

$$Vnsp = VLR3 - VLR - |Vtp| = VLR4 - VLR - |Vtp|.$$

Regarding the current flowing through the memory cell in low resistance writing, Expression (13) is $$ILR3 = \beta p/2 \cdot (VLR3-VCMP-|Vtp|)^2 = \beta p/2 \cdot (VLR3-VLR)^2 \tag{13}'$$

and Expression (17) is $$ILR4 = \beta n/2 \cdot (VCMN-Vtn)^2 = \beta n/2 \cdot (VLR4-VLR)^2 \tag{17}'$$

which are in the same expression form. Since design is made such that βp=βn as mentioned earlier, by performing voltage control such that VLR3=VLR4, i.e. by applying the voltage of the same absolute value for low resistance writing regardless of the memory layer, the drive currents of (i) and (iii) become equal to each other. Thus, the same resistance value can be set in the even layer and the odd layer.

Regarding the current flowing in high resistance writing, Expression (15) is $$IHR3 \leq \beta n/2 \times (Vnsn-Vtn)^2 = \beta n/2 \times (VLR)^2 \tag{15}'$$

and Expression (19) is $$IHR4 \leq \beta p/2 \times (VHR4-Vnsp-|Vtp|)^2 \approx \beta p/2 \times (VLR)^2 \tag{19}'$$

There is a magnitude relation VLR4−VLR<VLR<VLR3, as shown by the vertical axis in FIG. 25. As is clear from FIG. 25, the voltage applied to the node CMN connected to the gate terminal of the N-type current limiting element 90 is higher in (ii) than in (iii). In other words, a larger current flow can be generated in (ii) than in (iii). Likewise, the voltage applied to the node CMP connected to the gate terminal of the P-type current limiting element 91 is lower in (iv) than in (i). In other words, a larger current flow can be generated in (iv) than in (i). As mentioned above, (i) and (iii) are adjusted to the same amount of current, so that the amount of current in (ii) is larger than the amount of current in (i), and the amount of current in (iv) is larger than the amount of current in (iii). This indicates that Conditions 3 and 6 are satisfied.

In FIG. 25, a voltage difference A corresponds to a voltage drop due to an impedance between the source and the drain of the P-type current limiting element 91 when the voltage VLR3 for low resistance writing is applied to the global bit line GBL to cause the current ILR3 for low resistance writing to flow through the selected memory cell. A voltage difference B corresponds to a voltage drop due to an impedance between the source and the drain of the N-type current limiting element 90 when the voltage VLR4 for low resistance writing is applied to the selected word line to cause the current ILR4 for low resistance writing to flow through the selected memory cell. This being so, the relation VLR4−VLR<VLR<VLR3 can be satisfied by designing the transistor width W of each of the P-type current limiting element 91 and the N-type current limiting element 90 to an appropriate width or more so that the impedance of the transistor in low resistance writing is lower than the low resistance state of the memory cell (the impedance of the transistor is less than or equal to VLR/ILR3 or VLR/ILR4).

Table 4 shows set voltages of main signals in association with each of the operations of the memory cells M1 to M4 of the different layers.

TABLE 4

| | Writing to odd layer memory cell | | Writing to even layer memory cell | |
|---|---|---|---|---|
| | LR (A', E') | HR (B', F') | LR (C', G') | HR (D', H') |
| Gate voltage of odd layer bit line selection switch element 58 | Vpp (A')<br>0 V (E') | Vpp (B')<br>0 V (F') | 0 V (C')<br>Vpp (G') | 0 V (D')<br>Vpp (H') |
| Gate voltage of even layer bit line selection switch element 57 | 0 V (A')<br>Vpp (E') | 0 V (B')<br>Vpp (F') | Vpp (C')<br>0 V (G') | Vpp (D')<br>0 V (H') |
| Voltage of CMN | Vth ≤ Vnsn ≤ VLR + Vth | | Vth < VCMN ≤ VLR4 − VLR + Vth | |
| Voltage of CMP | VLR − |Vtp| ≤ VCMP < VLR3 − |Vtp| | | VLR4 − VLR − |Vtp| ≤ Vnsp ≤ VHR4 − |Vtp| | |
| Global bit line | VLR3 | 0 V | 0 V | VHR4 |

TABLE 4-continued

|  | Writing to odd layer memory cell | | Writing to even layer memory cell | |
| --- | --- | --- | --- | --- |
|  | LR (A', E') | HR (B', F') | LR (C', G') | HR (D', H') |
| Selected word line | 0 V | VHR3 | VLR4 | 0 V |
| Drive current of N-type current limiting element 90 | 0 | $\beta n/2 \times (VLR)^2$ | $\beta n/2 \times (VLR4 - VLR)^2$ | $\geq 0$ |
| Drive current of P-type current limiting element 91 | $\beta p/2 \times (VLR3 - VLR)^2$ | $\geq 0$ | 0 | $\beta p/2 \times (VLR)^2$ |

In Table 4, the odd layer bit line selection switch element 58 and the even layer bit line selection switch element 57 each include an NMOS transistor in this reference example. It is desirable to at least apply, as the gate voltage, a voltage higher than (VHR4+Vtn) to each of the even layer bit line selection signal and the odd layer bit line selection signal, thereby contributing to a sufficiently low impedance of the N-type current limiting element 90 or the P-type current limiting element 91 when functioning as a current limiter.

Though the design methods of Conditions 1 to 7 are described above based on the operation principle, there are various fluctuations in actual circuit operations. Accordingly, even when design is made such that βp=βn, for example, there is a possibility that the resistance value set in the even layer and the resistance value set in the odd layer do not exactly match. The conditions such as the equality relations described here have an acceptable error range of about 10% as with a typical fluctuation tolerance, though depending on factors such as specifications of products envisioned.

Moreover, the voltages VCMP, Vnsn, VCMN, and Vnsp designed based on these conditions may be subject to fine adjustment in a manufacturing stage by a trimming means typically known as a fuse programming circuit, to achieve more optimal states.

Figure 26:
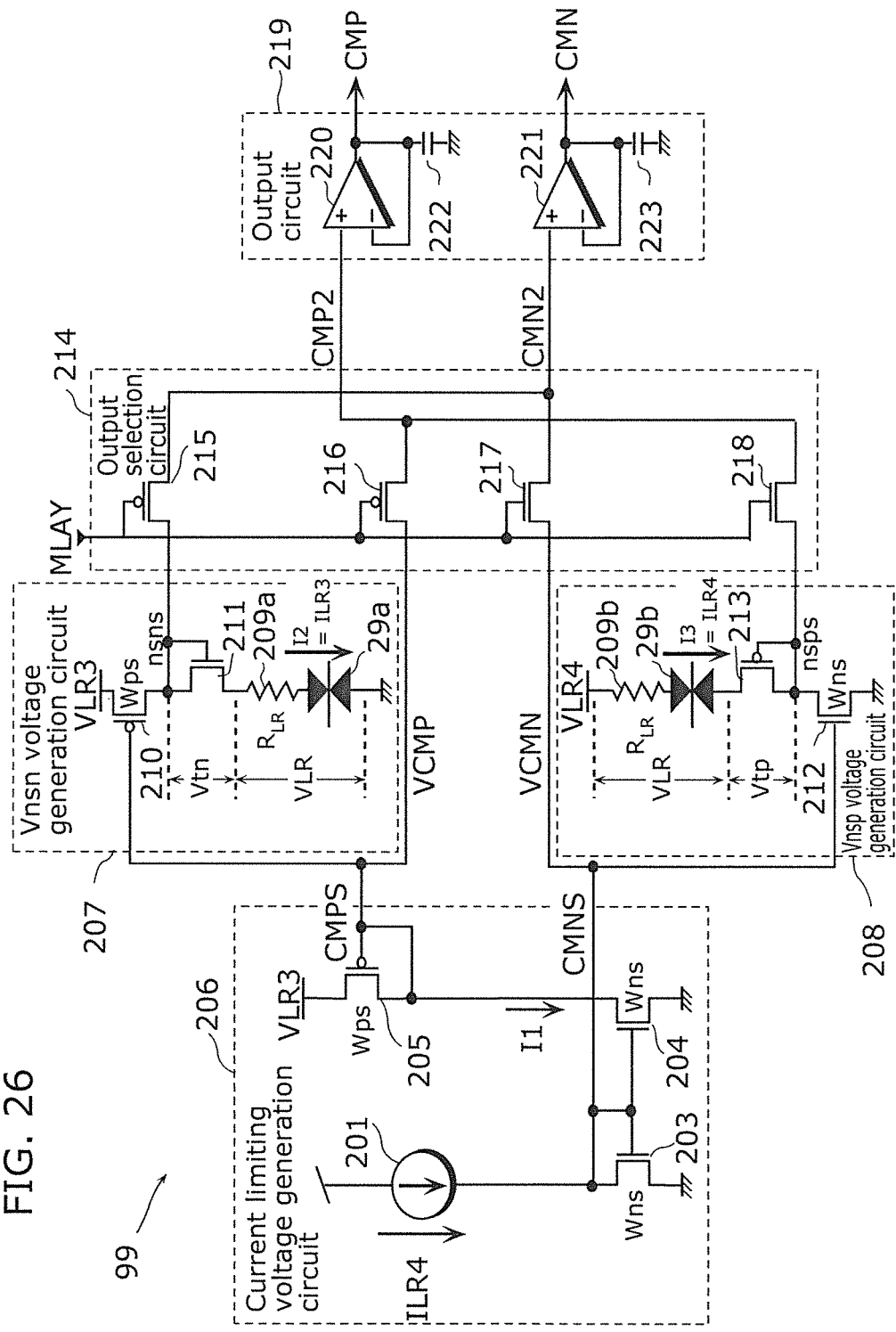
FIG. 26 is a diagram showing an example of a structure of a current limiting control circuit in the saturation current limiting mode in the reference example.

FIG. 26 shows an example of a circuit structure of the current limiting control circuit 99 in the saturation current limiting mode. This current limiting control circuit 99 includes a current limiting voltage generation circuit 206, a Vnsn voltage generation circuit 207, a Vnsp voltage generation circuit 208, an output selection circuit 214, and an output circuit 219.

In FIG. 26, a constant current source 201 is a constant current source that generates the predetermined current ILR4 for low resistance writing. An NMOS transistor 203 has a source terminal connected to a ground (0 V), and a drain terminal and a gate terminal connected to each other. An NMOS transistor 204 has a source terminal connected to the ground (0 V). A PMOS transistor 205 has a source terminal connected to the voltage VLR3 for low resistance writing of the odd layer memory cell, and a drain terminal and a gate terminal connected to each other. In the current limiting voltage generation circuit 206, the constant current source 201 and the diode-connected NMOS transistor 203 are connected in series, the diode-connected PMOS transistor 205 and NMOS transistor 204 are connected in series, and the gate and drain terminals of the NMOS transistor 203 and the gate terminal of the NMOS transistor 204 are current-mirror-connected. The gate of the NMOS transistor 203 is an output terminal CMNS, and the gate of the PMOS transistor 205 is an output terminal CMPS.

A current steering element 29a has one end connected to the ground, and is identical to the current steering element used in the memory cell 51. A fixed resistance element 209a is a fixed resistance element having the same resistance value as in the low resistance state of the variable resistance element 10. An NMOS transistor 211 has a drain terminal and a gate terminal connected to each other. A PMOS transistor 210 has a source terminal connected to the power voltage VLR3, and a gate terminal connected to the output node CMPS of the current limiting voltage generation circuit 206. In the Vnsn voltage generation circuit 207, the PMOS transistor 210, the NMOS transistor 211, the fixed resistance element 209a, and the current steering element 29a are connected in series between the power voltage VLR3 and the ground, and a drain node nsns of the NMOS transistor 211 is an output terminal.

A current steering element 29b is a bidirectional diode element identical to the one used in the memory cell 51. A fixed resistance element 209b is a fixed resistance element having the same resistance value as in the low resistance state of the variable resistance element 10. A PMOS transistor 213 has a drain terminal and a gate terminal connected to each other. An NMOS transistor 212 has a source terminal connected to the ground, and a gate terminal connected to the output node CMNS of the current limiting voltage generation circuit 206. In the Vnsp voltage generation circuit 208, the fixed resistance element 209b, the current steering element 29b, the PMOS transistor 213, and the NMOS transistor 212 are connected in series between the voltage VLR4 for low resistance writing of the even layer memory cell and the ground, and a drain node nsps of the PMOS transistor 213 is an output terminal.

The output selection circuit 214 selectively outputs a first input CMPS or a second input nsps as an output signal to a first output node CMP2, and selectively outputs a third input CMNS or a fourth input nsns as an output signal to a second output node CMN2, according to a signal MLAY.

The output circuit 219 includes two differential amplifiers 220 and 221 that respectively amplify in current an input signal from the first output node CMP2 and an input signal from the second output node CMN2. The differential amplifier 220 is a first differential amplifier that has a first input terminal connected to the first output node CMP2, and a second input terminal and an output terminal feedback-connected to each other. The differential amplifier 221 is a second differential amplifier that has a first input terminal connected to the second output node CMN2, and a second input terminal and an output terminal feedback-connected to each other. The output terminals of the differential amplifiers 220 and 221 are respectively connected to smoothing capacitors 222 and 223 for stable operation.

The NMOS transistor 203, the NMOS transistor 204, the NMOS transistor 212, and the N-type current limiting element 90 have the same transistor size so as to be equal in current drive capability. The PMOS transistor 205, the PMOS transistor 210, and the P-type current limiting element 91 have the same transistor size so as to be equal in current drive capability.

The following describes an operation of the current limiting control circuit 99 of this structure.

The constant current source 201 causes the current ILR4 for low resistance writing to flow through the selected memory cell of the even layer. The diode-connected NMOS transistor 203 has the same gate width Wns as the N-type current limiting element 90. Accordingly, when the current ILR4 flows, the voltage of the drain terminal of the NMOS transistor 203 in common with the voltage of the gate terminal is the current limiting voltage VCMN. This voltage VCMN is outputted to the CMNS terminal of the current limiting voltage generation circuit 206. The CMNS terminal is current-mirror-connected to the gate terminal of the NMOS transistor 204 of the same size as the NMOS transistor 203 at a mirror ratio of 1, and therefore a drain-to-source current I1 of the NMOS transistor 204 is ILR4, too. VCMP is generated so that ILR4=ILR3. The diode-connected PMOS transistor 205, to which VLR3 is applied at the source terminal, has the same gate width Wps as the P-type current limiting element 91. Accordingly, when the current I1 (=ILR3=ILR4) flows, the voltage of the drain terminal of the PMOS transistor 205 in common with the voltage of the gate terminal is the current limiting voltage VCMP. This voltage VCMP is outputted to the CMPS terminal of the current limiting voltage generation circuit 206.

When the output voltage VCMP of the CMPS terminal is inputted to the gate terminal of the PMOS transistor 210 in the Vnsn voltage generation circuit 207, a drain-to-source current I2 of the PMOS transistor 210 is equal to I1, because the PMOS transistor 210 is current-mirror-connected to the PMOS transistor 205 at a mirror ratio of 1 and the source terminals of both PMOS transistors 210 and 205 have the power voltage VLR3. That is, I2=ILR3. When the current ILR3 flows in the Vnsn voltage generation circuit 207 in which the components are connected in series, a potential difference of the current steering element 29a and the fixed resistance element 209a having the same resistance value as in the low resistance state is the voltage VLR for low resistance writing, and a potential difference of the diode-connected NMOS transistor 211 is substantially Vtn. Hence, the voltage of the intermediate node nsns has the same relation as in Expression (14), as a result of which the Vnsn voltage generation circuit 207 generates the voltage Vnsn.

When the output voltage VCMN of the CMNS terminal is inputted to the gate terminal of the NMOS transistor 212 in the Vnsp voltage generation circuit 208, a drain-to-source current I3 of the NMOS transistor 212 is equal to ILR4, because the NMOS transistor 212 is current-mirror-connected to the NMOS transistor 203 at a mirror ratio of 1 and the source terminals of both NMOS transistors 212 and 203 are connected to the ground. When the current ILR4 flows in the Vnsp voltage generation circuit 208 in which the components are connected in series, a potential difference of the current steering element 29b and the fixed resistance element 209b having the same resistance value as in the low resistance state and connected to the power voltage VLR4 at one end is the voltage VLR for low resistance writing, and a potential difference of the diode-connected PMOS transistor 213 is substantially Vtp. Hence, the voltage of the intermediate node nsps has the same relation as in Expression (18), as a result of which the Vnsp voltage generation circuit 208 generates the voltage Vnsp.

In the case where the memory cell layer to be accessed is an odd layer, when the signal MLAY="L" is inputted to the output selection circuit 214, switch elements 215 and 216 each including a PMOS transistor are ON, and switch elements 217 and 218 each including an NMOS transistor are OFF. As a result, the voltage VCMP is outputted to the first output node CMP2 of the output selection circuit 214, and the voltage Vnsn is outputted to the second output node CMN2 of the output selection circuit 214. When the signal MLAY="H" is inputted to the output selection circuit 214, on the other hand, the switch elements 215 and 216 each including a PMOS transistor are OFF, and the switch elements 217 and 218 each including an NMOS transistor are ON. As a result, the voltage Vnsp is outputted to the first output node CMP2 of the output selection circuit 214, and the voltage VCMN is outputted to the second output node CMN2 of the output selection circuit 214. Each combination of voltages selectively outputted according to the signal MLAY corresponds to the voltages inputted to the nodes CMN and CMP in the bidirectional current limiting circuit in the case of selecting the odd layer memory cell and in the case of selecting the even layer memory cell.

The voltages at the first output node CMP2 and the second output node CMN2 are respectively amplified in current by the differential amplifiers 220 and 221, and outputted to the nodes CMP and CMN as the same voltages as the input voltages. The output nodes CMP and CMN are connected in parallel with the plurality of bidirectional current limiting circuits, as shown in FIG. 13.

According to the above-mentioned structure and operation, the N-type current limiting element 90 and the P-type current limiting element 91 can be set to optimal voltages in each writing mode.

Here, the generated voltage Vnsn or Vnsp only needs to satisfy at least Expressions (15) and (14) or Expressions (19) and (18). Accordingly, the Vnsn voltage generation circuit 207 may have a structure in which the PMOS transistor 210 and the fixed resistance element 209a are connected in series, without the NMOS transistor 211. Likewise, the Vnsp voltage generation circuit 208 may have a structure in which the NMOS transistor 212 and the current steering element 29b are connected in series, without the PMOS transistor 213.

Moreover, the output voltage Vnsn to the nsns terminal and the output voltage Vnsp to the nsps terminal may be inputted from outside.

As a result of the voltage settings described above, current limiting writing for setting the resistance value of the low resistance state can be stably performed for all layers.

Besides, the voltages of the node CMN and the node CMP are the same in low resistance writing and high resistance writing of the memory cell of the same layer, and so low resistance writing and high resistance writing can be quickly performed in the same manner merely by changing the voltages of the global bit line 56 and the selected word line 52 related to the selected memory cell.

Therefore, even in the case where low resistance writing and high resistance writing for the memory cell of the same layer are performed in a plurality of blocks in the memory cell array 200 at the same time, the same voltage values can be used for VCMN0 to VCMN15 and VCMP0 to VCMP15 supplied on a block-by-block basis as shown in FIG. 14. Since only one current limiting control circuit is required, simpler circuitry can be achieved. In addition, it is also possible to easily and quickly execute inverse writing methods such as a method whereby, in low resistance writing, high resistance writing is first performed to create the high resistance state and then low resistance writing is performed and a method whereby, in high resistance writing, low resistance writing is first performed to create the low resistance state and then high resistance writing is performed.

[Method of Setting Lower Vt for Part of Transistors]

As can be understood from the description of Reference Examples 1 and 2, the voltage VLR1, VLR2, VLR3, or VLR4 applied to the global bit line or the word line for low resistance writing or the voltage VHR1, VHR2, VHR3, or VHR4 applied to the global bit line or the word line for high resistance writing needs to be at least greater than or equal to a total sum of the voltage for low resistance writing or high resistance writing of the variable resistance element in the memory cell 51, the threshold voltage VF of the current steering element (bidirectional diode element) (a total sum of the write voltage and VF substantially corresponds to the voltage VLR or VHR for the resistance change of the memory cell 51), the threshold voltage of the even layer bit line selection switch element or the odd layer bit line selection switch element, and the threshold voltage Vtn or Vtp of the N-type current limiting element 90 or the P-type current limiting element 91. For example, when the write voltage of the variable resistance element is about 1 V, the threshold voltage VF of the diode element is about 2 V, and the threshold voltage of the transistor of the bit line selection switch element or the current limiting element is about 0.5 V, a voltage of about 3.5 V is necessary. In actuality, a margin is provided, and the threshold voltage of the transistor is higher than 0.5 V due to a substrate bias effect. This means that a voltage of about 5 V is necessary as a voltage for driving the cross point memory.

The following modifications may be applied for further optimizing the structure or control of the cross point memory in Reference Examples 1 and 2 to decrease the write voltage, thereby reducing power consumption.

[Modification 1]

Figure 27:
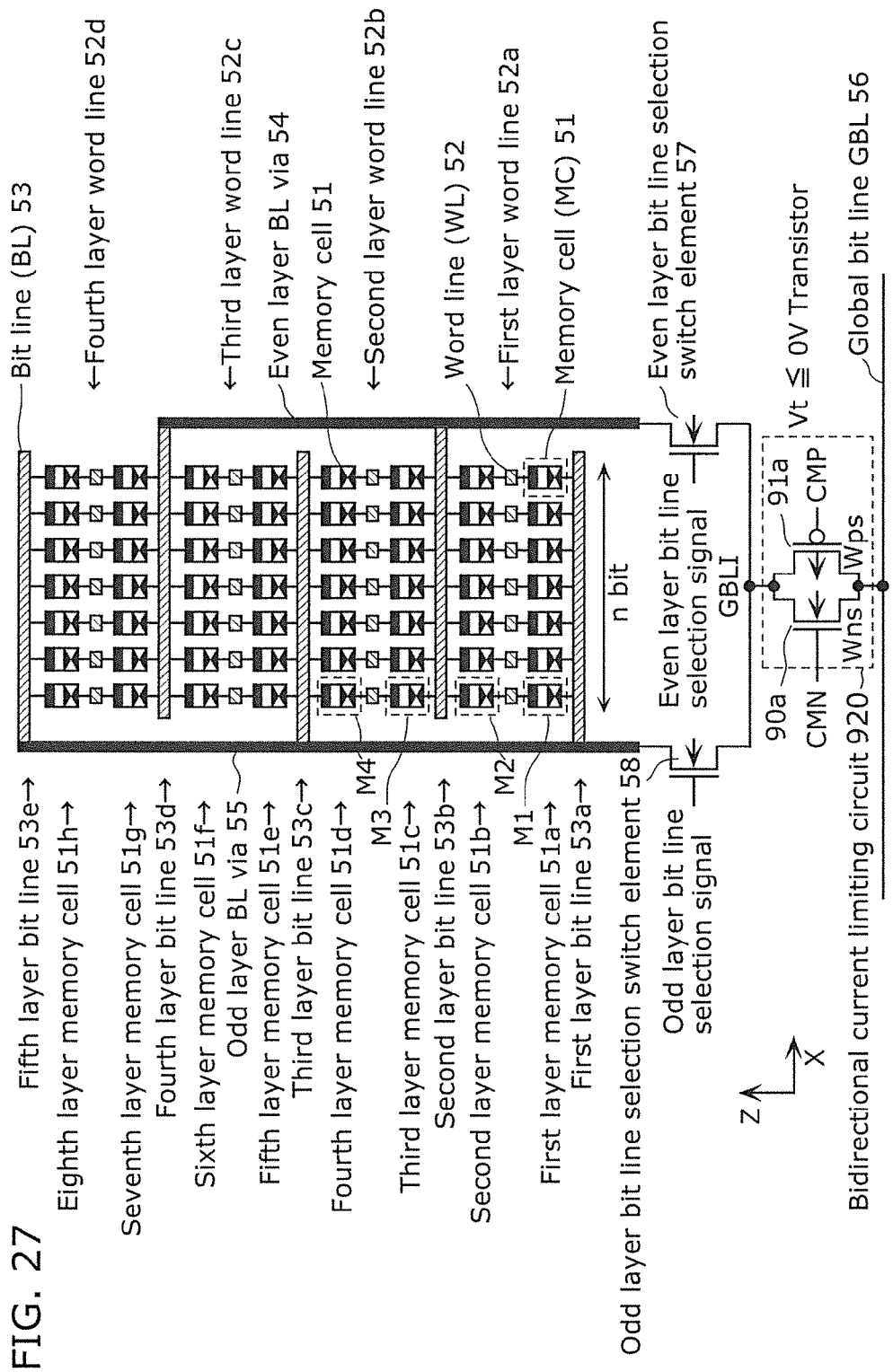
FIG. 27 is a cross section diagram of a multilayer cross point memory in Modification 1 in the reference example.

FIG. 27 is a diagram showing a structure in which the threshold voltages Vt of the MOS transistors in the N-type current limiting element 90 and the P-type current limiting element 91 are adjusted to 0 V in the structure shown in FIG. 11 (such N-type current limiting element and P-type current limiting element are respectively referred to as an N-type current limiting element 90a and a P-type current limiting element 91a). In this modification, the threshold voltage of the N-type current limiting element 90 is referred to as a third threshold voltage, the threshold voltage of the P-type current limiting element 91 as a fourth threshold voltage, the threshold voltage of the other NMOS transistors as a first threshold voltage, and the threshold voltage of the other PMOS transistors as a second threshold voltage. Changing the threshold voltage Vt only for a predetermined transistor can be easily realized by a generally known method such as providing a mask only in this transistor to prevent implantation for Vt or changing the amount of implantation for Vt only in this region.

Instead of setting the threshold to 0 V, the type of implanted ion may be changed only in this region to form a depression transistor so that the N-type current limiting element 90a is set to a normally ON state by a negative threshold voltage and the P-type current limiting element 91a is set to a normally ON state by a positive threshold voltage.

Moreover, a voltage that is greater than or equal to a total sum of the voltage VLR or VHR for the resistance change of the memory cell 51 and the threshold voltage Vt of the selection switch and that is a power voltage of the cross point variable resistance nonvolatile memory device or a result of stepping-up the power voltage is used as a high level of the even layer bit line selection signal or the odd layer bit line selection signal, thereby minimizing an impedance of the even layer bit line selection switch element 57 or the odd layer bit line selection switch element 58 in the ON state.

According to this structure, the voltage VLR1, VLR2, VLR3, or VLR4 between the global bit line and the word line for low resistance writing can be decreased by the threshold voltage of the transistor.

Such a structure is possible because the N-type current limiting element 90a or the P-type current limiting element 91a functions not as a switch but as a resistor having a bidirectional current limiting capability.

Note that the threshold voltage may be set to not 0 V but a negative voltage in depression type.

Thus, the write voltage VLR1, VLR2, VLR3, or VLR4 can be decreased by about the threshold voltage of the transistor, and accordingly the voltage VHR1, VHR2, VHR3, or VHR4 can be decreased, too. This contributes to lower power consumption in addition to stable writing operations.

In Modification 1, relatively high voltages are used as the drive voltage of the even layer bit line selection signal or the odd layer bit line selection signal and the gate voltage of the N-type current limiting element 90a, as mentioned above. However, this only involves transistor gate driving, and so does not affect power consumption as much as the reduction in write voltage VLR1, VLR2, VLR3, or VLR4.

[Modification 2]

Figure 28:
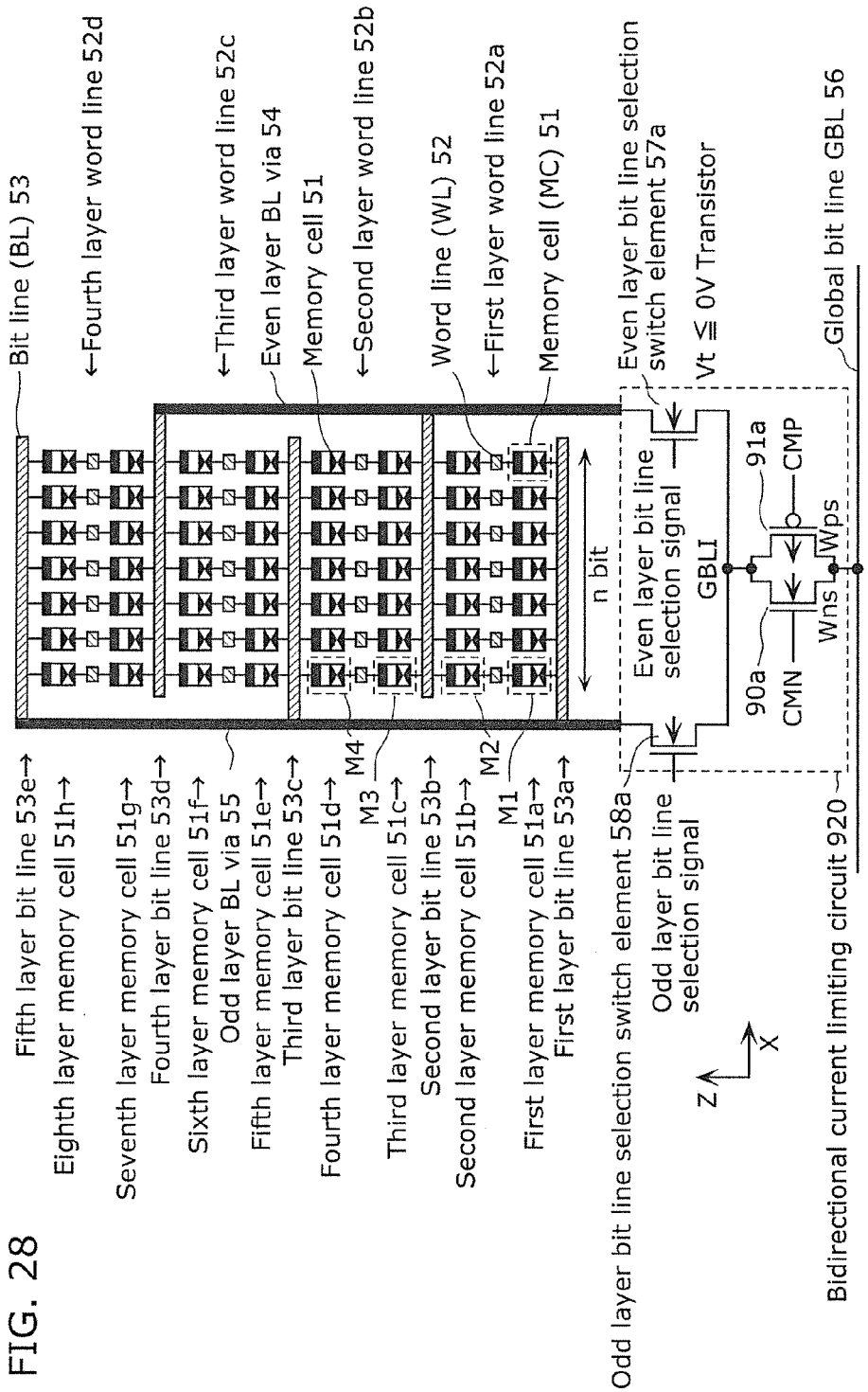
FIG. 28 is a cross section diagram of a multilayer cross point memory in Modification 2 in the reference example.

FIG. 28 is a diagram showing a structure in which the threshold voltages Vt of the NMOS transistors in the even layer bit line selection switch element 57 and the odd layer bit line selection switch element 58 are also set to the third threshold voltage less than or equal to 0 V, in the structure shown in FIG. 27 (such even layer bit line selection switch element and odd layer bit line selection switch element are respectively referred to as an even layer bit line selection switch element 57a and an odd layer bit line selection switch element 58a).

Figure 29:
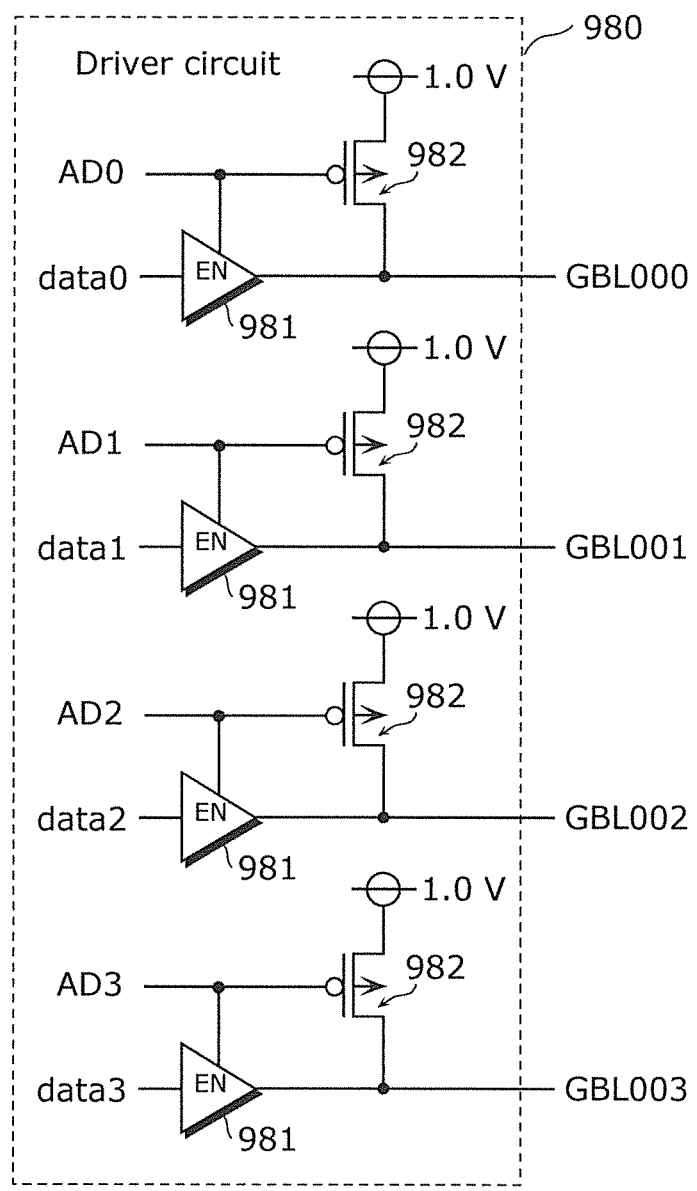
FIG. 29 is a diagram showing a global bit line driver circuit in Modification 2 in the reference example.

FIG. 29 shows an example of a driver circuit 980 in the global bit line decoder and driver circuit 98 used in Modification 2. The driver circuit 980 includes: a tri-state buffer 981 that outputs one of a first voltage output state corresponding to a high level of a write voltage and a second voltage output state corresponding to a low level of the write voltage in an activated state, and outputs a high impedance state in an inactivated state; and a pull-up element 982 having one end wired-connected to an output terminal of the tri-state buffer 981 and another end connected to a third voltage greater than or equal to a sum of absolute values of the first threshold voltage and the third threshold voltage. When writing to the memory cell 51, the global bit line decoder and driver circuit 98 applies the third voltage to each unselected global bit line. When reading from the memory cell 51, the global bit line decoder and driver circuit 98 applies the third voltage to each unselected global bit line. The third voltage is preferably a bit line voltage for setting the memory cell 51 to an unselected state.

In more detail, the driver circuit 980 includes the tri-state buffer 981 and the pull-up element 982 which is a PMOS transistor wired-connected to the output of the tri-state buffer 981. data0, data1, data2, or data3 for designating write data is inputted to the tri-state buffer 981, and a decode signal AD0, AD1, AD2, or AD3 for designating global bit line selection is connected to an enable terminal EN of the tri-state buffer 981. The decode signal AD0, AD1, AD2, or AD3 is equally connected to a gate terminal of the pull-up element 982, while a voltage source set to about 1 V is connected to a source of the pull-up element 982.

In FIG. 14, four driver circuits 980 of the same structure are respectively connected to the global bit lines GBL000, GBL001, GBL002, and GBL003.

Figure 30:
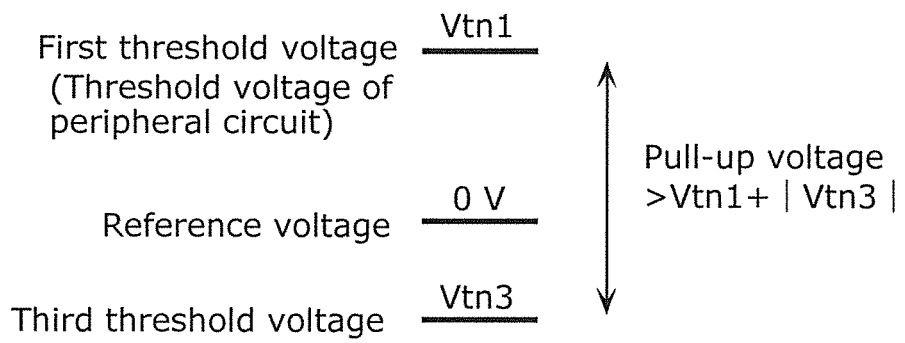
FIG. 30 is a voltage relation diagram related to a method of setting a source voltage of a pull-up element in the reference example.

FIG. 30 is a voltage relation diagram for a method of setting the source voltage of the pull-up element 982. Vtn1 denotes the first threshold voltage which is the threshold voltage of each NMOS transistor included in the peripheral circuitry such as the write circuit and the read circuit, and Vtn3 denotes the third threshold voltage which is the threshold voltage of each NMOS transistor in the even layer bit line selection switch element 57 (57a) and the odd layer bit line selection switch element 58 (58a). Though the threshold voltage is set to 0 V in this modification, a lower limit of the set threshold voltage including fluctuations is shown in FIG. 30. The source voltage is set to (Vtn1+|Vtn3|) or higher, within a range that does not exceed the unselected bit line voltage.

An operation principle of the above-mentioned structure is described below.

In Modification 2, the threshold voltages of the even layer bit line selection switch element 57a and the odd layer bit line selection switch element 58a are set to 0 V, too. This makes it possible to omit a means of stepping-up the gate voltage in the selected state, and further reduce the write voltage. However, there is also a possibility that, even when the gate voltage is set to 0 V in the unselected state, a leakage current occurs between the unselected global bit line and the unselected bit line due to an OFF leakage current, causing an increase in current consumption and an error in reading operation.

Such a leakage current can be prevented by applying a negative voltage less than or equal to the third threshold voltage Vtn3 as the gate voltage of the even layer bit line selection switch element 57a or the odd layer bit line selection switch element 58a in the unselected state. However, this method is not desirable because a negative voltage generation circuit is needed, which causes an increase in circuit area and cancels out the advantageous effect of omitting the step-up means.

In view of this, Modification 2 employs a method of turning OFF the transistor by setting the source voltage higher than the gate voltage or the substrate voltage so that the gate-to-source voltage is effectively made less than or equal to the threshold voltage of a typical transistor.

In FIG. 29, 1 V is applied to the unselected global bit line, as a voltage greater than or equal to the threshold voltage. For example, in the case where the global bit line GBL000 is selected, a high level is inputted to the decode signal AD0 of the tri-state buffer 981 to activate the tri-state buffer 981, and information designated by the write data signal data0 is provided to the global bit line GBL000.

In the case where the global bit line GBL000 is unselected, on the other hand, a low level is inputted to the decode signal AD0, and the tri-state buffer 981 outputs a high impedance. This turns ON the pull-up element 982 (PMOS transistor), and the source voltage 1 V of the pull-up element 982 is set in the global bit line GBL000.

Figure 31:
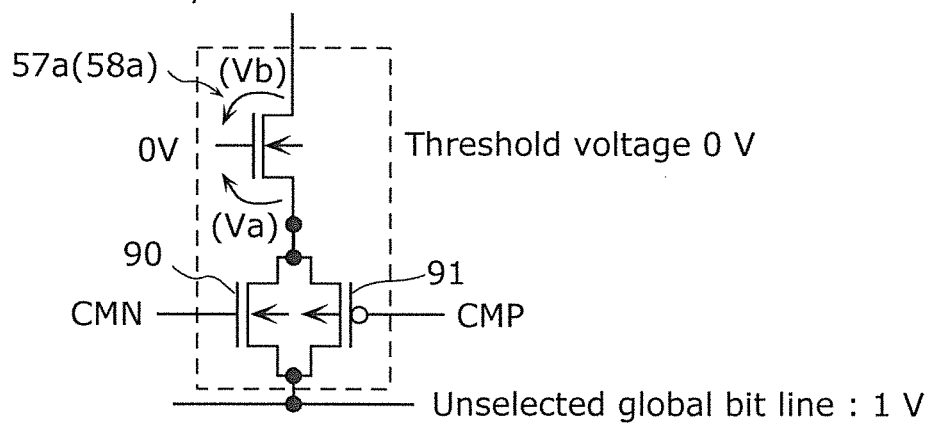
FIG. 31 is an equivalent circuit diagram of a current limiting element and an even layer bit line selection switch element or an odd layer bit line selection switch element in the reference example.

FIG. 31 shows an equivalent circuit of the even layer or odd layer selection switch element and the current limiting element between the global bit line and the bit line.

In FIG. 31, "(Va)" and "(Vb)" respectively indicate the gate voltage Vg as viewed from the source and the drain of the NMOS transistor (the even layer bit line selection switch element 57a or the odd layer bit line selection switch element 58a). In the unselected state, the gate voltage is 0 V. Meanwhile, the voltage of the unselected global bit line is 1 V, and the voltage of the bit line is about ½ of the voltage applied across both ends of the memory cell in the writing or reading operation (about 1 V to 2 V in reading, and about 2 V to 3 V in writing).

Accordingly, Vg (i.e. (Va)) as viewed from the global bit line side is −1 V, and also Vg (i.e. (Vb)) as viewed from the bit line side is V to −3 V. Both when viewed from the global bit line side and when viewed from the bit line side, the gate-to-source voltage Vg of the bit line selection switch element is sufficiently lower than the threshold voltage (0 V), so that the even layer bit line selection switch element 57a and the odd layer bit line selection switch element 58a are each effectively turned OFF. As a result, the leakage current to the unselected global bit line can be reduced.

In such a case, there is a need to generate a predetermined voltage between the power voltage and 0 V as the reference voltage. The use of a conventionally known means such as a resistive division method can easily realize this with a smaller circuit size than a step-up circuit or a negative voltage generation circuit.

Though the source voltage of the pull-up element 982 is set to be greater than or equal to Vtn1+|Vtn3|, it is more desirable to set the source voltage equal to the unselected bit line voltage, i.e. set the (Va) side voltage and (Vb) side voltage in FIG. 31 at the same potential, with it being possible to suppress the leakage current.

As described above, in Modification 2, the drive voltage of each of the even layer bit line selection signal and the odd layer bit line selection signal and the gate voltage of the N-type current limiting element 90 can be decreased in voltage as compared with Modification 1. Since there is no need to provide a step-up circuit for these voltages, both a voltage reduction and a simpler circuit structure can be achieved.

Though 0 V or a negative voltage is set as a threshold voltage of a predetermined transistor, in actual manufacturing there are fluctuations among a large number of transistors, and the threshold voltage is distributed in positive or negative voltages even when, for example, the threshold voltage is determined as 0 V. The threshold voltage typically fluctuates by 50 mV to 100 mV. Accordingly, the threshold voltage is less than or equal to 100 mV in the case of an NMOS transistor, and greater than or equal to −100 mV in the case of a PMOS transistor.

The cross point variable resistance nonvolatile memory device in the reference example is formed so that a threshold voltage of a typical transistor is 500 mV in the case of an NMOS transistor and −500 mV in the case of a PMOS transistor, as in a typical LSI. Therefore, by decreasing the threshold voltage to 0 V or less in order to reduce the voltage for the writing operation according to the reference example, a remarkable advantageous effect of a voltage reduction of about 500 mV can be achieved.

However, the reference example also includes such an instance where, when a typical transistor includes a high withstand voltage transistor or the like with a threshold voltage of 1 V or more, the threshold voltage of each transistor described in Modification 1 or 2 is not necessarily set to 0 V or below but is decreased by about 500 mV.

As described above, according to the reference example, a multilayer cross point memory capable of stably performing current limiting writing for setting the resistance value of the low resistance state for all layers can be realized in a nonvolatile memory device of a multilayer cross point memory structure in which cross point memory array layers of the same structure are stacked.

Though the cross point variable resistance nonvolatile memory device according to the reference example has been described above by way of Reference Examples 1 and 2 and Modifications 1 and 2, the reference example is not limited to such.

For example, though the second variable resistance layer 12 is located above in the orientation of the variable resistance element 10 in the Z direction in FIG. 11, the cross point variable resistance nonvolatile memory device according to the reference example may have each variable resistance element of the opposite orientation. In such a cross point variable resistance nonvolatile memory device, the memory cells M1, M2, M3, and M4 in FIG. 11 respectively correspond to M4, M3, M2, and M1 in terms of the relations between the memory cell 51 and the bit line 53 and the word line 52 which sandwich the memory cell 52. Hence, the structure can be realized by changing the control methods in accordance with this.

Though the oxygen-deficient transition metal oxide in the first variable resistance layer and the second variable resistance layer is tantalum oxide in the reference example described above, the first variable resistance layer and the second variable resistance layer in the variable resistance element according to the reference example are each not limited to this material, so long as it is a variable resistance layer: that has resistance change characteristics of reversibly changing between at least two states including a low resistance state and a high resistance state by application of voltages of different polarities; and that, in low resistance writing, is limited in current and, in high resistance writing, stably operates when a voltage higher in absolute value than and opposite in polarity to a voltage for low resistance writing is applied. In detail, the variable resistance layer may comprise at least one material selected from the group consisting of oxygen-deficient hafnium oxide and zirconium oxide, other than oxygen-deficient tantalum oxide. The variable resistance layer having the stack structure of such oxygen-deficient transition metal oxide, like the variable resistance layer having the stack structure of oxygen-deficient tantalum oxide, exhibits bidirectional resistance change characteristics of changing from the high resistance state to the low resistance state when a negative voltage is applied to the electrode on the side of the second variable resistance layer lower in oxygen deficiency with respect to the electrode on the side of the first variable resistance layer higher in oxygen deficiency, and changing from the low resistance state to the high resistance state when a positive voltage is applied to the electrode on the side of the second variable resistance layer with respect to the electrode on the side of the first variable resistance layer. Oxygen-deficient hafnium oxide and zirconium oxide can be formed by reactive sputtering in which sputtering is performed using hafnium and zirconium targets in an inert gas atmosphere containing oxygen, as with oxygen-deficient tantalum oxide. An oxygen concentration in a film can be adjusted by adjusting an oxygen concentration in the atmosphere during sputtering.

That is, though the variable resistance layer has the stack structure of tantalum oxide in each reference example described above, the above-mentioned advantageous effects of the reference example can also be achieved by materials other than tantalum oxide. For instance, the variable resistance layer may have the stack structure of hafnium (Hf) oxide, the stack structure of zirconium (Zr) oxide, or the like.

Moreover, the first variable resistance layer and the second variable resistance layer may comprise different metals. Here, it is preferable that the metal of the second variable resistance layer lower in oxygen deficiency has a lower standard electrode potential than the metal of the first variable resistance layer higher in oxygen deficiency. Since a smaller standard electrode potential facilitates oxidation, it is preferable that the metal of the second variable resistance layer lower in oxygen deficiency has a lower standard electrode potential than the metal of the first variable resistance layer higher in oxygen deficiency. This is because a resistance change phenomenon due to an oxidation reduction reaction is more likely to occur near an interface between the second variable resistance layer higher in oxygen content than the first variable resistance layer and the electrode connected to the second variable resistance layer. The same advantageous effects can also be achieved using other materials, so long as the variable resistance element in the cross point variable resistance nonvolatile memory device according to the reference example has the same resistance change characteristics.

The transition metal oxide layer sandwiched between the upper and lower electrodes includes an oxide layer of tantalum, hafnium, zirconium, or the like as a main variable resistance layer for performing a resistance change, and may additionally include, for example, a slight amount of other chemical element. It is also possible to intentionally include the other chemical element in a small amount, for resistance value fine adjustment and the like. For example, by adding nitrogen to the variable resistance layer, the variable resistance layer is increased in resistance value, which contributes to an improved resistance change reaction.

Accordingly, regarding the variable resistance element in which oxygen-deficient transition metal oxide is used in the variable resistance layer, in the case where the variable resistance layer includes a first region (first variable resistance layer) comprising a first oxygen-deficient transition metal oxide having a composition expressed as $MO_X$ and a second region (second variable resistance layer) comprising a second oxygen-deficient transition metal oxide having a composition expressed as $MO_y$ (where x<y), the first region and the second region may comprise a predetermined impurity (e.g. an additive for resistance value adjustment) in addition to the corresponding transition metal oxide.

When a resistance film is formed by sputtering, there is an instance where a slight amount of chemical element is unintentionally mixed into the resistance film due to residual gas, gas emission from a vacuum vessel wall, or the like. The reference example also includes such an instance where a slight amount of chemical element is mixed into the resistance film.

Though the electrode (second electrode) placed in contact with the second variable resistance layer (higher-oxygen-concentration oxide layer) comprises Pt (platinum) in the reference example described above, the electrode may be formed using at least one material having a higher standard electrode potential than the transition metal of the variable resistance layer, such as Au (gold), Ir (iridium), Pd (palladium), Cu (copper), Ag (silver), and the like. It is also preferable that the electrode (first electrode) placed in contact with the first variable resistance layer (lower-oxygen-concentration oxide layer) comprises a material (e.g. W, Ni, TaN, or the like in the case where the second electrode comprises the above-mentioned precious metal material) having a lower standard electrode potential than the material of the second electrode. In addition, it is more preferable that the first electrode comprises a material having a standard electrode potential lower than or equal to the standard electrode potential of the transition metal of the variable resistance layer.

A higher standard electrode potential leads to less oxidation. In the case where the standard electrode potential is higher than the standard electrode potential of the transition metal of the variable resistance layer, the variable resistance layer near their interface is more likely to be oxidized. In the case of the opposite structure, the variable resistance layer near their interface is less likely to be oxidized. Thus, a resistance change phenomenon is more likely to occur at the variable resistance layer near the interface of the electrode higher in standard electrode potential. This contributes to a stable operation.

This can be generalized as follows. It is preferable that the standard electrode potential $V_2$ of the second electrode and the standard electrode potential $V_M$ of the transition metal in the variable resistance layer have a relation $V_2 > V_M$, and also the standard electrode potential $V_2$ of the second electrode and the standard electrode potential $V_1$ of the first electrode have a relation $V_2 > V_1$. It is further preferable that there is a relation $V_1 \leq V_M$.

Such a structure enables a resistance change phenomenon to be stably induced in the second variable resistance layer in contact with the second electrode.

As described above, the cross point variable resistance nonvolatile memory device of the multilayer memory structure according to Reference Examples 1 and 2 is capable of stably setting a resistance value of a low resistance state for memory cells of each layer in the multilayer structure by a uniform current limiting method.

However, the bidirectional current limiting circuit is used in Reference Examples 1 and 2, which requires two bit line selection switch elements per vertical array plane. This causes an increase in layout area.

In view of this, the present inventors have conceived a cross point variable resistance nonvolatile memory device of a multilayer memory structure having the same functions as in Reference Examples 1 and 2, i.e. a cross point variable resistance nonvolatile memory device of a multilayer memory structure capable of stably setting a resistance value of a low resistance state for memory cells of each layer in the multilayer structure by a uniform current limiting method, without using the bidirectional current limiting circuit.

That is, an aspect of a cross point variable resistance nonvolatile memory device according to the present invention is a cross point variable resistance nonvolatile memory device including: a substrate; a memory cell array formed on the substrate and having a plurality of memory cells each of which includes a variable resistance element and a bidirectional current steering element, the variable resistance element reversibly changing between at least two states including a low resistance state and a high resistance state by application of voltages of different polarities, and the current steering element being connected in series with the variable resistance element and having nonlinear current-voltage characteristics, wherein each of the plurality of memory cells is formed at a different one of cross points of a plurality of bit lines and a plurality of word lines to be positioned between a corresponding bit line and a corresponding word line, the plurality of bit lines extending in an X direction and being formed in a first layer closer to a main surface of the substrate and a second layer farther from the main surface of the substrate, and the plurality of word lines extending in a Y direction and being formed between a bit line in the first layer and a bit line in the second layer, a memory cell of the plurality of memory cells that is formed at a cross point of the bit line in the first layer and each of the plurality of word lines is a first memory cell, a memory cell of the plurality of memory cells that is formed at a cross point of the bit line in the second layer and each of the plurality of word lines is a second memory cell, one or more XZ planes that each correspond to a different one of a plurality of bit line groups and are aligned in the Y direction are one or more vertical array planes respectively, each of the plurality of bit line groups being composed of the plurality of bit lines aligned in a Z direction which is a layer stacking direction, the one or more vertical array planes share the plurality of word lines that perpendicularly pass through the one or more vertical array planes, in each of the one or more vertical array planes, the bit line in the first layer is connected to a first via extending in the Z direction, and the bit line in the second layer is connected to a second via extending in the Z direction, the variable resistance element in each of the plurality of memory cells: includes a first electrode, a variable resistance layer, and a second electrode that are arranged in the stated order in the Z direction; and has characteristics of changing to the high resistance state when a voltage greater than or equal to a predetermined voltage is applied to the second electrode with respect to the first electrode and changing to the low resistance state when a voltage greater than or equal to a predetermined voltage is applied to the first electrode with respect to the second electrode, and the first electrode, the variable resistance layer, and the second electrode are arranged in the same order in the Z direction in the variable resistance element in the first memory cell and the variable resistance element in the second memory cell; a global bit line provided for each of the one or more vertical array planes; a first bit line selection switch element provided for each of the one or more vertical array planes, including one of a PMOS transistor and an NMOS transistor, and having one of a source terminal and a drain terminal connected to the first via and the other one of the source terminal and the drain terminal connected to the global bit line; and a second bit line selection switch element provided for each of the one or more vertical array planes, including the other one of the PMOS transistor and the NMOS transistor, and having one of a source terminal and a drain terminal connected to the second via and the other one of the source terminal and the drain terminal connected to the global bit line.

According to the present invention, each memory cell is formed at a different one of cross points of a plurality of bit lines extending in the X direction and formed in a plurality of layers and a plurality of word lines extending in the Y direction and formed in layers between the bit lines. One or more vertical array planes that share the word lines are aligned in the Y direction, each for a bit line group of bit lines aligned in the Z direction. A multilayer cross point structure is realized in this way. In each of the one or more vertical array planes, even layer bit lines are commonly connected, and odd layer bit lines are commonly connected. A first bit line selection switch element switches electrical connection and disconnection between a global bit line and the commonly-connected odd layer bit lines, whilst a second bit line selection switch element switches electrical connection and disconnection between the global bit line and the commonly-connected even layer bit lines.

Moreover, the first bit line selection switch element includes one of a PMOS transistor and an NMOS transistor and the second bit line selection switch element includes the other one of the PMOS transistor and the NMOS transistor, thus providing a current limiting function capable of limiting a current flow between the global bit line and each of the first and second bit line selection switch elements to a predetermined amount of current in any current direction in low resistance writing of memory cells of each layer.

That is, a hierarchical bit line system is realized by two bit line selection switch elements in each of the one or more vertical array planes, without adding any special current limiting circuit. This contributes to a smaller array size by minimizing an increase in layout area, and a leakage current to an unselected memory cell can be adequately reduced. Furthermore, by providing each of the first and second bit line selection switch elements with the current limiting function in a different current direction in low resistance writing, the variable resistance elements in the memory cells of all layers can be formed in the same orientation in the Z direction, and also a resistance value in low resistance writing can be stably set in each memory cell. Therefore, stable resistance change characteristics can be attained in all layers.

Here, the second electrode may be formed above the first electrode in the Z direction, wherein the first bit line selection switch element is the NMOS transistor, and the second bit line selection switch element is the PMOS transistor. Conversely, the second electrode may be formed below the first electrode in the Z direction, wherein the first bit line selection switch element is the PMOS transistor, and the second bit line selection switch element is the NMOS transistor.

Moreover, the memory cell array may be formed by stacking a plurality of two-layer memory cell array units each of which is a two-layer memory cell array including: the bit line in the first layer; a plurality of first memory cells; the plurality of word lines; a plurality of second memory cells; the bit line in the second layer; the first via; and the second via, wherein the respective first vias of the plurality of two-layer memory cell array units are connected in series with each other, and the respective second vias of the plurality of two-layer memory cell array units are connected in series with each other. This enables more memory cell arrays to be stacked, thus realizing a cross point variable resistance nonvolatile memory device of higher integration.

Moreover, the cross point variable resistance nonvolatile memory device may further include: a global bit line decoder and driver that supplies a signal for selecting a memory cell to the global bit line; a word line decoder and driver that supplies a signal for selecting the memory cell to any of the plurality of word lines; a sub-bit line selection circuit that supplies a selection signal for selecting any of the plurality of bit lines to the first bit line selection switch element and the second bit line selection switch element; a write circuit that writes data to the memory cell selected by the global bit line decoder and driver and the word line decoder and driver; a read circuit that reads data from the memory cell selected by the global bit line decoder and driver and the word line decoder and driver; and a control circuit that controls the global bit line decoder and driver, the word line decoder and driver, the write circuit, and the read circuit. Here, regarding a threshold of each transistor, it is preferable that the write circuit, the read circuit, and the control circuit each include at least one of an NMOS transistor having a first threshold voltage and a PMOS transistor having a second threshold voltage, a threshold voltage of the NMOS transistor included in the first bit line selection switch element or the second bit line selection switch element is a third threshold voltage lower than the first threshold voltage, and a threshold voltage of the PMOS transistor included in the first bit line selection switch element or the second bit line selection switch element is a fourth threshold voltage higher than the second threshold voltage. This enables a reduction in leakage current to an unselected global bit line, without using a step-up circuit or a negative voltage generation circuit.

To achieve this, the global bit line decoder and driver may include: a buffer circuit that at least outputs one of an output state of a first voltage and an output state of a second voltage in an activated state, and at least outputs a high impedance state in an inactivated state, the first voltage and the second voltage respectively corresponding to a high level and a low level of a write voltage; and a pull-up element having one end connected to an output terminal of the buffer circuit, and the other end connected to a power source having a third voltage that is greater than or equal to a sum of absolute values of the first threshold voltage and the third threshold voltage.

Here, the global bit line decoder and driver may apply the third voltage to an unselected global bit line, when writing the memory cell. The global bit line decoder and driver may apply the third voltage to an unselected global bit line, when reading the memory cell. The third voltage may be a voltage applied to a bit line connected to a memory cell that is to be set to an unselected state.

Moreover, in the case of being supplied with the selection signal from the sub-bit line selection circuit, each of the first bit line selection switch element and the second bit line selection switch element may: enter an ON state that produces a greater substrate bias effect to write the memory cell, when performing low resistance writing on the memory cell; and enter an ON state that produces a smaller substrate bias effect to write the memory cell, when performing high resistance writing on the memory cell. Thus, the current limitation in low resistance writing can be achieved through the use of the substrate bias effect.

To achieve this, a first current flowing through the first bit line selection switch element when performing the low resistance writing on the first memory cell and a second current flowing through the second bit line selection switch element when performing the low resistance writing on the second memory cell may be opposite in current direction, and equal in absolute value within a predetermined range of fluctuations.

Moreover, the cross point variable resistance nonvolatile memory device may further include a current limiting voltage generation circuit that generates voltages to be applied to gate terminals of the first bit line selection switch element and the second bit line selection switch element in order to cause the first current and the second current to be opposite in current direction and equal in absolute value within the predetermined range of fluctuations, wherein the sub-bit line selection circuit supplies the voltages generated by the current limiting voltage generation circuit to the gate terminals of the first bit line selection switch element and the second bit line selection switch element, as the selection signal.

Moreover, a gate width of the PMOS transistor included in the first bit line selection switch element or the second bit line selection switch element may be substantially twice a gate width of the NMOS transistor included in the first bit line selection switch element or the second bit line selection switch element.

Here, through the sub-bit line selection circuit, the current limiting voltage generation circuit may: supply the same first gate voltage to the gate terminal of the first bit line selection switch element, in the case of writing the memory cell to the high resistance state and in the case of writing the memory cell to the low resistance state; and supply the same second gate voltage to the gate terminal of the second bit line selection switch element, in the case of writing the memory cell to the high resistance state and in the case of writing the memory cell to the low resistance state.

The current limiting voltage generation circuit may turn ON the NMOS transistor included in the first bit line selection switch element or the second bit line selection switch element by applying a voltage greater than or equal to Vtn+VLR to a gate terminal of the NMOS transistor through the sub-bit line selection circuit, where VLR is a voltage applied across both ends of the memory cell when writing the memory cell to the low resistance state, and Vtn is a threshold voltage of the NMOS transistor. The current limiting voltage generation circuit may turn ON the PMOS transistor included in the first bit line selection switch element or the second bit line selection switch element by applying a voltage of 0 V to a gate terminal of the PMOS transistor.

The cross point variable resistance nonvolatile memory device may include: a plurality of vertical array planes as the one or more vertical array planes; a plurality of global bit lines each of which is provided for a different one of the plurality of vertical array planes, as the global bit line; and a plurality of first bit line selection switch elements each of which is provided for a different one of the plurality of vertical array planes and a plurality of second bit line selection switch elements each of which is provided for a different one of the plurality of vertical array planes, respectively as the first bit line selection switch element and the second bit line selection switch element. This enables a plurality of vertical array planes to be provided, thus realizing a cross point variable resistance nonvolatile memory device of higher integration.

Embodiment

The following describes an embodiment of the present invention in detail, with reference to drawings. The embodiment described below shows a preferred example of the present invention. The numerical values, shapes, materials, structural elements, structural element arrangements and connections, steps, step sequences, and the like described in the embodiment are merely examples, and should not limit the scope of the present invention. The scope of the present invention is limited only by the claims. Accordingly, the structural elements that are included in the embodiment but are not recited in any of the independent claims representing the broadest concepts of the present invention are described as not being necessarily required for achieving the object of the present invention but constituting a more preferred embodiment.

The differences from the above-mentioned Reference Examples 1 and 2 and Modifications 1 and 2 are mainly described in the following embodiment. The same structural elements as those in Reference Examples 1 and 2 and Modifications 1 and 2 are given the same reference signs, and their description is omitted or simplified. Therefore, the above description of Reference Examples 1 and 2 and Modifications 1 and 2 applies to the parts whose description is omitted in the following embodiment.

[Description of Circuit Structure According to the Present Invention]

[Structure and Method in Source Follower Current Limiting Mode for Low Resistance Writing]

Figure 32:
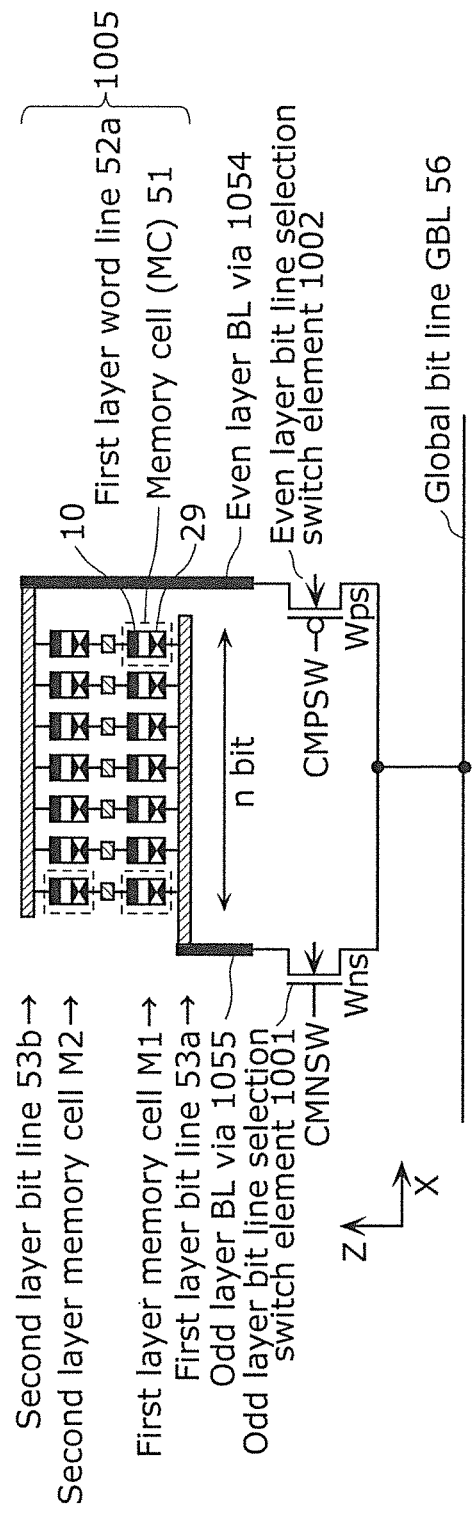
FIG. 32 is a cross section diagram of a two-layer cross point memory in an embodiment of the present invention.

FIG. 32 is a diagram showing a part (one vertical array plane) of a cross point variable resistance nonvolatile memory device in this embodiment. A cross section structure of a cross point memory cell array (equivalent to the two-layer part between the two wires 71 in the four-layer cross point memory cell array in FIG. 9) in which the same memory cells as the memory cell in FIG. 3 are stacked in two layers as viewed from a word line direction and a circuit structure provided below the cross point memory cell array are shown in FIG. 32.

This cross point variable resistance nonvolatile memory device includes a substrate (not shown), a memory cell array 1005, a global bit line 56, a first bit line selection switch element (an odd layer bit line selection switch element 1001 in this example), and a second bit line selection switch element (an even layer bit line selection switch element 1002 in this example).

The memory cell array 1005 is formed on the substrate, and has a plurality of memory cells 51 (in two layers in this example) each of which includes a variable resistance element 10 and a bidirectional current steering element 29. The variable resistance element 10 reversibly changes between at least two states including a low resistance state and a high resistance state by application of voltages of different polarities. The current steering element 29 is connected in series with the variable resistance element 10, and has nonlinear current-voltage characteristics.

Each memory cell 51 is formed at a different one of cross points of a plurality of bit lines (a first layer bit line 53*a* and a second layer bit line 53*b*) and a plurality of word lines (first layer word lines 52*a*), to be positioned between a corresponding bit line and a corresponding word line. The plurality of bit lines extend in an X direction, and are formed in a first layer closer to a main surface of the substrate and a second layer farther from the main surface of the substrate. The plurality of word lines extend in a Y direction, and are formed between a bit line in the first layer (the first layer bit line 53*a*) and a bit line in the second layer (the second layer bit line 53*b*).

Here, a memory cell 51 formed at a cross point of the bit line in the first layer (the first layer bit line 53*a*) and each of the plurality of word lines (the first layer word lines 52*a*) is referred to as a first memory cell (a first layer memory cell M1), and a memory cell 51 formed at a cross point of the bit line in the second layer (the second layer bit line 53*b*) and each of the plurality of word lines (the first layer word lines 52*a*) is referred to as a second memory cell (a second layer memory cell M2). One or more XZ planes (one XZ plane in this example) that each correspond to a different one of a plurality of bit line groups and are aligned in the Y direction are referred to as one or more vertical array planes. Each of the plurality of bit line groups is composed of the plurality of bit lines aligned in a Z direction which is a layer stacking direction.

The one or more vertical array planes share the plurality of word lines (the first layer word lines 52*a*) that perpendicularly pass through the one or more vertical array planes. In each of the one or more vertical array planes, the bit line in the first layer (the first layer bit line 53*a*) is connected to a first via (an odd layer BL via 1055) extending in the Z direction, and the bit line in the second layer (the second layer bit line 53*b*) is connected to a second via (an even layer BL via 1054) extending in the Z direction.

The variable resistance element 10 in each of the plurality of memory cells 51: includes a first electrode (a lower electrode 14 in this example), a variable resistance layer (a first variable resistance layer 13 and a second variable resistance layer 12 in this example), and a second electrode (an upper electrode 11 in this example) that are arranged in this order in the Z direction; and has characteristics of changing to the high resistance state when a voltage greater than or equal to a predetermined voltage is applied to the second electrode (the upper electrode 11) with respect to the first electrode (the lower electrode 14) and changing to the low resistance state when a voltage greater than or equal to a predetermined voltage is applied to the first electrode (the lower electrode 14) with respect to the second electrode (the upper electrode 11).

In the variable resistance element 10 in the first memory cell (the first layer memory cell M1) and the variable resistance element 10 in the second memory cell (the second layer memory cell M2), the first electrode (the lower electrode 14), the variable resistance layer (the first variable resistance layer 13 and the second variable resistance layer 12), and the second electrode (the upper electrode 11) are arranged in the same order in the Z direction.

The more detailed structure of the cross point variable resistance nonvolatile memory device is as follows.

In FIG. 32, the memory cell array 1005 including: the first layer bit line 53a; the first layer memory cell M1 composed of the memory cell 51; the first layer word lines 52a; the second layer memory cell M2 composed of the memory cell 51; and the second layer bit line 53b forms the same three-dimensional memory cell array as the memory cell array of the first and second layers in FIG. 11.

The odd layer BL via 1055 is a via for connecting the first layer bit line 53a and the odd layer bit line selection switch element 1001 located below. The even layer BL via 1054 is a via for connecting the second layer bit line 53b and the even layer bit line selection switch element 1002 located below. The connection relationship between the odd layer BL via 1005, the even layer BL via 1054, and the memory cell array 1005 is the same as in the case of forming the memory cell array in FIG. 11 in two layers.

The odd layer bit line selection switch element 1001 is an NMOS transistor having one of a source terminal and a drain terminal connected to the odd layer BL via 1055, the other one of the source terminal and the drain terminal connected to the global bit line 56, and a gate terminal connected to a node CMNSW to which a predetermined voltage is supplied. The even layer bit line selection switch element 1002 is a PMOS transistor having one of a source terminal and a drain terminal connected to the even layer BL via 1054, the other one of the source terminal and the drain terminal connected to the global bit line 56, and a gate terminal connected to a node CMPSW to which a predetermined voltage is supplied.

That is, in the case where the variable resistance element 10 has the characteristics of changing to the high resistance state when a voltage greater than or equal to a predetermined voltage is applied to the second electrode (the upper electrode 11) with respect to the first electrode (the lower electrode 14) and changing to the low resistance state when a voltage greater than or equal to a predetermined voltage is applied to the first electrode (the lower electrode 14) with respect to the second electrode (the upper electrode 11), the second electrode (the upper electrode 11) is formed above the first electrode (the lower electrode 14) in the Z direction in the structure shown in FIG. 32. In accordance with such an arrangement direction of the variable resistance element 10, the first bit line selection switch element (the odd layer bit line selection switch element 1001) connected to the first via (the odd layer BL via 1055) for connecting the odd layer bit line includes an NMOS transistor, whereas the second bit line selection switch element (the even layer bit line selection switch element 1002) connected to the second via (the even layer BL via 1054) for connecting the even layer bit line includes a PMOS transistor.

The odd layer bit line selection switch element 1001 and the even layer bit line selection switch element 1002 are the elements that have both the bit line selection switch function of the transistors 57 and 58 and the current limiting function of the transistors 90 and 91 in FIG. 11. In detail, the odd layer bit line selection switch element 1001 has both the function of being turned ON to select the first layer bit line 53a when the first layer memory cell M1 is selected, and the function of limiting the current in the source follower limiting mode in low resistance writing of the first layer memory cell M1. Meanwhile, the even layer bit line selection switch element 1002 has both the function of being turned ON to select the second layer bit line 53b when the second layer memory cell M2 is selected, and the function of limiting the current in the source follower limiting mode in low resistance writing of the second layer memory cell M2. According to this, the current in low resistance writing can be limited in the structure in which the memory cells 51 are stacked in the same orientation in all layers, without the need for the bidirectional current limiting circuit 920 as in the above reference example.

The cross point variable resistance nonvolatile memory device in this embodiment having the structure described above operates in the following manner.

First, upon selection of the first layer memory cell M1, a predetermined voltage for low resistance writing or high resistance writing is applied to the global bit line 56 and a word line corresponding to the selected memory cell from among the first layer word lines 52a, to turn ON the odd layer bit line selection switch element 1001. Moreover, a predetermined voltage (a voltage that enables predetermined current limitation in the case of low resistance writing) is applied to the node CMNSW connected to the gate terminal, as a result of which a predetermined voltage for low resistance writing or high resistance writing is applied to the bit line of the selected memory cell through the selected first layer bit line 53a, thus performing low resistance writing or high resistance writing on the selected first layer memory cell. Upon selection of the second layer memory cell M2, a predetermined voltage for low resistance writing or high resistance writing is applied to the global bit line 56 and a word line corresponding to the selected memory cell from among the first layer word lines 52a, to turn ON the even layer bit line selection switch element 1002. Moreover, a predetermined voltage (a voltage that enables predetermined current limitation in the case of low resistance writing) is applied to the node CMPSW connected to the gate terminal, as a result of which a predetermined voltage for low resistance writing or high resistance writing is applied to the bit line of the selected memory cell through the selected second layer bit line 53b, thus performing low resistance writing or high resistance writing on the selected second layer memory cell.

The characteristic point here is that, in the cross point variable resistance nonvolatile memory device, the activated bit line selection switch element (the odd layer bit line selection switch element 1001 or the even layer bit line selection switch element 1002) operates as a source follower when writing the corresponding memory cell to the low resistance state.

That is, for the first layer memory cell M1, since the current flows from the first layer bit line 53a to the first layer word line 52a in low resistance writing, the current flows through the odd layer bit line selection switch element 1001 which is an NMOS transistor from the terminal (drain terminal) connected to the global bit line 56 to the terminal (source terminal) connected to the first layer bit line 53a. Hence, the odd layer bit line selection switch element 1001 which is an NMOS transistor supplies the current to the memory cell from the source terminal, and so operates as a source follower producing a greater substrate bias effect. The current limitation in low resistance writing of the first layer memory cell M1 is realized in this way.

For the second layer memory cell M2, since the current flows from the first layer word line 52a to the second layer bit line 53b in low resistance writing, the current flows through the even layer bit line selection switch element 1002 which is a PMOS transistor from the terminal (source terminal) connected to the second layer bit line 53b to the terminal (drain terminal) connected to the global bit line 56. Hence, the even layer bit line selection switch element 1002 which is a PMOS transistor drives (draws in), by the source terminal, the current that is caused to flow through the memory cell, and so operates as a source follower producing a greater substrate bias effect. The current limitation in low resistance writing of the second layer memory cell M2 is realized in this way.

Figure 33:
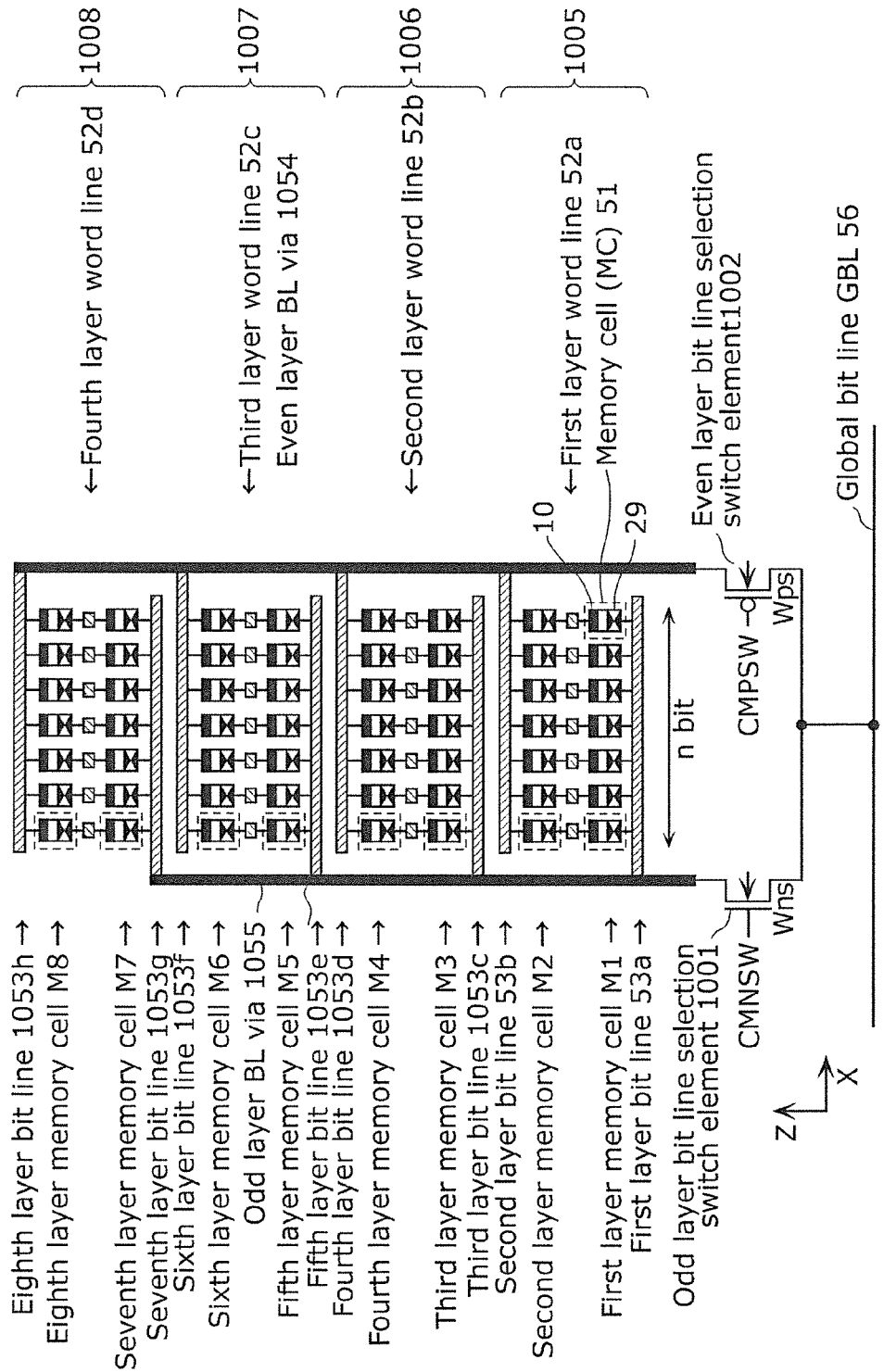
FIG. 33 is a cross section diagram of a multilayer cross point memory in the embodiment of the present invention.

In the case where the memory cell array is formed in three or more layers, the same structure as the memory cell array 1005 in two layers is stacked above the memory cell array 1005, as memory cell arrays 1006, 1007, and 1008 shown in FIG. 33. That is, when the two-layer memory cell array shown in FIG. 32 is referred to as a two-layer memory cell array unit, the memory cell array shown in FIG. 33 is formed by stacking a plurality of two-layer memory cell array units. FIG. 33 shows the memory cell array in eight layers, as a memory cell array example. As can be understood from the comparison of the memory cell array structures in FIGS. 11 and 33, the cross point variable resistance nonvolatile memory device in FIG. 33 differs from the cross point variable resistance nonvolatile memory device in FIG. 11 in that each bit line is not shared by the memory cells located above and below the bit line. This is because each bit line selection switch element (the odd layer bit line selection switch element 1001 and the even layer bit line selection switch element 1002) in FIG. 33 is provided with the current limiting function in this embodiment and as a result the cross point variable resistance nonvolatile memory device in FIG. 33 does not include such a bidirectional current limiting function (the bidirectional current limiting circuit 920) as in FIG. 11. In other words, the odd layer bit line selection switch element 1001 is connected to the odd layer memory cells M1, M3, M5, and M7 that can be current-limited by a source follower in low resistance writing, while the even layer bit line selection switch element 1002 is connected to the even layer memory cells M2, M4, M6, and M8 that can be current-limited by a source follower in low resistance writing.

This structure has both the advantage that the circuitry below the memory cell array can be realized by a small number of elements, i.e. two elements that are the odd layer bit line selection switch element 1001 and the even layer bit line selection switch element 1002, and the disadvantage that each bit line cannot be shared by the memory cells above and below the bit line.

However, there is only a limited area where transistors can be provided, below the memory cell array in the Z direction. In this respect, the structure shown in FIGS. 32 and 33 is more useful than the structure shown in FIG. 11.

The odd layer bit line selection switch element 1001 is designed to have a channel width Wns, and the even layer bit line selection switch element 1002 is designed to have a channel width Wps (the channel width Wps is substantially twice the channel width Wns).

The voltage values of the signals applied from the nodes CMNSW and CMPSW respectively to the gates of the odd layer bit line selection switch element 1001 and the even layer bit line selection switch element 1002 and their control method will be described in detail later.

Here, a group having the structure obtained by slicing in the direction in which the bit lines 53$a$ and 53$b$ are aligned, as shown in FIG. 32, is referred to as a vertical array plane as in FIG. 11. In detail, a plurality of XZ planes (one XZ plane in FIGS. 32 and 33) that each correspond to a different one of a plurality of bit line groups each of which has bit lines aligned in the Z direction which is a layer stacking direction, that share word lines perpendicularly passing through the plurality of XZ planes, and that are aligned in the Y direction are each referred to as a vertical array plane.

Figure 34:
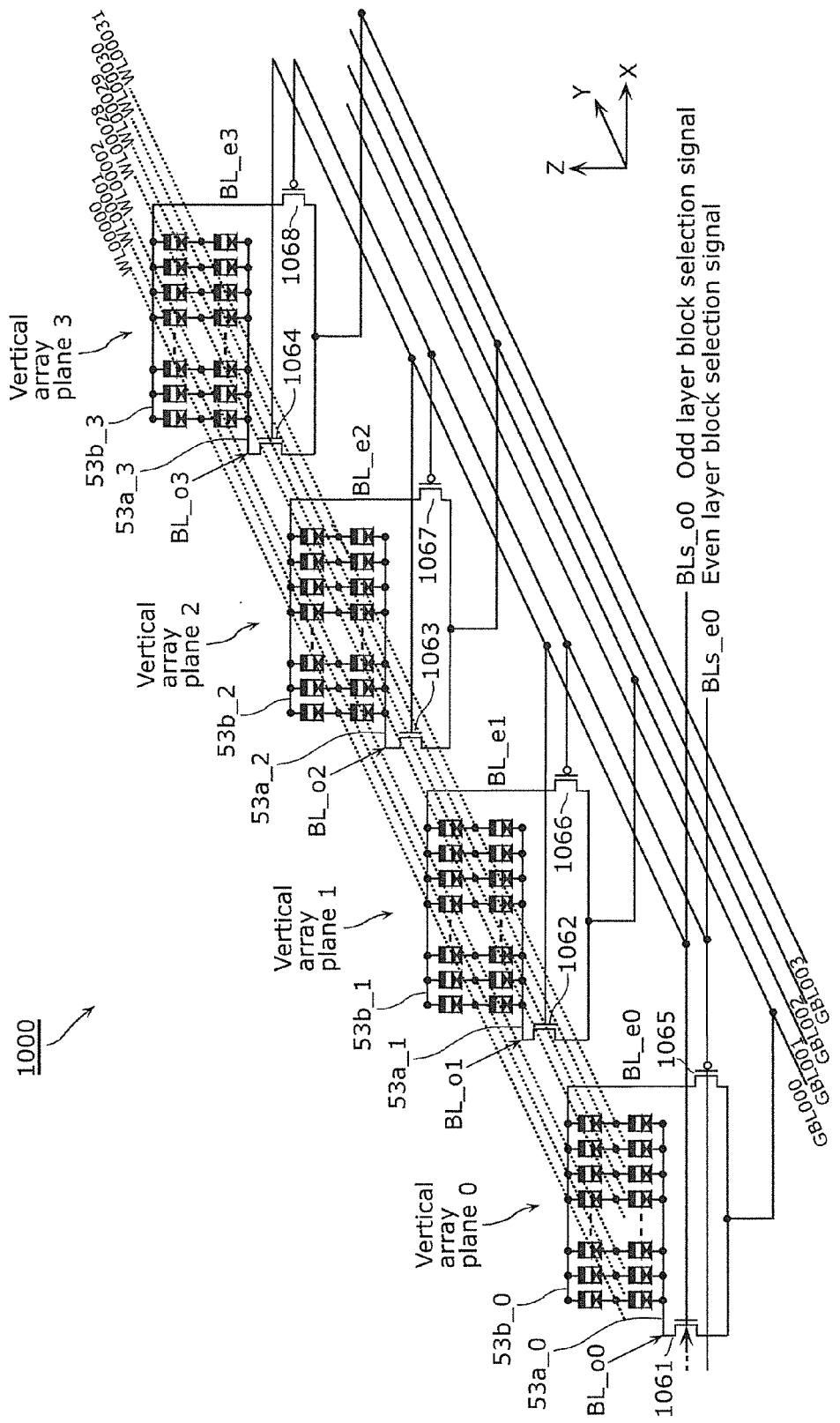
FIG. 34 is a circuit diagram showing a structure of a memory cell array in the embodiment of the present invention.

FIG. 34 is a diagram showing a memory cell array in which four vertical array planes are arranged face to face (in parallel with each other).

In FIG. 34, the X direction is a direction in which bit lines extend, the Y direction is a direction in which word lines extend, and the Z direction is a direction in which the bit lines or the word lines are stacked in layers (layer stacking direction).

In FIG. 34, bit lines (BL) 53$a$_0 to 53$a$_3 and 53$b$_0 to 53$b$_3 extend in the X direction and are formed in a plurality of layers (two layers in FIG. 34), and word lines (WL) WL00000 to WL00031 extend in the Y direction and are formed in layers (one layer in FIG. 34) between the bit lines 53$a$_0 to 53$a$_3 and 53$b$_0 to 53$b$_3. In such a memory cell array 1000, each memory cell (MC) 51 is formed at a different one of cross points of the bit lines 53$a$_0 to 53$a$_3 and 53$b$_0 to 53$b$_3 and the word lines WL00000 to WL00031 so as to be positioned between the corresponding bit line and word line. Note that a part of the memory cells and a part of the word lines are not shown for the sake of simplicity.

Each of vertical array planes 0 to 3 that corresponds to a different one of bit line BL groups (53$a$_0 and 53$b$_0, 53$a$_1 and 53$b$_1, 53$a$_2 and 53$b$_2, 53$a$_3 and 53$b$_3) each composed of bit lines arranged in layers in the Z direction includes memory cells formed between the bit lines and the word lines WL00000 to WL00031. The vertical array planes 0 to 3 share the word lines WL00000 to WL00031. In the example shown in FIG. 34, the number of memory cells in the X direction is 32 (n=32 in FIG. 32) and the number of memory cells in the Z direction is 2, in each of the vertical array planes 0 to 3. The memory cell array 1000 includes the four vertical array planes 0 to 3 aligned in the Y direction.

Note that the number of memory cells in each vertical array plane and the number of vertical array planes in the Y direction are not limited to such.

In the vertical array planes 0 to 3, the even layer bit lines 53$b$_0 to 53$b$_3 are commonly connected by even layer bit line vias BL_e0 to BL_e3, and the odd layer bit lines 53$a$_0 to 53$a$_3 are commonly connected by odd layer bit line vias BL_o0 to BL_o3.

Moreover, global bit lines GBL000 to GBL003 respectively corresponding to the vertical array planes 0 to 3 extend in the Y direction. Further, odd layer bit line selection switch elements 1061 to 1064 and even layer bit line selection switch elements 1065 to 1068 are respectively provided for the vertical array planes 0 to 3. In FIG. 34, the odd layer bit line selection switch elements 1061 to 1064 each include an NMOS transistor, and the even layer bit line selection switch elements 1065 to 1068 each include a PMOS transistor. The diffusion layer terminal of one of the drain and the source of each of the odd layer bit line selection switch elements 1061 to 1064 is connected to the corresponding one of the odd layer bit line vias BL_o0 to BL_o3, and the diffusion layer terminal of the other one of the drain and the source is connected to the corresponding one of the global bit lines GBL000 to GBL003. The diffusion layer terminal of one of the drain and the source of each of the even layer bit line selection switch elements 1065 to 1068 is connected to the corresponding one of the even layer bit line vias BL_e0 to BL_e3, and the diffusion layer terminal of the other one of the drain and the source is connected to the corresponding one of the global bit lines GBL000 to GBL003.

Voltages of an odd layer bit line selection signal BLs_o0 applied to the gate terminals of the odd layer bit line selection switch elements 1061 to 1064 and an even layer bit line selection signal BLs_e0 applied to the gate terminals of the even layer bit line selection switch elements 1065 to 1068 can be arbitrarily set according to the amount of current to which the current flow is to be limited.

That is, the odd layer bit line selection switch elements 1061 to 1064 are controlled by the voltage of the odd layer bit line selection node BLs_o0, so as to switch electrical connection and disconnection between the global bit lines GBL000 to GBL003 for the respective vertical array planes and the odd layer bit line vias BL_o0 to BL_o3 commonly connected in the respective vertical array planes and, in low resistance writing upon connection, perform predetermined current limitation. The even layer bit line selection switch elements 1065 to 1068 are controlled by the voltage of the even layer bit line selection node BLs_e0, so as to switch electrical connection and disconnection between the global bit lines GBL000 to GBL003 for the respective vertical array planes and the even layer bit line vias BL_e0 to BL_e3 commonly connected in the respective vertical array planes and, in low resistance writing upon connection, perform predetermined current limitation.

According to this structure, each of the vertical array planes 0 to 3 can be formed by placing the memory cells so that their variable resistance elements 10 have the same structure in the Z direction in all memory cell layers. Moreover, in the multilayer structure of three or more layers shown in FIG. 33, the even layer bit lines 53b_0 to 53b_3 are commonly connected and the odd layer bit lines 53a_0 to 53a_3 are commonly connected by independent vias (the even layer BL vias BL_e0 to BL_e3 and the odd layer BL vias BL_o0 to BL_o3), and these vias are connected to the global bit lines GBL through the odd layer bit line selection switch elements 1061 to 1064 or the even layer bit line selection switch elements 1065 to 1068 in FIG. 34. A multilayer cross point structure according to a hierarchical bit line system is realized in this way.

Figure 35:
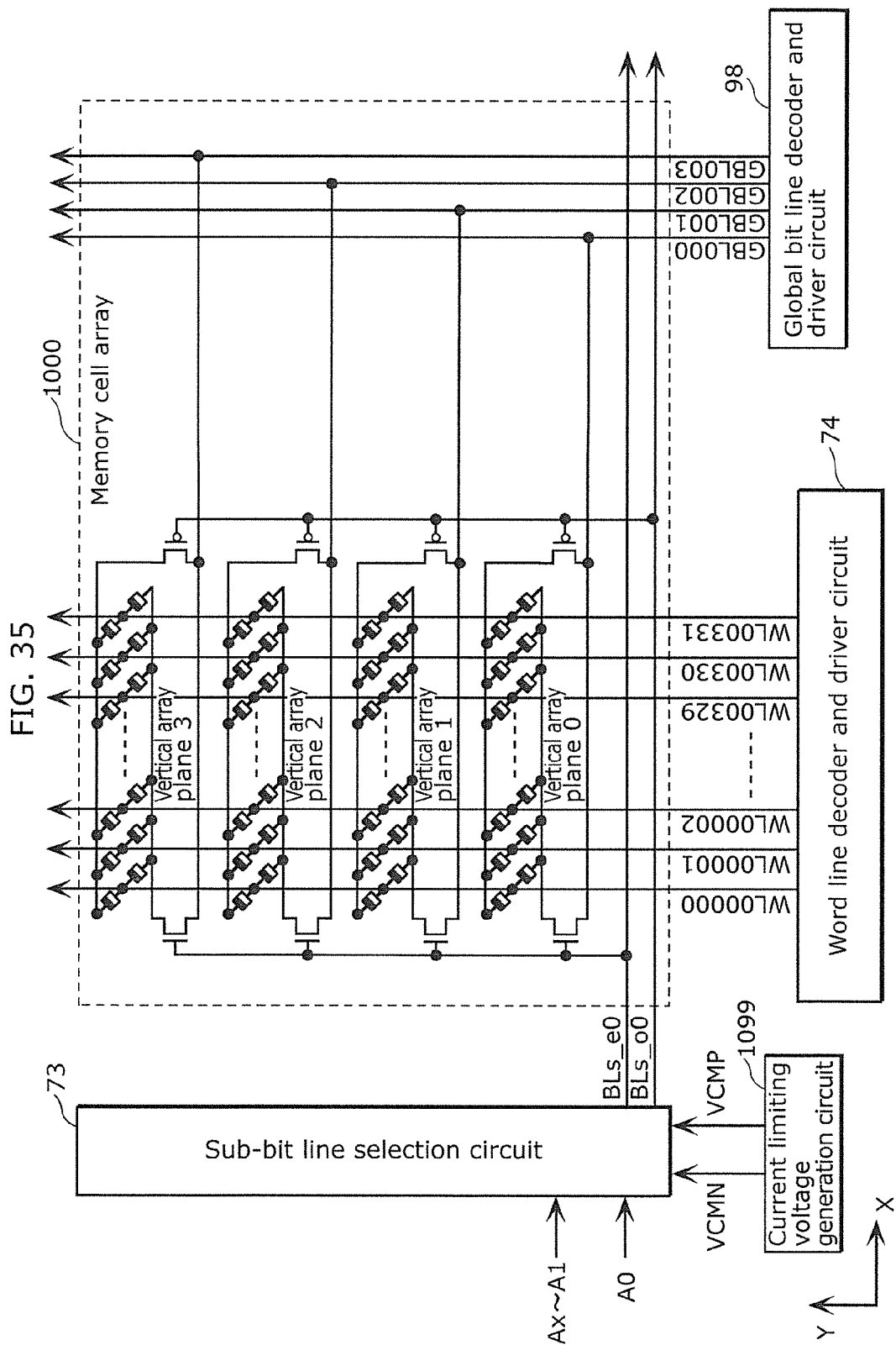
FIG. 35 is a circuit diagram showing the memory cell array shown in FIG. 34 and its peripheral circuitry.

FIG. 35 is a circuit diagram showing the memory cell array 1000 in FIG. 34 and its peripheral circuitry.

In FIG. 35, a global bit line decoder and driver circuit 98 is a circuit that supplies a signal for selecting a memory cell 51 to each of the global bit lines GBL000 to GBL003, and selectively drives and controls the global bit lines GBL000 to GBL003.

A sub-bit line selection circuit 73 is a circuit that controls the odd layer bit line selection switch elements 1061 to 1064 and the even layer bit line selection switch elements 1065 to 1068, and outputs the even layer bit line selection signal BLs_e0 and the odd layer bit line selection signal BLs_o0 according to address signals A0 to Ax.

A current limiting voltage generation circuit 1099 is a circuit that generates two types of voltages VCMN and VCMP. The output voltages VCMN and VCMP are supplied to the sub-bit line selection circuit 73. The voltage VCMN is used as a high-side voltage of the odd layer bit line selection signal BLs_o0, and the voltage VCMP is used as a low-side voltage of the even layer bit line selection signal BLs_e0.

In detail, in the case of changing the selected memory cell from the high resistance state to the low resistance state, the current limiting voltage generation circuit 1099 generates the voltage VCMN or VCMP for limiting the amount of current for a write pulse. In the case of changing the selected memory cell from the low resistance state to the high resistance state, the current limiting voltage generation circuit 1099 generates a sufficiently high voltage VCMN or a sufficiently low voltage VCMP so as not to limit the amount of current for a write pulse. In the case of the reading mode, too, the current limiting voltage generation circuit 1099 generates VCMN or VCMP so as not to limit the amount of current for a read pulse.

Thus, in this embodiment, the output voltages VCMN and VCMP to the nodes CMNSW and CMPSW are controlled by the current limiting voltage generation circuit 1099 and the sub-bit line selection circuit 73, according to the type of operation mode (e.g. high resistance writing mode, low resistance writing mode, reading mode) and the selected memory cell layer (even layer or odd layer). Various voltage settings for the selected memory cell will be described in detail later.

A word line decoder and driver circuit 74 is a circuit that supplies a signal for selecting a memory cell 51 to each of the word lines WL00000 to WL00031, and selectively drives and controls the word lines WL00000 to WL00031.

Figure 36:
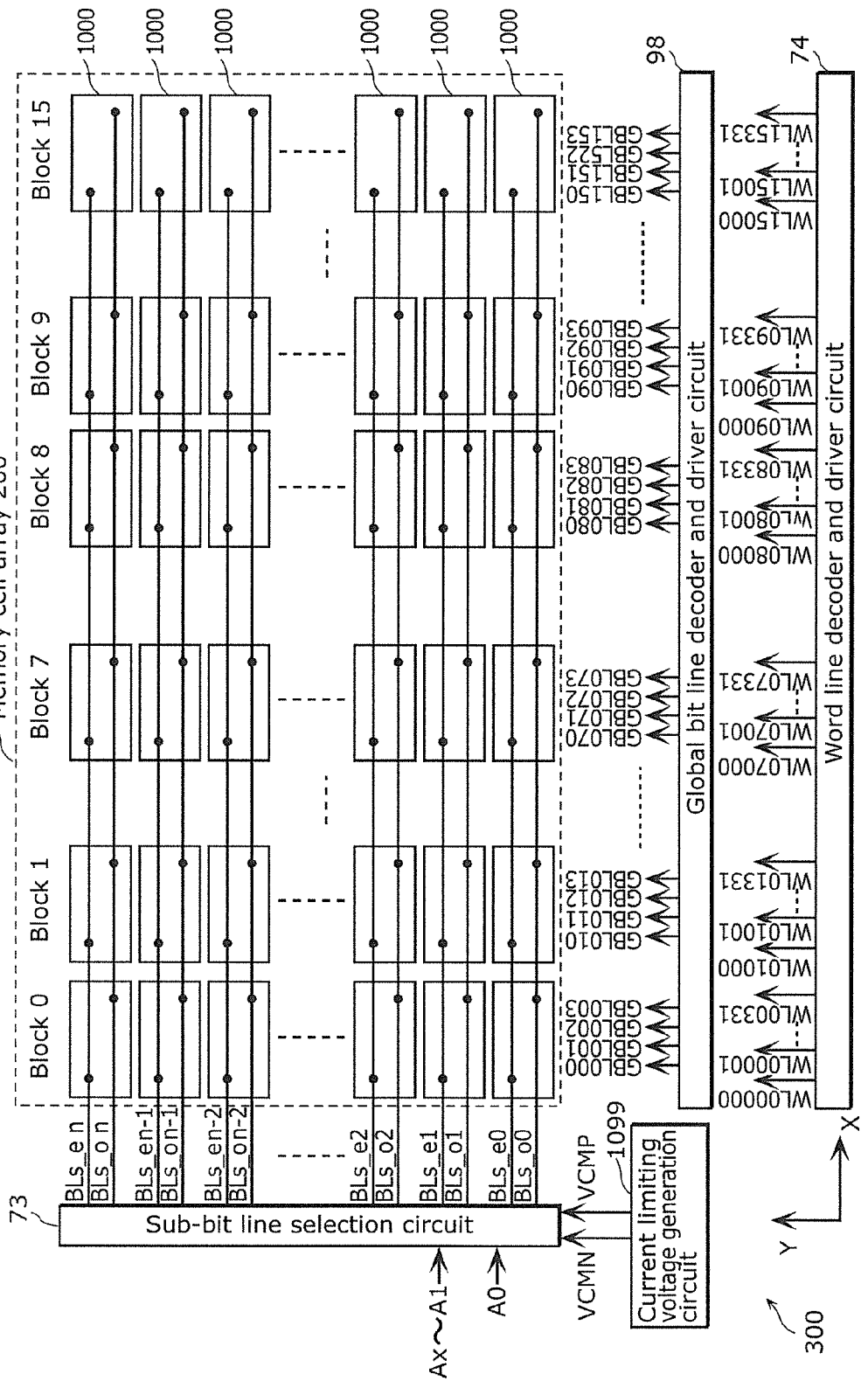
FIG. 36 is a circuit diagram showing a main part of a cross point variable resistance nonvolatile memory device that uses a plurality of memory cell arrays shown in FIG. 34.

FIG. 36 is a circuit diagram showing a main part of the cross point variable resistance nonvolatile memory device in this embodiment. As shown in FIG. 36, in the cross point variable resistance nonvolatile memory device, a memory cell array 200 is formed by providing a plurality of memory cell arrays 1000 (each corresponding to the vertical array planes) shown in FIG. 34. (n+1)×16 memory cell arrays 1000 are arranged in the example shown in FIG. 36.

The word line decoder and driver circuit 74 supplies a signal for memory cell selection, to selectively drive and control word lines WL00000 to WL15331.

The global bit line decoder and driver circuit 98 supplies a signal for memory cell selection, to selectively drive and control global bit lines GBL000 to GBL153.

The current limiting voltage generation circuit 1099 generates the voltages VCMN and VCMP for controlling the gate voltages CMNSW and CMPSW of the odd layer bit line selection switch elements 1061 to 1064 and the even layer bit line selection switch elements 1065 to 1068 selected according to the operation mode.

The sub-bit line selection circuit 73 outputs, according to the address signals A0 to Ax, even layer bit line selection signals BLs_e0 to BLs_en and odd layer bit line selection signals BLs_o0 to BLs_on for the memory cell arrays 1000 so that, in the memory cell array 200, an odd layer bit line selection switch element (one of the odd layer bit line selection switch elements 1061 to 1064 in the example shown in FIG. 34) or an even layer bit line selection switch element (one of the even layer bit line selection switch elements 1065 to 1068 in the example shown in FIG. 34) belonging to the selected vertical array plane becomes conductive.

Figure 37:
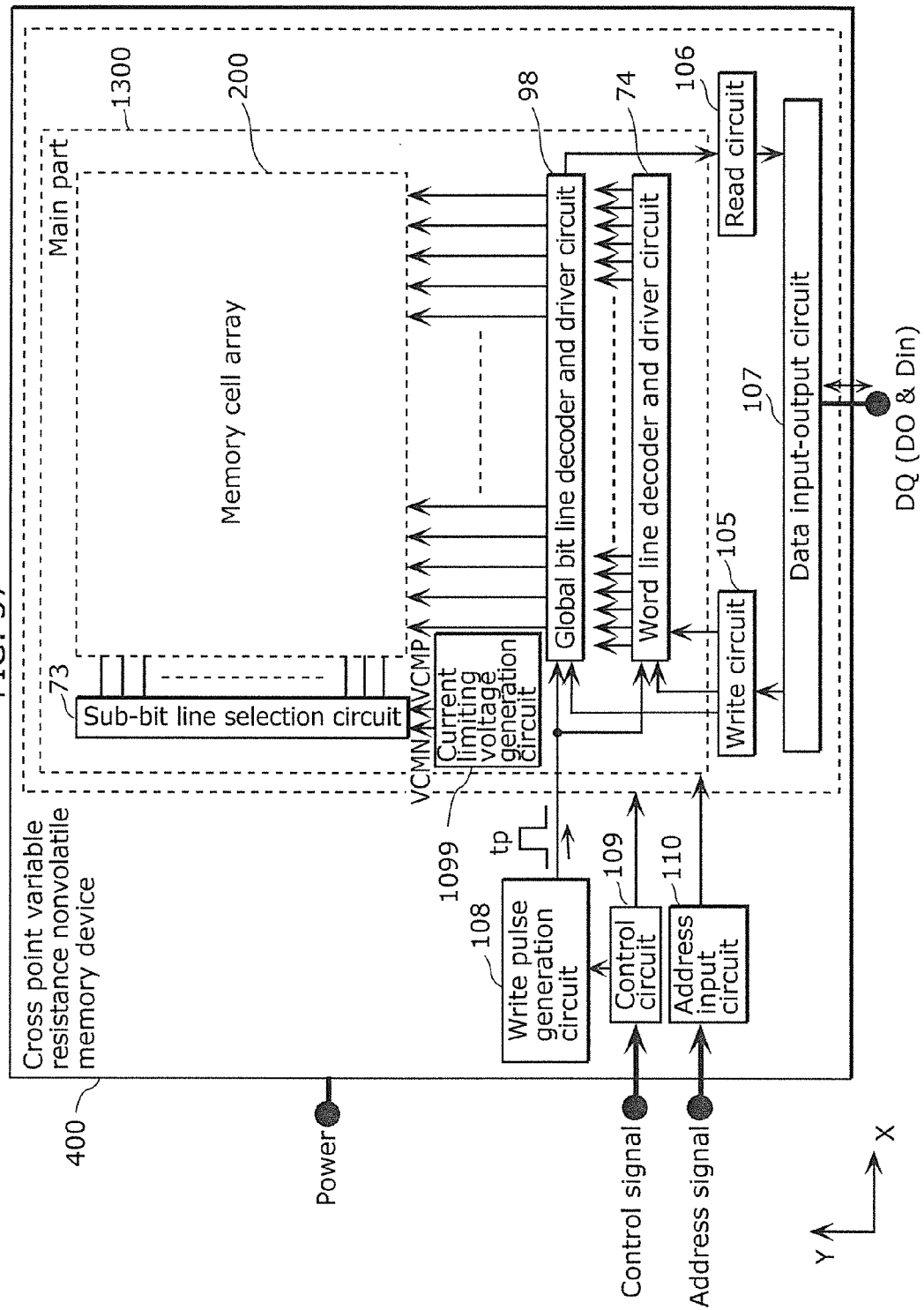
FIG. 37 is a circuit diagram showing a structure of a cross point variable resistance nonvolatile memory device in the embodiment of the present invention.

FIG. 37 is a circuit diagram showing an overall structure of a cross point variable resistance nonvolatile memory device 400 in this embodiment. A main part 1300 shown in FIG. 37 corresponds to the structure shown in FIG. 36.

In FIG. 37, an address input circuit 110 temporarily latches address signals from outside during a high resistance writing cycle, a low resistance writing cycle, or a reading cycle, and outputs the latched address signals to the sub-bit line selection circuit 73, the global bit line decoder and driver circuit 98, and the word line decoder and driver circuit 74.

A control circuit 109 receives a plurality of input signals (control signals), and outputs signals indicating states in the high resistance writing cycle, the low resistance writing cycle, the reading cycle, and standby, to the sub-bit line selection circuit 73, the global bit line decoder and driver circuit 98, the word line decoder and driver circuit 74, the current limiting voltage generation circuit 1099, a write circuit 105, a read circuit 106, and a data input-output circuit 107. The control circuit 109 also outputs trigger signals for generating a high resistance write pulse, a low resistance write pulse, and a read pulse respectively in the high resistance writing cycle, the low resistance writing cycle, and the reading cycle, to a write pulse generation circuit 108.

The write pulse generation circuit 108 generates a pulse for a given period tp (tp_E, tp_P, tp_R) in a high resistance writing time in the high resistance writing cycle, a low resistance writing time in the low resistance writing cycle, or a reading time in the reading cycle, and outputs the generated pulse to the global bit line decoder and driver circuit 98 and the word line decoder and driver circuit 74.

The data input-output circuit 107 is a block that sends or receives data to or from outside. In a writing operation, the data input-output circuit 107 latches data Din at an external terminal DQ, and outputs the write data to the write circuit 105 until reception of the next data. In a reading operation, the data input-output circuit 107 latches read data from the read circuit 106, and outputs the read data to the external terminal DQ as output data DO until reception of the next output data.

The write circuit 105 is a circuit that writes data to a memory cell selected by the global bit line decoder and driver circuit 98 and the word line decoder and driver circuit 74. Upon receiving a data signal from the data input-output circuit 107, the write circuit 105 outputs a write command signal to the global bit line decoder and driver circuit 98 and the word line decoder and driver circuit 74.

The read circuit 106 is a circuit that reads data from a memory cell selected by the global bit line decoder and driver circuit 98 and the word line decoder and driver circuit 74. The read circuit 106 detects a stored data state of a memory cell selected by the sub-bit line selection circuit 73 and the global bit line decoder and driver circuit 98, and outputs a detection result to the data input-output circuit 107 as a data signal.

Regarding a threshold of a transistor included in each circuit, the peripheral circuits of the memory cell array 200, namely, the sub-bit line selection circuit 73, the global bit line decoder and driver circuit 98, the word line decoder and driver circuit 74, the current limiting voltage generation circuit 1099, the write circuit 105, the read circuit 106, the data input-output circuit 107, the write pulse generation circuit 108, the control circuit 109, and the address input circuit 110 each include at least one of an NMOS transistor having a positive first threshold voltage and a PMOS transistor having a negative second threshold voltage. A threshold voltage of an NMOS transistor included in each of the odd layer bit line selection switch elements 1061 to 1064 is set to a third threshold voltage (e.g. 100 mV) lower than the first threshold voltage, and a threshold voltage of a PMOS transistor included in each of the even layer bit line selection switch elements 1065 to 1068 is set to a fourth threshold voltage (e.g. −100 mV) lower in absolute value than the second threshold voltage.

[Description of Operating Voltage Setting]

The following describes examples of writing the memory cells 51 included in the first layer memory cells M1 and the second layer memory cells M2 in FIG. 32, with reference to FIGS. 38A to 38D.

(A) Operation of writing the odd layer memory cell M1 to the low resistance state FIG. 38A is an equivalent circuit diagram showing an element connection structure from the global bit line 56 to the word line 52a in the cross section diagram in FIG. 32, for describing an operation of writing the selected memory cell M1 in the odd layer to the low resistance state. The diagram of FIG. 18A is shown on the left side of FIG. 38A for reference.

The odd layer bit line selection switch element 1001 (NMOS transistor) in FIG. 38A is an element that has both the switch function of the odd layer bit line selection switch element 58 (NMOS transistor) and the current limiting function of the N-type current limiting element 90 (NMOS transistor) in FIG. 18A.

The selected memory cell M1 in FIG. 38A is written to the same low resistance state as the selected memory cell M1 in FIG. 18A. Accordingly, the same voltage and current as those in FIG. 18A are applied to the selected memory cell M1. In detail, to set the first layer bit line 53a in the same voltage-current state as in FIG. 18A, the voltage VCMN same as the voltage applied to the gate of the N-type current limiting element 90 is outputted from the current limiting voltage generation circuit 1099, and applied to the gate of the odd layer bit line selection switch element 1001 through the sub-bit line selection circuit 73. The voltage VLR1 is applied to the global bit line 56 from the global bit line decoder and driver circuit 98, and the voltage of 0 V is applied to the selected word line 52a from the word line decoder and driver circuit 74. This causes the source-follower limited current to flow in the direction of the global bit line 56→the odd layer bit line selection switch element 1001→the bit line 53a→the selected memory cell M1→the word line 52a. The selected bit line 53a is set to the voltage VLR, the selected word line 52a is set to the voltage of 0 V, and the current ILR1 flows through the selected memory cell M1, thus performing the same predetermined low resistance writing as in FIG. 18A.

Meanwhile, since the upper bit line 53b is unselected, the predetermined OFF voltage Vpp is applied to the gate terminal of the even layer bit line selection switch element 1002 from the sub-bit line selection circuit 73, to turn OFF the even layer bit line selection switch element 1002 (PMOS transistor) in the same way as turning OFF the even layer bit line selection switch element 57 (NMOS transistor) in FIG. 18A.

That is, by setting the gate voltage VCMN of the odd layer bit line selection switch element 1001 to an appropriate value, the odd layer bit line selection switch element 1001 operates as a source follower. This causes the current limited to a predetermined current value to flow through the selected memory cell M1 in the direction from the bit line 53a to the word line 52a, allowing the memory cell 51 to be set to a predetermined low resistance value. According to the above-mentioned control, when changing any of the odd layer memory cells M1, M3, M5, and M7 to the low resistance state, the selected memory cell 51 can be changed to the low resistance state of a desired resistance value by current limitation in the source follower mode.

Figure 38B:
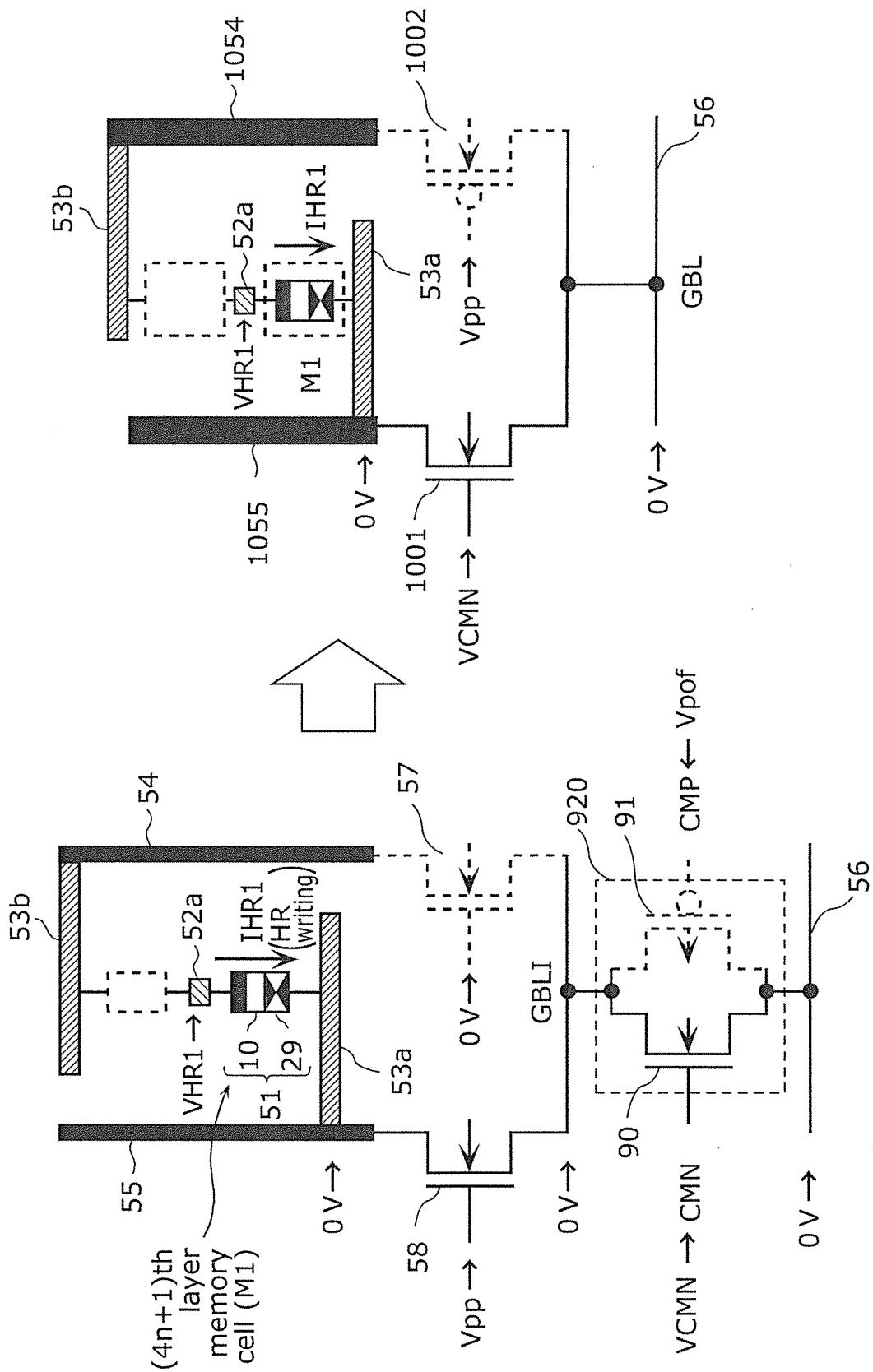
FIG. 38B is a diagram for describing a high resistance writing operation of the (4n+1)th layer memory cell in the source follower mode in the embodiment of the present invention.

(B) Operation of Writing the Odd Layer Memory Cell M1 to the High Resistance State FIG. 38B is an equivalent circuit diagram showing an element connection structure from the global bit line 56 to the word line 52a in the cross section diagram in FIG. 32, for describing an operation of writing the selected memory cell M1 in the odd layer to the high resistance state. The diagram of FIG. 18B is shown on the left side of FIG. 38B for reference.

The odd layer bit line selection switch element 1001 (NMOS transistor) in FIG. 38B is an element that has both the switch function of the odd layer bit line selection switch element 58 (NMOS transistor) and the switch function of the N-type current limiting element 90 (NMOS transistor) in FIG. 18B.

The selected memory cell M1 in FIG. 38B is written to the same high resistance state as the selected memory cell M1 in FIG. 18B. Accordingly, the same voltage and current as those in FIG. 18B are applied to the selected memory cell M1. In detail, to set the first layer bit line 53a in the same voltage-current state as in FIG. 18B, the voltage VCMN same as the voltage applied to the gate of the N-type current limiting element 90 is outputted from the current limiting voltage generation circuit 1099, and applied to the gate of the odd layer bit line selection switch element 1001 through the sub-bit line selection circuit 73. The voltage of 0 V is applied to the global bit line 56 from the global bit line decoder and driver circuit 98, and the voltage VHR1 is applied to the selected word line 52a from the word line decoder and driver circuit 74. This causes the current to flow in the direction of the word line 52a→the selected memory cell M1→the bit line 53a→the odd layer bit line selection switch element 1001→the global bit line 56. The selected bit line 53a is set to the voltage of 0 V, the selected word line 52a is set to the voltage VHR1, and the current IHR1 opposite in direction to low resistance writing flows through the selected memory cell M1, thus performing the same predetermined high resistance writing as in FIG. 18B.

Meanwhile, since the upper bit line 53b is unselected, the predetermined OFF voltage Vpp is applied to the gate terminal of the even layer bit line selection switch element 1002 from the sub-bit line selection circuit 73, to turn OFF the even layer bit line selection switch element 1002 (PMOS transistor) in the same way as turning OFF the even layer bit line selection switch element 57 (NMOS transistor) in FIG. 18B.

That is, by applying the voltage VCMN to the gate of the odd layer bit line selection switch element 1001, the voltage of 0 V to the global bit line 56, and the voltage VHR1 to the selected word line 52a, the word line terminal of the selected memory cell M1 is set to the voltage VHR1 while the bit line terminal of the selected memory cell M1 is set to 0 V. This causes the current IHR1 to flow in the direction from the word line 52a to the bit line 53a, allowing the memory cell M1 to be set to a predetermined high resistance value. According to the above-mentioned control, when changing any of the odd layer memory cells M1, M3, M5, and M7 to the high resistance state, the selected memory cell 51 can be changed to the high resistance state of a desired resistance value by applying the high resistance write voltage VHR1 so that the current opposite in direction to low resistance writing flows.

Figure 38C:
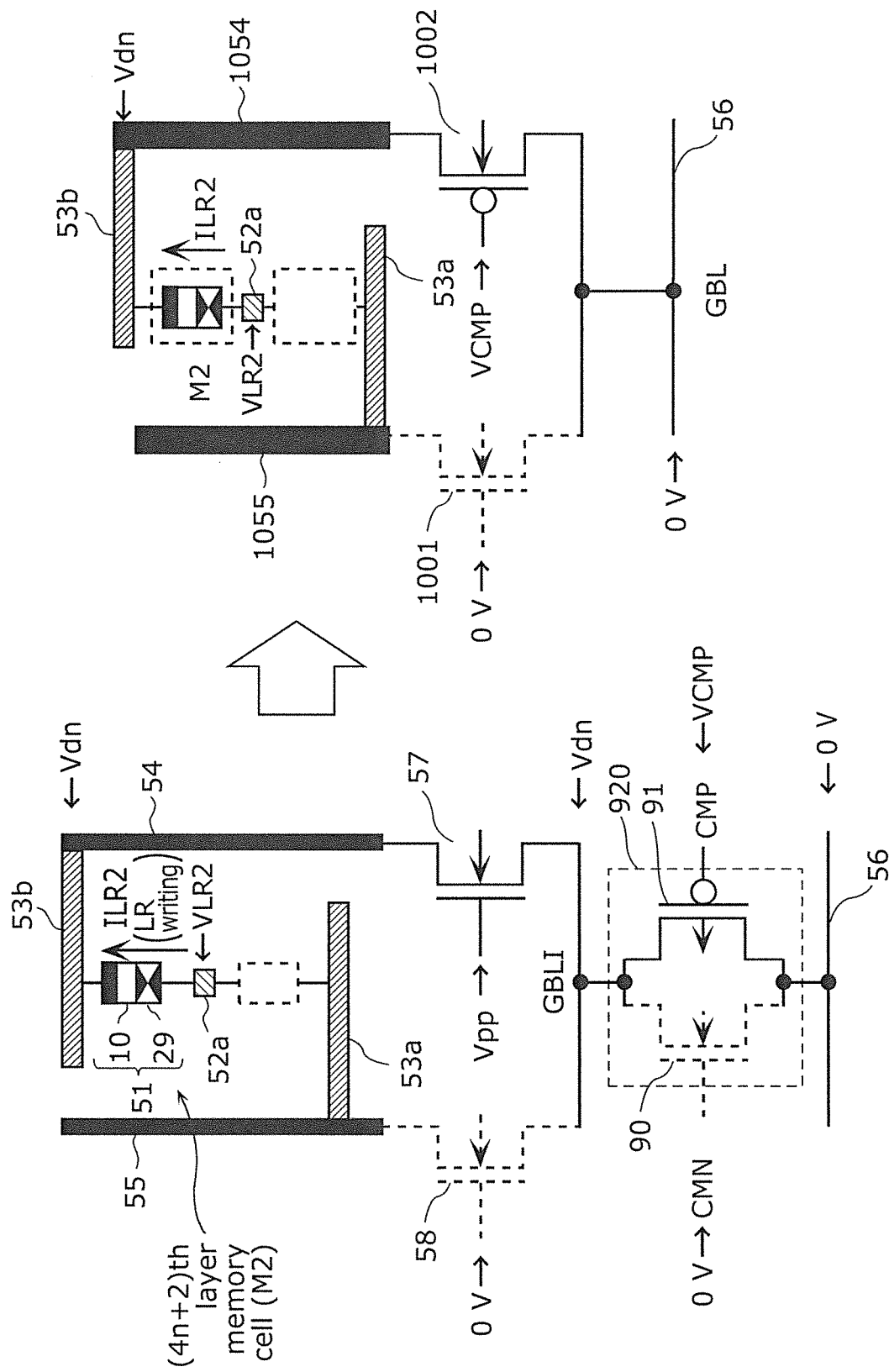
FIG. 38C is a diagram for describing a low resistance writing operation of a (4n+2)th layer memory cell in the source follower mode in the embodiment of the present invention.

(C) Operation of Writing the Even Layer Memory Cell M2 to the Low Resistance State FIG. 38C is an equivalent circuit diagram showing an element connection structure from the global bit line 56 to the word line 52a in the cross section diagram in FIG. 32, for describing an operation of writing the selected memory cell M2 in the even layer to the low resistance state. The diagram of FIG. 18C is shown on the left side of FIG. 38C for reference.

The even layer bit line selection switch element 1002 (PMOS transistor) in FIG. 38C is an element that has both the switch function of the even layer bit line selection switch element 57 (NMOS transistor) and the current limiting function of the P-type current limiting element 91 (PMOS transistor) in FIG. 18C.

The selected memory cell M2 in FIG. 38C is written to the same low resistance state as the selected memory cell M2 in FIG. 18C. Accordingly, the same voltage and current as those in FIG. 18C are applied to the selected memory cell M2. In detail, to set the second layer bit line 53b in the same voltage-current state as in FIG. 18C, the voltage VCMP same as the voltage applied to the gate of the P-type current limiting element 91 is outputted from the current limiting voltage generation circuit 1099, and applied to the gate of the even layer bit line selection switch element 1002 through the sub-bit line selection circuit 73. The voltage of 0 V is applied to the global bit line 56 from the global bit line decoder and driver circuit 98, and the voltage VLR2 is applied to the selected word line 52a from the word line decoder and driver circuit 74. This causes the source-follower limited current to flow in the direction of the word line 52a→the selected memory cell M2→the bit line 53b→the even layer bit line selection switch element 1002→the global bit line 56. The selected bit line 53b is set to the voltage Vdn, the selected word line 52a is set to the voltage VLR2, and the current ILR2 flows through the selected memory cell M2, thus performing the same predetermined low resistance writing as in FIG. 18C.

Meanwhile, since the lower bit line 53a is unselected, the OFF voltage of 0 V is applied to the gate terminal of the odd layer bit line selection switch element 1001 from the sub-bit line selection circuit 73, to turn OFF the odd layer bit line selection switch element 1001 (NMOS transistor) in the same way as turning OFF the odd layer bit line selection switch element 58 (NMOS transistor) in FIG. 18C.

That is, by setting the gate voltage VCMP of the even layer bit line selection switch element 1002 to an appropriate value, the even layer bit line selection switch element 1002 operates as a source follower. This causes the current limited to a predetermined current value to flow through the selected memory cell M2 in the direction from the word line 52a to the bit line 53b, allowing the memory cell 51 to be set to a predetermined low resistance value. According to the above-mentioned control, when changing any of the even layer memory cells M2, M4, M6, and M8 to the low resistance state, the selected memory cell 51 can be changed to the low resistance state of a desired resistance value by current limitation in the source follower mode.

Figure 38D:
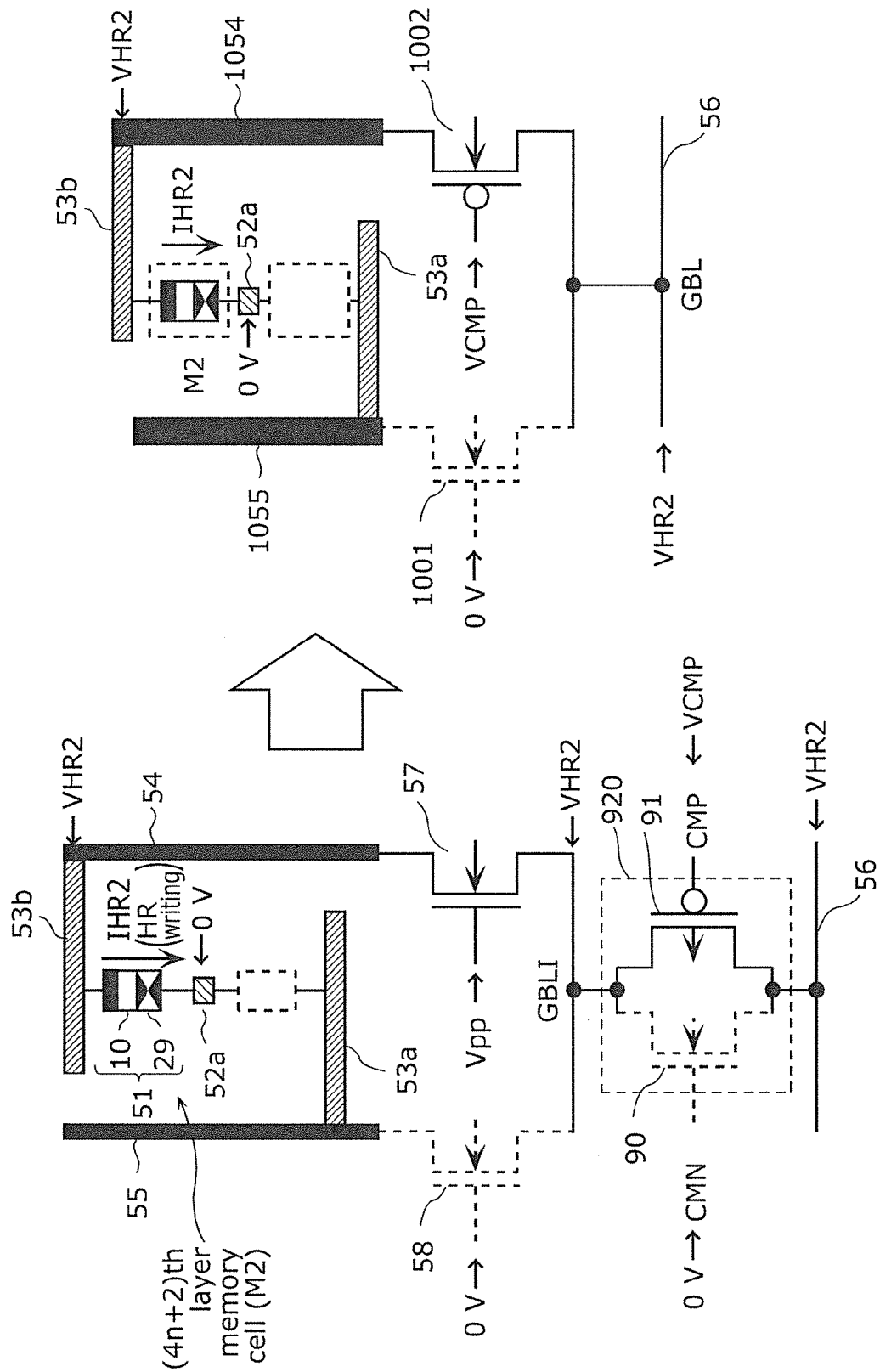
FIG. 38D is a diagram for describing a high resistance writing operation of the (4n+2)th layer memory cell in the source follower mode in the embodiment of the present invention.

(D) Operation of Writing the Even Layer Memory Cell M2 to the High Resistance State FIG. 38D is an equivalent circuit diagram showing an element connection structure from the global bit line 56 to the word line 52a in the cross section diagram in FIG. 32, for describing an operation of writing the selected memory cell M2 in the even layer to the high resistance state. The diagram of FIG. 18D is shown on the left side of FIG. 38D for reference.

The even layer bit line selection switch element 1002 (PMOS transistor) in FIG. 38D is an element that has both the switch function of the even layer bit line selection switch element 57 (NMOS transistor) and the switch function of the P-type current limiting element 91 (PMOS transistor) in FIG. 18D.

The selected memory cell M2 in FIG. 38D is written to the same high resistance state as the selected memory cell M2 in FIG. 18D. Accordingly, the same voltage and current as those in FIG. 18D are applied to the selected memory cell M2. In detail, to set the second layer bit line 53b in the same voltage-current state as in FIG. 18D, the voltage VCMP same as the voltage applied to the gate of the P-type current limiting element 91 is outputted from the current limiting voltage generation circuit 1099, and applied to the gate of the even layer bit line selection switch element 1002 through the sub-bit line selection circuit 73. The voltage VHR2 is applied to the global bit line 56 from the global bit line decoder and driver circuit 98, and the voltage of 0 V is applied to the selected word line 52a from the word line decoder and driver circuit 74. This causes the current to flow in the direction of the global bit line 56 the even layer bit line selection switch element 1002, the bit line 53b-4 the selected memory cell M2 the word line 52a. The selected bit line 53b is set to the voltage VHR2, the selected word line 52a is set to the voltage of 0 V, and the current IHR2 opposite in direction to low resistance writing flows through the selected memory cell M2, thus performing the same predetermined high resistance writing as in FIG. 18D.

Meanwhile, since the lower bit line 53a is unselected, the predetermined OFF voltage of 0 V is applied to the gate terminal of the odd layer bit line selection switch element 1001 from the sub-bit line selection circuit 73, to turn OFF the odd layer bit line selection switch element 1001 (NMOS transistor) in the same way as turning OFF the odd layer bit line selection switch element 58 (NMOS transistor) in FIG. 18D.

That is, by applying the voltage VCMP to the gate of the even layer bit line selection switch element 1002, the voltage VHR2 to the global bit line 56, and the voltage of 0 V to the selected word line 52*a*, the bit line terminal of the selected memory cell M2 is set to the voltage VHR2 while the word line terminal of the selected memory cell M2 is set to 0 V. This causes the current IHR2 to flow in the direction from the bit line 53*b* to the word line 52*a*, allowing the memory cell M2 to be set to a predetermined high resistance value. According to the above-mentioned control, when changing any of the even layer memory cells M2, M4, M6, and M8 to the high resistance state, the selected memory cell 51 can be changed to the high resistance state of a desired resistance value by applying the high resistance write voltage VHR2 so that the current opposite in direction to low resistance writing flows.

Table 5 summarizes the gate voltage of the odd layer bit line selection switch element 1001, the gate voltage of the even layer bit line selection switch element 1002, the applied voltage of the global bit line 56, the applied voltage of the selected bit line, and the applied voltage of the selected word line, in low resistance writing in the source follower mode and high resistance writing of the odd layer memory cells M1, M3, M5, and M7 and the even layer memory cells M2, M4, M6, and M8 described above. In Table 5, "(ON:SF)" in the rows of the gate voltage of the odd layer bit line selection switch element 1001 and the gate voltage of the even layer bit line selection switch element 1002 means that the corresponding transistor is ON in the source follower mode.

TABLE 5

|  | Writing to odd layer memory cell (M1, M3, M5, M7) | | Writing to even layer memory cell (M2, M4, M6, M8) | |
| --- | --- | --- | --- | --- |
|  | LR (A) | HR (B) | LR (C) | HR (D) |
| Gate voltage of odd layer bit line selection switch element 1001 | VCMN (ON:SF) | VCMN (ON) | 0 V (OFF) | 0 V (OFF) |
| Gate voltage of even layer bit line selection switch element 1002 | Vpp (OFF) | Vpp (OFF) | VCMP (ON:SF) | VCMP (ON) |
| Global bit line 56 | VLR1 | 0 V | 0 V | VHR2 |
| Selected bit line 53a/53b | VLR | 0 V | Vdn | VHR2 |
| Selected word line 52a | 0 V | VHR1 | VLR2 | 0 V |

(SF: source follower current limitation)

FIGS. 32 and 33 show the bit line selection switch element structure in the case of using the memory cell 51 in which the variable resistance element 10 is written to the low resistance state when the write current flows from the lower electrode to the upper electrode.

Figure 39:
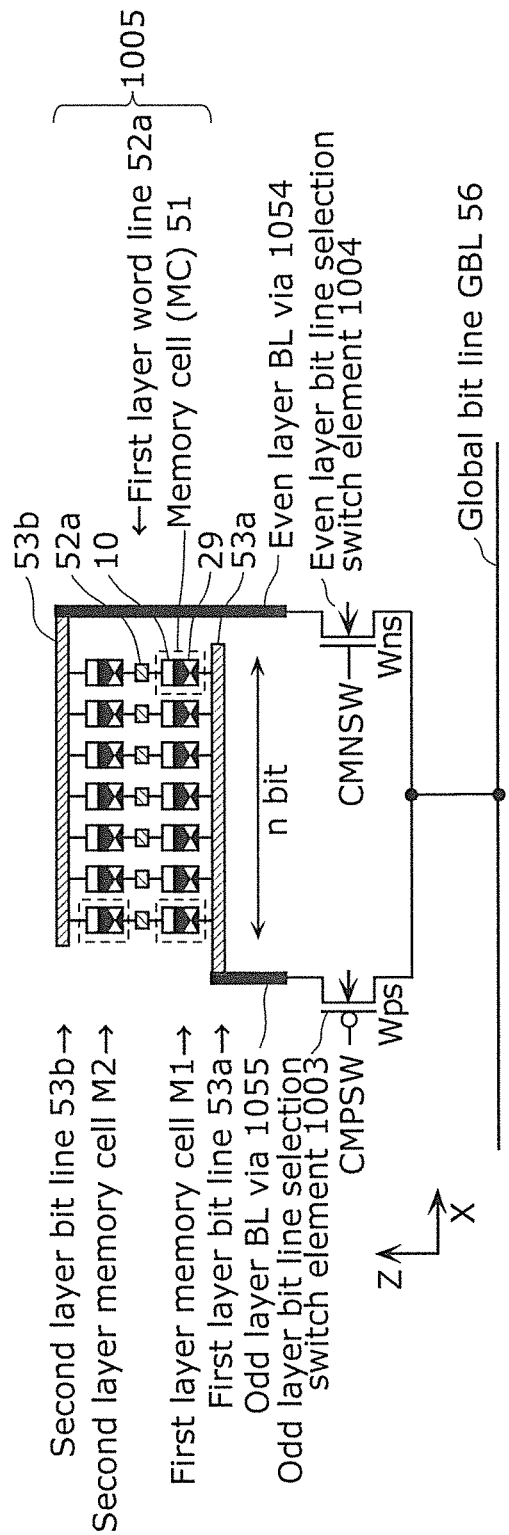
FIG. 39 is a cross section diagram of a two-layer cross point memory according to a variation of the embodiment of the present invention.

FIG. 39 shows the bit line selection switch element structure in the case of using the memory cell 51 in which the variable resistance element 10 is written to the low resistance state when the write current flows from the upper electrode to the lower electrode in the Z direction. That is, in the case where the variable resistance element 10 has the characteristics of changing to the high resistance state when a voltage greater than or equal to a predetermined voltage is applied to the second electrode with respect to the first electrode and changing to the low resistance state when a voltage greater than or equal to a predetermined voltage is applied to the first electrode with respect to the second electrode, the second electrode is formed below the first electrode in the Z direction in the structure shown in FIG. 39.

In FIG. 39, the directions of the currents flowing through the odd layer BL via 1055 and the even layer BL via 1054 in low resistance writing change from those in FIG. 32, so that the types of the bit line selection switch elements are changed. An odd layer bit line selection switch element 1003 including a PMOS transistor is connected to the odd layer BL via 1055, and an even layer bit line selection switch element 1004 including an NMOS transistor is connected to the even layer BL via 1054. This enables the current limiting function in the source follower mode to be employed in low resistance writing in the memory cell of the above-mentioned characteristics, too. In FIG. 39, in accordance with such an arrangement direction of the variable resistance element 10, the first bit line selection switch element (the odd layer bit line selection switch element 1003) connected to the first via (the odd layer BL via 1055) for connecting the odd layer bit line includes a PMOS transistor, whereas the second bit line selection switch element (the even layer bit line selection switch element 1004) connected to the second via (the even layer BL via 1054) for connecting the even layer bit line includes an NMOS transistor.

Figure 40:
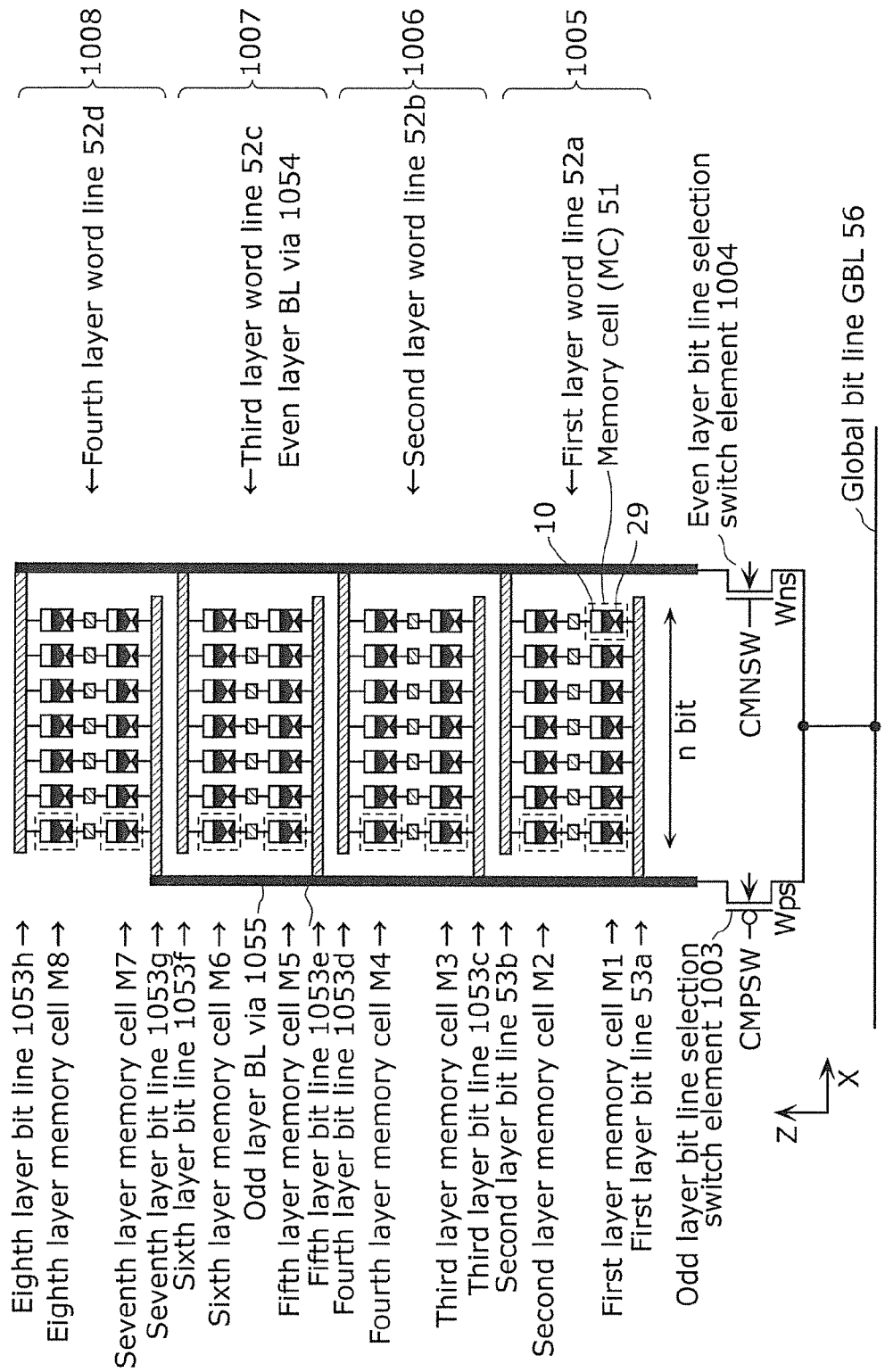
FIG. 40 is a cross section diagram of a multilayer cross point memory according to the variation of the embodiment of the present invention.

FIG. 40 shows a multilayer memory cell array obtained by forming the memory cell array in FIG. 39 in eight layers. FIG. 40 is the same as FIG. 39, except that bit lines, word lines, and memory cells are stacked above. The memory cell array in FIG. 40 has the same multilayer structure as the memory cell array in FIG. 33, but differs from the memory cell array in FIG. 33 in that the vertical orientation of the variable resistance element in each memory cell is opposite. Hence, the transistor types (PMOS/NMOS) of the odd layer bit line selection switch element 1003 and the even layer bit line selection switch element 1004 are reversed. The operation of the memory cell array in FIG. 40 is therefore different from that of the memory cell array in FIG. 33 in that it is reversed including the voltages applied to the gate terminals of the odd layer bit line selection switch element 1003 and the even layer bit line selection switch element 1004. The operation of the memory cell array in FIG. 40 is the same as that of the memory cell array in FIG. 33 in the other respects, and so the detailed description of the operation of the memory cell array in FIG. 40 is omitted.

Note that, as can be understood from the above description, the voltage applied to the gate terminal of the first bit line selection switch element or the second bit line selection switch element is the same in the case of writing the selected memory cell to the high resistance state and in the case of writing the selected memory cell to the low resistance state. This enables switching between high resistance writing and low resistance writing simply by changing the applied voltage of the global bit line 56 and the applied voltage of the selected word line. High-speed writing can thus be facilitated.

As described above, only two elements that are the odd layer bit line selection switch element 1001 (or 1003) connected to the odd layer bit line and the even layer bit line selection switch element 1002 (or 1004) connected to the even layer bit line need to be provided in the area below the memory cell array, to realize both the bit line selection and the current limiting function in the source follower mode in low resistance writing.

According to this structure, in the limited area below the memory cell array, the bit line selection and the current limitation in the source follower mode in low resistance writing to the selected memory cell can both be realized by a small number of elements, i.e. two elements, per vertical array plane. This makes it possible to provide a multilayer cross point memory implementable in a small area.

Though the cross point variable resistance nonvolatile memory device according to the present invention has been described above by way of the embodiment, the present invention is not limited to such an embodiment. Modifications obtained by applying various changes conceivable by a person skilled in the art to the embodiment and any combinations of the structural elements in the embodiment and the reference example are also included in the present invention without departing from the scope of the present invention.

The differences from the above-mentioned Reference Examples 1 and 2 and Modifications 1 and 2 are mainly described in the embodiment. Therefore, the above description of Reference Examples 1 and 2 and Modifications 1 and 2 applies to the parts whose description is omitted in the embodiment. For example, the details on the materials of the variable resistance element and the like in the embodiment are as described in Reference Example 1.

Though the overall structure of the cross point variable resistance nonvolatile memory device according to the present invention is shown in FIG. 37, the present invention does not necessarily require all structural elements shown in FIG. 37. The cross point variable resistance nonvolatile memory device according to the present invention may at least include one vertical array plane of the two-layer structure (memory cells in two layers, bit lines in two layers, word lines in one layer, two bit line vias, and two bit line selection switch elements) shown in FIG. 32 or 39. According to this structure, low resistance writing with current limitation can be realized by a small number of transistors.

INDUSTRIAL APPLICABILITY

According to the present invention, a write circuit that performs current limitation in resistance value setting of a low resistance state can be provided in a small layout area and also each variable resistance element can be formed in the same orientation in all layers, in a cross point variable resistance nonvolatile memory device. The present invention is therefore useful as a low-cost multilayer cross point variable resistance nonvolatile memory device having stable resistance change characteristics.

REFERENCE SIGNS LIST

10 Variable resistance element
11 Upper electrode (third electrode)
12 Second variable resistance layer
13 First variable resistance layer
14 Lower electrode
21 Upper electrode (second electrode)
22 Current steering layer
23 Lower electrode (first electrode)
26 to 28 Via
29, 29a, 29b Current steering element
51 Memory cell
52, 52a to 52d Word line
53, 53a to 53b, 1053c to 1053h Bit line
54, 1054 Even layer BL (bit line) via (second via)
55, 1055 Odd layer BL (bit line) via (first via)
55 Global bit line
57, 57a, 65 to 68, 1002, 1004 Even layer bit line selection switch element (second bit line selection switch element)
58, 58a, 61 to 64, 1001, 1003 Odd layer bit line selection switch element (first bit line selection switch element)
70 Upper wire
71 Lower wire
73 Sub-bit line selection circuit
74 Word line decoder and driver circuit
90, 90a, 92, 94, 96 N-type current limiting element
91, 91a, 93, 95, 97 P-type current limiting element
98 Global bit line decoder and driver circuit
99 Current limiting control circuit
100, 200, 1000, 1005, 1006, 1007, 1008 Memory cell array
105 Write circuit
106 Read circuit
107 Data input-output circuit
108 Pulse generation circuit
109 Control circuit
110 Address input circuit
190, 203, 204, 211, 212, 578 NMOS transistor
201 Constant current source
205, 210, 213 PMOS transistor
206 Current limiting voltage generation circuit
207 Vnsn voltage generation circuit
208 Vnsp voltage generation circuit
209a, 209b Fixed resistance element
214 Output selection circuit
215 to 218 Bit line selection switch element
219 Output circuit
220, 221 Differential amplifier
222, 223 Smoothing capacitor
300, 1300 Main part
920 Bidirectional current limiting circuit
980 Driver circuit
981 Tri-state buffer
982 Pull-up element
1099 Current limiting voltage generation circuit

The invention claimed is:

1. A cross point variable resistance nonvolatile memory device comprising:
a substrate;
a memory cell array formed on the substrate and having a plurality of memory cells each of which includes a variable resistance element and a bidirectional current steering element, the variable resistance element reversibly changing between at least two states including a low resistance state and a high resistance state by application of voltages of different polarities, and the current steering element being connected in series with the variable resistance element and having nonlinear current-voltage characteristics,
wherein each of the plurality of memory cells is formed at a different one of cross points of a plurality of bit lines and a plurality of word lines to be positioned between a corresponding bit line and a corresponding word line, the plurality of bit lines extending in an X direction and being formed in a first layer closer to a main surface of the substrate and a second layer farther from the main surface of the substrate, and the plurality of word lines extending in a Y direction and being formed between a bit line in the first layer and a bit line in the second layer,
a memory cell of the plurality of memory cells that is formed at a cross point of the bit line in the first layer and each of the plurality of word lines is a first memory cell,
a memory cell of the plurality of memory cells that is formed at a cross point of the bit line in the second layer and each of the plurality of word lines is a second memory cell,
one or more XZ planes that each correspond to a different one of a plurality of bit line groups and are aligned in the Y direction are one or more vertical array planes respectively, each of the plurality of bit line groups being composed of the plurality of bit lines aligned in a Z direction which is a layer stacking direction, the one or more vertical array planes share the plurality of word lines that perpendicularly pass through the one or more vertical array planes, in each of the one or more vertical array planes, the bit line in the first layer is connected to a first via extending in the Z direction, and the bit line in the second layer is connected to a second via extending in the Z direction, the variable resistance element in each of the plurality of memory cells: includes a first electrode, a variable resistance layer, and a second electrode that are arranged in the stated order in the Z direction; and has characteristics of changing to the high resistance state when a voltage greater than or equal to a predetermined voltage is applied to the second electrode with respect to the first electrode and changing to the low resistance state when a voltage greater than or equal to a predetermined voltage is applied to the first electrode with respect to the second electrode, and the first electrode, the variable resistance layer, and the second electrode are arranged in the same order in the Z direction in the variable resistance element in the first memory cell and the variable resistance element in the second memory cell;

a global bit line provided for each of the one or more vertical array planes;

a first bit line selection switch element provided for each of the one or more vertical array planes, including one of a PMOS transistor and an NMOS transistor, and having one of a source terminal and a drain terminal connected to the first via and the other one of the source terminal and the drain terminal connected to the global bit line; and a second bit line selection switch element provided for each of the one or more vertical array planes, including the other one of the PMOS transistor and the NMOS transistor, and having one of a source terminal and a drain terminal connected to the second via and the other one of the source terminal and the drain terminal connected to the global bit line.

2. The cross point variable resistance nonvolatile memory device according to claim 1, wherein the second electrode is formed above the first electrode in the Z direction, and the first bit line selection switch element is the NMOS transistor, and the second bit line selection switch element is the PMOS transistor.

3. The cross point variable resistance nonvolatile memory device according to claim 1, wherein the second electrode is formed below the first electrode in the Z direction, and the first bit line selection switch element is the PMOS transistor, and the second bit line selection switch element is the NMOS transistor.

4. The cross point variable resistance nonvolatile memory device according to claim 1, wherein the memory cell array is formed by stacking a plurality of two-layer memory cell array units each of which is a two-layer memory cell array including: the bit line in the first layer; a plurality of first memory cells; the plurality of word lines; a plurality of second memory cells; the bit line in the second layer; the first via; and the second via, and the respective first vias of the plurality of two-layer memory cell array units are connected in series with each other, and the respective second vias of the plurality of two-layer memory cell array units are connected in series with each other.

5. The cross point variable resistance nonvolatile memory device according to claim 1, further comprising:

a global bit line decoder and driver that supplies a signal for selecting a memory cell to the global bit line;

a word line decoder and driver that supplies a signal for selecting the memory cell to any of the plurality of word lines;

a sub-bit line selection circuit that supplies a selection signal for selecting any of the plurality of bit lines to the first bit line selection switch element and the second bit line selection switch element;

a write circuit that writes data to the memory cell selected by the global bit line decoder and driver and the word line decoder and driver;

a read circuit that reads data from the memory cell selected by the global bit line decoder and driver and the word line decoder and driver; and a control circuit that controls the global bit line decoder and driver, the word line decoder and driver, the write circuit, and the read circuit.

6. The cross point variable resistance nonvolatile memory device according to claim 5, wherein the write circuit, the read circuit, and the control circuit each include at least one of an NMOS transistor having a first threshold voltage and a PMOS transistor having a second threshold voltage, a threshold voltage of the NMOS transistor included in the first bit line selection switch element or the second bit line selection switch element is a third threshold voltage lower than the first threshold voltage, and a threshold voltage of the PMOS transistor included in the first bit line selection switch element or the second bit line selection switch element is a fourth threshold voltage higher than the second threshold voltage.

7. The cross point variable resistance nonvolatile memory device according to claim 6, wherein the global bit line decoder and driver includes:

a buffer circuit that at least outputs one of an output state of a first voltage and an output state of a second voltage in an activated state, and at least outputs a high impedance state in an inactivated state, the first voltage and the second voltage respectively corresponding to a high level and a low level of a write voltage; and a pull-up element having one end connected to an output terminal of the buffer circuit, and the other end connected to a power source having a third voltage that is greater than or equal to a sum of absolute values of the first threshold voltage and the third threshold voltage.

8. The cross point variable resistance nonvolatile memory device according to claim 7, wherein the global bit line decoder and driver applies the third voltage to an unselected global bit line, when writing the memory cell.

9. The cross point variable resistance nonvolatile memory device according to claim 7, wherein the global bit line decoder and driver applies the third voltage to an unselected global bit line, when reading the memory cell.

10. The cross point variable resistance nonvolatile memory device according to claim 7, wherein the third voltage is a voltage applied to a bit line connected to a memory cell that is to be set to an unselected state.

11. The cross point variable resistance nonvolatile memory device according to claim 5,
wherein, in the case of being supplied with the selection signal from the sub-bit line selection circuit, each of the first bit line selection switch element and the second bit line selection switch element:
enters an ON state that produces a greater substrate bias effect to write the memory cell, when performing low resistance writing on the memory cell; and
enters an ON state that produces a smaller substrate bias effect to write the memory cell, when performing high resistance writing on the memory cell.

12. The cross point variable resistance nonvolatile memory device according to claim 11,
wherein a first current flowing through the first bit line selection switch element when performing the low resistance writing on the first memory cell and a second current flowing through the second bit line selection switch element when performing the low resistance writing on the second memory cell are opposite in current direction, and equal in absolute value within a predetermined range of fluctuations.

13. The cross point variable resistance nonvolatile memory device according to claim 12, further comprising
a current limiting voltage generation circuit that generates voltages to be applied to gate terminals of the first bit line selection switch element and the second bit line selection switch element in order to cause the first current and the second current to be opposite in current direction and equal in absolute value within the predetermined range of fluctuations,
wherein the sub-bit line selection circuit supplies the voltages generated by the current limiting voltage generation circuit to the gate terminals of the first bit line selection switch element and the second bit line selection switch element, as the selection signal.

14. The cross point variable resistance nonvolatile memory device according to claim 12,
wherein a gate width of the PMOS transistor included in the first bit line selection switch element or the second bit line selection switch element is substantially twice a gate width of the NMOS transistor included in the first bit line selection switch element or the second bit line selection switch element.

15. The cross point variable resistance nonvolatile memory device according to claim 13,
wherein, through the sub-bit line selection circuit, the current limiting voltage generation circuit:
supplies the same first gate voltage to the gate terminal of the first bit line selection switch element, in the case of writing the memory cell to the high resistance state and in the case of writing the memory cell to the low resistance state; and
supplies the same second gate voltage to the gate terminal of the second bit line selection switch element, in the case of writing the memory cell to the high resistance state and in the case of writing the memory cell to the low resistance state.

16. The cross point variable resistance nonvolatile memory device according to claim 13,
wherein the current limiting voltage generation circuit turns ON the NMOS transistor included in the first bit line selection switch element or the second bit line selection switch element by applying a voltage greater than or equal to Vtn+VLR to a gate terminal of the NMOS transistor through the sub-bit line selection circuit, where VLR is a voltage applied across both ends of the memory cell when writing the memory cell to the low resistance state, and Vtn is a threshold voltage of the NMOS transistor.

17. The cross point variable resistance nonvolatile memory device according to claim 13,
wherein the current limiting voltage generation circuit turns ON the PMOS transistor included in the first bit line selection switch element or the second bit line selection switch element by applying a voltage of 0 V to a gate terminal of the PMOS transistor.

18. The cross point variable resistance nonvolatile memory device according to claim 1, comprising:
a plurality of vertical array planes as the one or more vertical array planes;
a plurality of global bit lines each of which is provided for a different one of the plurality of vertical array planes, as the global bit line; and
a plurality of first bit line selection switch elements each of which is provided for a different one of the plurality of vertical array planes and a plurality of second bit line selection switch elements each of which is provided for a different one of the plurality of vertical array planes, respectively as the first bit line selection switch element and the second bit line selection switch element.

* * * * *